(12) United States Patent
Toda

(10) Patent No.: US 8,595,592 B2
(45) Date of Patent: Nov. 26, 2013

(54) MEMORY SYSTEM

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 13/232,456

(22) Filed: Sep. 14, 2011

(65) Prior Publication Data

US 2012/0075940 A1    Mar. 29, 2012

(30) Foreign Application Priority Data

Sep. 24, 2010  (JP) ................................ 2010-214357

(51) Int. Cl.
*G11C 29/00*    (2006.01)

(52) U.S. Cl.
USPC ....... 714/764; 714/752; 714/763; 365/185.03

(58) Field of Classification Search
USPC ...................... 714/752, 763, 764; 365/185.03
See application file for complete search history.

(56) References Cited

U.S. PATENT DOCUMENTS

| | | | |
|---|---|---|---|
| 6,359,806 B1 | 3/2002 | Nozoe et al. | |
| 7,984,360 B2 * | 7/2011 | Sharon et al. | 714/766 |
| 8,156,398 B2 * | 4/2012 | Sommer | 714/752 |
| 8,321,760 B2 * | 11/2012 | Son et al. | 714/763 |
| 2009/0024903 A1 * | 1/2009 | Bueb | 714/764 |
| 2009/0198881 A1 | 8/2009 | Toda | |
| 2010/0103735 A1 * | 4/2010 | Kim et al. | 365/185.03 |
| 2010/0107039 A1 | 4/2010 | Toda | |
| 2010/0211856 A1 * | 8/2010 | Weingarten | 714/777 |

FOREIGN PATENT DOCUMENTS

JP    2000-305861 A    11/2000

OTHER PUBLICATIONS

Office Action issued Sep. 25, 2012, in Japanese Patent Application No. 2010-214357 with English translation.
Japanese Office Action issued Dec. 11, 2012 in Patent Application No. 2010-214357 with English Translation.
U.S. Appl. No. 13/367,655, filed Feb. 7, 2012, Toda.
U.S. Appl. No. 13/011,318, filed Jan. 21, 2011, Haruki Toda.
Ron M. Roth, et al., "Lee-Metric BCH Codes and their Application to Constrained and Partial-Response Channels", IEEE Transactions on Information Theory, vol. 40, No. 4, Jul. 1994, pp. 1083-1096.

* cited by examiner

*Primary Examiner* — Sam Rizk
(74) *Attorney, Agent, or Firm* — Oblon, Spivak, McClelland, Maier & Neustadt, L.L.P.

(57) ABSTRACT

A memory system according to the embodiment comprises a cell array including word lines and plural memory cells operative to store data in accordance with plural different physical levels when selected by the word lines; a register operative to hold first data input from external; and a data converter unit operative to convert the first data held in the register into second data and overwrite the second data in the area of the register for holding the first data, and further operative to convert the second data held in the register into third data to be recorded in the memory cells and overwrite the third data in the area of the register for holding the second data.

20 Claims, 62 Drawing Sheets

FIG. 1

| L | 7 | 11 | 11 | 13 | 13 | 17 | 17 | 17 | 19 | 19 | 23 |
|---|---|---|---|---|---|---|---|---|---|---|---|
| p | 7 | 11 | 11 | 13 | 13 | 17 | 17 | 17 | 19 | 19 | 23 |
| h | 3 | 4 | 4 | 4 | 4 | 5 | 5 | 5 | 5 | 5 | 5 |
| ε | 2 | 2 | 3 | 2 | 3 | 2 | 3 | 4 | 4 | 5 | 6 |
| M | 6 | 24 | 20 | 32 | 28 | 60 | 55 | 50 | 60 | 55 | 70 |
| δ | 2 | 6 | 5 | 8 | 7 | 12 | 11 | 10 | 12 | 11 | 14 |
| M/(p−1) | 1 | 2.4 | 2 | 2.67 | 2.333 | 3.75 | 3.438 | 3.125 | 3.333 | 3.056 | 3.182 |
| (p−1) | 6 | 10 | 10 | 12 | 12 | 16 | 16 | 16 | 18 | 18 | 22 |
| $\log_2 L$ | 2.8 | 3.4 | 3.4 | 3.7 | 3.7 | 4 | 4 | 4 | 4.2 | 4.2 | 4.5 |
| ε/(p−1) | 0.33 | 0.2 | 0.3 | 0.17 | 0.25 | 0.125 | 0.19 | 0.25 | 0.22 | 0.28 | 0.27 |
| $\log_2 L$ /[M/(p−1)] | 2.8 | 1.42 | 1.7 | 1.39 | 1.59 | 1.07 | 1.16 | 1.28 | 1.27 | 1.37 | 1.41 |

$r_{58} \sim r_{60}$ are Dummies

FIG. 46
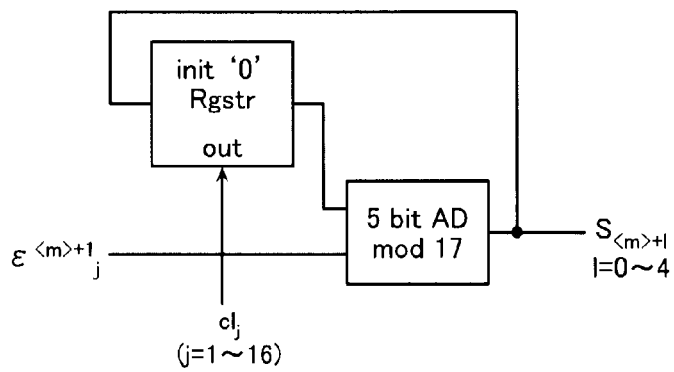
FIG. 47
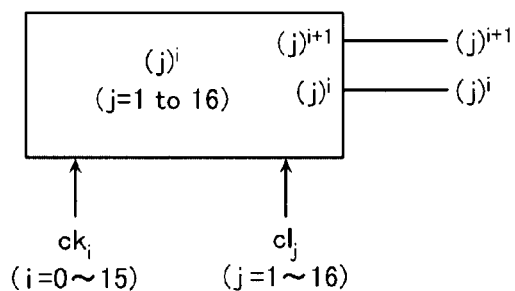
FIG. 48
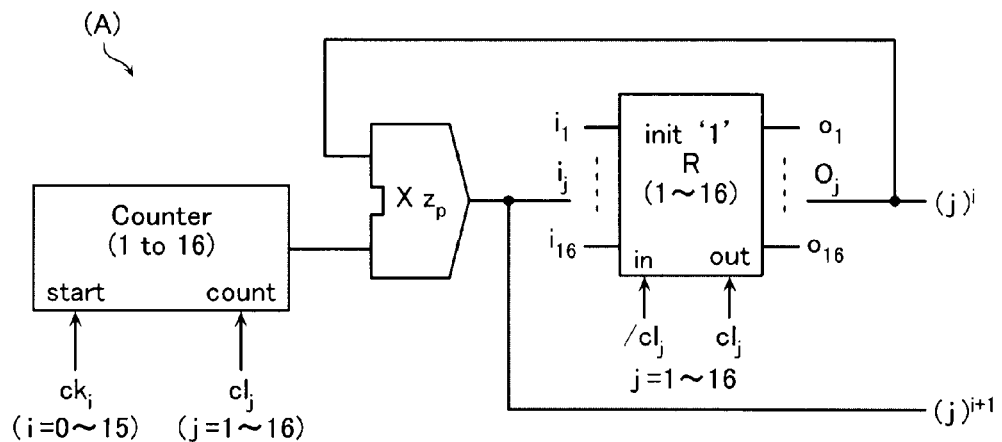
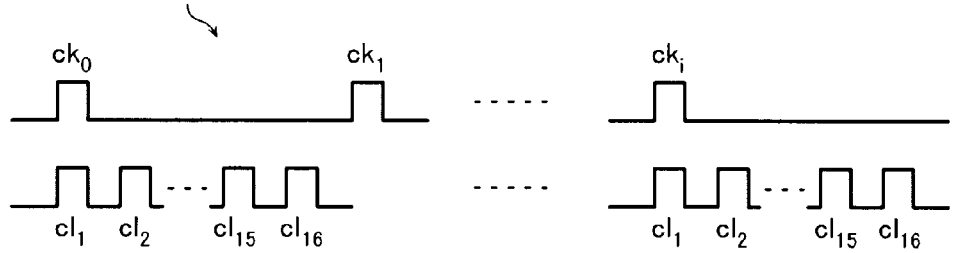

FIG. 51

| j | 17−j | 17−j⁻¹ | j² | j³ | j⁴ | j!(17) | j⁻¹(17) | 3ʲ(17) | 5ʲ(17) | 6ʲ(17) | 7ʲ(17) | 10ʲ(17) |
|---|------|--------|----|----|----|--------|---------|--------|--------|--------|--------|---------|
| 1 | 16 | 16 | 1 | 1 | 1 | 1 | 1 | 3 | 5 | 6 | 7 | 10 |
| 2 | 15 | 8 | 4 | 8 | 16 | 2 | 9 | 9 | 8 | 2 | 15 | 15 |
| 3 | 14 | 11 | 9 | 10 | 13 | 6 | 6 | 10 | 6 | 12 | 3 | 14 |
| 4 | 13 | 4 | 16 | 13 | 1 | 7 | 13 | 13 | 13 | 4 | 4 | 4 |
| 5 | 12 | 10 | 8 | 6 | 13 | 1 | 7 | 5 | 14 | 7 | 11 | 6 |
| 6 | 11 | 14 | 2 | 12 | 4 | 6 | 3 | 15 | 2 | 8 | 9 | 9 |
| 7 | 10 | 12 | 15 | 3 | 4 | 8 | 5 | 11 | 10 | 14 | 12 | 5 |
| 8 | 9 | 2 | 13 | 2 | 16 | 13 | 15 | 16 | 16 | 16 | 16 | 16 |
| 9 | 8 | 15 | 13 | 15 | 16 | 15 | 2 | 14 | 12 | 11 | 10 | 7 |
| 10 | 7 | 5 | 15 | 14 | 4 | 14 | 12 | 8 | 9 | 15 | 2 | 2 |
| 11 | 6 | 3 | 2 | 5 | 4 | 1 | 14 | 7 | 11 | 5 | 14 | 3 |
| 12 | 5 | 7 | 8 | 11 | 13 | 12 | 10 | 4 | 4 | 13 | 13 | 13 |
| 13 | 4 | 13 | 16 | 4 | 1 | 3 | 4 | 12 | 3 | 10 | 6 | 11 |
| 14 | 3 | 6 | 9 | 7 | 13 | 8 | 11 | 2 | 15 | 9 | 8 | 8 |
| 15 | 2 | 9 | 4 | 9 | 16 | 1 | 8 | 6 | 7 | 3 | 5 | 12 |
| 16 | 1 | 1 | 1 | 16 | 1 | 16 | 16 | 1 | 1 | 1 | 1 | 1 |

$n=0 \quad f_0 = x^\gamma$ $n=1 \quad f_1 = \Psi(x) = 1 + \Psi_1 x + \Psi_2 x^2 + \cdots + \Psi_{\gamma-2} x^{\gamma-2} + \Psi_{\gamma-1} x^{\gamma-1}$ $n=0 \quad p_{-1} = 0$ $n=1 \quad p_0 = 1$

MEMORY SYSTEM

CROSS-REFERENCE TO RELATED APPLICATION

This application is based upon and claims the benefit of priority from the prior Japanese Patent Application No. 2010-214357, filed on Sep. 24, 2010, the entire contents of which are incorporated herein by reference.

FIELD

The embodiment relates to a memory system.

BACKGROUND

In recent years, mass data is held in mobile devices, for example, in handheld smart terminals and electronic books for fast access. Such technologies have become important increasingly. Further, from the viewpoint of weight-reducing and energy-saving of information devices, integrated circuit memories having no moving parts such as a motor has proceeded rapidly. The importance in this case is how to use up memory cells in performance marginal parts on memory production. In accordance with this, lower prices and larger capacities due to improvements in productivity of memories can be realized. In addition, the reliability of data stored in such the mass-capacity memories becomes important.

Even with no large-scale technical innovation, mass-capacity memories can be realized. One such method is a multi-level technology, which can increase the storage capacity per memory cell. In addition, as the technology of insuring data for marginal memory cells, ECC is known. In particular, as for NAND flash memories, multi-levels of memory cells and ECC system technologies have been matured and almost completed.

Such the NAND flash memories have been used increasingly wider, for example, in mobile terminals and SSDs. Accordingly, it is required to achieve additional technical leaps for the NAND flash memories. For that purpose, it is required to add innovative modifications to the conventional multi-leveling technologies and ECC.

The multi-leveled NAND flash memories have been developed originally based on the specifications without consideration of multi-level. In addition, the ECC is applied to the NAND flash memories based on the technologies for the system of the overall memory. Therefore, the multi-leveling technologies and ECC have not been made optimal as the technology kept with multi-levels of memory cells.

BRIEF DESCRIPTION OF THE DRAWINGS

FIG. 1 is a table showing relations among the numbers of levels of p-adic cells, the data storage efficiencies and so forth in a memory system according to a first embodiment.

FIG. 46 is a block diagram of a circuit for deriving a syndrome in the memory system according to the present embodiment.

FIG. 47 is a diagram showing a circuit symbol of a circuit for deriving the cumulative sum of elements in Zp ("$(j)^i$ (j=1 to 16)" circuit block) in the memory system according to the present embodiment.

FIG. 48 is a block diagram of the "$(j)^i$ (j=1 to 16)" circuit block in the memory system according to the present embodiment.

FIG. 51 is a table of various operational results over elements in Zp in the memory system according to the present embodiment.

DETAILED DESCRIPTION

Figure 2:
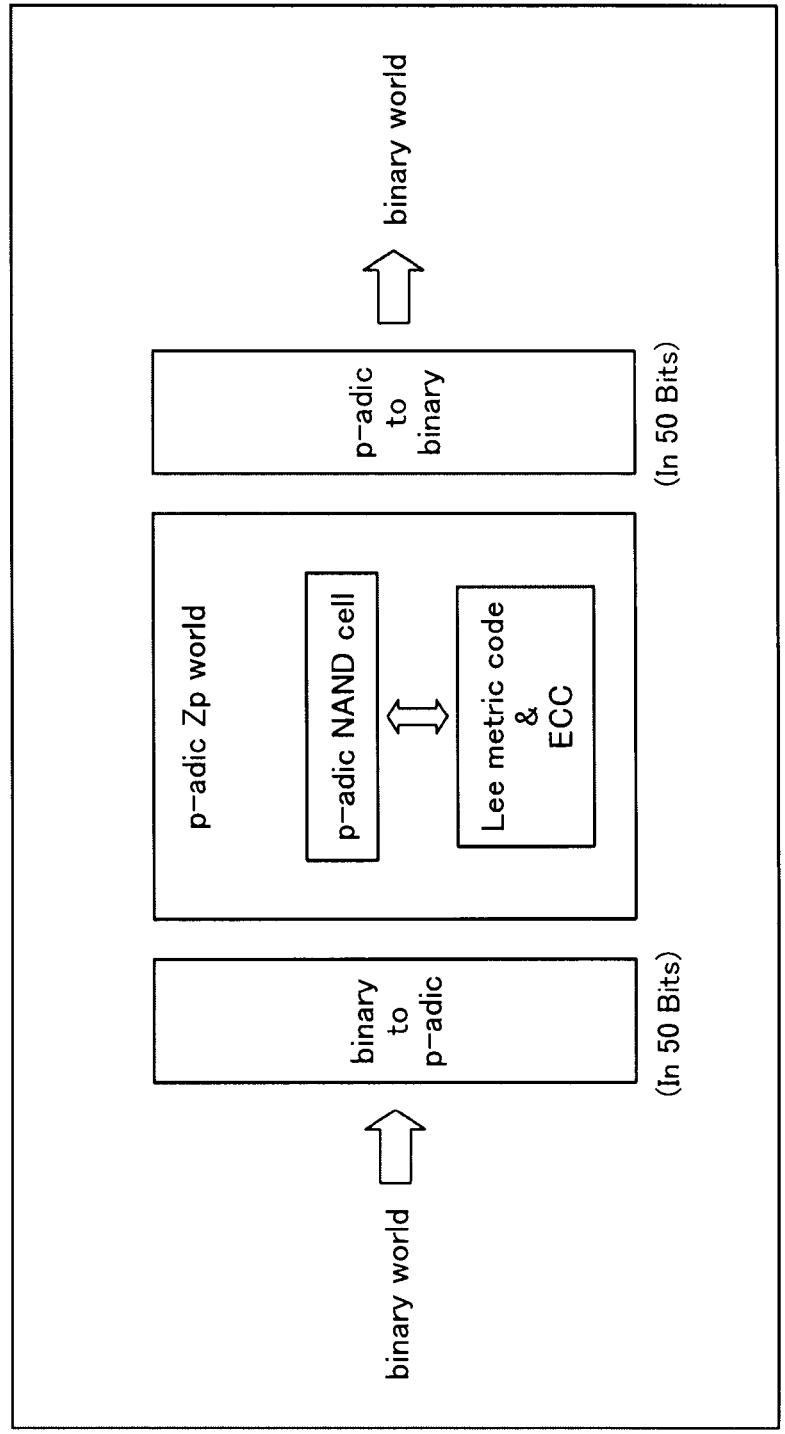
FIG. 2 is a conceptual view of the memory system according to the present embodiment.

A memory system according to the embodiment comprises a cell array including word lines and plural memory cells operative to store data in accordance with plural different physical levels when selected by the word lines; a register operative to hold first data input from external; and a data converter unit operative to convert the first data held in the register into second data and overwrite the second data in the area of the register for holding the first data, and further operative to convert the second data held in the register into third data to be recorded in the memory cells and overwrite the third data in the area of the register for holding the second data.

With reference to the drawings, memory systems according to the embodiments will now be described below.

Overview of Embodiment

A memory system realizes a higher-density storage capacity by finely fabricating a cell array, forming the cell array and so forth in 3-dimensional structures, and thinking physical phenomena for use in memory cells. If the memory system is further required to have a higher density after completion of stable process steps, multi-leveling of memory cells is effective means.

In particular, as for NAND flash memories, multi-leveling proceeds promptly and 3-bit cells capable of storing 8 levels per cell become practical. Much higher multi-leveling of memory cells associates with a sudden deterioration of reliability, however, and suffers a 2-decimal places or more error rate per bit error rate increase at least. Thus, from the problem on the reliability and production yield, the progression of multi-leveling of memory cells has a difficult problem even though it is expected as means for realizing high-capacity file memories.

If the problem on multi-leveling of memory cells can be overcome to achieve effective use, NAND flash memories can be attained to have a higher-density storage capacity while utilizing stable process steps for NAND flash memories for longer terms.

Therefore, the first embodiment, under the following gist, proposes a memory system utilizing a Lee metric code.

(1) An error in a memory cell, in many cases, may be caused by writing an adjacent level in the memory cell and reading an adjacent level from the memory cell. Even in such the case, the assignment of binary bits to the conventional memory cell may cause a larger error quantity. Therefore, the memory system according to the embodiment described below utilizes multi-level storage cells with reliability improved by simplifying the assignment of levels to a memory cell.

(2) A multi-level of the memory cell can be grasped as a height from the base level. In a word, a multi-leveled memory cell is suitable for storing information not digitalized by a binary but digitalized by a prime. Therefore, the memory system according to the embodiment described below is configured with the use of memory cells having physical quantity levels assigned to elements in a finite field Zp of a prime p (hereinafter referred to as "p-adic cells").

(3) An ECC (Error Correcting Code) effective in the case of the error caused by writing an adjacent level in the memory cell and reading an adjacent level from the memory cell is a Lee metric code in the finite field Zp. Therefore, the memory system according to the embodiment described below utilizes an ECC system that uses a Lee metric code thought to cause no error searching miss.

(4) The configuration of the NAND flash memory using p-adic cells is different from the configuration of the conventional NAND flash memory. Therefore, the embodiment described below proposes an essential idea of the specification about a specific memory system and describes the memory system configured based thereon.

(5) If it is desired to set a larger correctable error quantity, an error correcting method using a Euclidean iterative method may be effective if it is used as the error correcting method using the Lee metric code ECC. Therefore, the following description is given to specific circuits required to realize the memory system using the Euclidean iterative method for error correction.

First Embodiment

Lee Metric Code

First, an overview of the Lee metric code is described.

A symbol c representative of the code is an integer shown in Expression 1.

$$c_j \in GF(p) = Zp, 0 \leq c < p \quad \text{[Expression 1]}$$

When the metrics of these integers are represented by $|c_j|$ as Lee metrics and all Lee metrics $|c_j|$ are represented by integers of p/2 or below, the Lee metrics $|c_j|$ can be defined as in Expression 2.

$$0 \leq c < p/2 : |c_j| = c_j$$

$$p/2 < c < p : |c_j| = p - c_j \quad \text{[Expression 2]}$$

As the code C can be considered a row of n (=p−1) symbols $c_j$, it can be represented by $C = (c_1, c_2, \ldots, c_n)$, and a metric w(C) of the code C can be defined as the sum of Lee metrics of the symbols $c_j$ as in Expression 3.

$$w(C) = |c_1| + |c_2| + \ldots + |c_n| \quad \text{[Expression 3]}$$

The distance between codes can be defined by the sum of Lee metrics of differences between the symbols corresponding to the code. Here, a difference between 2 symbols c and y (Lee distance) $d_L(c, y)$ is given as Expression 4.

$$d_L(c,y) = w(c-y) \quad \text{[Expression 4]}$$

Further, the minimum Lee distance of the code C can be defined by the minimum metric of the metrics w(C) of the code C as shown in Expression 5.

$$d_L(C) = \min w(C) \quad \text{[Expression 5]}$$

In this case, the Lee metric code is such a code that has the minimum distance of 2γ between codes having a generator matrix G and a syndrome matrix H shown in Expression 6 and that can correct (γ−1) or lower Lee metric errors.

$$G = \begin{bmatrix} 1 & 2 & \cdots & (p-1) \\ 1^2 & 2^2 & \cdots & (p-1)^2 \\ \vdots & \vdots & \ddots & \vdots \\ 1^k & 2^k & \cdots & (p-1)^k \end{bmatrix},$$ [Expression 6]

$$H = \begin{bmatrix} 1 & 2 & \cdots & (p-1) \\ 1^1 & 2^1 & \cdots & (p-1)^1 \\ \vdots & \vdots & \ddots & \vdots \\ 1^{\gamma-1} & 2^{\gamma-1} & \cdots & (p-1)^{\gamma-1} \end{bmatrix}$$

Here, when the word length of the code C is denoted with n and the word length of data is denoted with k, then γ=n−k where γ represents the redundant word length contained in the code C.

For the purpose of generating the Lee metric code thus configured, the input-converted data is presented by a k-digit, p-adic number. The numerals on the digits of the p-adic number are the elements in Zp and therefore can be used as a data word X of the Lee metric code to obtain a code expression through an operation C=XG based on the generator matrix G. The obtained code word is stored in the memory. Information about the error caused on the stored numeral in Zp is used as a data word Y of the Lee metric code read out of the memory to obtain a syndrome through an operation S=YH$^t$ (H$^t$ is a transpose of H) so that the position and quantity of the error can be computed to correct the error.

<Principle of Data Processing, Syndrome Converting Method>

The following description is given to the principle of a data processing method in the NAND flash memory using p-adic cells. Hereinafter, the principle is referred to as a "syndrome converting method".

The components of the code C held in the p-adic cells are the numerals in Zp and they cause variations on receipt of various disturbances at every component and make a change to the code Y consisting of different components as shown in Expression 7.

$$Y = (y_i), y_i = c_i + e_i, i = 1 \sim p-1$$ [Expression 7]

The operation to restore C from Y is decoding. Prior to decoding, a syndrome is derived.

After selecting 3-component vectors $<m> = <m_1, m_2, m_3>$ ($m_i$=0 to p−2) from Zp and applying a matrix operation of these vectors and H matrix as in Expression 8, a syndrome $^{<m>}S$ can be derived as elements $S_{<m>+0}, S_{<m>+1}, S_{<m>+\epsilon}$ where $\epsilon=\gamma-1$.

[Expression 8]

$$^{<m>}S = Y \begin{bmatrix} (p-1^{-1}) & 0 & \cdots & 0 \\ 0 & (p-2^{-1}) & \cdots & 0 \\ \vdots & \vdots & \ddots & \vdots \\ 0 & 0 & \cdots & \{p-(p-1)^{-1}\} \end{bmatrix}^{m_3}$$

-continued $$\begin{bmatrix} (p-1) & 0 & \cdots & 0 \\ 0 & (p-2) & \cdots & 0 \\ \vdots & \vdots & \ddots & \vdots \\ 0 & 0 & \cdots & \{p-(p-1)\} \end{bmatrix}^{m_2} \begin{bmatrix} 1 & 0 & \cdots & 0 \\ 0 & 2 & \cdots & 0 \\ \vdots & \vdots & \ddots & \vdots \\ 0 & 0 & \cdots & (p-1) \end{bmatrix}^{m_1} H^t$$

After setting $^{<m>}S = (S_{<m>+l})$ (l=0 to ε), and deriving $S_0$ from $<m>+l=0$, if $|S_0| \leq \epsilon$, then decoding starts.

This is because the generator matrix G and the syndrome matrix H are configured to satisfy GH$^t$=0(mod p), for example. Therefore, the substitution of Y=C+E makes zero the part corresponding to C as shown in Expression 9 so that S can be represented by the components of E.

[Expression 9]

$$\sum_{j=1}^{p-1} (p-j^{-1})^{m_3} (p-j)^{m_2} (j)^{m_1} (j)^l c_j =$$

$$\sum_{i=0}^{p-\epsilon-3} a_i \sum_{j=1}^{p} (j)^{i+1+l+m_1} (p-j)^{m_2} (p-j^{-1})^{m_3} =$$

$$0 \Rightarrow S_{<m>+l} = \sum_{j=1}^{p-1} (p-j^{-1})^{m_3} (p-j)^{m_2} (j)^{m_1} (j)^l y_j =$$

$$\sum_{j=1}^{p-1} (p-j^{-1})^{m_3} (p-j)^{m_2} (j)^{m_1+l} e_j$$

If $<m>=<0>$, l=0 and E=$(e_1, e_2, \ldots, e_n)$, the representation of $S_{<0>+0}=S_0=\Sigma e_j$ can be given so that $S_0$ indicates the total sum of errors as can be found.

If $|S_0| \leq \gamma-1$, an error can be found through the following syndrome converting method. Even if this condition is not satisfied, the value of the error on the code component can be obtained according to the computation. It is not possible to determine whether the error is an error on a true code or an error on an adjacent code. Therefore, it cannot be used in error correction. This is because the requirement for enabling error correction of the Lee metric code includes the minimum value of the Lee metric code between codes being equal to 2γ, and because in this case the Lee metric code of $S_0$ always becomes equal to ε or below, that is, the total sum of Lee metrics of error components becomes equal to ε or below.

If $|S_0| \leq \epsilon$, the flow enters the error searching through the syndrome converting method and executes the syndrome conversion at the start. In this case, the flow seeks u= $\epsilon(S_{<m>+0})^{-1}$ that makes $uS_{<m>+0} \equiv \epsilon$ over $<m>$ that leads to $S_{<m>+0} \neq 0$, from Expression 10, to obtain a new syndrome $u^{<m>}S = (uS_{<m>+0}, uS_{<m>+1}, \ldots, uS_{<m>+\epsilon})$.

[Expression 10]

$$uS_{<m>+0} = \sum_{j=1}^{p-1} u(p-j^{-1})^{m_3} (p-j)^{m_2} (j)^{m_1} e_j = \epsilon \equiv u \sum_{j=1}^{p-1} (j)^{<n>} e_j$$

Subsequently, the converted syndrome is used to decode the error. This method is described.

The code stored in the memory cell array contains the error $E=(e_1, e_2, \ldots, e_n)$ $(n=p-1)$. Accordingly, a virtual error on the new syndrome includes $\{u(1)^{<m>}e_1, u(2)^{<m>}e_2, \ldots, u(n)^{<m>}e_{p-1}\}$. These n $(=p-1)$ error components are converted and classified into 2 sets $J_+$ and $J_-$ as in Expression 11.

$$J_+ = \{j \in (1, 2, \ldots, n); u(j)^{\langle m \rangle} e_j < p/2\}$$

$$J_- = \{j \in (1, 2, \ldots, n); u(j)^{\langle m \rangle} e_j > p/2\} \qquad \text{[Expression 11]}$$

Namely, it is classified into $J_+$, which is an arrangement of the positions j of the symbols $c_j$, if the error quantity of the symbol is $u(j)^{<m>}e_j<p/2$, and $J_-$, which is an arrangement of the positions j of the symbols $c_j$, if the error quantity of the symbol is $u(j)^{<m>}e_j>p/2$. Polynomials $\Lambda(x)$, $V(x)$ on Zp are configured on the basis of these sets as in Expression 12.

$$\Lambda(x) = \prod_{j \in J_+} (1 - jx)^{u(j)^{\langle m \rangle} e_j}, \qquad \text{[Expression 12]}$$

$$V(x) = \prod_{j \in J_-} (1 - jx)^{p - u(j)^{\langle m \rangle} e_j}$$

Thus, the polynomial $\Lambda(x)$ is such a polynomial that has a reciprocal number of the error component position j in $J_+$ as a root, and that has a Lee metric $u(j)^{<m>}e_j$ of that error component as the multiplicity of the root. On the other hand, the polynomial $V(x)$ is such a polynomial that has a reciprocal number of the error component position j in $J_-$ as a root, and that has a Lee metric $p-u(j)^{<m>}e_j$ of that error component as the multiplicity of the root. Decoding is a process of finally configuring these polynomials only from the information on the syndromes to solve them, thereby obtaining information on errors. In a word, it is required to seek a relation between these polynomials $\Lambda(x)$, $V(x)$ and the syndromes. When it is configured with a series polynomial having each syndrome $u^{<m>}S$ on a coefficient of the corresponding degree, it is represented with a rational polynomial having the position of the error composition and the value of the virtual error composition in factors thereof as in Expression 13.

$$S(x) = \sum_{l=1}^{\infty} uS_{\langle m \rangle + l} x^l \qquad \text{[Expression 13]}$$

$$= \sum_{j=1}^{p-1} u(j)^{\langle m \rangle} e_j \sum_{l=1}^{\infty} (jx)^l$$

$$= \sum_{j=1}^{p-1} u(j)^{\langle m \rangle} e_j \frac{jx}{1-jx}$$

From Expression 13, a relational equation shown in Expression 14 can be established among the polynomials $\Lambda(x)$, $V(x)$ and the syndrome $S(x)$.

$$\left(\frac{\Lambda(x)}{V(x)}\right) S(x) = -x \left(\frac{\Lambda(x)}{V(x)}\right)' \qquad \text{[Expression 14]}$$

Subsequently, the relational equation shown in Expression 14 is used to seek the polynomials $\Lambda(x)$, $V(x)$ from the syndrome $S(x)$.

From the syndrome $S(x)$, a polynomial $\Psi(x)$ with a degree of $\gamma-1$ or lower shown in Expression 15 is sought.

$$\Psi(x) S(x) \equiv -x \Psi'(x) \pmod{x^\gamma} \qquad \text{[Expression 15]}$$

$$\Psi(x) = 1 + \sum_{j=1} \psi_j x^j,$$

$$\psi_j = -\frac{1}{j} \sum_{i=1}^{j} \psi_{j-i} u S_{\langle m \rangle + i}$$

In an expansive expression of the polynomial $\Psi(x)$, a coefficient $\psi_j$ can be sought from a comparison between coefficients of the homogeneous degree on both sides of the expression shown in Expression 15 through an iterative method using the syndrome $uS_{<m>+j}$ and an already-determined coefficient $\psi_{j-1}$. Coefficients $\psi_0$-$\psi_\epsilon$ of the polynomial $\Psi(x)$ are sought from syndromes $uS_{<m>+0}$ to $uS_{<m>+\epsilon}$. The results are shown in Expression 16.

$$\psi_0 = 1 \qquad \text{[Expression 16]}$$

$$\psi_1 = -\psi_0 u S_{\langle m \rangle + 1} = -u S_{\langle m \rangle + 1}$$

$$\psi_2 = -(\psi_1 u S_{\langle m \rangle + 1} + \psi_0 u S_{\langle m \rangle + 2})/2$$

$$= -u(\psi_1 S_{\langle m \rangle + 1} + \psi_0 S_{\langle m \rangle + 2})/2$$

$$\vdots$$

$$\psi_{\gamma-1} = -(\psi_{\epsilon-1} u S_{\langle m \rangle + 1} + \ldots + \psi_0 u S_{\langle m \rangle + \epsilon})/\epsilon$$

$$= -u(\psi_{\epsilon-1} S_{\langle m \rangle + 1} + \ldots + \psi_0 S_{\langle m \rangle + \epsilon})/\epsilon$$

The polynomial $\Psi(x)$ is a polynomial equivalent to $\Lambda(x)/V(x)$. In this case, the key conditions on mutual primes $\lambda(x)$ and $\nu(x)$ are given as in Expression 17. Therefore, $V(x)=1$ can be established and $\Psi(x)$ can be applied as $\Lambda(x)$ itself.

$$\nu(x) \Psi(x) \equiv \lambda(x) \pmod{x^{\epsilon+1}}$$

$$\deg \lambda(x) - \deg \nu(x) = uS_{\langle m \rangle + 0} = \epsilon \pmod{p}$$

$$\deg \lambda(x) - \deg \nu(x) \leq \epsilon \qquad \text{[Expression 17]}$$

The condition, deg $\lambda(x)$−deg $\nu(x)=\epsilon$ and deg $\lambda(x)$+deg $\nu(x)\leq\epsilon$, on the degree of the polynomial results in $0 \leq 2$ deg $\nu(x) \leq 0$, which establishes deg $\nu(x)=0$ as can be found. Namely, as $V(x)=1$ and $\Lambda(x)=\Psi(x)$ can be established, so $\Psi(x)$ can satisfy this condition. In this case, $\epsilon$ previously determined by $\Psi(x)$ derived from the syndrome, and $\epsilon=\deg \Psi(x)=\deg \Lambda(x)$ should be established. If it is established, all key conditions can be satisfied and accordingly $\Psi(x)$ can be used to obtain a solution. On the other hand, if it is not established, no error satisfies the key conditions, resulting in no solution.

This method corresponds to conversions, which collect the positions of all error code components into the set $J_+$, applied to errors. Another viewpoint indicates the presence of the possibility of error correction if conversions are executed such that the total sum of the converted errors reaches $\epsilon$.

The possibility referred above has two meanings. The first is associated with the requirement in which the positions of all error code components are collected in $J_+$, and the degree of $\Psi(x)$ derived from the syndrome is just equal to $\epsilon$. The second is associated with the requirement in which the error quantity can be obtained according to the computation even though $|S_0| \leq \epsilon$ is not satisfied. This condition is added, though, to exclude failed corrections.

The method of solution searching comprises substituting $\Lambda(x)=\Psi(x)$ and $V(x)=1$ to find a solution that satisfies the equation from the elements in Zp, and applying an inverse transformation to obtain a true error E from the obtained root and multiplicity.

Next, with respect to the syndrome converting method in accordance with the above principle, an effective condition on error searching is considered.

When a point in a true error code word actually indistinct is represented by $E=(e_1, e_2, \ldots, e_{p-1})$, in the syndrome converting method the process converts it to a point $^{<m>}E=(u(1)^{<m>}e_1, u(2)^{<m>}e_2, \ldots, u(n)^{<m>}e_{p-1})$ in a virtual error code word. Note that the component coordinates themselves are unchanged. In this case, the syndrome is represented as in Expression 18. In Expression 18, $j_i$ (i=1 to $\xi$) indicates the component coordinates of E different from zero where $j_1 < j_2 < \ldots < j_\xi$.

$$uS_{\langle m \rangle+0} = u\sum_{i=1}^{\xi}(j_i)^{\langle m \rangle}e_{j_i} = \varepsilon \qquad \text{[Expression 18]}$$

If $\xi \geq 2$ and $<m> \neq <m'>$, the conversions to the virtual errors are all independent. Because if there is an equal one, $u(j)^{<m>}=u'(j)^{<m'>}$ is required to establish over $\xi$ different j because $j_i$ is unchanged through the conversion. This means that Expression 19 shown below can establish over all $j_i$ and can establish only if $\xi=1$.

$$(j_i)^{\langle m \rangle}S_{\langle m' \rangle+0} = (j_i)^{\langle m' \rangle}S_{\langle m \rangle+0} \Rightarrow \qquad \text{[Expression 19]}$$

$$(j_i)^{\langle m \rangle}\sum_{i=1}^{\xi}(j_i)^{\langle m' \rangle}e_{j_i}$$

$$= (j_i)^{\langle m' \rangle}\sum_{i=1}^{\xi}(j_i)^{\langle m \rangle}e_{j_i}$$

Thus, according to the syndrome converting method, scanning <m> can configure polynomials of virtual error points different at every different <m>. The case of $\xi=1$ corresponds to one in which only the conversion of the syndrome multiplied by u is required to ready for virtual errors.

In addition, when paying attention to one virtual error component, for example, $u(j)^{<m>}e_j=(S_{<m>+0})^{-1}(j)^{<m>}e_j$ moves through all Zp components except zero under the following condition. In other words, when any one of <m> components fluctuates from 0 to p−2, then $$\{(j_i)^{\langle m \rangle}\}^{-1}S_{\langle m \rangle+0} = \qquad \text{[Expression 20]}$$

$$\sum_{k \neq i}^{\xi}\{(p-j_i^{-1})^{-1}(p-j_k^{-1})\}^{m_3}\{(p-j_i)^{-1}(p-j_k)\}^{m_2}$$

$$\{(j_i)^{-1}(j_k)\}^{m_1}e_{j_k} + e_{j_i}$$

it moves through Zp components 1 to p−1 except 0. Accordingly, the inverse element thereof $(S_{<m>+0})^{-1}(j)^{<m>}$ also takes all components except zero. In the end, as $u(j)^{<m>}e_j$ takes all components except zero once at least, the sufficient condition is to scan any one of <m> components from 0 to p−2.

In the syndrome converting method, the process introduces syndromes, (p−1) diagonal matrixes, and uses 0-th to (p−2)-th powers of these individuals to cause a virtual error. Therefore, the following description is given to the error that can be covered by the conversion to such the virtual error, and to the condition on the syndrome converting method.

When a point in a true error code word is given by $E=(e_1, e_2, \ldots, e_{p-1})$, a point in a virtual error code word in accordance with the syndrome converting method is given $^{<m>}E=\{u(1)^{<m>}e_1, u(2)^{<m>}e_2, \ldots, u(p-1)^{<m>}e_{p-1}\}$.

There are $\xi$ error component positions, which are represented by $j_i$ (i=1−$\xi$, $j_1 < j_2 < \ldots < j_\xi$) and replaced as in Expression 21.

$$uS_{\langle m \rangle+0} = u\sum_{i=1}^{\xi}(j_i)^{\langle m \rangle}e_{j_i} = \varepsilon, u(j_i)^{\langle m \rangle}e_{j_i} = \varepsilon_i \qquad \text{[Expression 21]}$$

In Expression 21, $\epsilon_i$ (i=1 to p−1) is considered a variable where the sum of $\epsilon_i$ to $\epsilon_{p-1}$ is fixed to $\epsilon$.

Therefore, the process computes the number in the case of $\xi$ components that make the sum equal to $\epsilon$.

As for ($\xi$−1) components, 1 to p−1 can be selected freely. The final $\xi$-th value can be selected for the sum of ($\xi$−1) such that the sum of $\xi$ components is made congruent with $\epsilon$. Accordingly, the number is equal to $(p-1)^{\xi-1}$ in the case of selection of the variable.

This result, however, also contains the case where the final selection is required to take 0. Accordingly, this case is excluded. If the number is equal to n($\xi$) when the sum is congruent with $\epsilon$ for $\xi$ pieces of 1 to p−1, it is required to exclude the case where the sum reaches $\epsilon$ before the final selection. Therefore, $n(\xi)=(p-1)^{\xi-1}-n(\xi-1)$ establishes, and thus n($\xi$) can be obtained as in Expression 22.

$\xi$:even $n(\xi)=\{(p-1)^\xi-1\}/p$ $\xi$:odd $n(\xi)=\{(p-1)^\xi+1\}/p$ $$\Rightarrow n(\xi)=\{(p-1)^\xi-(-1)^\xi\}/p \qquad \text{[Expression 22]}$$

When $\epsilon$ is divided into $\xi$ pieces, there is one having components all present between 0 and 2/p, that is, components belong only in $J_+$. If the number of conversions to different virtual errors is higher than the number in the case of n($\xi$) pieces, it is possible to make $J_+$ virtual errors. In this case, if the resultant true error can satisfy the condition on error correction of the Lee metric code, it is possible to find solutions through the syndrome converting method without misses.

Subsequently, the flow finds the number of different virtual errors that can be caused from the true error through the syndrome converting method. In the case described above, the degree of the vector <m> is equal to 3. Therefore, $<m>=<m_1, m_2, m_3>$ establishes, and in order to allow the divided components of $\epsilon$ to move all from 1 to p−1, the components are independently scanned from 0 to p−2. In the case of the current specific example, the number of conversions in the case of $<m> \neq <m'>$ is equal to $(p-1)^3$.

In comparison with the number n($\xi$) when the sum of $\xi$ free variables $\epsilon_i$ reaches $\epsilon$, $$n(\xi)=\{(p-1)^\xi-(-1)^\xi\}/p \leq (p-1)^3 \qquad \text{[Expression 23]}$$

is the scan condition without misses. Thus, $\xi=4$ can satisfy this condition, and the method using 3 diagonal matrixes is possible to execute searching up to $\xi=4$ without misses.

When j moves from 1 to p−1, an additional m-th power of the matrix that includes a diagonal matrix, that is, a function that moves through all Zp components 1 to p−1 except zero allows the number of conversions to increase at every (p−1)-fold similar to the above.

When ζ matrixes are aligned, the number of conversions reaches $(p-1)^\zeta$, which makes the condition without misses always be ξ=ζ+1.

In addition to the above used j, p−j, $p-j^{-1}$, examples of these functions include a in Zp but a≠1, 2, and $a^j$, $p-a^3$ of which a is the number other than a power of a certain number so that a sufficient number of conversions can be made. Therefore, an appropriate selection of a to make a diagonal matrix can extend the degree of <m> so that ξ can be set always larger by 1 than this degree. Therefore, even if the syndrome converting method is used over all the cases, where the correctable condition on the Lee metric code is satisfied, instead of using the Euclidean iterative method, it is possible to execute error searching without misses.

The number in the case of the conversion grows (p−1)-fold when ξ increases by 1, however, and accordingly the number of searches increases exponentially. Therefore, depending on the case, the use of the conventional Euclidean iterative method shortens the processing time than the syndrome converting method as can be considered. In this case, it is required to execute an optimal selection in accordance with the applied memory system. In particular, in the case of ε=1, 2 and so forth, the use of the syndrome converting method is more advantageous.

<Data Interface in p-adic NAND Flash Memory>

On the basis of the above, the following description is given to a specific example of the NAND flash memory that uses the syndrome converting method for error correction. Hereinafter, this NAND flash memory is referred to as the "p-adic NAND flash memory". In addition, if no special notice is given, a "memory system" refers to the p-adic NAND flash memory.

First, a comparison/consideration is performed to determine what kind of p-adic cell should be selected.

FIG. 1 is a table showing relations among the data storage efficiencies and so forth at every number of levels of p-adic cells in a memory system according to a first embodiment. The first column in the table shows evaluated items. The evaluated items are as follows.

L: The number of threshold level divisions of the p-adic cell.

p: A prime to be used.

h: A minimum number of bits required for binary representation of Zp.

ε: An overall quantity of Lee metrics of error-correctable errors.

M: A value determined by M=h(p−ε−3), which is the number of bits, that is, the quantity of binary data in a "Binary World" subject to batch processing by ECC.

The "Binary World" refers to an environment outside the memory system according to the present embodiment, for example, an IT instrument that handles data in binary.

δ: The number of digits of M as a $2^h$-adic number (δ=M/h).

M/(p−1): An index indicative of the number of binary bits that one p-adic cell can store.

Binary M bits are treated as a code word having (p−1) code components, which are stored in (p−1) p-adic cells.

p−1: The number of p-adic cells required for storing a code word of the Lee metric code.

$\log_2$ L: The number of bits that can be stored in a p-adic cell when the p-adic cell is made as a binary storing multi-level cell.

ε/(p−1): A proportion of the maximum number of correctable cells when c is used. Or a proportion of the maximum error level length correctable in one p-adic cell.

$\log_2$ L/{M/(p−1)}: A redundancy when a memory cell is used as a p-adic cell for storing ECC with the Lee metric code, and the memory cell is regarded as a binary multi-bit cell.

In the table dotted parts are ranges that can be considered practical from the viewpoint of the level of the p-adic cell and the redundancy to binary.

The following description is given to an example of the practical memory system in the case of L=17 and ε=4 shown in FIG. 1 with the star mark where 4 cells among 16 cells can be corrected.

This considers that the number of levels per cell in the practically used NAND flash memory is equal to 16 levels. When E increases by 1, the scale of processing through the syndrome converting method increases almost p-fold. Accordingly, if p=17 is used, the case of ε=2 shown in FIG. 1 with a double circle where 2 cells among 16 cells are correctable is considered practical for the present, though the case of ε=4 is picked up for convenience in understanding of the embodiment.

Subsequently, a NAND flash memory system is configured for the specific example in the case of L=17 and ε=4. Initially, the specification for the NAND flash memory system is shown. The specification herein shown provides a skeleton of the specification for the use of other p and ε. In this case, the values of the skeleton can be changed to the corresponding values in accordance with the values of p and ε.

The following is the specification for the p-adic NAND flash memory system.

(1) The configuration of the data interface is a ×8 1-byte configuration.

(2) It operates in sync with clocks.

(3) A sector contains 512 bytes as a data transfer unit.

(4) The unit of conversion processing from a binary to a p-adic number includes 50 bits. Hereinafter, the conversion processing from the 50-bit binary to the p-adic number is referred to as a "process". For the purpose of distinguishing it from other general terms, "process", it is expressed by "PROCESS". Therefore, a binary corresponding to 1 sector is converted to a p-adic number through 82 PROCESS.

(5) A page size is determined by 4 sectors (2048 bytes). A block size is not determined particularly though it has a size of 64 pages, for example, which depends on the configuration of the cell array.

(6) Each sector contained in a page can be accessed at random.

(7) A variety of modes are prepared as access methods in a sector. The access modes are roughly divided into two: a "fast mode" and a "random mode".

The fast mode: A mode in which accesses are made in order of addresses fixed in a sector. In writing, after a lapse of 10 cycles since the beginning of the sector access, a PROCESS starts for processing data in turn. In reading, after completion of 1 PROCESS, a sector access is allowed. In both writing and reading, a PROCESS to a sector and an access to the sector proceed at the same time.

The random mode: An access mode in which a burst length of access to a sector, the burst mode, and the top address of burst can be set.

For example, the burst length may include 4/8/16/32/256 bits and so forth, and the burst mode can be set in an interleave mode/wrap-around mode and so forth.

After completion of PROCESS to the data to be stored in a sector, an access to the sector is allowed.

At the time of writing, PROCESS starts after completion of data storage in the sector access.

In the random mode, an access and a process start after pieces of data to the sector are grouped. Therefore, the access and the PROCESS to the same sector cannot proceed at the same time.

The following description is given to an overview of the memory system capable of realizing the above specification skeleton. This system is a system that directly treats the numerals in Zp as data.

As describe above, the environment outside the memory system, for example, the IT instrument that handles data in binary is referred to as the "binary world". In contrast, containing a part that handles data in binary such as operational processing, an environment inside the p-adic NAND flash memory system that handles data in Zp is referred to as a "p-adic Zp world". In this case, the "binary world" can also be referred to as a "p-adic $Z_2$ world".

FIG. 2 is a conceptual view of the memory system. This memory system mainly comprises a "p-adic NAND cell" part operative to store data (codes), and a "Lee metric code & ECC" part operative to execute error processing at the time of executing write/read to the "p-adic NAND cell" part. These "p-adic NAND cell" part and "Lee metric code & ECC" part are parts that belong to the "p-adic Zp world".

The memory system further comprises, as interfaces between the "binary world" and the "p-adic Zp world", a "binary to p-adic" converter unit operative to convert binary data to Zp data, and a "p-adic to binary" converter unit operative to convert Zp data to binary data.

As the outside of the memory system is the "binary world", the "binary to p-adic" converter unit receives binary data from the "binary world" and processes it at every 50 bits. Thereafter, the data is stored in p-adic cells, and further provided to external at every 50 bits by the "p-adic to binary" converter unit.

ECC to the data stored in the "p-adic NAND cell" part can be executed easily by applying a Lee metric code to Zp. The present memory system is also possible to execute ECC processing because it comprises the "Lee metric code & ECC" part.

As the memory system comprises the "binary to p-adic" part and the "p-adic to binary" converter unit, users can handle the memory system just as the "binary world" without having consciousness about the "p-adic Zp world" inside the memory system.

Data write and read to the "p-adic NAND cell" part is handled directly with relating the threshold levels to the elements in Zp. There are two such relating methods.

The first is a method in which interfaces are used to deal data write and read to conventionally NAND-connected multi-level cells (hereinafter referred to as "NAND MLC"). It is required to once convert the Zp level (1 to p−1) stored in MLC to page information and so forth of NAND MLC. Therefore, a part, which mediates between the NAND MLC and a peripheral circuit "p-adic Zp world", is required to have a logic part. In the case of this method, information on Zp stored in MLC spans over page information of plural NAND MLCs and accordingly data transfer needs a longer time.

The second is a method in which a Zp level is directly written as a physical level in a p-adic cell. This method can make data write/read processing faster than the first method.

The present embodiment applies the second method.

The following description is given to data transfer suitable for the above-described memory system specification, and to an interface circuit for making the match with internal p-adic cells.

In the case of the memory system according to the present embodiment, all the results on data processing show up on page registers contained in pages. The p-adic cells communicate data with the page registers. Therefore, how to configure the page registers is the key to the data transfer specification.

At the start, the data interface specification is confirmed once again.

(1) The I/O transfer rate of the memory system is 1 byte/cycle. In a word, the transfer unit is 1 byte.

(2) 50 bits of binary data are converted as a processing unit to a Lee metric code.

(3) 1 sector includes 512 bytes. Therefore, 512 cycles are required to transfer 1 sector of binary data.

(4) 82 PROCESS are required to convert 1 sector of binary data to a Lee metric code. Binary data that can be processed by 82 PROCESS includes 82×50=4100 bits. Therefore, it is required to process 1 sector plus 4 bits.

(5) When binary data is converted to p-adic data, there is an increase to 55 bits per 50 bits. Therefore, 1 sector requires registers corresponding to 82×55=4510 bits.

(6) If binary data is converted to a Lee metric code through the conversion to p-adic data, there is an increase to 80 bits per 50 bits. Therefore, 1 sector requires registers corresponding to 82×80=6560 bits (820 bytes).

In consideration of the above (2), the subsequent description is given to a register configuration that allows data processing at every 50 bits to be executed efficiently.

Data is transferred at a rate of 1 byte/cycle in accordance with the above (1). Therefore, transfer of 50-bit binary data requires 7 cycles at the minimum. When 50-bit binary data is converted to a Lee metric code, there is an increase in size to 80 bits in accordance with the above (6).

Here, 50 bits can be represented by 5×10 bits, and 80 bits by 8×10 bits. Therefore, the memory system according to the present embodiment configures (10×8) register blocks with plural byte-unit registers to execute data processing using the registers thus configured. Thus, it is possible to realize an optimal register configuration and data processing in the memory system. The (10×8) register blocks are described later.

Subsequently, a flow of data processing is described with reference to FIG. 3.

The transfer of 50-bit binary data to 1 register block is executed in 10 cycles.

Therefore, if the address order of data transfer has been determined, processing of 1 PROCESS is made enable at every 10 cycles. In PROCESS, however, pieces of data are merged at every I/O and processed. Accordingly, if an I/O is masked and invalidated, the I/O is processed as it holds fixed data.

On the other hand, if the address order of data transfer is at random, it is not possible to determine which part of the registers contained in a sector the data is transferred. Accordingly, on receipt of a command indicative of completion of 1-sector data transfer, the flow decides that preparation of processing-target data is completed, and starts PROCESS.

The PROCESS is treated by regarding (10×8) register blocks as the later-described "D-r" register and utilizing overwrite to the "D-r" register.

Figure 3:
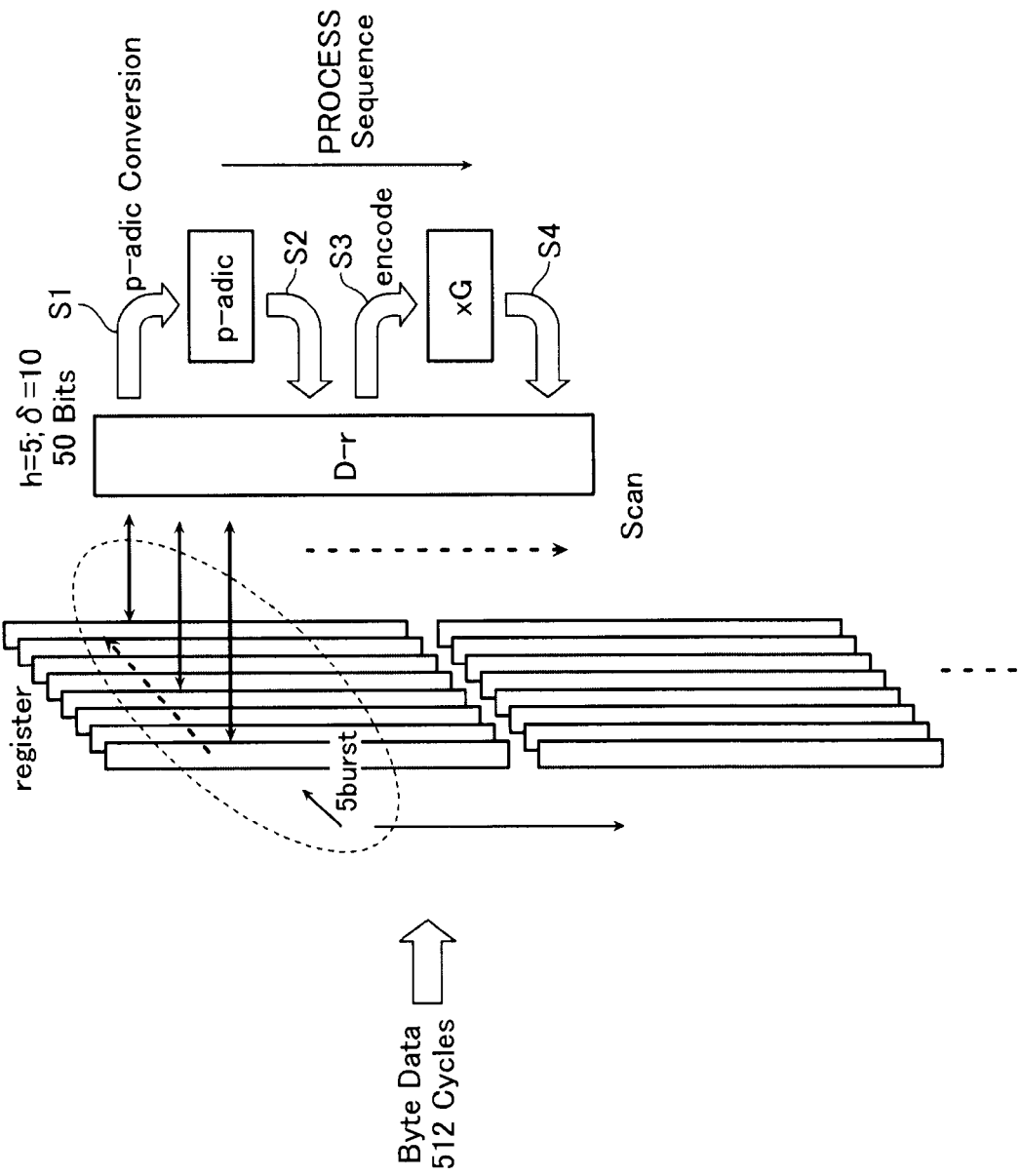
FIG. 3 is a diagram illustrative of the outline of a data interface in the memory system according to the present embodiment.

At the start, processing-target data stored in the "D-r" register is regarded as h=5, δ=10 binary data (first data) and converted to a p-adic number (second data) (S1 in FIG. 3). Subsequently, the data converted to the p-adic number is overwritten in the "D-r" register (S2 in FIG. 3). Subsequently, the p-adic data stored in the "D-r" register is multiplied by a generator matrix G to convert it to a Lee metric code (third data) (S3 in FIG. 3). Finally, the Lee metric code is overwritten in the "D-r" register (S4 in FIG. 3).

Thus, binary data corresponding to 1 PROCESS stored in the registers in a (10×8) or 80-bit register block serving as the "D-r" register is converted to the Lee metric code, then overwritten in the same register block and stored therein.

The repetition of the above PROCESS sequence can treat 512 bytes of sector data in 82 PROCESS. The quantity of data that can be treated in 82 PROCESS is equal to 512 bytes plus 4 bits. Accordingly, 4 fixed dummy bits are added for processing.

The following description is given to the relation between the configuration of register blocks and the burst data transfer.

Figure 4:
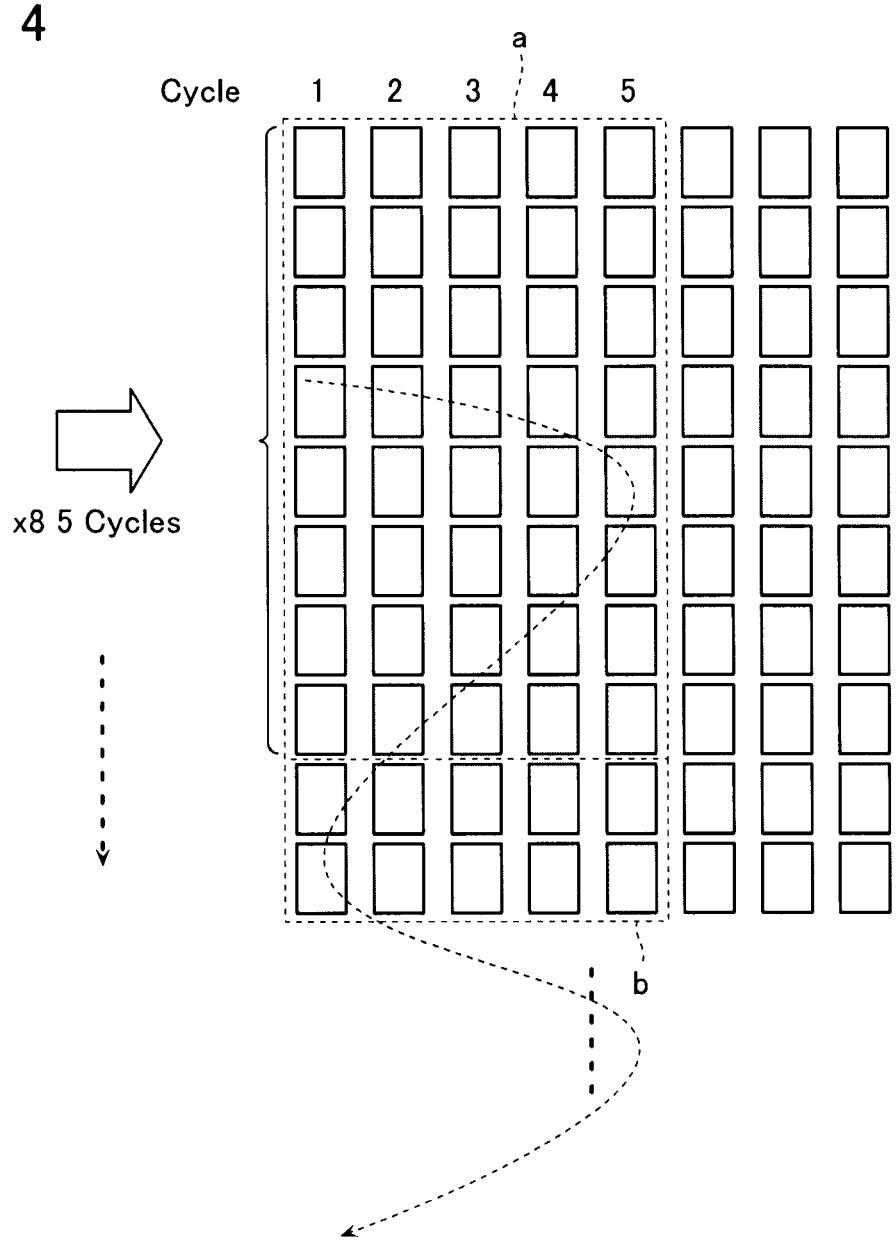
FIG. 4 is a diagram illustrative of the procedure of data transfer in the memory system according to the present embodiment.

FIG. 4 is a diagram showing a first register block contained in a sector register.

One register block includes 80 bit registers, in which a (8×5) register group shown with a in FIG. 4 holds pieces of data transferred in No. 1-5 cycles.

Pieces of data transferred in No. 6-10 cycles are held in another register group shown with b in FIG. 4, which is located beneath and in parallel with the (8×5) register group. A part of the data transferred in No. 6-10 cycles is contained in part of data corresponding to 1 PROCESS held in the first register block shown in FIG. 4 and the other is contained in part of data corresponding to 1 PROCESS held in the next register block.

Transfer scanning of input byte data advances wave-like as shown with the dashed line in FIG. 4. In a word, the data transferred in first 10 cycles decides data in the first register block. Thereafter, data processing is allowed.

Pieces of byte data transferred over cycles are merged on processing. Accordingly, the number of cycles used at every bit of byte data differs from one another as can be found. In the case of FIG. 4, the first 2 bits of byte data form 10-cycle data and the remaining 6 bits form 5-cycle data.

Next, the process of data processing in the sector register at the time of data write is described with reference to FIG. 5.

Figure 5:
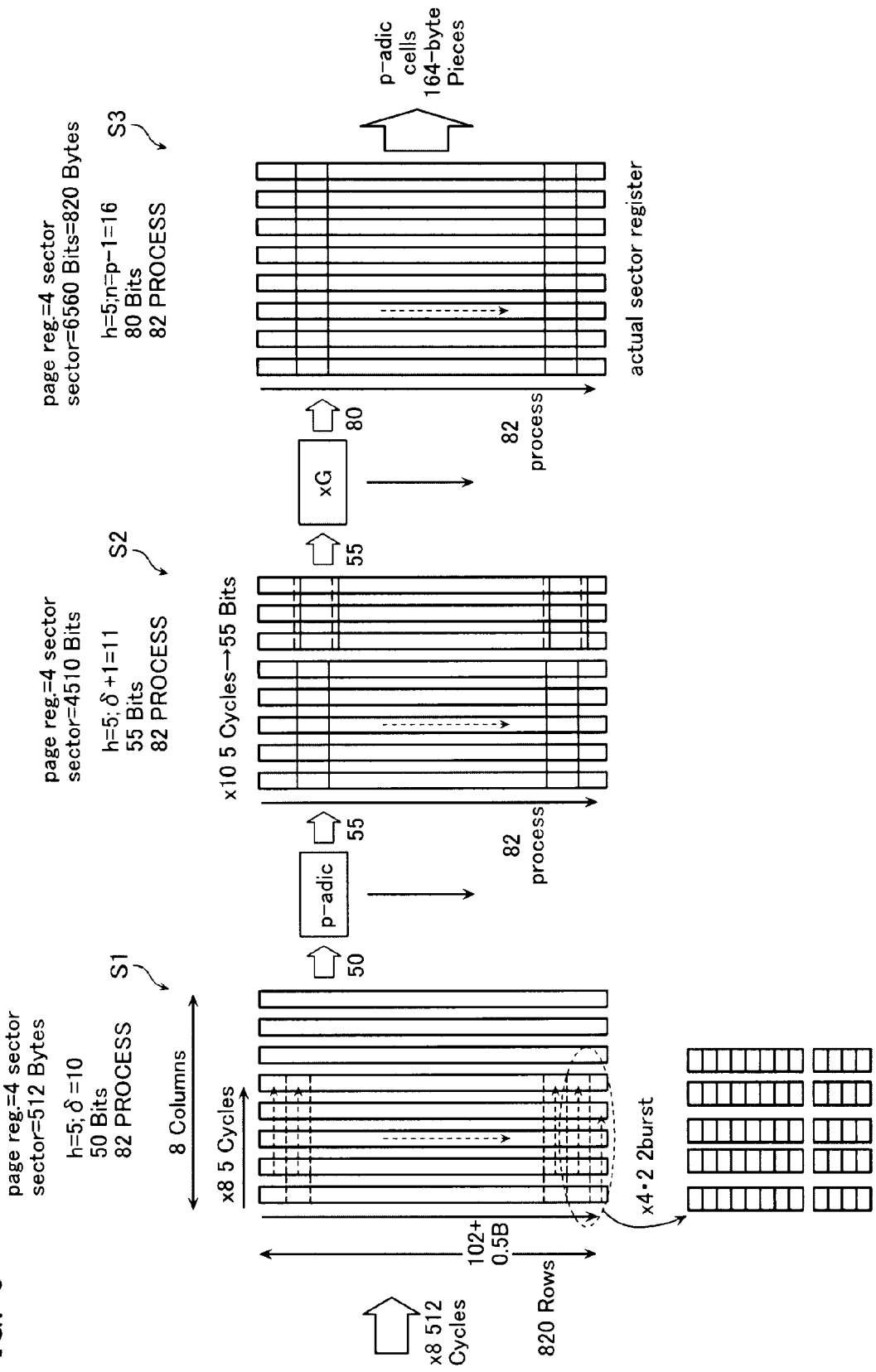
FIG. 5 is a diagram illustrative of write processing at every sector in the memory system according to the present embodiment.

FIG. 5 shows, sequentially from the left, the state of a sector register on burst transfer of binary data (S1 in FIG. 5), the state of a sector register after the p-adic conversion (S2 in FIG. 5), and the state of a sector register after the Lee metric code conversion (S3 in FIG. 5). The dashed line in FIG. 5 indicates the boundary of a byte register at every 8 bits.

The sector register is configured to include 820 registers aligned in 8 columns and has a receiving portion of 820 rows for 102.5-byte data transfer. Of 8 columns, No. 1-5 columns are used in data transfer and the remaining No. 6-8 columns are used in holding the target data after data transfer.

At S1 in FIG. 5, binary data corresponding to 1 PROCESS is transferred to the register block in 512 cycles. At the start, of the binary data transferred in 512 cycles, pieces of binary data transferred in the first No. 1-510 cycles are stored in the byte registers on No. 1-5 columns in order at every 5 cycles. At the time of completion of storing binary data transferred in No. 510 cycle, registers on No. 1-816 rows of 820 rows are filled with data.

Pieces of data transferred in subsequent No. 511, 512 cycles are divided into 4 bits each and held in registers on No. 817-820 rows, No. 1-4 columns as shown in the S1 lower figure of FIG. 5. The registers on No. 817-820 rows, No. 5 column are used to store 4 bits of fixed dummy data.

Thus, the sector register can store 50-bit binary data corresponding to h=5, δ=10 of a 10-digit, $2^5$-adic number, by 82 PROCESS.

At S2 in FIG. 5, 50-bit binary data is converted to an 11-digit, p-adic number (p=17), that is, 55-bit data and overwritten in the sector register. This PROCESS is executed at every 10 register rows. The converted p-adic data is stored over 55 bits of each 10-row, 8-column register block. The sector register includes 820-row, 8-column registers such that data is overwritten at every 10 rows by 1 PROCESS. Therefore, all sector registers are filled with p-adic data in 82 PROCESS.

Thus, S1 and S2 in FIG. 5 complete the conversion of binary data to p-adic data in 1 sector.

At S3 in FIG. 5, p-adic data is converted to a Lee metric code.

The Lee metric code is data having components that are equal to (p−1) (=16) elements in Zp. A Lee metric code by 1 PROCESS is 80-bit data resulted from 5-bit, p-adic data multiplied by a G matrix. The Lee metric code by 1 PROCESS is overwritten and stored in one 10-row, 8-column register block. In this case, 1 sector register is entirely filled with the Lee metric code in 82 PROCESS. Thus, the sector register can hold pieces of data to be written in 164-byte pieces of p-adic cells.

Thus, processing in 3 stages shown at S1-S3 in FIG. 5 sequentially advances at every 10-row, 8-column register block.

The data transfer to the sector register is executed in the fast mode and in the random mode as described earlier. In the case of the fast mode, pieces of transferred binary data are filled in the sector register in turn from the top. Therefore, in the fast mode, when pieces of binary data by 1 PROCESS are stored in the 10-row, 8-column register block, PROCESS can be executed sequentially in serial.

On the other hand, in the random mode, it is possible to designate the top address at every burst length to set a data storage location and also possible to select 2 addressing modes: interleave, and wrap-around. In this case, no-data stored areas exist at intervals in the register block. Therefore, in the random mode, it is required to wait a command indicative of completion of binary data storage to the sector register to exert control over starting PROCESS and so forth.

Thus, in the memory system according to the present embodiment, data is overwritten in the sector register twice at the time of conversion of binary data (first data) to p-adic data (second data) and at the time of conversion of the p-adic data (second data) to a Lee metric code (third data).

By the way, in the case of the conventional memory system, there is no processing corresponding to the conversion of binary data to p-adic data, and binary data is directly converted to a code using Reed-Solomon and so forth. Accordingly, overwrite to a register is executed once at the most.

Next, the process of data processing in the sector register at the time of data read is described with reference to FIG. 6.

Figure 6:
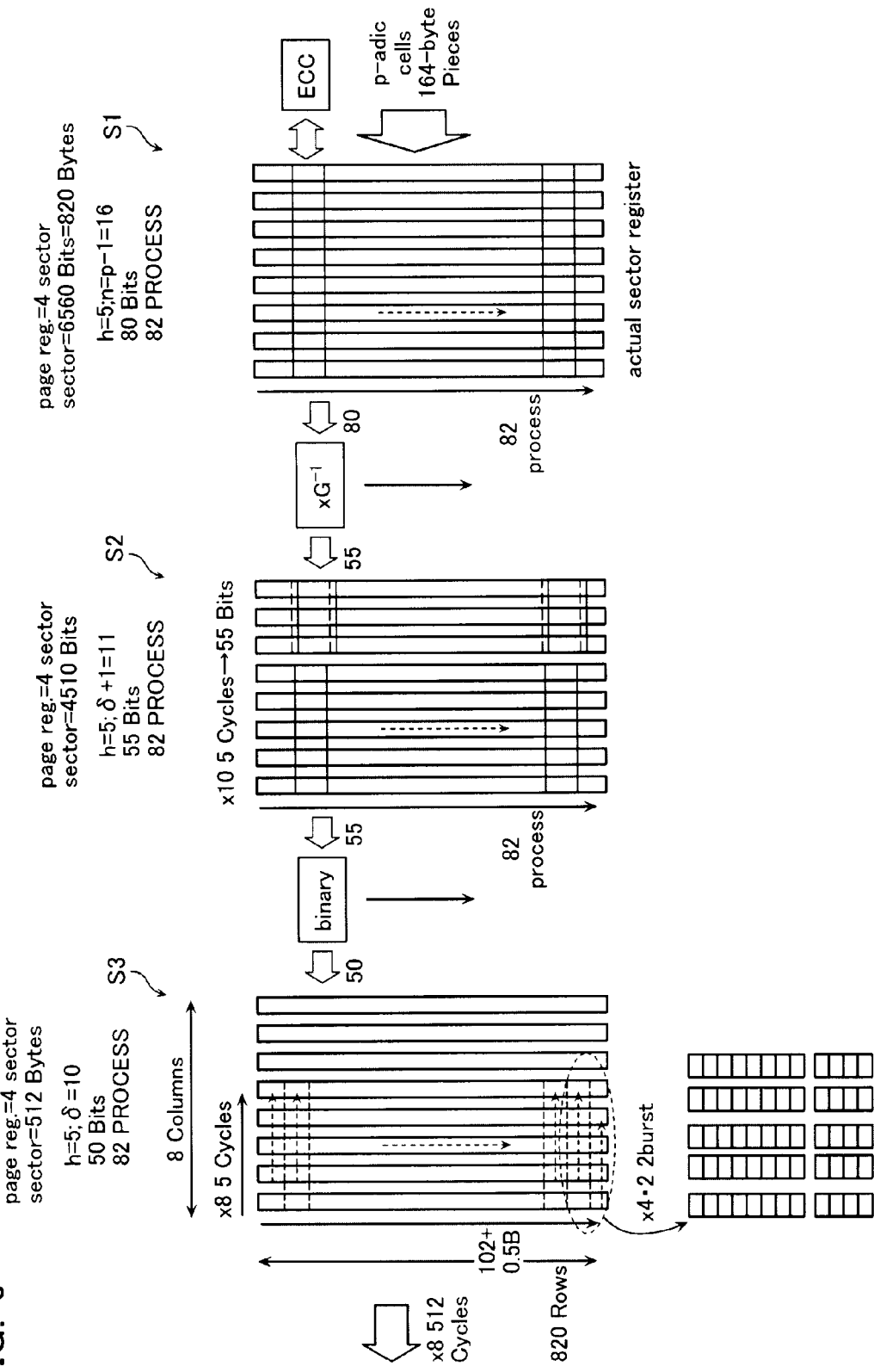
FIG. 6 is a diagram illustrative of read processing at every sector in the memory system according to the present embodiment.

At S1 in FIG. 6, pieces of data stored in 164-byte pieces of p-adic cells in the p-adic cell array are read out to 820-byte pieces of sector registers corresponding to 82 PROCESS.

The pieces of data stored in the sector registers are subject to computation processing by ECC, at every data corresponding to 1 PROCESS stored in a 10-row, 8-column register block, beginning from the sector register end, then error-corrected if enable, and left as it is if unable. Then, 82 PROCESS can be applied to complete ECC processing over all data in 1 sector to restore the Lee metric code.

At S2 in FIG. 6, the Lee metric code restored at S1 in FIG. 6 is converted to p-adic data sequentially. Here, the Lee metric code corresponding to 1 sector is subject to inverse transformation with a generator matrix G at every 80 bits corresponding to 1 PROCESS such that it is converted to a 5-bit, 11-digit, p-adic number and then overwritten in each register block.

At S3 in FIG. 6, the p-adic number generated at S2 in FIG. 6 is converted to a $2^5$-adic number, that is, binary data. The "p-adic to binary" part converts p-adic data corresponding to 1 PROCESS to 5-bit, 10-digit, 50-bit binary data and then overwrite the binary data at every 10-row, 8-column register block.

Thereafter, the binary data is read out at every 8-row, 5-column register group in column order at a rate of 1 byte/cycle and provided as data corresponding to 1 sector. With respect to data read from the sector register at the last 2 cycles, 4-bit, 2-column binary data is read out as byte data in 1 cycle, similar to data write, as shown in the lower figure at S3 in FIG. 6.

In the fast access mode, data is read out from the top of the sector register. Accordingly, data in the sector register can be read out sequentially with the latency of 1-PROCESS processing. On the other hand, in the random mode, the top of burst in the sector has not been known previously. Accordingly, after completion of 82 PROCESS when binary data corresponding to 1 sector is reproduced in the sector register, a first access is allowed.

Thus, in the memory system according to the present embodiment, data is overwritten in the sector register twice at the time of conversion of a Lee metric code (third data) to p-adic data (second data) executed after ECC processing and at the time of conversion of the p-adic data (second data) to binary data (first data).

By the way, in the case of the conventional memory system, there is no processing corresponding to the conversion of the Lee metric code to p-adic data. Accordingly, overwrite to a register is executed once at the most.

<Assignment of Elements in Zp to p-adic Cell>

The following description is given to an assignment of elements in Zp to p-adic cell levels, which is optimal for storing each code $c_j$ of a Lee metric code $C=(c_1, c_2, \ldots, c_{16})$ in a p-adic cell.

Figure 7:
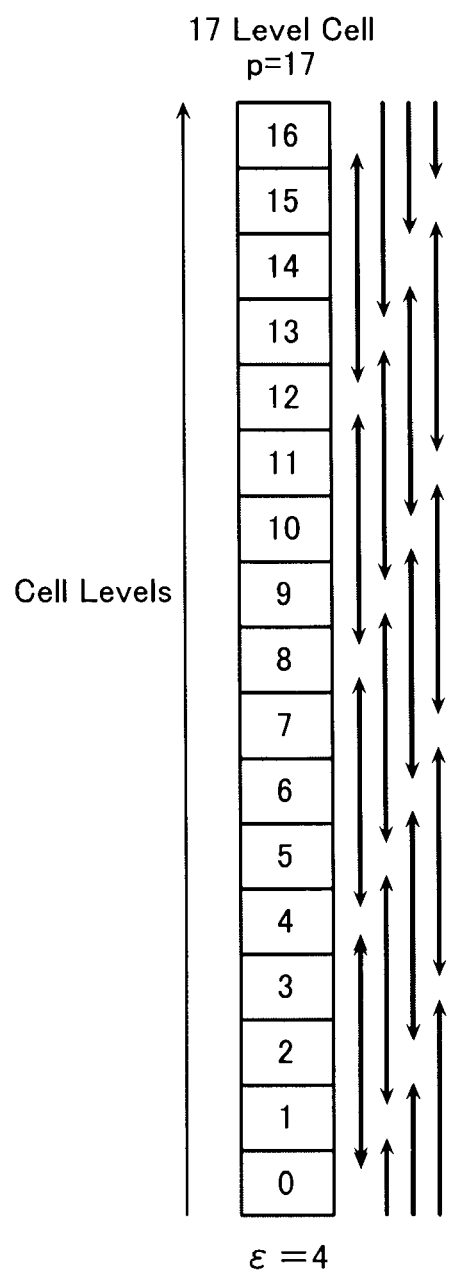
FIG. 7 is a diagram illustrative of assigning numerals in a finite field Zp (p=17) to p-adic cells in the memory system according to the present embodiment.

In the present embodiment, as shown in FIG. 7, elements in Zp are assigned continuously, beginning from the lowermost level of the p-adic cell, as $0, 1, \ldots, 16$. In this case, the error quantity is proportional to the quantity of level variation.

In the case of p=17, the number of levels required for a p-adic cell is equal to 17, and the number of boundaries (thresholds) between these 17-stage levels is equal to 16.

In the case of c=4, if an error arises only in 1 cell, error correction is possible on failed identification of a level within a range shown with a bold arrow in FIG. 7. The error, however, arises mainly due to failed identification within a range of adjacent levels.

In a word, the memory system according to the present embodiment is possible to have a strong error correcting ability to realize error correction of 4 cells among 16 cells substantially in accordance with the assignment way shown in FIG. 7.

<Data Read/Write>

An example of a method of data write/read to the p-adic cell array is described next with reference to FIG. 8. The herein-called "p-adic cell array" means a cell array including plural p-adic cells NAND-connected, using a floating gate transistor as each p-adic cell.

Figure 8:
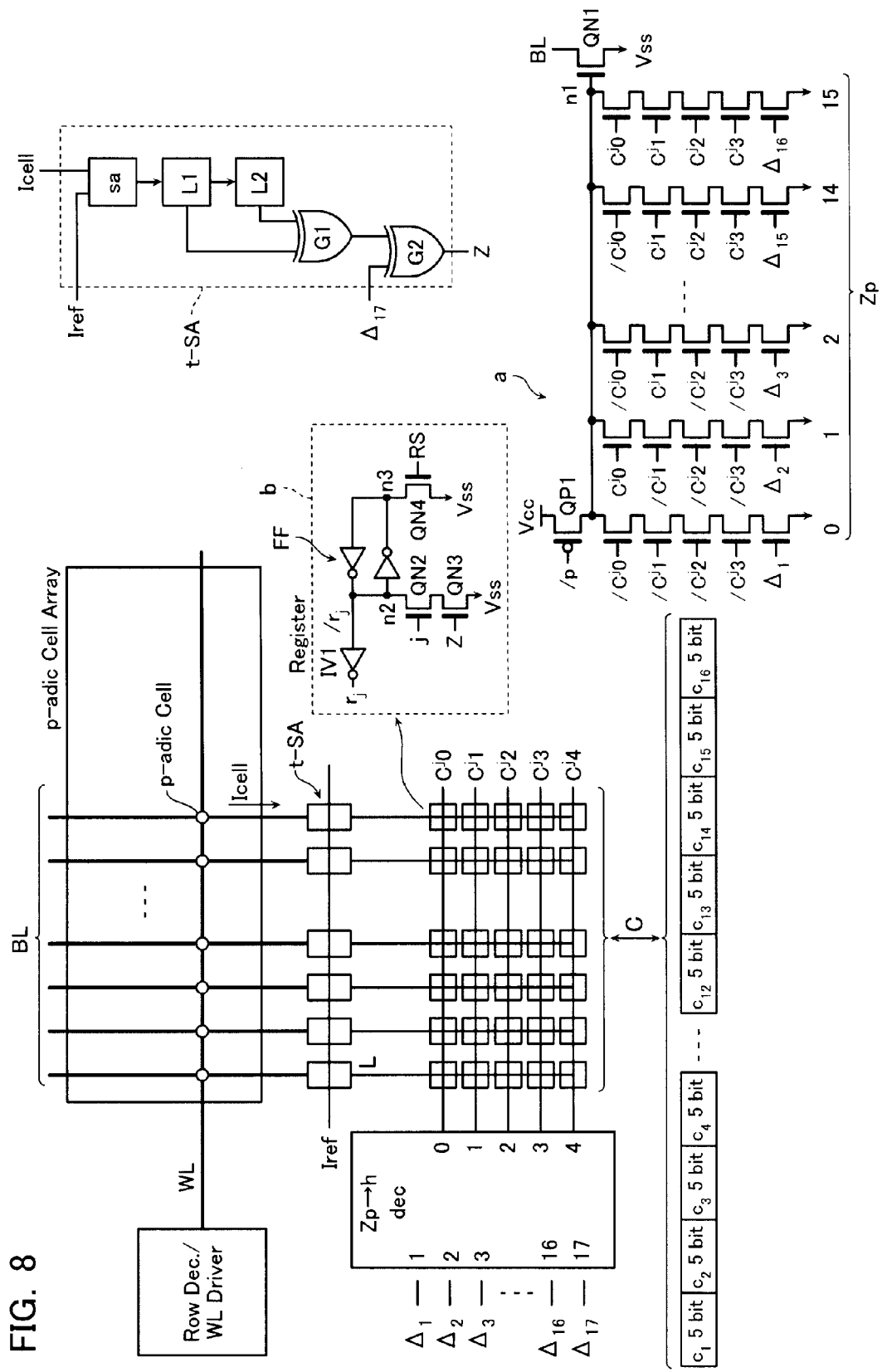
FIG. 8 is a diagram illustrative of write/read methods in the memory system according to the present embodiment.

Previously, the meanings of symbols shown in FIG. 8 are described.

In the case of p=17, the Lee metric code has 16 code components. These codes are denoted with $c_1$-$c_{16}$. Each code c can be represented by a 5-bit binary h. The bits from the least significant bit through the most significant bit of the binary h are denoted with $C^j0$-$C^j4$.

At the time of data write/read, a write voltage/read voltage supplied from a row decoder/word-line driver (Row Dec/WLDriver) serving as part of a data write unit or a data read unit changes the level on a word line WL in 17 stages. At this time, the signals indicative of the levels on the word line WL are denoted with $\Delta_1$-$\Delta_{17}$. In addition, the inversion of a bit X is represented by '/X' with additional '/'.

At the start, data write to the p-adic cell is described.

The threshold of a NAND cell serving as the p-adic cell is set in accordance with the quantity of electrons injected into the floating gate while a certain voltage is applied between the word line WL and the bit line BL.

At the time of data write, the potential on the word line WL elevates in 16 stages. On the other hand, the bit line BL is connected to a certain power supply Vss. When the p-adic cell changes to have a desired threshold, it shifts to the floating state isolated from the certain voltage Vss. Thus, no voltage is applied to the floating gate such that injection of extra electrons into the floating gate can be prevented.

The present embodiment uses this method to set thresholds in batch over p-adic cells corresponding to the components contained in the code. The code components $c_1$-$c_{16}$ correspond to elements in Zp and accordingly they are expressed in binary. As for the thresholds serving as levels of the p-adic cell, the lowermost threshold is assigned with the element 0 in Zp, and then the elements in Zp are assigned in ascending order from lowest. The upper limit of a threshold division corresponding to each level L of Zp is denoted with L, the level on the word line WL for injecting electrons by the quantity corresponding to the threshold is denoted with $WV_L$, and the signal for generating the word line level $WV_L$ is denoted with $\Delta_L$.

If the erased state of the p-adic cell is assumed to have a threshold in the lowermost state, it is not required to change the threshold of the p-adic cell targeted to write the component 0 in Zp therein though it is required to change the threshold of the p-adic cell targeted to write another component in Zp therein.

Therefore, in order to change the threshold of the p-adic cell, the present embodiment elevates the voltage on the word line WL sequentially from lowest to inject electrons into the floating gate. At that time, if the voltage on the word line WL exceeds the voltage corresponding to the threshold to be set in the p-adic cell, the bit line BL connected to that p-adic cell is brought into the floating state, as described above, to prevent extra electron injections. This control is executed in a program setting circuit shown with a in FIG. 8.

The program setting circuit includes an NMOS transistor QN1 for connecting the bit line BL to the voltage Vss. The gate of the transistor QN1 is connected to a constant voltage Vcc via a PMOS transistor QP1 controlled by the later-described control signal /p. The gate of the transistor QN1 is also connected to the voltage Vss via 16 paths, aligned in parallel, corresponding to the elements in Zp. These 16 paths each include a circuit of 5 serially connected NMOS transistors. Each path can conduct if /$C^j0\square$/$C^j1\square$/$C^j2\square$/$C^j3\square\Delta_1$, /$C^j0\square$/$C^j1\square$/$C^j2\square$/$C^j3\square\Delta_2$, $\ldots$, /$C^j0\square$/$C^j1\square$/$C^j2\square$/$C^j3\square\Delta_{16}$.

On data write, the word line level varies from $WV_0$ to $WV_{16}$. At that time, the program setting circuit exerts control, in accordance with the word line level, so that the bit line BL can be connected to the voltage Vss or isolated from the voltage Vss and brought into the floating state.

Namely, when the word line level is at $WV_L$, that is, when the signal $\Delta_L$ is made activate, the circuit isolates the bit line BL connected to the p-adic cell to be set at L−1 from the voltage Vss. Thus, the threshold of that p-adic cell is set in the division of L−1. Isolation of the bit line BL from the voltage Vss is controlled by the transistor QN1. The node n1 on the gate of the transistor QN1 is initially precharged via the transistor QP1 that is controlled by the signal /p. The result from decoding with bits of information $C^j0$-$C^j3$ representative of the code components and the signals $\Delta_1$-$\Delta_{16}$ indicative of the word line levels are used to discharge the node n1, thereby turning off the transistor QN1 to bring the bit line BL in the floating state. As for the p-adic cell targeted to write the element 16 in Zp therein, it is not required to discharge the node n1 but just required to decode the elements 0-15 in Zp using 4 bits of information $C^j0$-$C^j3$.

The program setting circuit may be provided at every bit line BL connected to p-adic cells belonging to the same word line WL and corresponding to components of different codes. In this case, the p-adic cell can be set at the threshold level corresponding to Zp of the code component by sequentially elevating the voltage on the word line WL.

For the purpose of setting an accurate threshold level to the p-adic cell, an operation of verify read may be introduced to verify the state of the threshold of the p-adic cell when the word line level varies.

Subsequently, data read from the p-adic cell is described.

At the time of data read, the level of a p-adic cell is sensed from the current Icell flowing in the p-adic cell. This operation is executed at a sense amp unit t-SA provided on the end of the bit line BL.

The sense amp unit t-SA includes a sense amp sa operative to compare the reference current Iref with the cell current Icell; a latch L1 operative to hold the latest comparison result from the sense amp sa; a latch L2 operative to hold the previous comparison result from the sense amp sa; an XOR gate G1 operative to detect a variation in comparison result from the results held in the latches L1 and L2; and an XOR gate G2 operative to detect if the p-adic cell changes to the threshold corresponding to 16 in Zp. The output from the XOR gate G2 provides the output from the sense amp sa.

The reference current Iref is set to a current slightly larger than the cell current when the upper limit of the division of the threshold level and the voltage on the word line WL corresponding to the threshold level are applied to the p-adic cell.

In the sense amp unit t-SA the sense amp sa compares the reference current Iref with the cell current Icell and outputs '1' to the latch L1 if the cell current Icell is larger. The voltage on the word line WL is sequentially varied within a range of $WV_1$-$WV_{16}$ and, only if the word line level is at '0' on $WV_L$ and at '1' on $WV_{L+1}$, the threshold level of the p-adic cell belongs to the division L. In this case, the p-adic cell holds the element L in Zp.

The comparison result from the sense amp sa is transferred to 2 latches L1 and L2 in turn. If the contents of these latches L1 and L2 are different from each other, the output from the sense amp unit t-SA provides Z='1'. This makes it possible to determine the state of the threshold written in the p-adic cell from the word line level $WV_L$.

If Z='1' has been established already when the word line level is at $WV_1$, it is required to determine if the threshold of the p-adic cell belongs to the division 0 or lower. If Z='0' when the word line level is at $WV_{16}$, it is required to determine if the threshold of the p-adic cell belongs to the division 16 or higher. Therefore, for the purpose of enabling these decisions, the initial states of the latches L1, L2 are set at '0', and a signal $\Delta_{17}$ is generated after the signal $\Delta_{16}$. Thus, it is possible to decide that the threshold level of the p-adic cell is at L−1 from the signal $\Delta_L$ when the output from the sense amp unit t-SA provides Z='1'.

The following description is given to the 5-bit register hanging from each bit line BL and operative to hold $C^j0$-$C^j4$.

The register has a circuit as b in FIG. 8 at every bit. In a word, the register includes, at every bit, a flip-flop FF composed of 2 inverters; an inverter IV1 having an input connected to a node n2 on one end of the flip-flop FF; 2 serially connected NMOS transistors QN2, QN3 for discharging the voltage on the node n2; and a transistor QN4 for discharging a node n3 on the other end of the flip-flop FF. This configuration provides the node n2 with /$r_j$, and the output from the inverter IV1 with $r_j$. The node n2 is connected to the voltage Vss if j□Z='1', and the node n3 is connected to the voltage Vss if RS='1'.

A "Zp→h dec" circuit block shown in FIG. 8 is a decoder operative to convert the signals $\Delta_1$-$\Delta_{17}$ to 5-bit representations of 0-16.

The register shown with b in FIG. 8 is arranged on each point of intersection of lines of the binary signals $C^j0$-$C^j4$ output from the "Zp→h dec" circuit block and lines of the outputs Z from the sense amp unit t-SA. Thus, the outputs Z from the sense amp unit t-SA can be held in 5 registers. In this case, the data held in these 5 registers can be utilized as binary representations of code components c.

These registers may also be utilized to exert control on data write/read. For example, if these registers are used, at the time of data write, to store binary representations of components of the code to be set, they can be utilized for control such that the program setting circuit executes verify and brings the bit line BL in the floating state.

The subsequent description is given to setting of the write voltage/read voltage supplied from the row decoder/word-line driver to the word line WL.

With respect to all p-adic cells to be accessed at the same time, the levels of the p-adic cells are assigned with the values of codes at the same time. Accordingly, it is required to scan all the voltages $WV_0$-$WV_{16}$ over the word line WL.

Figure 9:
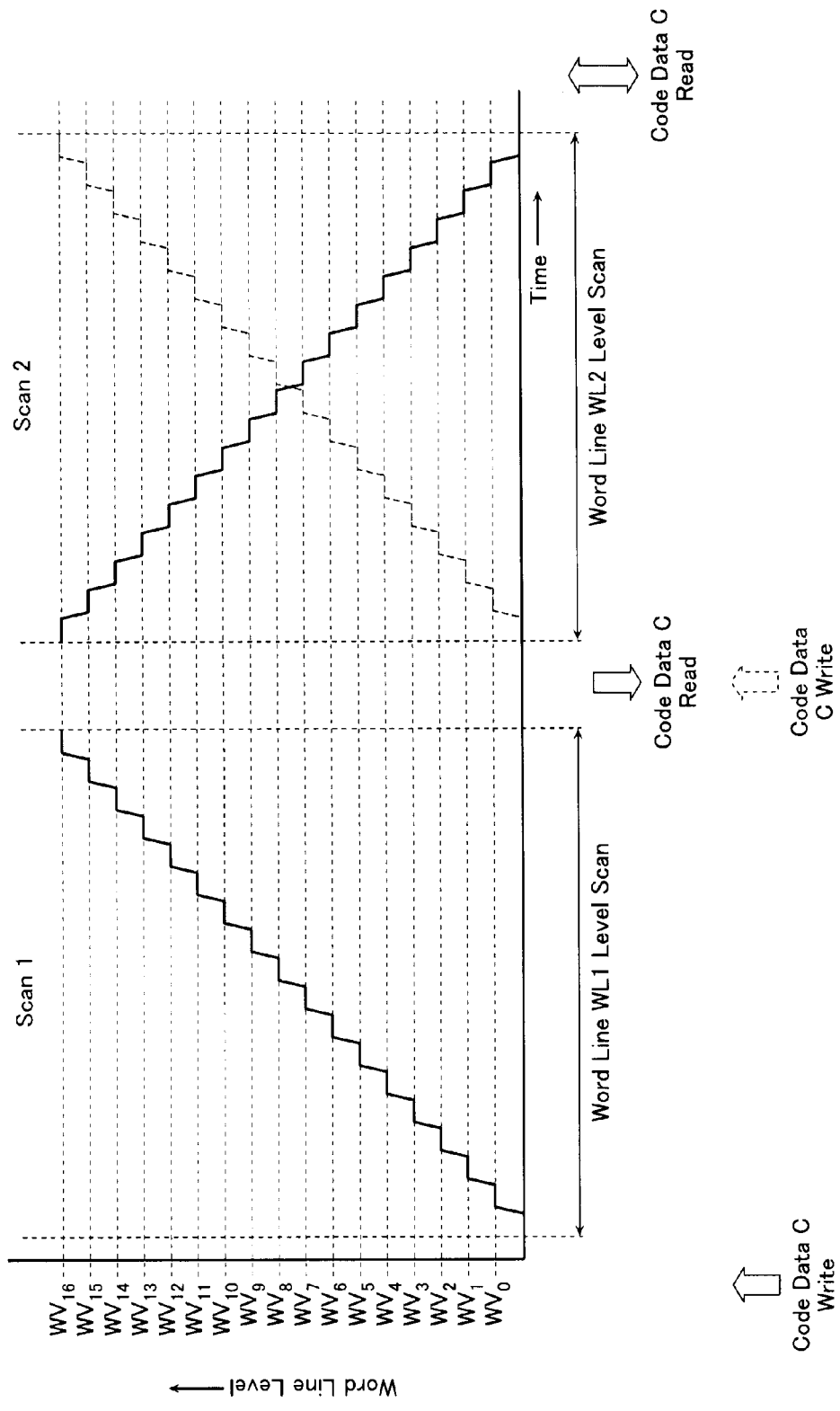
FIG. 9 is a diagram illustrative of word-line level conversion and data transfer timing at the time of write/read in the memory system according to the present embodiment.

FIG. 9 shows an example of sequential upward and downward scan of the voltage on the word line WL.

In data write (Write), there is no changing method other than one in which the flow elevates the threshold of the p-adic cell in order. Accordingly, the word line voltage is changed from the lower voltage side to the higher voltage side. On the other side, in data read (Read), it is sufficient to shift all levels within the scan as described above.

In the case of FIG. 9, the word line level rises from $WV_0$ to $WV_{16}$ in scan 1. Accordingly, the code data C is set in the register prior to the rise such that data write can be executed. In the case of data read, data read can be executed at the time of completion of scan 1 because the code data is decided.

If data write is executed after completion of scan 1, it is required to return the word line voltage to WV0 again and elevate it to WV16 sequentially as shown with the dotted line in scan 2. On the other hand, in the case of data read, the word line voltage may be elevated sequentially as shown with the dotted line in scan 2 or dropped sequentially subsequent to scan 1 as shown with the solid line. As the code data is decided at the time of completion of scan 2, data read can be executed similarly to the time of completion of scan 1.

If scan 1 and scan 2 are applied to access all p-adic cells belonging to the word lines WL, it is required to select different word lines WL in these scan 1 and scan 2. If p-adic cells belonging to the same word line WL are subject to serial read, for example, if the sense amp unit t-SA is shared among plural bit lines BL, it is also possible to select the same word line WL in scan 1 and scan 2.

<Conversion from Binary Data to 17-Adic Number>

The following description is given to a binary/p-adic number (17-adic number) converter circuit required at the entrance and the exit of the memory system according to the present embodiment.

Figure 10:
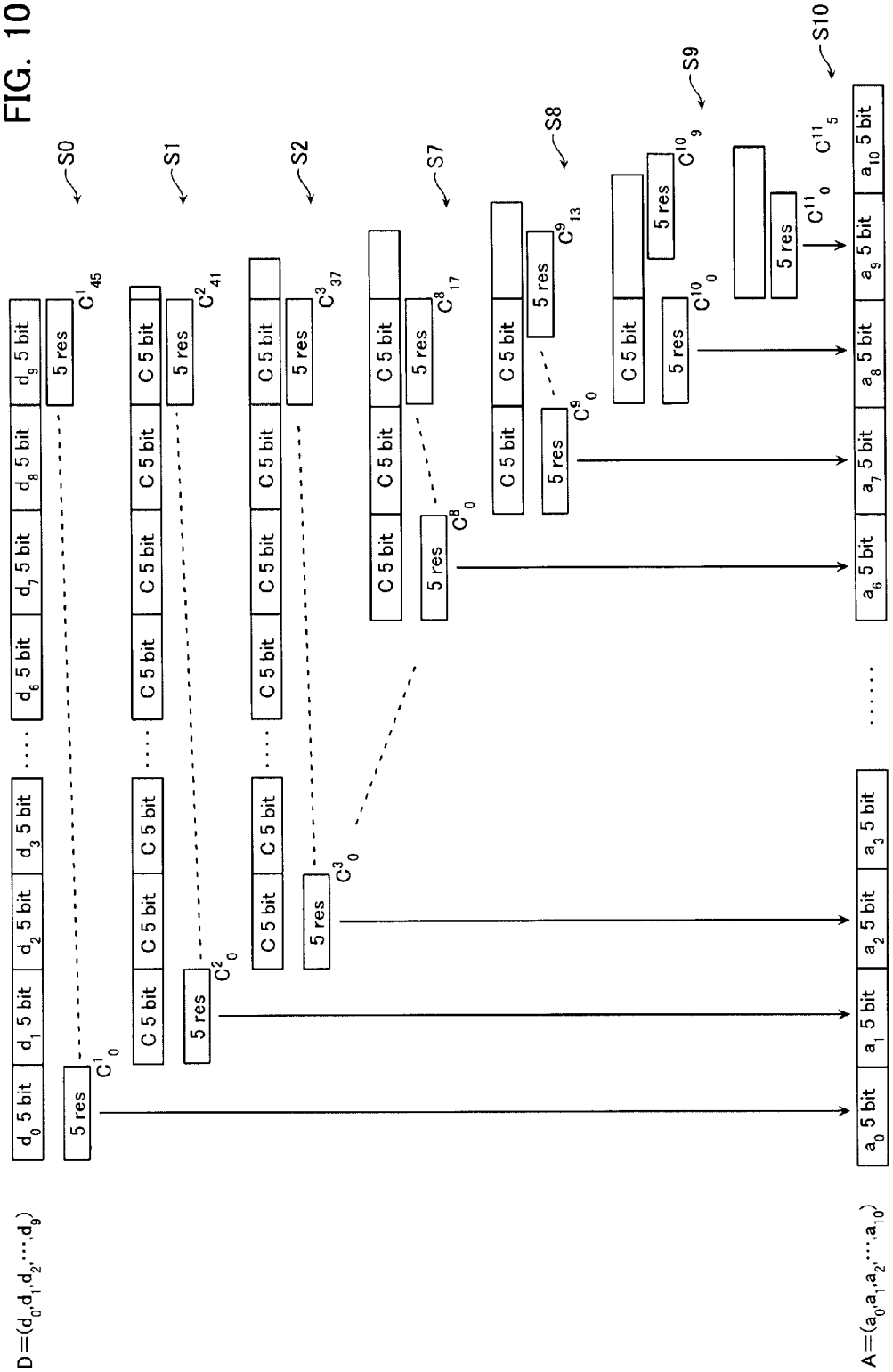
FIG. 10 is a diagram illustrative of the configuration of a to-17-adic converter circuit in the memory system according to the present embodiment.

FIG. 10 is a diagram schematically showing the configuration of the process of conversion computation from a δ-digit, $2^h$-adic number D ($d_0, d_1, \ldots, d_{\delta-1}$) in the "binary world" to a (δ+1)-digit, p-adic number D ($a_0, a_1, \ldots, a_{\delta-1}, a_\delta$) in the "p-adic Zp mod p world" in the case of p=17.

A square shown with "5 res" in FIG. 10 indicates an operating circuit operative to derive a quotient and the residue from the input binary data divided by 17. The input to the operating circuit is 6-bit binary data and the output therefrom is the residue obtained by dividing the binary data by 17. If the input binary data is equal to or larger than 17, then the quotient is output as a carry C. Hereinafter, the operating circuit element is referred to as the "5 res" circuit block.

At the start, at the 0-th step (S0 in FIG. 10), 10-digit, $2^5$-adic data D ($d_0, d_1, \ldots, d_9$) is subject to numeration from $d_9$ on the rightmost side. Here, the flow directly generates the residue and a quotient or carry $C^1_{45}$ by substituting 0 for the most significant bit of 6-bit binary data input to the "5 res" circuit block and dividing $d_9$ by 17.

Subsequently, 6-bit binary data, of which No. 5-1 bits are the outputs from the previous "5 res" circuit block (the residue represented by 5 bits) and No. 0 bit (the least significant bit) is the most significant bit $D^8_4$ (=$D_{39}$) of $d_8$, is input to the next "5 res" circuit block, which generates the residue and a quotient or carry $C^1_{44}$ derived from the input binary data divided by 17.

Thereafter, until No. 0 bit of 6-bit binary data input to the "5 res" circuit block reaches the least significant bit $D^0_0$ (=$D_0$) of $d_0$, 46 "5 res" circuit blocks are used to generate carries $C^1_0$-$C^1_{45}$. Binary data expressed by these generated carries $C^1_0$-$C^1_{45}$ indicates the number of 17s contained in the data D.

The output from the "5 res" circuit block having the input of $d_0$ has a binary representation $a_0$ of a 11-digit, 17-adic number D ($a_0, a_1, \ldots, a_{10}$).

Subsequently, at the 1st step (S1 in FIG. 10), over the number of 17s contained in the data D obtained at the 0-th step, a further computation is executed to determine how many 17s are contained to seek the number of $17^2$s, thereby obtaining a binary having a coefficient $a_1$ on a digit of a weight of $17^1$ in the 17-adic number D.

At the 1st step, numeration of 17 is executed to the carries $C^1_0$-$C^1_{45}$ from $C^1_{45}$ on the rightmost side. At the time of the numeration of 17 executed to the carries $C^1_{41}$-$C^1_{45}$, the flow directly generates the residue and a carry $C^2_{41}$ by substituting 0 for the most significant bit of 6-bit input binary data and dividing the input binary data by 17.

Subsequently, 6-bit binary data, of which No. 5-1 bits are the outputs from the previous "5 res" circuit block (the residue represented by 5 bits) and No. 0 bit (the least significant bit) is $C^1_{40}$, is input to the next "5 res" circuit block, which generates the residue and a quotient or carry $C^2_{40}$ derived from the input binary data divided by 17.

Thereafter, until No. 0 bit of 6-bit binary data input to the "5 res" circuit block reaches the least significant bit $C^1_0$ of $C^1_x$, 41 "5 res" circuit blocks are used to generate carries $C^2_0$-$C^2_{41}$. Binary data expressed by these generated carries $C^2_0$-$C^2_{41}$ indicates the number of primes $17^2$s contained in the data D.

The output from the "5 res" circuit block having the input of $C^1_0$ has a binary $a_1$ of a 11-digit, 17-adic number D ($a_0, a_1, \ldots, a_{10}$).

At the subsequent 2nd step (S2 in FIG. 10), over the number of $17^2$s contained in the data D obtained at the 1st step, a further computation is executed to determine how many primes p are contained to seek the number of $17^3$s, thereby obtaining a binary having a coefficient $a_2$ on a digit of a weight of $17^2$ in the 17-adic number D.

Thereafter, the flow advances up to the 10th step (S10 in FIG. 10) similarly to obtain a binary representation of a coefficient $a_{10}$ on a digit of a weight of $17^{10}$ of the p-adic number.

The carries $C^{11}_0$-$C^{11}_5$ at the 10th step are not used in computation.

A consideration is given next to the configuration of the "binary to p-adic" converter unit using a "6 bit mod p" circuit block. The "6 bit mod p" circuit block is a circuit that compares an input A or 6-bit binary data with a prime 17, then provides PF0='1' if A is equal to or higher than 17 and provides the residue Q modulo the prime 17 of A. The details are described later.

Figure 11:
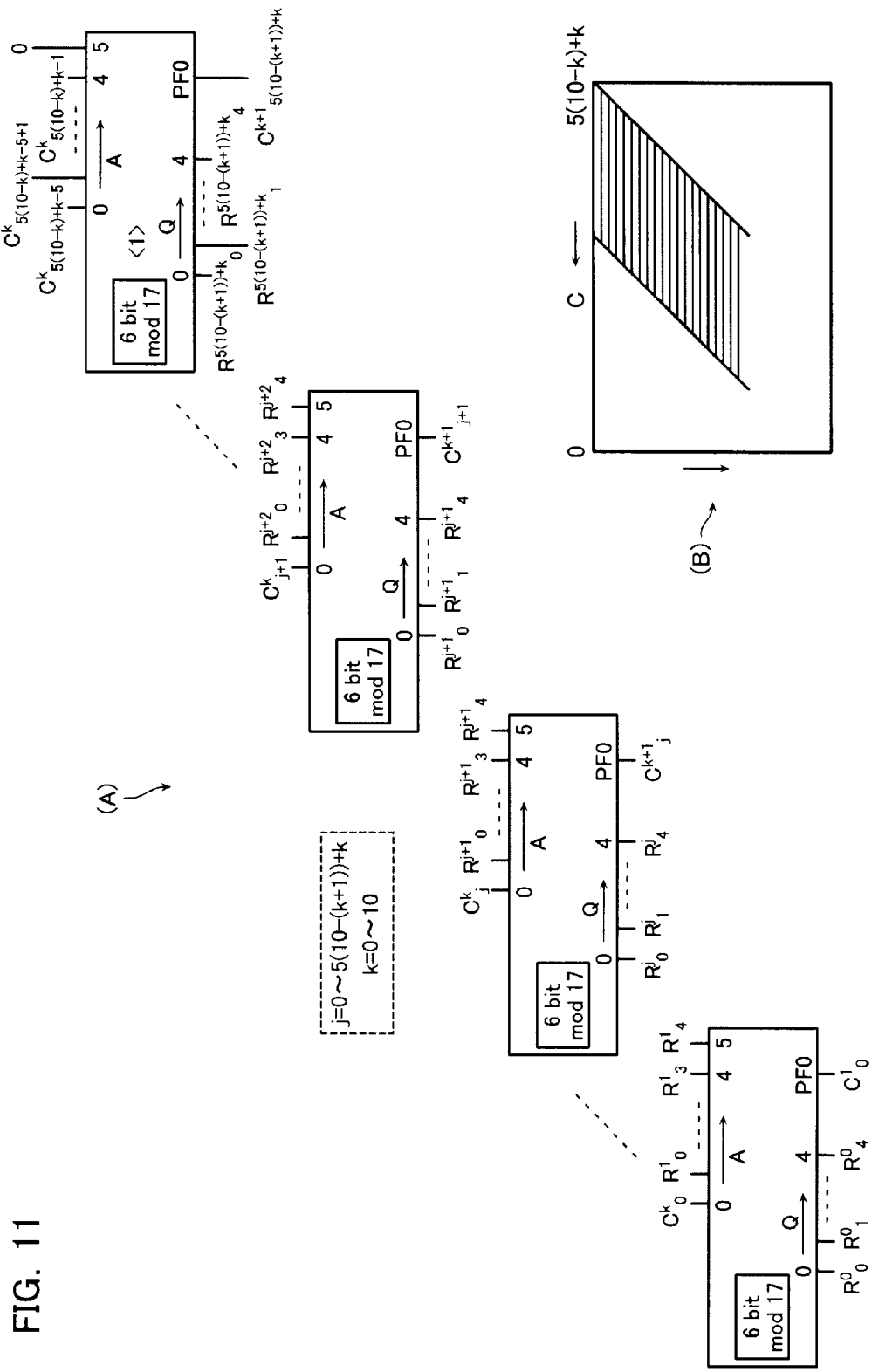
FIG. 11 is a block diagram of a to-17-adic converter circuit corresponding to 1 step ("X to p" circuit block) in the memory system according to the present embodiment.

FIG. 11 (A) shows a circuit at the k-th step in the "binary to p-adic" converter unit, which is configured with "6 bit mod 17" circuit blocks.

Here, the j-th digit is denoted with $d_j$ when data is subject to a 10-digit, $2^5$-adic expression. In this case, $d_j$ can be indicated in 5-bit binary though the coefficient D of the indication is expressed in common with the coefficient D of other d. For that purpose, sub-indexes are used as shown in Expression 24.

$$d_j = D^j_0 + D^j_1 2 + D^j_2 2^2 + D^j_3 2^3 + D^j_4 2^4$$

$$d_j(2^5)^j = D_{5j} 2^{5j} + D_{5j+1} 2^{5j+1} + D_{5j+2} 2^{5j+2} + D_{5(j+1)-2} 2^{5(j+1)-2} + D_{5(j+1)-1} 2^{5(j+1)-1}$$ [Expression 24]

The input to the operation at the k-th step, that is, the carry at the previous step (the (k-1)-th step) is $C^k_0$-$C^k_{5(10-k)+k-1}$, which is the coefficient of a binary expression that has the sub-index as an exponential of 2, and the numeral expressed by this binary indicates the number of $17^k$s contained in the data.

At the k-th step, the input includes 5 (10-k)+k pieces of binaries (carries $C^k_0$-$C^k_{5(10-k)+k-1}$) as shown in FIG. 11(A), which are received at 5(10-(k+1))+k+1 pieces of "6 bit mod 17" circuit blocks.

The 1st "6 bit mod 17" circuit block <1> receives $C^k_{5(10-k)+k-5}$ to $C^k_{5(10-k)+k-1}$ and 0 on the input binary $A_0$-$A_4$, $A_5$, and provides $R^{5(10-(k+1))+k}$ to $R^{5(10-(k+1))+k}_4$ and $C^{k+1}_{5(10-(k+1))+k}$ from the outputs $Q_0$-$Q_4$ and the carry PF0, respectively.

The 2nd "6 bit mod 17" circuit block <2>, not shown, receives a carry $C^k_{5(10-(k+1))+k-1}$ and the outputs $R^{5(10-(k+1))+k}_0$ to $R^{5(10-(k+1))+k}_4$ from the 1st "6 bit mod 17" circuit block <1> on the input binary $A_0, A_1$-$A_5$, and provides $R^{5(10-(k+1))+k-1}_0$ to $R^{5(10-(k+1))+k-1}_4$ and $C^{k+1}_{5(10-(k+1))+k-1}$ from the outputs $Q_0$-$Q_4$ and the carry PF0, respectively.

Thereafter, as shown in FIG. 11(A), "6 bit mod 17" circuit blocks having the same input/output are aligned 5(10-(k+1))+k+1 pieces in total, and the carries $C^{k+1}_0$ to $C^{k+1}_{5(10-(k+1))+k}$ output from the "6 bit mod 17" circuit blocks turn to the inputs at the next step, that is, the (k+1)-th step.

Thus, the conversion of binary to p-adic number is executed sequentially from the most significant bit of the carry C as in the schematic diagram shown in FIG. 11 B.

FIG. 11(A) shows the circuitry related to the k-th step. The circuitry shown in FIG. 11(A) can be used over steps if the steps are processed in time division. In this case, for the purpose of using simple on/off for control of the inputs/outputs of the "6 bit mod 17" circuit blocks, the circuitry at the 0-th step having the maximum number of required "6 bit mod 17" circuit blocks is additionally provided with 10 "6 bit mod 17" circuit blocks.

Figure 12:
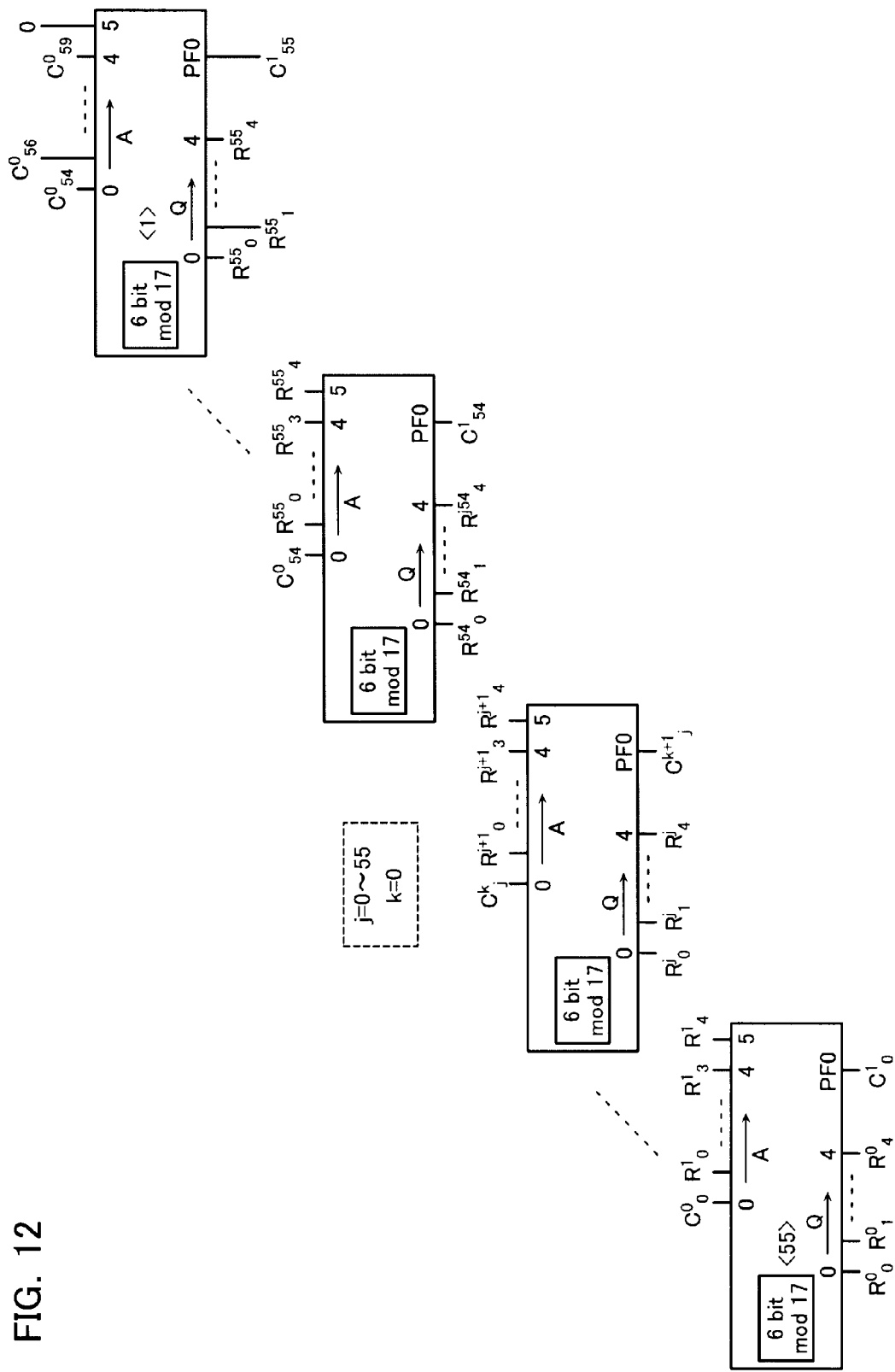
FIG. 12 is a block diagram of the "X to p" circuit block in the memory system according to the present embodiment.

A circuit including 56 "6 bit mod 17" circuit blocks thus configured is shown in FIG. 12. Hereinafter, this circuit is referred to as the "X to p" circuit block.

Figure 13:
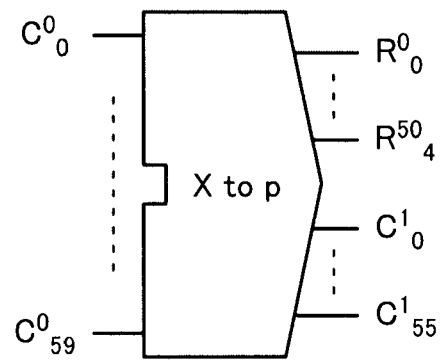
FIG. 13 is a diagram showing a circuit symbol of the "X to p" circuit block in the memory system according to the present embodiment.

As shown in FIG. 13, the inputs to the "X to p" circuit block include $C^0_0$-$C^0_{59}$, 60 pieces in total, 10 pieces more than that in the case of k=0 in FIG. 12(A). The outputs therefrom include 11 5-bit binaries $R^0_0$-$R^0_4$, $R^5_0$-$R^5_4$, ..., $R^{45}_0$-$R^{45}_4$, $R^{50}_0$-$R^{50}_4$ output from every 5 "6 bit mod 17" circuit blocks, and 55 carries $C^1_0$-$C^1_{55}$ to be used as the inputs at the next step.

Next, the "5 res" circuit block shown in FIG. 10, that is, the "6 bit mod 17" circuit block is described specifically.

Figure 14:
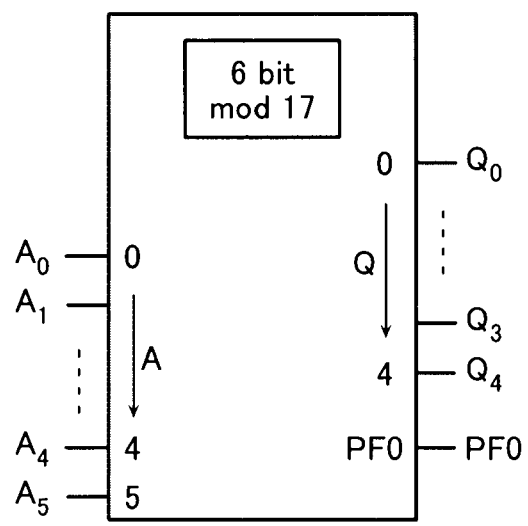
FIG. 14 is a diagram showing a circuit symbol of an operating circuit element for deriving elements in Zp ("6 bit mod 17" circuit block) in the memory system according to the present embodiment.

FIG. 14 is a diagram showing a circuit symbol of the "6 bit mod 17" circuit block. The "6 bit mod 17" circuit block receives a 6-bit binary $A_0$-$A_5$ and provides a 5-bit binary $Q_0$-$Q_4$ and a carry PF0.

The "6 bit mod 17" circuit block provides the residue Q modulo the prime 17 of the input binary A, and provides '1' from PF0 if the input binary A is equal to or more than 17 and '0' from PF0 if it is lower than 17.

In the case of h=5, p=17, relations shown in Expression 25 can establish among the binary A, the binary Q and the prime p.

$$a = A_0 + A_1 2 + A_2 2^2 + A_3 2^3 + A_4 2^4 + A_5 2^5$$

$$Q = a \pmod{p} \quad (a = Q + PF0 \times p)$$

$$Q = Q_0 + Q_1 2 + Q_2 2^2 + Q_3 2^3 + Q_4 2^4 \qquad \text{[Expression 25]}$$

Figure 15:
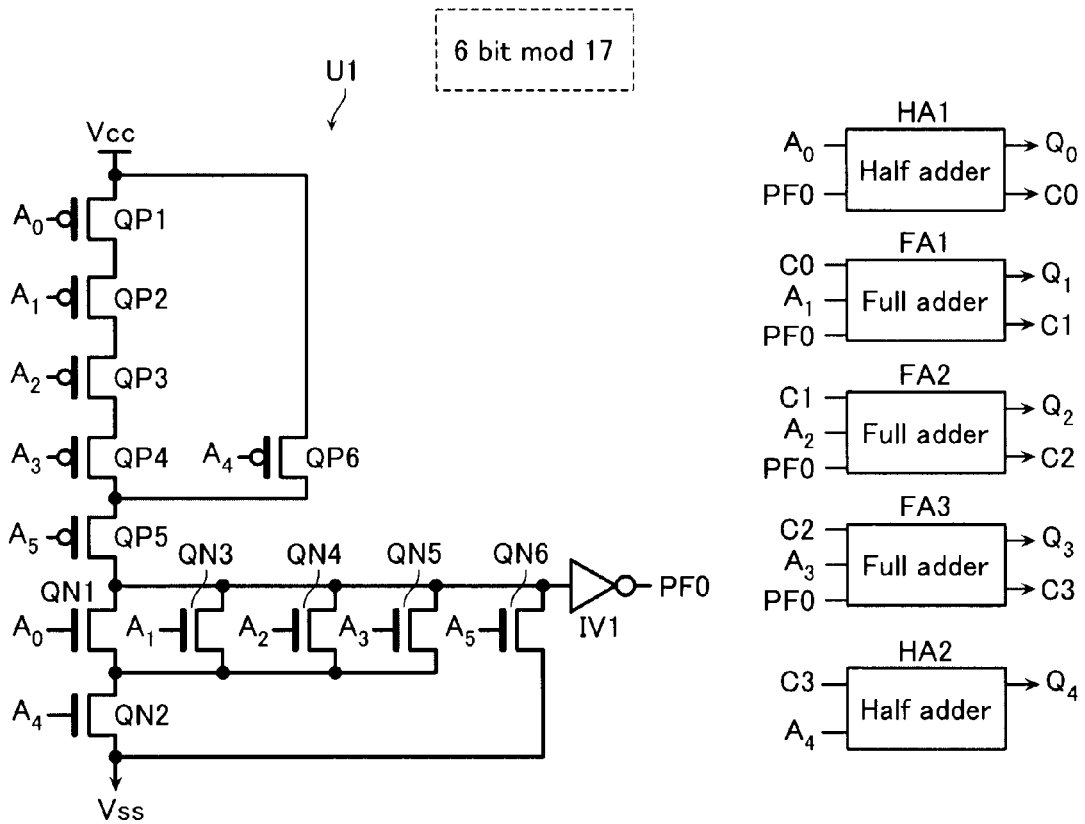
FIG. 15 is a block diagram of the "6 bit mod 17" circuit block in the memory system according to the present embodiment.

FIG. 15 is a block diagram of the "6 bit mod 17" circuit block.

The "6 bit mod 17" circuit block comprises a PF0 generator unit U1, 2 half adders HA1, HA2, and 3 full adders FA1-FA3.

The PF0 generator unit U1 includes serially connected PMOS transistors QP1-QP5 and NMOS transistors QN1-QN2 between the Vcc terminal supplied with a certain voltage and the Vss terminal supplied with the ground voltage. These transistors QP1, QP2, QP3, QP4, QP5, QN1 and QN2 are controlled by $A_0$, $A_1$, $A_2$, $A_3$, $A_5$, $A_0$ and $A_4$, respectively.

The PF0 generator unit U1 also includes a PMOS transistor QP6, 4 NMOS transistors QN3-QN6, and an inverter IV1.

The transistor QP6 is connected between the source of the transistor QP1 and the drain of the transistor QP4 in parallel. The transistors QN3-N5 are connected between the source and drain of the transistor QN1 in parallel. The transistor QN6 is connected between the source of the transistor QN1 and the drain of the transistor QN2 (Vss terminal) in parallel. These transistors QP6, QN3, QN4, QN5 and QN6 are controlled by $A_4$, $A_2$, $A_3$ and $A_5$, respectively.

The inverter IV1 has an input connected to the sources of transistors QN1, QN3-QN6. The output from the inverter IV1 provides the carry PF0.

The half adder HA1 has inputs $A_0$ and PF0, an output $Q_0$, and a carry output C0. The full adder FA1 has inputs C0 and $A_1$, a carry input PF0, an output $Q_1$, and a carry output C1. The full adder FA2 has inputs C1 and $A_2$, a carry input PF0, an output $Q_2$, and a carry output C2. The full adder FA3 has inputs C2 and $A_3$, a carry input PF0, an output $Q_3$ and a carry output C3. The half adder HA2 has inputs C3 and $A_4$, and an output Q.

In accordance with the above configuration, the PF0 generator unit U1 decides if the binary A input to the "6 bit mod 17" circuit block is equal to or more than 17, and provides the result from PF0. If the binary A is equal to or more than 17, the half adders HA1, HA2 and the full adders FA1-FA3 are used to add 15, a complement of the 6-bit binary 17, to the binary A in order to subtract 17 from the binary A.

The following description is given to the core part of the "binary to p-adic" converter unit, that is, the p-adic circuit block.

Figure 16:
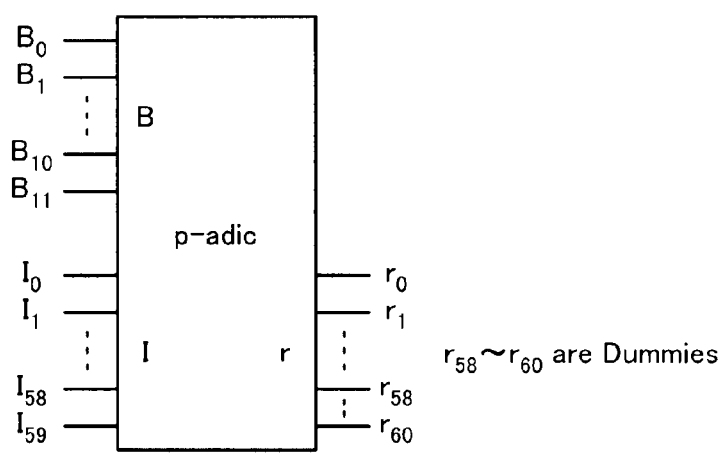
FIG. 16 is a diagram showing a circuit symbol of a to-17-adic conversion core ("p-adic" circuit block) in the memory system according to the present embodiment.

FIG. 16 is a diagram showing a circuit symbol of the "p-adic" circuit block.

The "p-adic" circuit block receives $B_0$-$B_{11}$, $I_0$-$I_{59}$, and provides $r_0$-$r_{60}$ as shown in FIG. 16.

Figure 17:
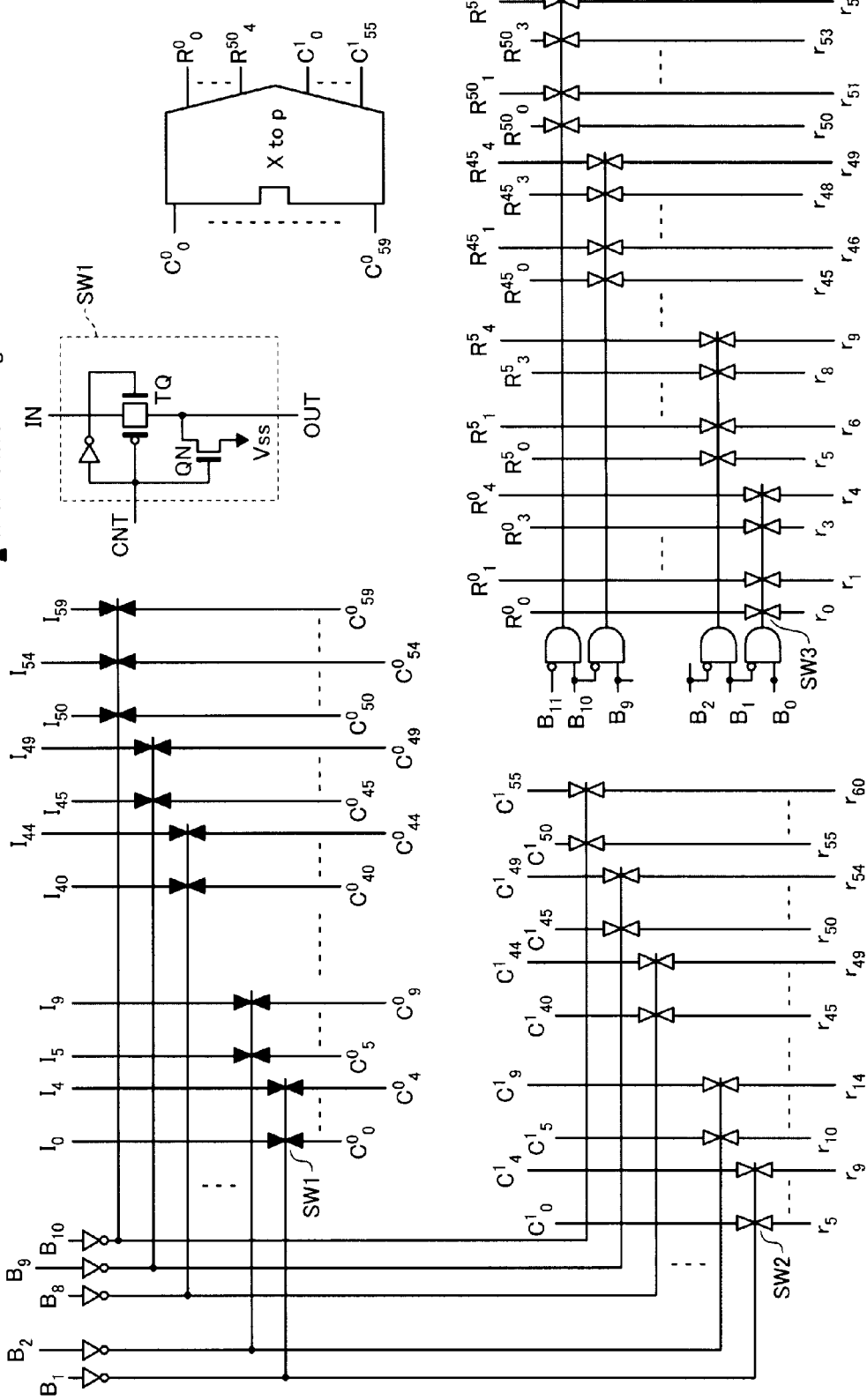
FIG. 17 is a block diagram of the "p-adic" circuit block in the memory system according to the present embodiment.

FIG. 17 is a block diagram of the "p-adic" circuit block. The "p-adic" circuit block includes an "X to p" circuit block in the 1-step circuitry, and additional control switches SW for controlling the input/output of the "X to p" circuit block.

Specifically, the inputs $I_0$-$I_4$, $I_5$-$I_9$, ..., $I_{54}$-$I_{59}$ are fed via the control switches SW1 to the "X to p" circuit block as $C^0_0$-$C^0_4$, $C^0_5$-$C^0_9$, ..., $C^0_{54}$-$C^0_{59}$, respectively. These control switches SW1 are controlled by the inputs $B_1$-$B_{10}$, respectively.

One control switch SW1 includes a transfer transistor TQ operative to connect the input IN with the output OUT, and an NMOS transistor QN operative to pull down the output OUT to the ground voltage. The transfer transistor TQ turns on if the control signal is CNT='0' while the transistor QN turns on if the control signal is CNT='1'.

In the case of the control switches SW1, the control signals CNT include /$B_1$-/$B_{10}$. Therefore, $I_0$-$I_{59}$ are provided directly as $C^0_0$-$C^0_{59}$ if B='1', and the output turns to '0' independent of the input if B='0'. This is effective to prevent the input to the "X to p" circuit block from becoming indefinite even if the inputs $I_0$-$I_{59}$ to the "p-adic" circuit block are indefinite.

The "X to p" circuit block on receipt of $C^0_0$-$C^0_{59}$ provides $R^0_0$-$R^{50}_4$, $C^1_0$-$C^1_{55}$ as described above.

The outputs $C^1_0$-$C^1_{55}$ from the "X to p" circuit block pass through the control switches SW2 and turn to $r_5$-$r_{60}$, that is, the outputs from the "p-adic" circuit block. These control switches SW2 are controlled by the inputs $B_1$-$B_{10}$. Therefore, these control switches SW2 directly pass $C^1_0$-$C^1_{55}$ as $r_5$-$r_{60}$ if B='0'.

The outputs $R^0_0$-$R^{50}_4$ from the "X to p" circuit block pass through the control switches SW3 and turn to $r_0$-$r_{54}$, that is, the outputs from the "p-adic" circuit block. These control switches SW3 are controlled by $B_0$□/$B_1$ to $B_{10}$□/$B_{11}$, respectively. Therefore, the control switches SW3 located between $R^0_0$ and $r_0$, for example, directly provide $R^0_0$ as $r_0$ only if $B_0$='1' and $B_1$='0'.

$B_1$-$B_{11}$ for use in control of the control switches SW are timing signals, which are signals that rise sequentially. In sync with this, the paths for the inputs I open at every 5 bits from the lower bit side and the paths for the outputs r switch to the paths for the outputs R.

In order to provide the result at the present step until the flow enters the computation process at the next step, R corresponding to a coefficient A on each digit of a 17-adic number is provided to the later-described external "D-r" register via the control switches SW3 on/off-controlled by the signals resulted from the logical operation with the adjacent timing signals B.

The following description is given to the "binary to p-adic" converter unit including the above-described circuits grouped together.

Figure 18:
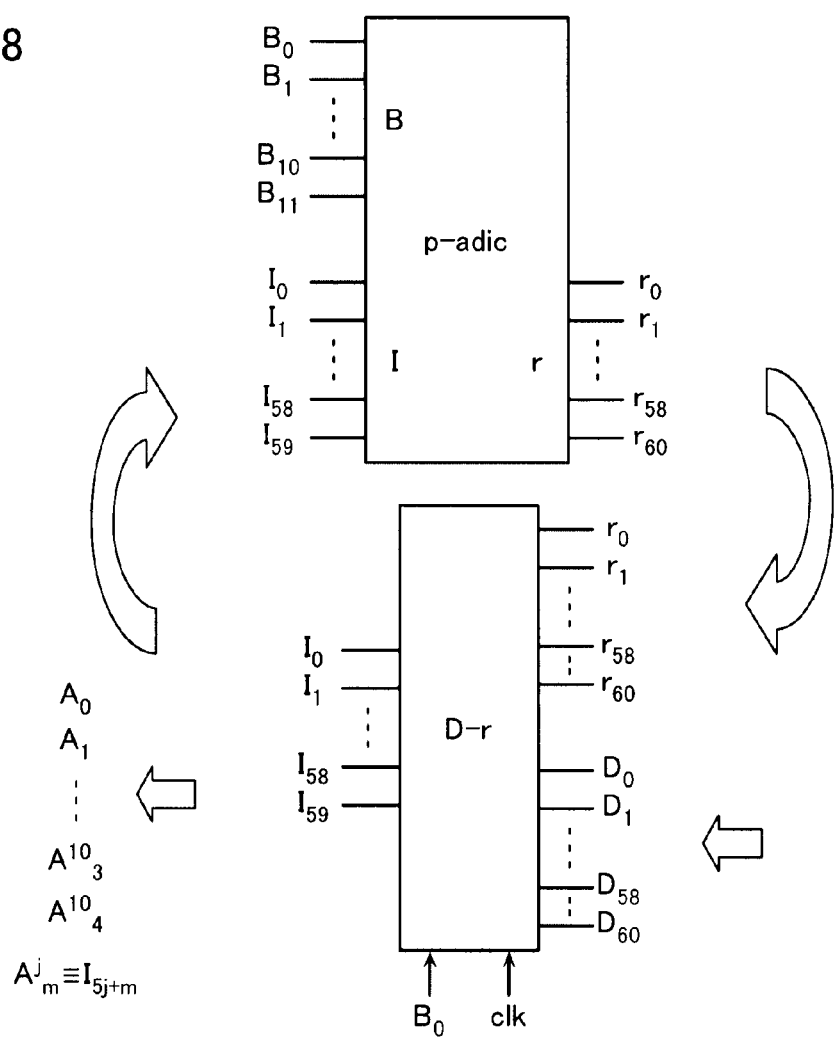
FIG. 18 is a block diagram of the to-17-adic converter circuit in the memory system according to the present embodiment.

FIG. 18 is a block diagram of the "binary to p-adic" converter unit. The "binary to p-adic" converter unit includes the "p-adic" circuit block and the "D-r" register coupled thereto.

The "D-r" register is a register controlled by the timing signal B and the clock clk as shown in FIG. 18. It has the inputs $r_0$-$r_{60}$, $D_0$-$D_{60}$ and the outputs $I_0$-$I_{59}$.

Figure 19:
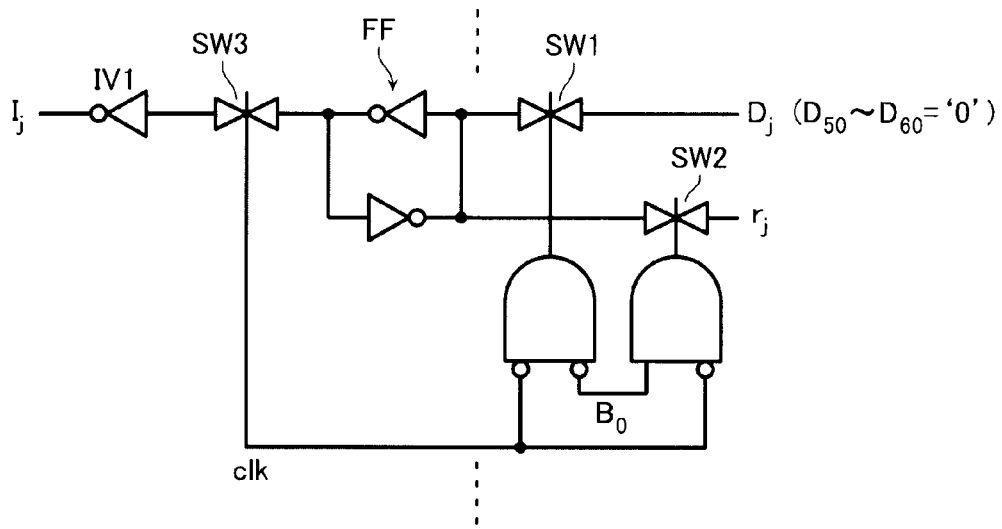
FIG. 19 is a circuit diagram of a "D-r" register in the memory system according to the present embodiment.

FIG. 19 is a circuit diagram of the "D-r" register.

The "D-r" register includes a flip-flop FF composed of 2 inverters at every bit. The flip-flop FF receives $D_j$ (j=0-60) via the control switch SW1 and receives $r_j$ via the control switch SW2. On the other hand, the flip-flop FF is connected to an inverter IV1 on the output side via the control switch SW3. The output from the inverter IV1 provides $I_j$.

The control switches SW1-SW3 are controlled by the timing signal $B_0$ and the clock clk. Specifically, the control switch SW1 turns on if /clk☐/$B_0$='1', the control switch SW2 if /clk☐$B_0$='1', and the control switch SW3 if clk='1', respectively.

$D_{50}$-$D_{60}$ not contained in the data input to the "D-r" register are held at '0'.

In the initial state of the "D-r" register, a binary $D_0$-$D_{49}$ is set, and the rest is filled with '0'. Thereafter, when $B_0$ rises, data $r_j$ is taken in sync with the fall of clk, and the taken $r_j$ is provided as $I_j$ in sync with the rise of clk.

Figure 20:
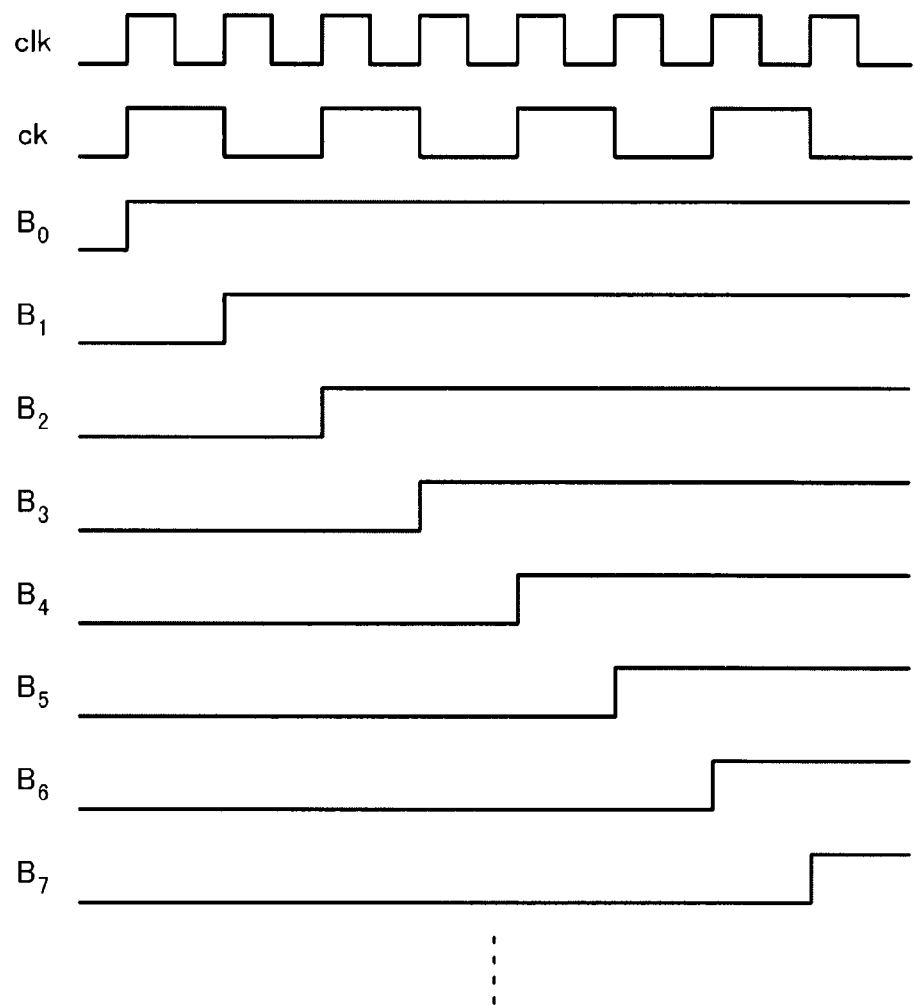
FIG. 20 is a timing chart of timing signals for use in control of the to-17-adic converter circuit in the memory system according to the present embodiment.

The "D-r" register couples with the "p-adic" circuit block to advance the computation step at every timing signal $B_j$. The state of variations in each clock is shown in FIG. 20. The clock clk is used to generate a clock ck and further generate timing signals $B_j$.

At each computation step, each digit $A_j$ of a 17-adic number is obtained as the output r from the lower side, and this is held at the same timing as that for taking I in the second half of the timing signal $B_j$.

After completion of all the computation steps, the "D-r" register holds the coefficients $A^j{}_m$ on respective digits when the coefficients a on respective digits of 17-adic data D are converted to binaries.

In the case of p=17, the number of computation steps is equal to 12, and the number of "6 bit mod 17" circuit blocks contained in the "p-adic" circuit block is equal to 56.

<Conversion of 17-Adic Number to $2^5$-Adic Number>

Figure 21:
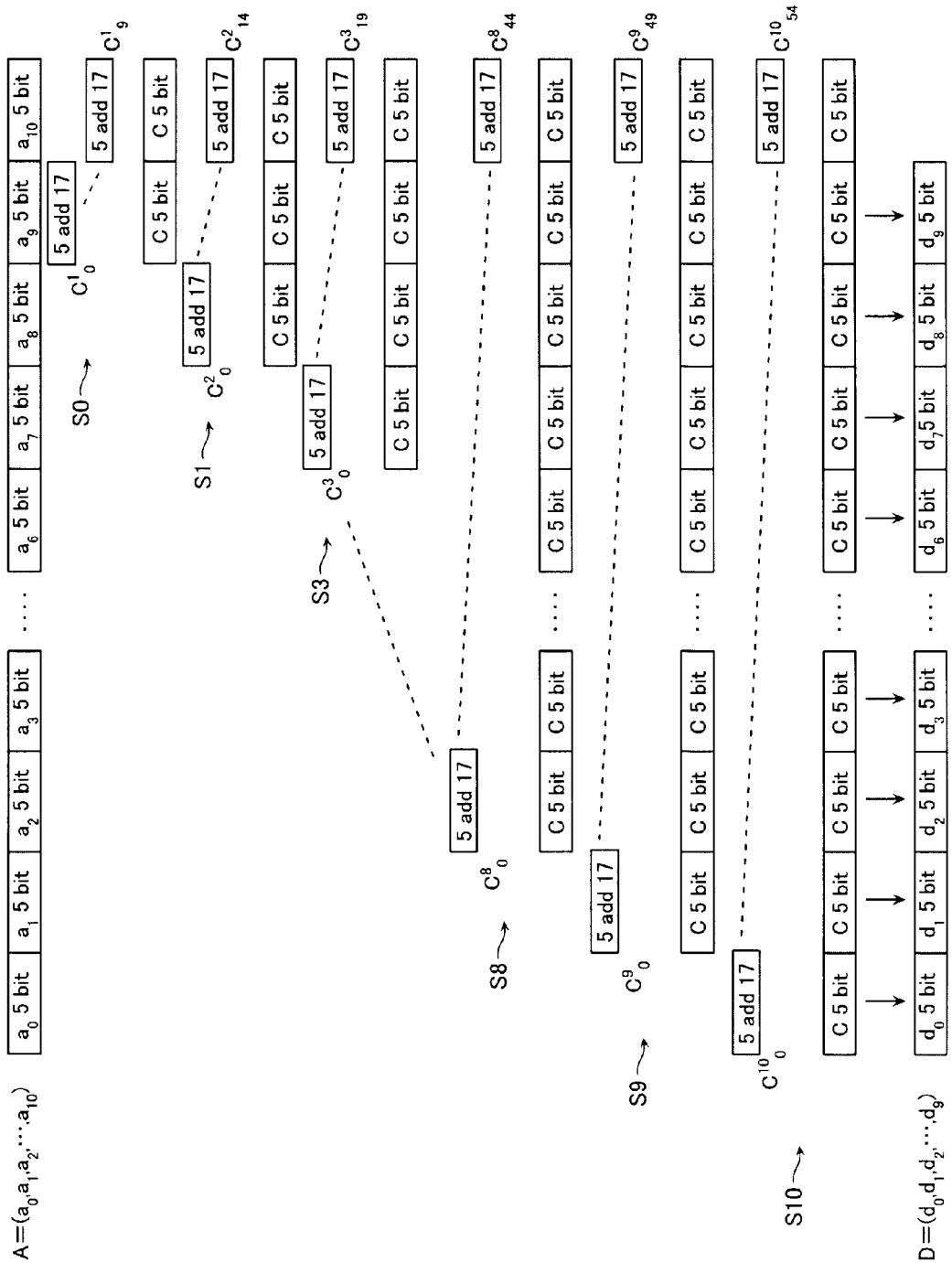
FIG. 21 is a diagram illustrative of the configuration of a to-$2^5$-adic converter circuit in the memory system according to the present embodiment.

FIG. 21 is a diagram schematically showing the configuration of a circuit for converting a 11-digit, 17-adic number D ($a_0, a_1, \ldots, a_9, a_{10}$) in the "p-adic Zp world" to a 10-digit, $2^5$-adic number D ($d_0, d_1, \ldots, d_9$) in the "binary world".

A square shown with "5 add 17" in FIG. 21 indicates an operating circuit operative to add 17 to the input 5-bit data in accordance with the input carry C to provide a 6-bit binary. Hereinafter, this circuit is referred to as the "5 add 17" circuit block.

At the start, at the 0-th step (S0 in FIG. 21), the above-described computation is executed to a binary representation of the digit at the 9th degree of the 17-adic number with a binary representation of the digit at the 10th degree used as a carry, that is, a binary representation of the number of $17^{10}$s, thereby obtaining 10 bits of a carry $C^1{}_0$-$C^1{}_9$ as the number of $17^9$s. This carry $C^1{}_0$-$C^1{}_9$ turns to the input at the next 1st step.

Subsequently, at the 1st step (S1 in FIG. 21), the above-described computation is executed to a binary representation of the digit at the 8th degree of the 17-adic number with the carry $C^1{}_0$-$C^1{}_9$ obtained at the 0-th step used as a binary representation of the number of $17^9$s, thereby obtaining 15 bits of a carry $C^2{}_0$-$C^2{}_{14}$ as the number of $17^8$s. This carry $C^2{}_0$-$C^2{}_{14}$ turns to the input at the next 2nd step (S2 in FIG. 21).

Thereafter, the same steps as the 0-th step and the 1st step are repeated and, at the 9th step (S9 in FIG. 21), the above-described computation is executed to a binary representation of the digit at the 0-th degree of the 17-adic representation with a carry $C^9{}_0$-$C^9{}_{49}$ obtained at the previous 8th step (S8 in FIG. 21) used as a binary representation of the number of p, thereby obtaining 55 bits of a carry $C^{10}{}_0$-$C^{10}{}_{54}$ as the number of $17^0$s, that is, a binary representation of D. In this case, the upper 5 bits are held at zero in accordance with the setting of the 17-adic number and the $2^5$-adic number associated with D. When $C^{10}{}_{50}$-$C^{10}{}_{54}$ are excluded from the carries $C^{10}{}_0$-$C^{10}{}_{54}$ and the remaining $C^{10}{}_0$-$C^{10}{}_{49}$ are grouped at every 5 bits, a binary representation of D, that is, D ($d_0, d_1, \ldots, d_9$) can be obtained.

A consideration is given next to the configuration of the "p-adic to binary" converter unit.

Figure 22:
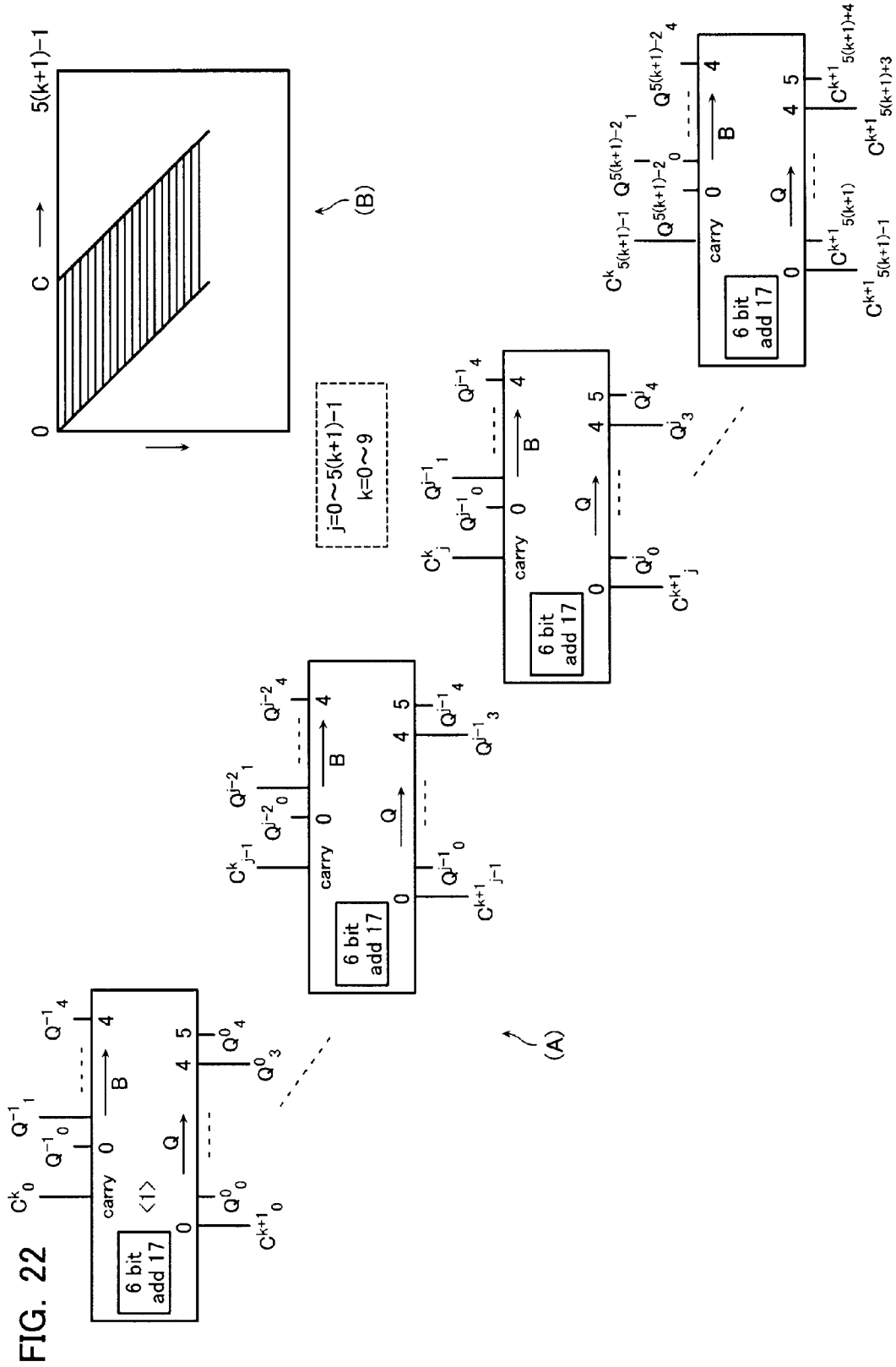
FIG. 22 is a block diagram of a to-$2^5$-adic converter circuit corresponding to 1 step ("a to X" circuit block) in the memory system according to the present embodiment.

FIG. 22 shows the circuitry at the k-th step in the "p-adic to binary" converter unit configured using "6 bit add 17" circuit blocks. The "6 bit add 17" circuit block is a circuit operative to add a prime 17 to 5-bit binary data, that is, the input B, and provides the result as binary data Q. The details are described later.

It is possible to express data, a coefficient $a_3$ on the digit at the j-th place of a 11-digit, 17-adic representation, in 5-bit binary. For the purpose of bringing the coefficient A of this binary representation into a representation in common with coefficients a on other digits, sub-indexes as shown in Expression 26 are used.

$$a_j = A^j{}_0 + A^j{}_1 2 + A^j{}_2 2^2 + A^j{}_3 2^3 + A^j{}_4 2^4$$

$$a_j(2^5)^j = A_{5j} 2^{5j} + A_{5j+1} 2^{5j+1} + A_{5j+2} 2^{5j+2} + A_{5(j+1)-2} 2^{5(j+1)-2} + A_{5(j+1)-1} 2^{5(j+1)-1}$$

[Expression 26]

The input to the operation at the k-th step, that is, the carry at the previous step (the (k−1)-th step) includes $C^k{}_0$-$C^k{}_{5(k+1)-1}$, of which sub-index of a coefficient in the binary representation is an exponent of 2. The number expressed by this binary indicates the number of $17^{10-k}$s contained in the data.

At the k-th step, 5 (k+1) pieces of "6 bit add 17" circuit blocks are used in processing as shown in FIG. 22(A). Each "6 bit add 17" circuit block receives 1 carry, and 5 binaries indicative of a coefficient on 1 digit of a 17-adic representation.

The 1st "6 bit add 17" circuit block <1> receives $C^k{}_0$, $Q^{-1}{}_0$-$Q^{-1}{}_4$ at the carry and the inputs $B_0$-$B_4$, and provides $C^{k+1}{}_0$, $Q^0{}_0$-$Q^0{}_4$ from $Q_0$, $Q_1$-$Q_5$, respectively.

The 2nd "6 bit add 17" circuit block <2>, not shown, receives $C^k{}_1$, $Q^0{}_0$-$Q^0{}_4$ at the carry and the inputs $B_0$-$B_4$, and provides $C^{k+1}{}_1$, $Q^1{}_0$-$Q^1{}_4$ from $Q_0$, $Q_1$-$Q_5$, respectively.

Thereafter, the "6 bit add 17" circuit blocks having the similar inputs and outputs are aligned 5(k+1) pieces in total as shown in FIG. 22(A), and a carry $C^{k+1}{}_0$-$C^{k+1}{}_{5(k+1)-1}$ output from each "6 bit add 17" circuit block turns to the input at the next step, that is, the (k+1)-th step.

Thus, the conversion of a 17-adic number to a binary is executed sequentially from the least significant bit of a carry C as in a schematic diagram shown in FIG. 22(B).

Figure 23:
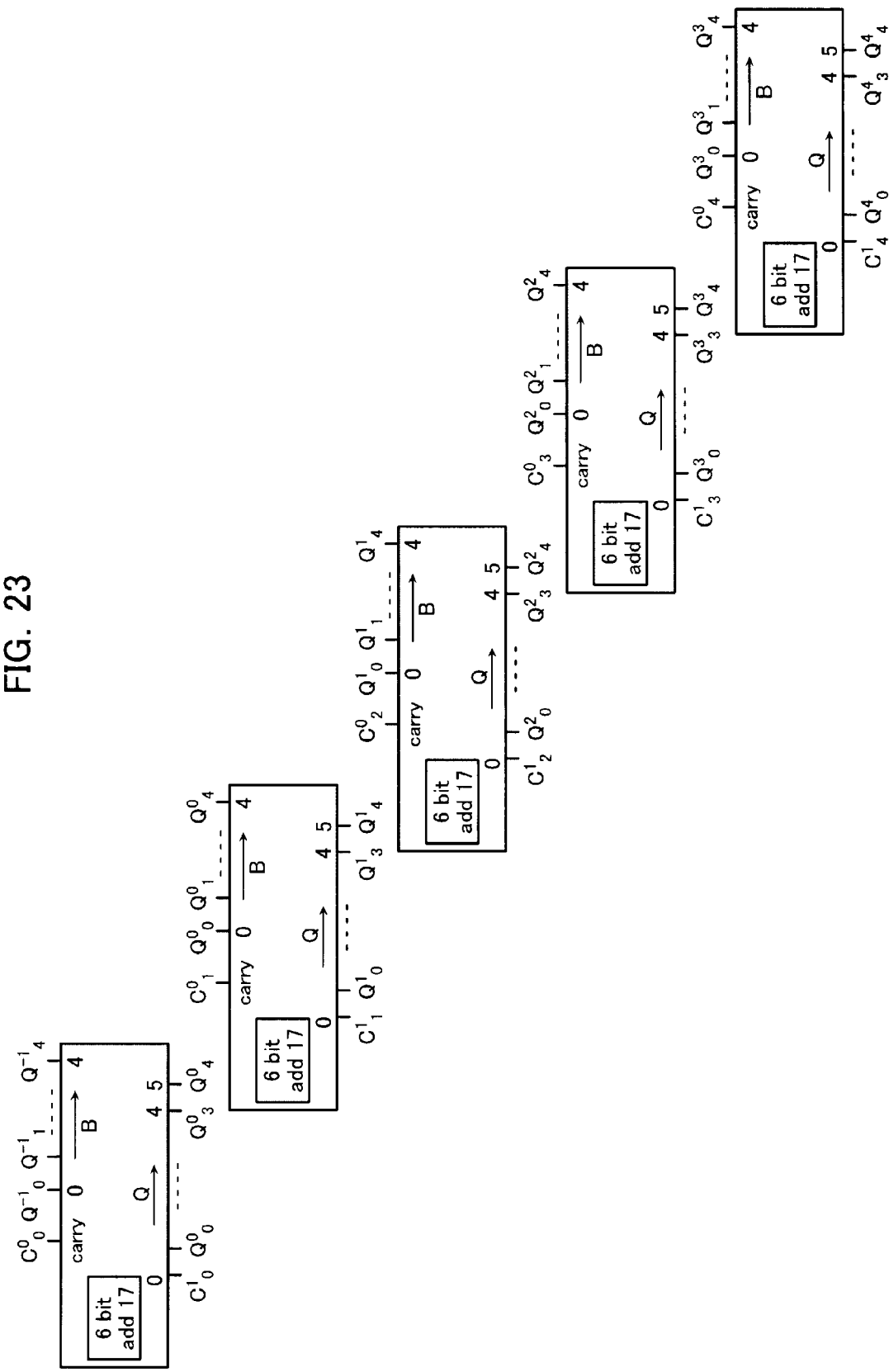
FIG. 23 is a block diagram of the "a to X" circuit block in the memory system according to the present embodiment.

FIG. 22(A) shows the circuitry related to the k-th step as described above. The circuitry shown in FIG. 22(A) can be used over at each step if each step is processed in time division. In this case, for the purpose of making the input/output of each "6 bit add 17" circuit block controllable in accordance with simple on/off, 5 "6 bit add 17" circuit blocks in the case of k=0 are configured to form a circuit block with a minimum configuration as shown in FIG. 23.

The circuit including the 5 "6 bit add 17" circuit blocks thus configured is referred to as an "a to X" circuit block.

Figure 24:
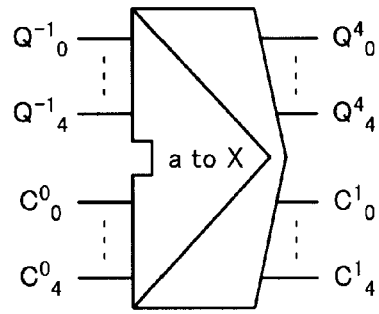
FIG. 24 is a diagram showing a circuit symbol of the "a to X" circuit block in the memory system according to the present embodiment.

As shown in FIG. 24, the "a to X" circuit block has the inputs of $Q^{-1}{}_0$-$Q^{-1}{}_4$ and $C^0{}_0$-$C^0{}_4$, 10 in number, and the outputs of $Q^4{}_0$-$Q^4{}_4$ and $C^1{}_0$-$C^1{}_4$, 10 in number.

The following specific description is given to the "5 add 17" circuit block shown in FIG. 21, that is, the "6 bit add 17" circuit block.

Figure 25:
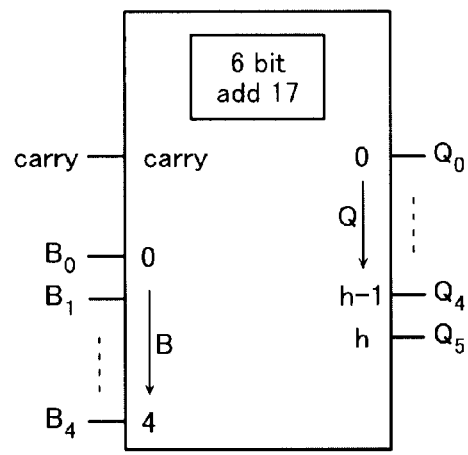
FIG. 25 is a diagram showing a circuit symbol of an operating circuit element for deriving a binary element ("6 bit add 17" circuit block) in the memory system according to the present embodiment.

FIG. 25 shows a circuit symbol of the "6 bit add 17" circuit block. The "6 bit add 17" circuit block receives a 5-bit binary $B_0$-$B_4$ and a 1-bit carry (carry), and provides a 6-bit binary $Q_0$-$Q_5$. The "6 bit add 17" circuit block adds a prime 17 to the input B if the carry is '1', and provides the result as Q.

In the case of h=5, p=17, the relation shown in Expression 27 can be established between the binary B and the binary Q.

$$b = B_0 + B_1 2 + B_2 2^2 + B_3 2^3 + B_4 2^4$$

$$Q = b + \text{carry} \times p$$

$$Q = Q_0 + Q_1 2 + Q_2 2^2 + Q_3 2^3 + Q_4 2^4 + Q_5 2^5 \quad \text{[Expression 27]}$$

Figure 26:
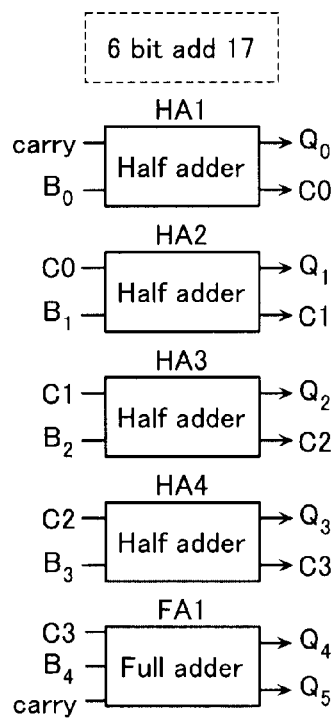
FIG. 26 is a block diagram of the "6 bit add 17" circuit block in the memory system according to the present embodiment.

FIG. 26 is a block diagram of the "6 bit add 17" circuit block.

The "6 bit add 17" circuit block includes 4 half adders HA1-HA4 and a single full adder FA1.

The half adder HA1 has inputs $B_0$ and carry, an output $Q_0$, and a carry output C0. The half adder HA2 has inputs C0 and $B_1$, an output $Q_1$, and a carry output C1. The half adder HA3 has inputs C1 and $B_2$, an output $Q_2$, and a carry output C2. The half adder HA4 has inputs C2 and $B_3$, an output $Q_3$, and a carry output C3. The full adder FA1 has inputs $B_4$ and carry, a carry input C3, an output $Q_4$, and a carry output $Q_5$.

In accordance with the above configuration, the "6 bit add 17" circuit block adds a prime 17 to the input binary B if carry='1'.

Next, the above-described "a to X" circuit blocks are used to configure a circuit for 1 step operative to lower the degree of the 17-adic number by 1. Hereinafter, the circuit is referred to as the "p to X" circuit block. The "p to X" circuit block can be used in all the computation steps in common.

Figure 27:
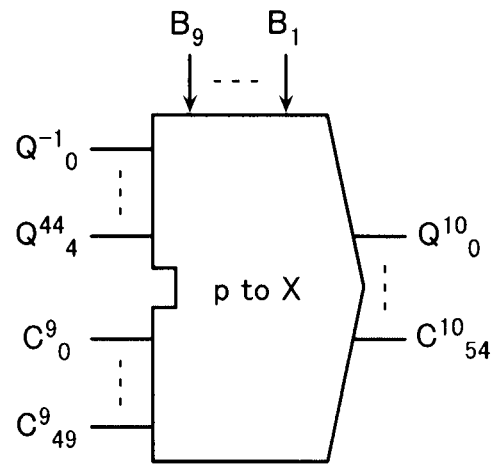
FIG. 27 is a block diagram of a to-$2^5$-adic converter circuit block corresponding to 1 step ("p to X" circuit block) common to the memory system according to the present embodiment.

FIG. 27 is a diagram showing a circuit symbol of the "p to X" circuit block. The "p to X" circuit block is controlled by the timing signals $B_1$-$B_9$ to provide outputs $C^{10}_0$-$C^{10}_{54}$ in response to inputs $Q^{-1}_0$-$Q^{44}_4$, $C^9_0$-$C^9_{49}$.

Figure 28:
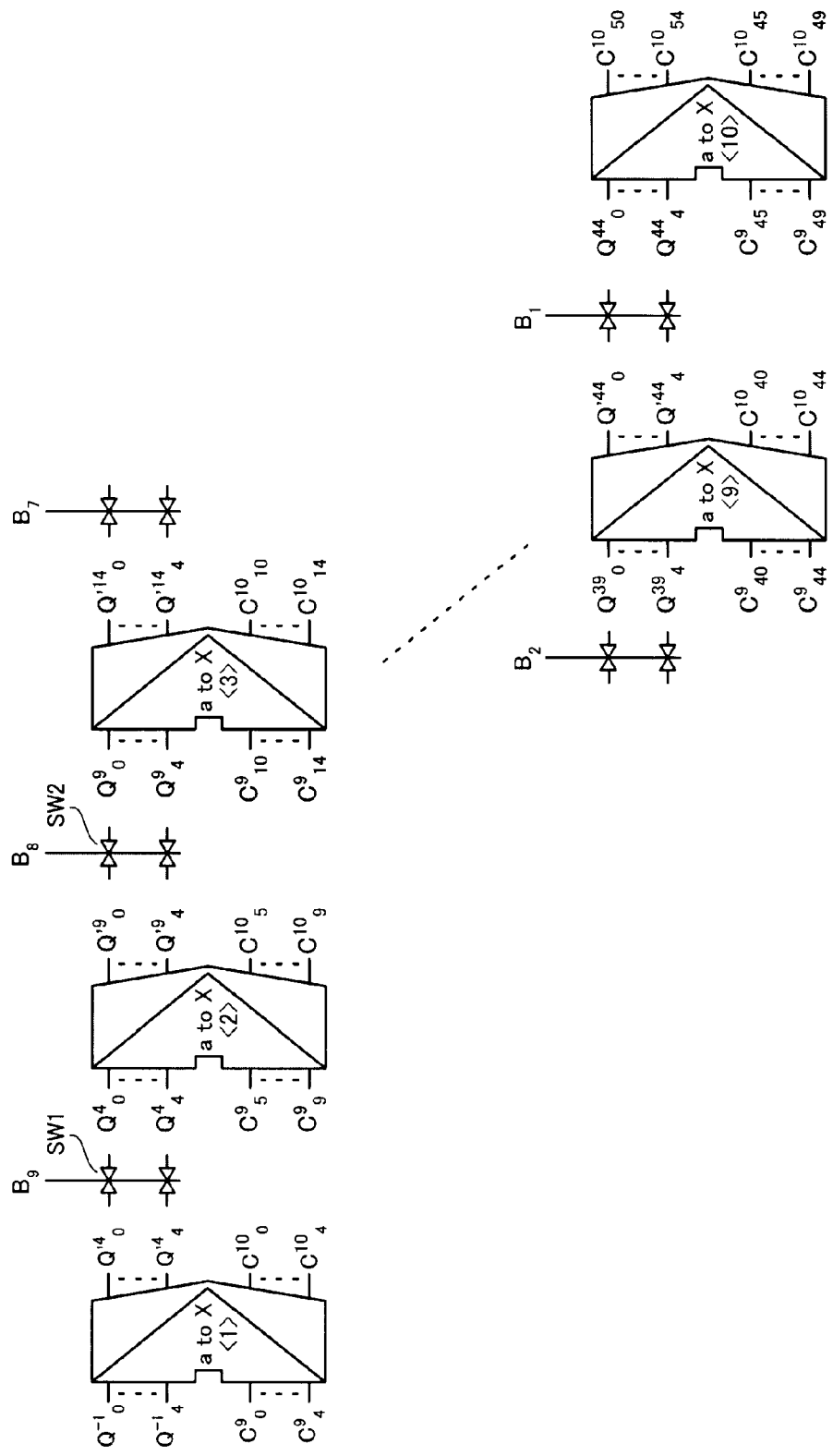
FIG. 28 is a diagram showing a circuit symbol of the "p to X" circuit block in the memory system according to the present embodiment.

FIG. 28 is a block diagram of the "p to X" circuit block.

The "p to X" circuit block comprises 10 "a to X" circuit blocks.

The 1st "a to X" circuit block <1> receives part of the inputs to the "p to X" circuit block, that is, $Q^{-1}_0$-$Q^{-1}_4$, and $C^9_0$-$C^9_4$, and provides $Q'^4_0$-$Q'^4_4$ and part of the outputs from the "p to X" circuit block, that is, $C^{10}_0$-$C^{10}_4$.

The 2nd "a to X" circuit block <2> receives $Q^4_0$-$Q^4_4$ and part of the inputs to the "p to X" circuit block, that is, $C^9_5$-$C^9_9$, and provides $Q'^9_0$-$Q'^9_4$ and part of the outputs from the "p to X" circuit block, that is, $C^{10}_5$-$C^{10}_9$. Among the inputs, $Q^4_0$-$Q^4_4$ are signals fed via the control switches SW1, through which the outputs $Q'^4_0$-$Q'^4_4$ from the 1st "a to X" circuit block <1> are controlled by the timing signal $B_9$.

The 3rd "a to X" circuit block <3> receives $Q^9_0$-$Q^9_4$ and part of the inputs to the "p to X" circuit block, that is, $C^9_{10}$-$C^9_{14}$, and provides $Q'^{14}_0$-$Q'^{14}_4$ and part of the outputs from the "p to X" circuit block, that is, $C^{10}_{10}$-$C^{10}_{14}$. Among the inputs, $Q^9_0$-$Q^9_4$ are signals fed via the control switches SW2, through which the outputs $Q'^9_0$-$Q'^9_4$ from the 2nd "a to X" circuit block are controlled by the timing signal $B_8$.

Thereafter, similar connections will be made up to the 10th "a to X" circuit block <10>.

The inputs and outputs of the "a to X" circuit block are connected via the control switches SW in this way, because the connection of the input is switched between the external input and the internal input at every computation step, and for the purpose of preventing the output from the internal circuit from interfering in the case of the external input.

In the case of the circuitry of FIG. 28, all the control switches SW are turned off at the timing when only the timing signal $B_0$ is at '1', thereby activating only the last "a to X" circuit block <10>. This corresponds to the 0-th step.

Subsequently, when the timing signal $B_1$ also turns to '1', the 9th "a to X" circuit block <9> is activated additionally. This corresponds to the 1st step.

Thereafter, at every sequential rise of the timing signals $B_2$-$B_9$, the "a to X" circuit block required at each step is activated.

The following description is given to the core part of the "p-adic to binary" converter unit, that is, the "binary" circuit block.

Figure 29:
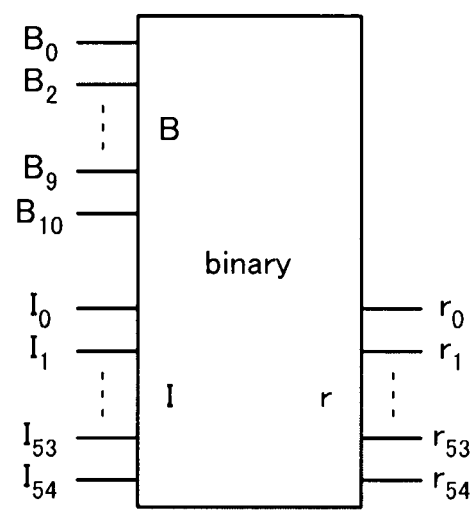
FIG. 29 is a diagram showing a circuit symbol of a to-$2^5$-adic converter circuit core ("binary" circuit block) in the memory system according to the present embodiment.

FIG. 29 shows a circuit symbol of the "binary" circuit block.

As shown in FIG. 29, the "binary" circuit block receives $B_0$-$B_{10}$, $I_0$-$I_{54}$, and provides $r_0$-$r_{54}$.

Figure 30:
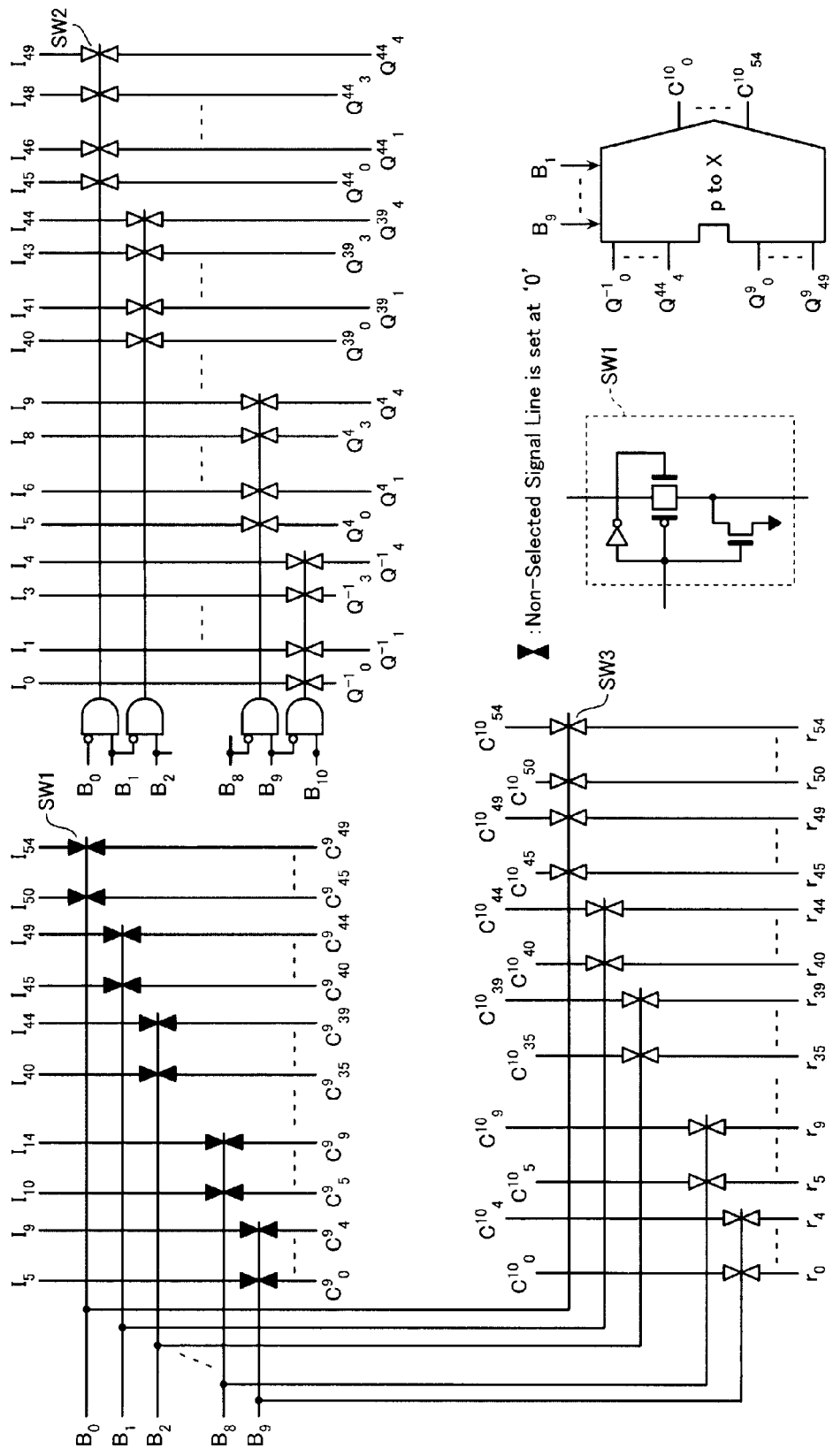
FIG. 30 is a block diagram of the "binary" circuit block in the memory system according to the present embodiment.

FIG. 30 is a block diagram of the "binary" circuit block. The "binary" circuit block includes the "p to X" circuit block in the circuitry for 1 step, and additionally the control switch SW for use in control of the input/output of the "p to X" circuit block.

Specifically, the inputs $I_5$-$I_{54}$ are fed as $C^9_0$-$C^9_{49}$ to the "p to X" circuit block via the control switches SW1. These control switches SW1 are controlled by the timing signals $B_1$-$B_{10}$. Therefore, the control switches SW1 pass $I_5$-$I_{54}$ directly as $C^9_0$-$C^9_{49}$ if B='1' and keep the outputs at '0' independent of the inputs if B='0'.

In addition, the input $I_0$-$I_{49}$ are fed as $Q^{-1}_0$-$Q^{44}_4$ to the "p to X" circuit block via the control switches SW2, respectively. These control switches SW2 are controlled in accordance with $B_{10}\hat{}/B_9$ to $B_1\hat{}/B_0$, respectively. Therefore, the control switch SW2 located between $I_0$ and $Q^{-1}_0$ passes $I_0$ directly as $Q^{-1}_0$ only if $B_{10}$='1', $B_9$='0'.

The outputs $C^{10}_0$-$C^{10}_{54}$ from the "p to X" circuit block turn to $r_0$-$r_{54}$, that is, the outputs from the "binary" circuit block via the control switches SW3. The control switches SW3 are controlled by the timing signals $B_9$-$B_0$. Therefore, the control switches SW3 pass $C^{10}_0$-$C^{10}_{54}$ directly as $r_0$-$r_{54}$ if B='1'.

In accordance with the above circuitry, the "p to X" circuit block responds to each computation step while increasing the bit widths of the input and output 5-bit by 5-bit sequentially. While taking the numerals A on the digits of the 17-adic number from the upper digit sequentially at each computation step, and when all the computation steps are completed, a binary representation of data can be obtained.

As describe earlier, the timing signals $B_0$-$B_{10}$ are the signals that rise in order. In accordance therewith, the paths to the inputs I and outputs r conduct 5-bit by 5-bit from the upper bit.

The numeral A on each digit of the 17-adic number is initially set in the later-described external "A-r" register, and fed to the "A-r" register via the control switch SW3 on/off-controlled by the adjacent timing signal B such that the path switches selectively until the flow enters the next computation step.

The following description is given to the "p-adic to binary" converter unit including the above-described circuits grouped together.

Figure 31:
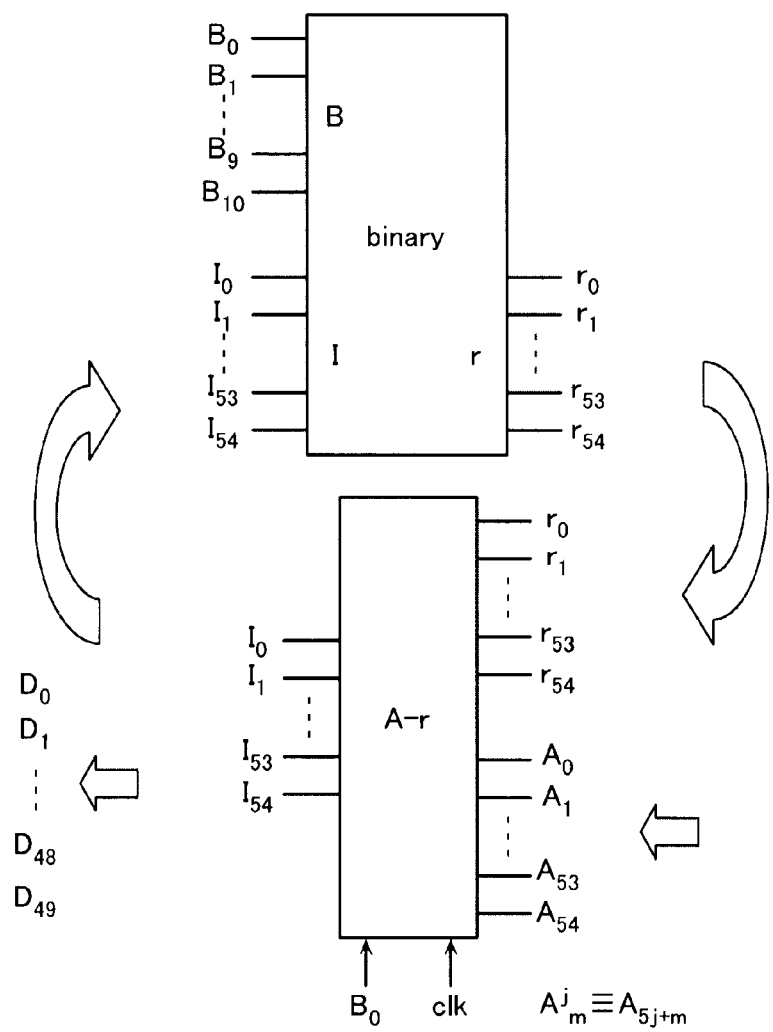
FIG. 31 is a block diagram of a to-$2^5$-adic converter circuit in the memory system according to the present embodiment.

FIG. 31 is a block diagram of the "p-adic to binary" converter unit. The "p-adic to binary" converter unit includes the "binary" circuit block and the "A-r" register coupled thereto.

The "A-r" register is a register controlled by the timing signal $B_0$ and the clock clk and having the inputs $r_0$-$r_{54}$, $A_0$-$A_{54}$ and the outputs $I_0$-$I_{54}$ as shown in FIG. 31.

Figure 32:
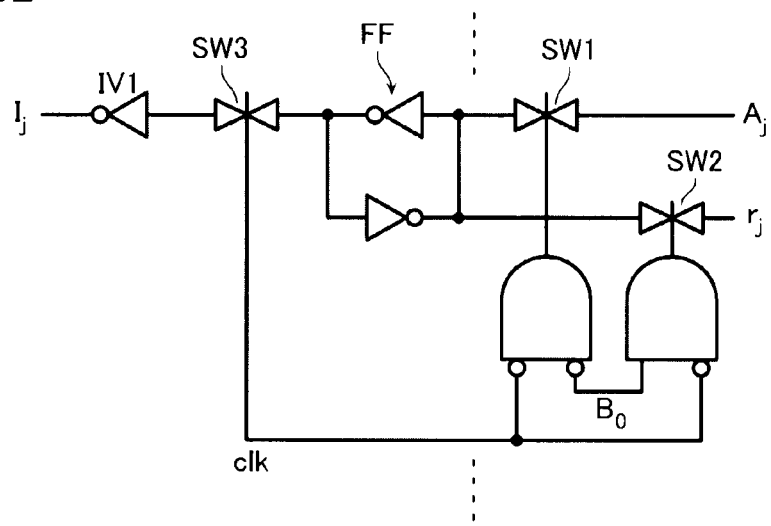
FIG. 32 is a circuit diagram of an "A-r" register in the memory system according to the present embodiment.

FIG. 32 is a circuit diagram of the "A-r" register.

The "A-r" register includes, at every bit, a flip-flop FF composed of 2 inverters. The flip-flop FF receives $A_j$ (j=0-54) via the control switch SW1 and receives $r_j$ via the control switch SW2. On the other hand, the output of the flip-flop FF is connected to an inverter IV1 via the control switch SW3. The output from the inverter IV1 provides $I_j$.

The control switches SW1-SW3 are controlled by the timing signal $B_0$ and the clock clk. Specifically, the control switch SW1 turns on if /clk☐/B0='1', the control switch SW2 if /clk☐B0='1, and the control switch SW3 if clk='1, respectively.

The initial state of the "A-r" register includes the digits $A_0$-$A_{54}$ of the 17-adic number.

Thereafter, after the timing signal $B_0$ rises, $r_j$ taken in sync with the fall of the clock clk is provided as $I_j$ in sync with the rise of the clock clk.

The "A-r" register couples with the "binary" circuit block to advance the computation step at every timing signal $B_j$. The state of variations in each clock is similar to FIG. 20. The clock clk is used to generate ck and further generate the timing signal $B_j$.

After completion of all the computation steps, the "A-r" register holds a binary representation $D_j$ of the input, that is, the p-adic number A.

Thus, preparations for configuring the p-adic NAND flash memory have been made.

Next, the configuration of the memory system according to the present embodiment is described along the flow of data processing.

Data processing in the memory system according to the present embodiment can be executed using a Lee metric code. The methods of data processing include the above-described syndrome converting method, and a Euclidean iterative method. A first embodiment describes a memory system using the syndrome converting method for data processing.

The general principle of the syndrome converting method is as described above. The following case is described with specific numerals such as p=17, ε=4, and δ=10 substituted based on the above-described specification.

Figure 33:
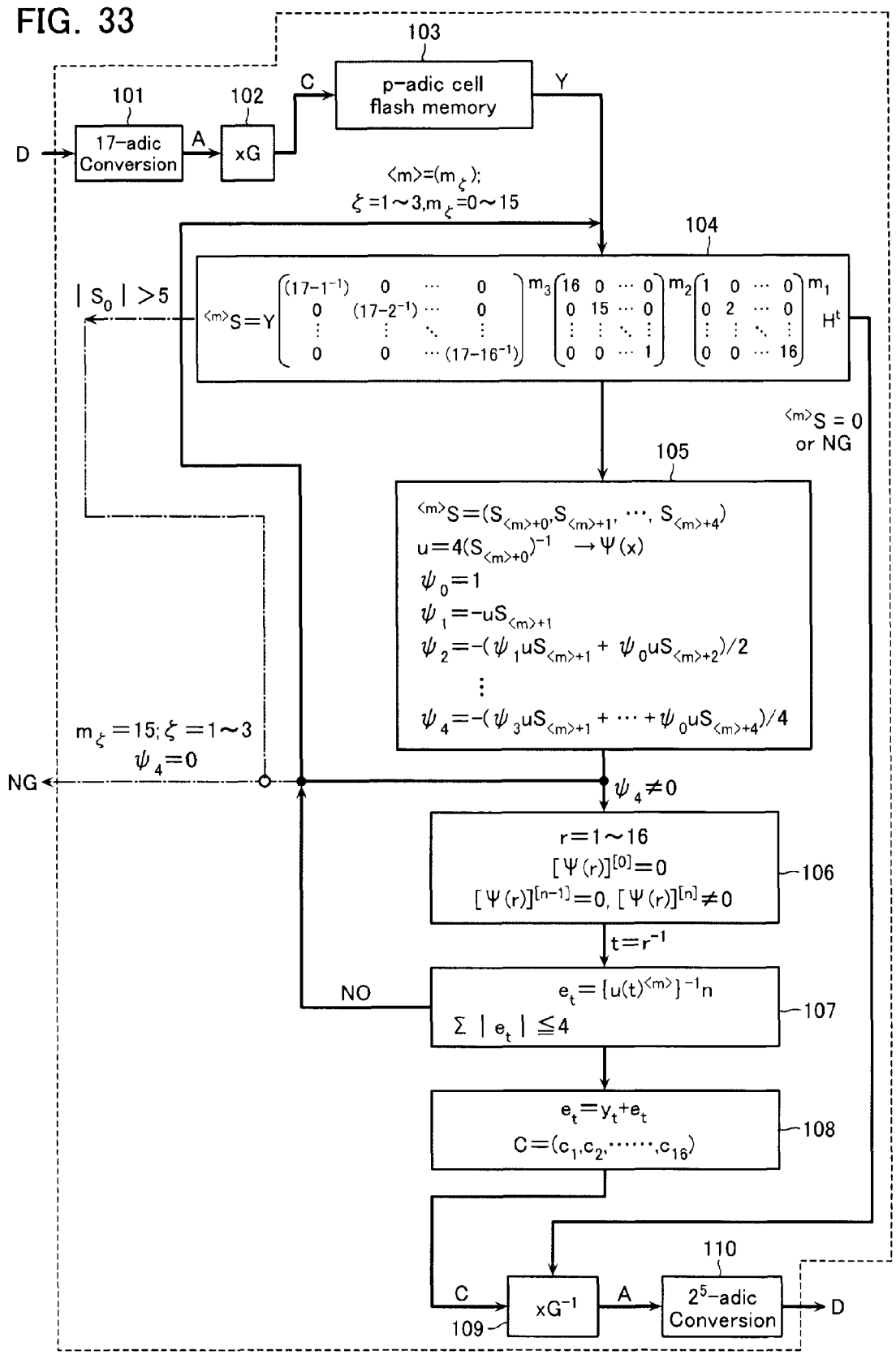
FIG. 33 is a block diagram of the memory system according to the present embodiment.

FIG. 33 is a block diagram showing the configuration of a p-adic memory system.

Data D, that is, binary data to the "binary world" is converted to a 17-adic number at a 17-adic converter unit 101 serving as the entrance to the "p-adic Zp world", and converted to a code in Zp, that is, data A.

The 17-adic converter unit 101 can be composed of the circuits described with reference to FIGS. 10-20, such as the "X to p" circuit block.

Subsequently, an encoder unit 102 brings the data A output from the 17-adic converter unit 101 into action with a generator matrix G, thereby converting the data A to a Lee metric code, that is, a code C.

Subsequently, the code C output from the encoder unit 102 is stored in a p-adic cell flash memory 103.

Subsequently, the code held in p-adic cells is read out of the p-adic cell flash memory 103. The code read out of the p-adic cell flash memory 103 is a code Y (fourth data). The code Y corresponds to the code C, which has been deformed by errors caused when the code C is written in p-adic cells for storage, or while it is stored in the p-adic cells, or when it is read out of the p-adic cells.

The read-out code Y is fed to a syndrome generator unit 104. The syndrome generator unit 104 computes a syndrome $^{<m>}S$ in accordance with Expression 28 using a transpose syndrome matrix $H^t$ and the powers of 3 types of diagonal matrixes.

$$^{<m>}S = Y \begin{bmatrix} (17-1^{-1}) & 0 & \cdots & 0 \\ 0 & (17-2^{-1}) & \cdots & 0 \\ \vdots & \vdots & \ddots & \vdots \\ 0 & 0 & \cdots & (17-16^{-1}) \end{bmatrix}^{m_3}$$

[Expression 28]

-continued $$\begin{bmatrix} 16 & 0 & \cdots & 0 \\ 0 & 15 & \cdots & 0 \\ \vdots & \vdots & \ddots & \vdots \\ 0 & 0 & \cdots & 1 \end{bmatrix}^{m_2} \begin{bmatrix} 1 & 0 & \cdots & 0 \\ 0 & 2 & \cdots & 0 \\ \vdots & \vdots & \ddots & \vdots \\ 0 & 0 & \cdots & 16 \end{bmatrix}^{m_1} H^t$$

If $^{<m>}S=0$, no error arises. Then, for the purpose of achieving the final processing step in the "p-adic Zp world", the code Y is fed to a decoder unit 109. In the case of $^{<m>}S \ne 0$, on the other hand, if the first component $S_0$ of $^{<m>}S$ in the case of $<m>=(0, 0, 0)$ satisfies $|S_0|>5$, reliable error correction is impossible. Accordingly, NG signal is provided and the error-containing code Y is fed to the decoder unit 109. In other cases, the syndrome $^{<m>}S$ is fed to a solution searching polynomial generator unit 105.

The solution searching polynomial generator unit 105 derives a solution searching polynomial $\Psi(x)$ from the syndrome $^{<m>}S$ and, if the coefficient at the 4th degree is $\phi_4 \ne 0$, then it feeds the $\phi(x)$ to a Hasse differential polynomial generator unit 106. In the case of $\phi_4=0$, on the other hand, the step of seeking a new syndrome $^{<m>}S$ with changed $<m>$ is repeated to seek a polynomial $\Psi(x)$ again. If the coefficient at the 4th degree of $\Psi(x)$ is still $\phi_4=0$ even after repetitions up to $<m>=(15, 15, 15)$, error correction is impossible. Accordingly, NG signal is provided and the error-containing code Y is fed to the decoder unit 109.

The Hasse differential polynomial generator unit 106 derives a Hasse differential polynomial from the input $\Psi(x)$, then computes a root r and the multiplicity n of the root, and feeds them as $t=r^{-1}$ to an error quantity computing unit 107.

The error quantity computing unit 107 derives the positional coordinates of the error-caused code word from $t=r^{-1}$ and derives the error quantity $e_t$ ($=\{u(t)^{<m>}\}^{-1}n$) from n to obtain the total quantity, $\Sigma|e_t|$, of Lee metrics of the error quantity. If $\Sigma|e_t| \le 4$, the flow shifts processing to a code restorer unit 108 in order to restore the code C of the Lee metric code. If $\Sigma|e_t| \ge 5$, it is dealt as uncorrectable because there is the possibility of failed correction. In this case, the flow repeats processing on and after the syndrome generator unit 104 for the next $<m>$. In the case of $<m>=(15, 15, 15)$, error correction is impossible. Accordingly, NG signal is provided and the error-containing code Y is fed to the decoder unit 109.

The code restorer unit 108 restores the code C ($c_1, c_2, \ldots, c_3$) in accordance with $c_t=y_t-e_t$. The restored code C is fed to the decoder unit 109.

The decoder unit 109 executes an inverse transformation of the generator matrix G to the code C to obtain a 17-adic code A. This code A is fed to a $2^5$-adic converter unit 110.

The $2^5$-adic converter unit 110 converts the code A to a $2^5$-adic number represented in binary, which is provided as the restored binary data D.

The $2^5$-adic converter unit 110 can be composed of the circuits described with reference to FIGS. 21-32, such as the "p to X" circuit block.

<Generation of Lee Metric Code, Error Correction, and Restoration of Lee Metric Code>

Next, the procedures of data processing described with reference to FIG. 33 are detailed.

Hereinafter, with respect to an ECC operation in the "p-adic Zp world", the procedure of encoding data that is input as Zp data to the memory system, and the procedures of decoding the code read out of the memory system to finally obtain the data A are arranged.

The procedure of encoding is as follows.

Figure 34:
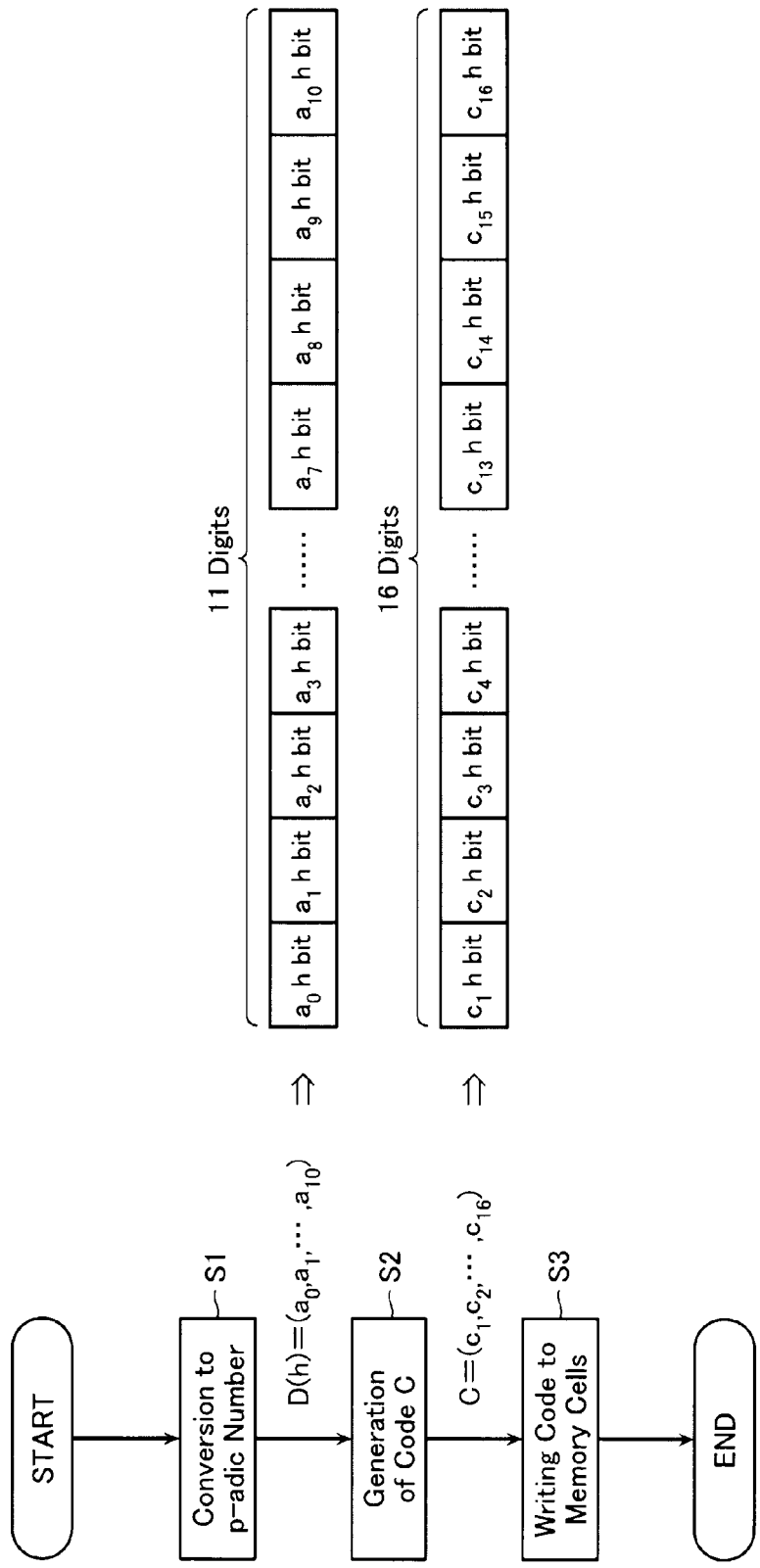
FIG. 34 is a flowchart of encoding in the memory system according to the present embodiment.

At the start, the input data D is converted at the "binary to p-adic" converter unit to a 17-adic-represented, 11-digit data word D(h) shown in Expression 29 (S1 in FIG. 34).

$$D(h) = (a_0, a_1, \ldots, a_{10}) \quad \text{[Expression 29]}$$

Subsequently, the data D is multiplied by the generator matrix G to obtain 16 code word components $c_1$-$c_{16}$ of the code C (S2 in FIG. 34). The value of each code word component is as shown in Expression 30.

$$c_j = \sum_{i=0}^{10} (j^{i+1}) a_i \quad \text{[Expression 30]}$$

Finally, the code word component $c_j$ is stored in memory cells (S3 in FIG. 34). Each code word component can be processed as a 5-bit binary representation. In this case, as threshold levels corresponding to the p-adic cells, levels are set as they are representations of numerals in Zp.

The procedure of decoding the code Y read out of the p-adic cell array is as follows.

Figure 35:
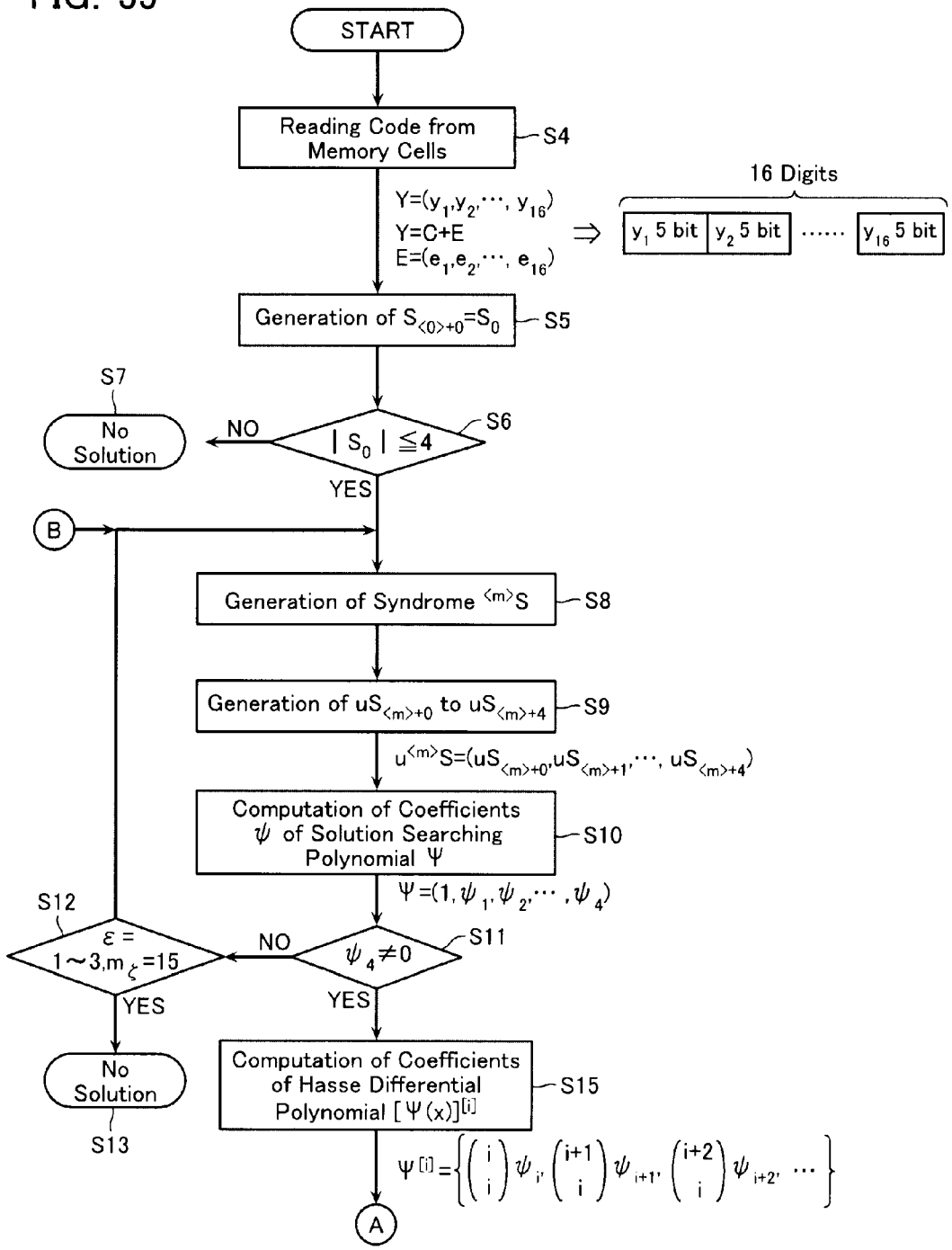
FIG. 35 is a flowchart of decoding in the memory system according to the present embodiment.

At the start, the code Y read out of the p-adic cell array is read out (S4 in FIG. 35). The code Y is configured as shown in Expression 31 where $e_j$ denotes an error on the code word symbol located at the position j in the code Y.

$$Y = (y_1, y_2, \ldots, y_{16})$$

$$Y = C + E, E = (e_1, e_2, \ldots, e_{16}) \quad \text{[Expression 31]}$$

Subsequently, a syndrome is computed from the code Y (S5 in FIG. 35). With a substitution of $(j)^{<m>} = (p-j^{-1})^{m3} (p-j)^{m2} j^{m1}$ and a substitution of $<m> = (m1, m2, m3)$, a syndrome $^{<m>}S = (S_{<m>+0}, S_{<m>+1}, \ldots, S_{<m>+4})$ is derived from $^{<m>}Y = \{(1)^{<m>} y_1, (2)^{<m>} y_2, (3)^{<m>} y_3, \ldots, (15)^{<m>} y_{n-1}, (16)^{<m>} y^n\}, ^{<m>}S = ^{<m>}YH$.

Subsequently, as $S_{<0>+0} = S_0$ in the case of $<m> = 0$, the total quantity of Lee metrics of errors cannot reach 5 or higher if $|S_0| \leq 4$ and accordingly the flow starts the following Procedures 2 and 3. In the case of $|S_0| > 4$, as the total quantity of Lee metrics of errors reaches 5 or higher, the flow determines that it is uncorrectable and terminates solution searching as no solution (S6, S7 in FIG. 35).

(Procedure 1) For $<m>$ of which components are changed in order, a syndrome $^{<m>}S = (S_{<m>+0}, S_{<m>+1}, \ldots, S_{<m>+4})$ is derived from Expression 32 (S8 in FIG. 35).

$$S_{(m)+l} = \sum_{j=1}^{16} (j)^{(l)} y_j = \sum_{j=1}^{16} (j)^{(l)} e_j \quad \text{[Expression 32]}$$

(Procedure 2) For $\epsilon = 4$, that is, the upper limit of the number of the correctable code word components, $u = 4 (S_{<m>+0})^{-1}$ is computed first, and then a syndrome $u^{<m>}S = (uS_{<m>+0}, uS_{<m>+1}, \ldots, uS_{<m>+4})$ is derived from the syndrome obtained in Procedure 1 (S9 in FIG. 35). The coefficients $\phi_j$ of the solution searching polynomial $\Psi(x)$ are computed from the syndrome $u^{<m>}S$ in turn using Expression 33 (S10 in FIG. 35).

$$\Psi(x) = 1 + \sum_{j=1}^{4} \psi_j x^j, \psi_j = -j^{-1} \sum_{i=1}^{j} \psi_{j-1} u S_{(m)+i} \quad \text{[Expression 33]}$$

If the degree of $\Psi(x)$ is equal to 4, that is, $\phi_4 \neq 0$, then the flow advances to Procedure 3 to obtain a solution (S11 in FIG. 35). In the case of $\phi_4 = 0$, on the other hand, the flow puts $<m>$ forward to repeat (Procedure 1) (S12 in FIG. 35). In the case of $\phi_4 = 0$ and $m_\xi = 15$ ($\xi = 1$-3), the flow abandons error correction as no solution (S13 in FIG. 35).

(Procedure 3) If it is found in Procedure 2 that a solution can be obtained, processing on and after Procedure 3 is proceeded to obtain the solution.

The process seeks coefficients of the Hasse differential polynomial required for obtaining the multiplicity of the solution of the polynomial $\Psi(x)$ sought in Procedure 2 (S15 in FIG. 35). The coefficients $\phi_j$ obtained in Procedure 2 can be multiplied by a series of binomial coefficients $_jC_i$ to obtain vectors $\Psi^{[i]} = (_iC_i \phi_i, _{i+1}C_i \phi_{i+1}, \ldots)$ of the coefficients of the Hasse differential polynomial.

$$[\Psi(x)]^{[i]} = \sum_{j=i} \binom{j}{i} \psi_j x^{j-i} \quad \text{[Expression 34]}$$

(Procedure 4) The Hasse differential polynomial obtained in Procedure 3 is given a substitution of the elements 1-16 in Zp to seek an element r that makes zero the 0-th degree differential polynomial ($= \Psi(x)$). Subsequently, as shown in Expression 35, such the degree n is sought that makes an (n−1)-th differential polynomial zero and an n-th differential polynomial non-zero, for each element r (S16 in FIG. 35).

$$[\Psi(r)]^{[0]} = \Psi(r) = 0,$$

$$[\Psi(r)]^{[n-1]} = \sum_{j=n-1} \binom{j}{n-1} \psi_j r^{j-n+1} = 0, \quad \text{[Expression 35]}$$

$$[\Psi(r)]^{[n]} = \sum_{j=n} \binom{j}{n} \psi_j r^{j-n} \neq 0$$

The obtained r is an inverse element of the position number t of the error-caused code component, and the corresponding n is the quantity converted from the caused error quantity $e_t$. This process is executed over all the elements r.

Figure 36:
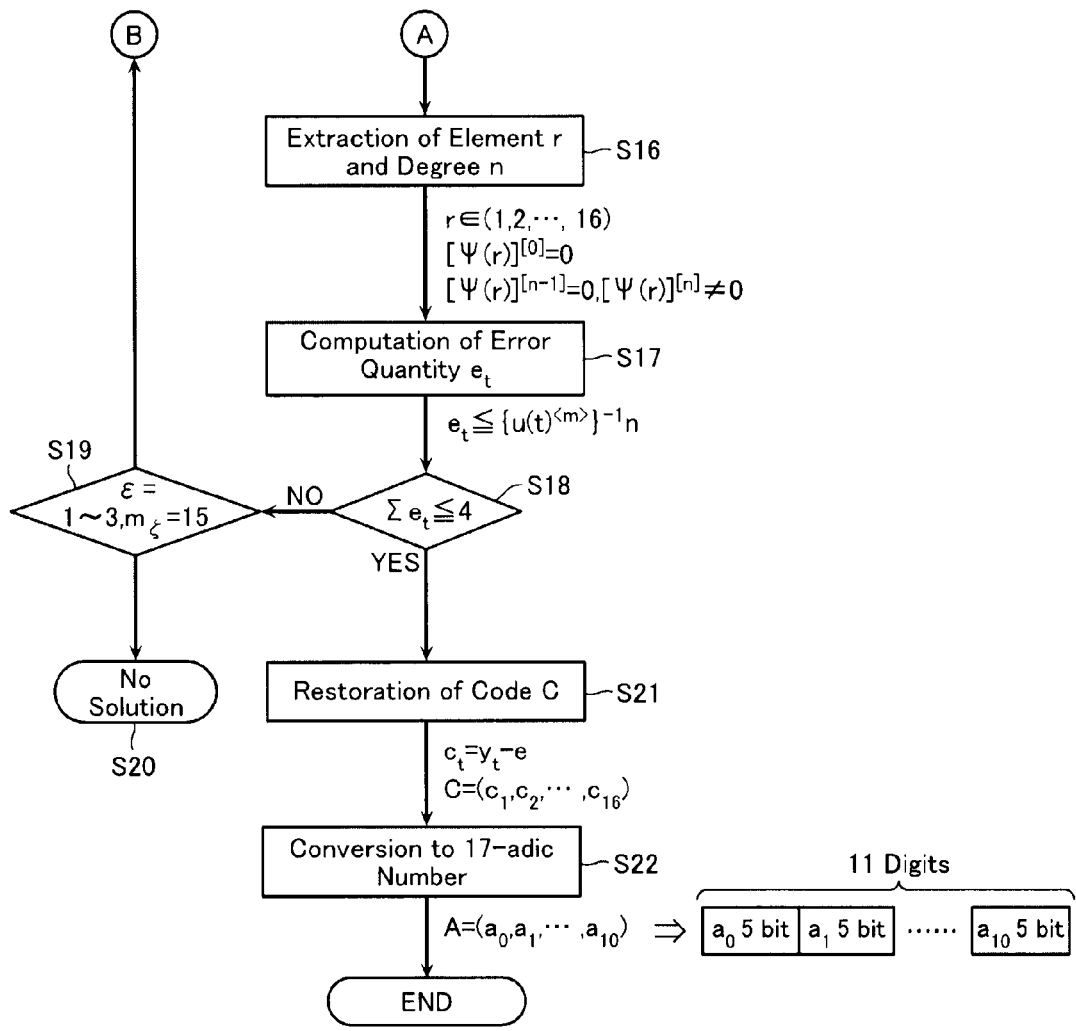
FIG. 36 is a flowchart of decoding in the memory system according to the present embodiment.

(Procedure 5) In Procedure 5, the error quantity is obtained through conversion from the multiplicity n of the solution (S17 in FIG. 35). The position number of the error-caused code word component is $t = r^{-1}$, and an inverse transformation of the conversion executed to obtain the polynomial for obtaining the solution is applied to n. As there is a relation of $u(t)^{<m>} e_t = n$, the original error quantity $e_t$ can be obtained from n if $e_t = (u(t)^{<m>})^{-1} n$. The possibility of failed correction of errors is confirmed here. In the case of $\Sigma |e_t| \leq 4$, the flow subtracts the error quantity $e_t$ from the symbol value $y_t$ of the code Y read out of the memory cells to obtain a symbol value $c_t$ of the corrected code C, and shifts processing to Procedure 6 (S18, S21 in FIG. 36). In the case of $\Sigma |e_t| > 4$, on the other hand, there is the possibility of failed correction. Accordingly, the flow changes the next m and repeats processing from Procedure 1 (S19 in FIG. 36). Even in the case of $m_\xi = 15$ ($\xi$=1-3), however, if the flow fails to shift processing to Procedure 6, it abandons error correction as no solution (S20 in FIG. 36).

Until now, the correct code C stored in the p-adic cell array has been obtained. Accordingly, binary data input to the p-adic memory system is sought in accordance with Procedure 6.

(Procedure 6) A pluralistic system of linear equations of a relation AG=C among the codes C and A and the generator matrix G is applied to obtain 11 elements $a_0$-$a_{10}$ in Zp and A (=$a_0, a_1, \ldots, a_{10}$). Thus, 11 elements $a_0$-$a_{10}$ in Zp can be obtained. The obtained elements $a_0$-$a_{10}$ are used to create data A (=$a_0, a_1, \ldots, a_{10}$) therefrom (S22 in FIG. 36).

Thus, data processing in the "p-adic Zp world" is finished. Subsequently, a conversion is made to restore the data A to binary data at the exit of the "p-adic Zp world". The data A is converted from the 11-digit, 17-adic representation to a 10-digit, $2^5$-adic representation such that a numeral on each digit of 10 digits is represented in binary. This provides the binary data D input to the p-adic memory system.

Thus, restoration of data is completed.

Next, a computing circuit operative to seek the product of Zp is described. Hereinafter, the computing circuit is referred to as the "X Zp" circuit block.

Figure 37:
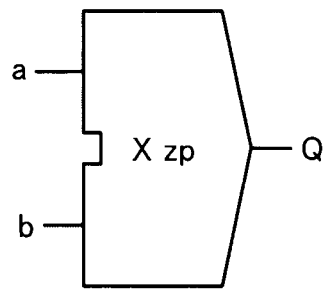
FIG. 37 is a diagram showing a circuit symbol of a multiplier circuit for deriving the product of elements in Zp ("X Zp" circuit block) in the memory system according to the present embodiment.

FIG. 37 is a diagram showing a circuit symbol of the "X Zp" circuit block. FIG. 38(A) is a block diagram of the "X Zp" circuit block. FIGS. 38(B) and (C) are diagrams schematically showing operational processing in the "X Zp" circuit block.

The "X Zp" circuit block is roughly divided into a circuit for processing a computation step group in the first half, and a circuit for processing a computation step group in the second half.

The circuit for processing the computation step group in the first half includes an AND gate G1, and 4 "5 bit AD mod 17" circuit blocks.

The AND gate G1 yields the logical product of the i-th bit (i=0-4) of the multiplied numeral a and the j-th bit (j=0-4) of the multiplying numeral b, and provides it as $M_{ij}$.

The "5 bit AD mod 17" circuit block is a circuit operative to seek the sum of 2 numerals in Zp modulo 17. The "5 bit AD mod 17" circuit block has the inputs $A_0$-$A_4$ and $B_0$-$B_4$ and the outputs $Q_0$-$Q_4$. The details are described later.

The 1st "5 bit AD mod 17" circuit block <1> receives $M_{10}$-$M_{40}$, '0', $M_{01}$-$M_{41}$ at $A_0$-$A_3$, $A_4$ and $B_0$-$B_4$, and provides $Q^0_0$-$Q^0_4$ from $Q_0$-$Q_4$, respectively.

The 2nd "5 bit AD mod 17" circuit block <2> receives $Q^0_1$-$Q^0_4$, that is, the output from the "5 bit AD mod 17" circuit block <1>, '0', and $M_{02}$-$M_{42}$ at $A_0$-$A_3$, $A_4$ and $B_0$-$B_4$, and provides $Q^1_0$-$Q^1_4$ from $Q_0$-$Q_4$, respectively.

As described above, the circuit for processing the computation step group in the first half includes the "5 bit AD mod 17" circuit block <1> through the "5 bit AD mod 17" circuit block <4>, of which inputs and outputs are connected in order.

The circuit for processing the computation step group in the second half includes 4 "6 bit mod 17" circuit blocks. The "6 bit mod 17" circuit block is the circuit shown in FIGS. 25 and 26.

The 1st "6 bit mod 17" circuit block <1> receives $Q^2_0$ and $Q^3_0$-$Q^3_4$ at $A_0$ and $A_1$-$A_5$, and provides $Q^4_0$-$Q^4_4$ from $Q_0$-$Q_4$, respectively.

The 2nd "6 bit mod 17" circuit block <2> receives $Q^1_0$ and $Q^4_0$-$Q^4_4$ at $A_0$ and $A_1$-$A_5$, and provides $Q^5_0$-$Q^5_4$ from $Q_0$-$Q_4$, respectively.

As described above, the circuit for processing the computation step group in the second half includes the "6 bit mod 17" circuit block <1> through the "6 bit mod 17" circuit block <4>, of which inputs and outputs are connected in order.

All the circuits operate not in sync with clocks and decide the output Q when the input $M_{ab}$ is given.

Mention is made here of the circuit scale of the "X Zp" circuit block.

If p=17, h=5 as in the present example, the "X Zp" circuit block can be configured with 4"5 bit AD mod 17" circuit blocks and 4"6 bit mod 17" circuit blocks.

There is a requirement for such "X Zp" of 8 circuit blocks.

Figure 38:
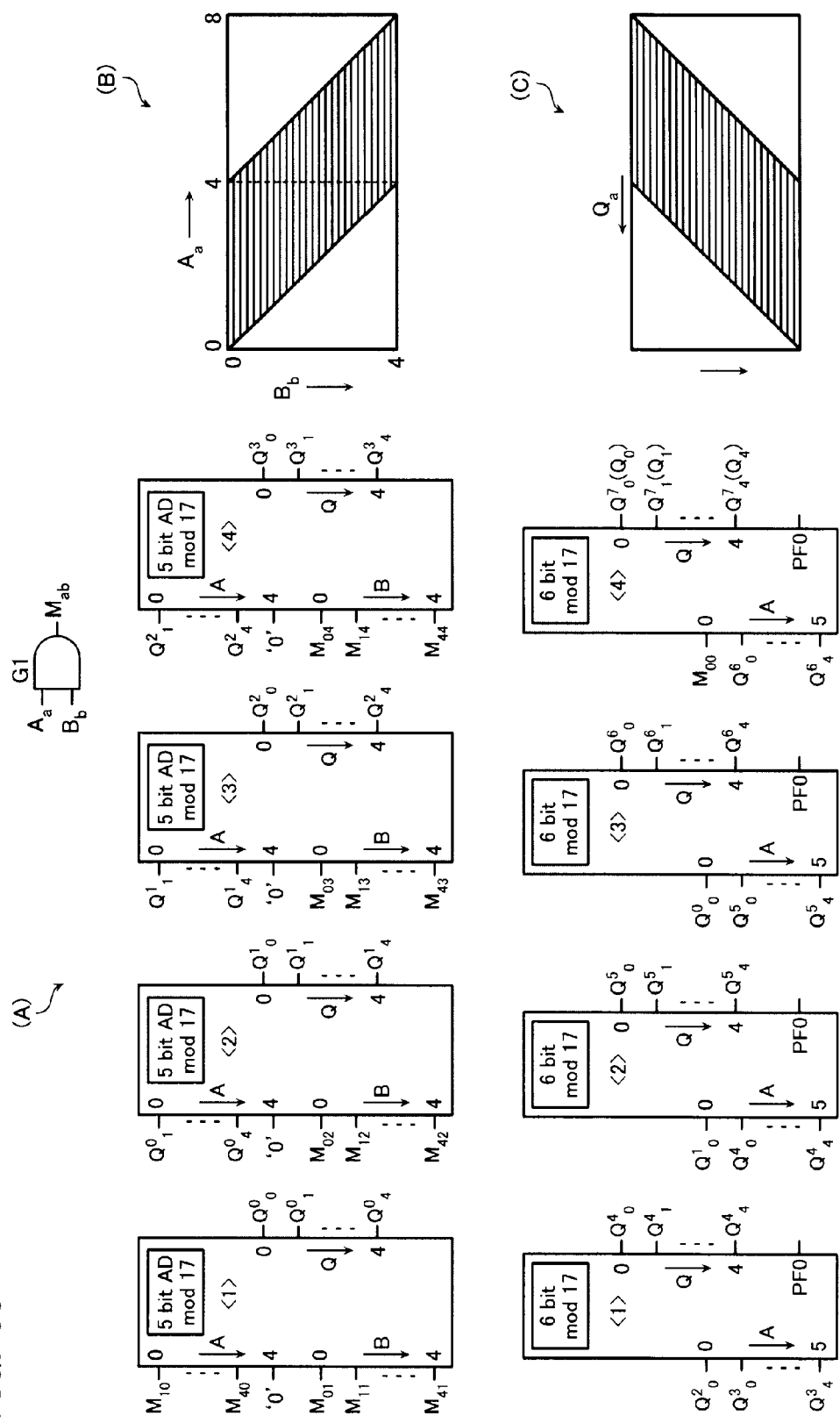
FIG. 38 is a block diagram of the "X Zp" circuit block in the memory system according to the present embodiment.

Next, the "5 bit AD mod 17" circuit block shown in FIG. 38 is described in detail.

Figure 39:
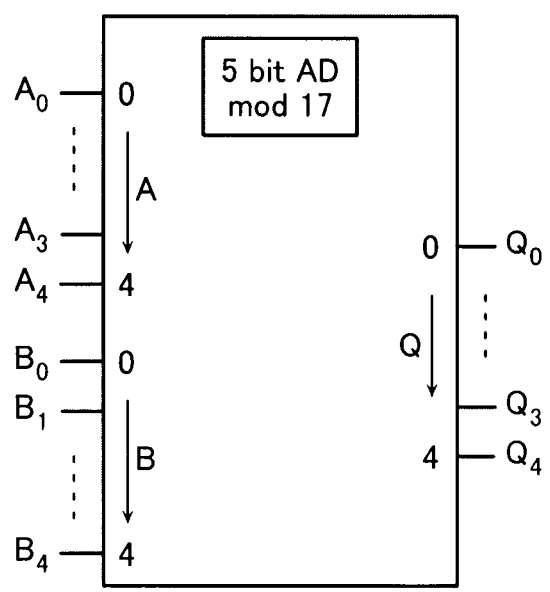
FIG. 39 is a diagram showing a circuit symbol of an operating circuit element for deriving the sum of elements in Zp ("5 bit AD mod 17" circuit block) in the memory system according to the present embodiment.

FIG. 39 shows a circuit symbol of the "5 bit AD mod 17" circuit block.

The "5 bit AD mod 17" circuit block seeks the sum of numerals a and b input from A and B, and provides the residue modulo a prime p of the resultant sum, from Q.

In the case of h=5, p=17, the numerals a, b and the binary representation Q of the residue establish a relation shown in Expression 36.

$$a = A_0 + A_1 2 + A_2 2^2 + A_3 2^3 + A_4 2^4$$

$$b = B_0 + B_1 2 + B_2 2^2 + B_3 2^3 + B_4 2^4$$

$$p = 17 = 2^4 + 1, /p = 2^5 - p = 2^3 + 2^2 + 2^1 + 1 = 15$$

$$a + b \equiv Q \pmod{17} (a + b = Q + PF0 \times 17)$$

$$Q = Q_0 + Q_1 2 + Q_2 2^2 + Q_3 2^3 + Q_4 2^4 \quad \text{[Expression 36]}$$

Figure 40:
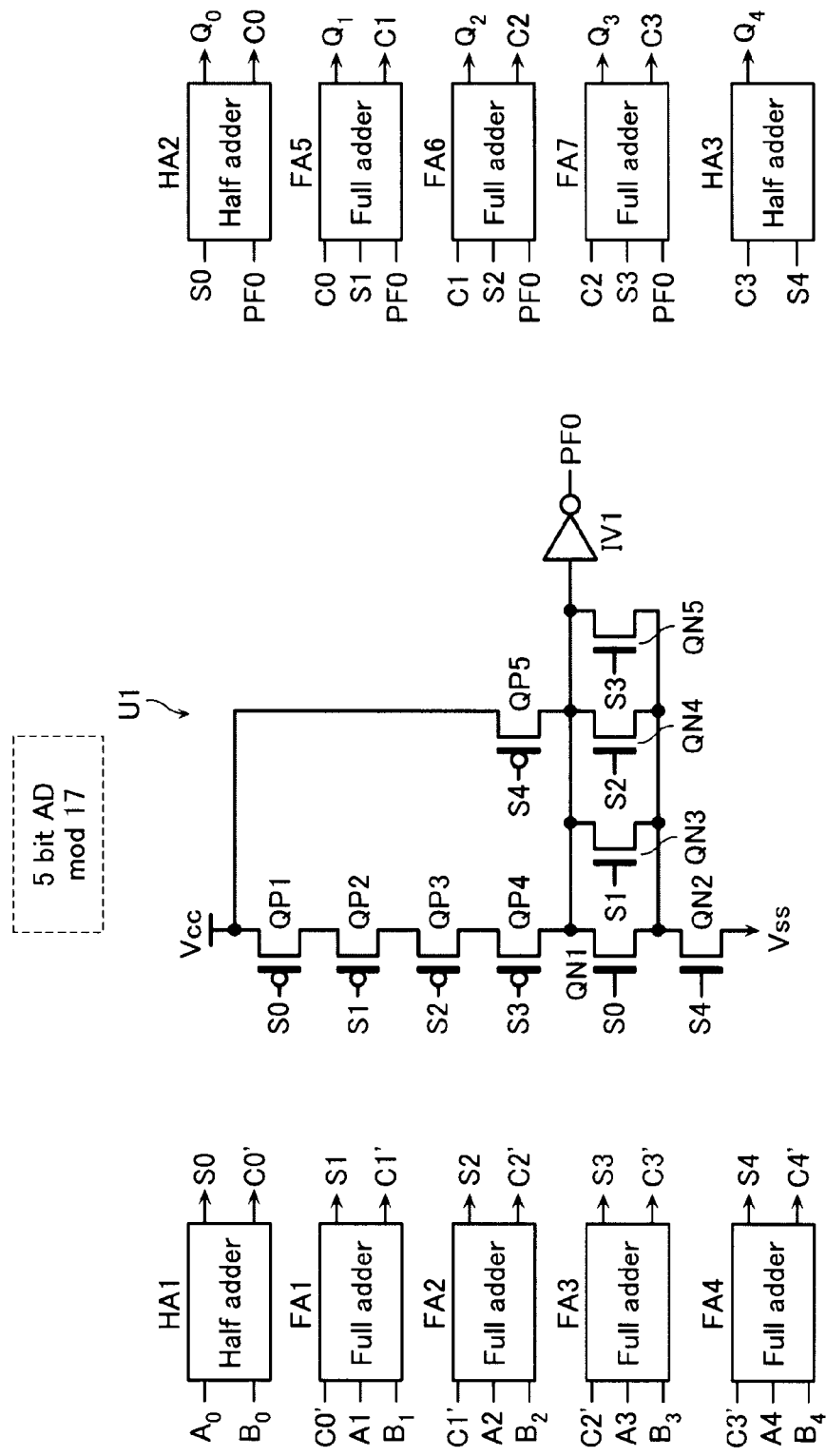
FIG. 40 is a block diagram of the "5 bit AD mod 17" circuit block in the memory system according to the present embodiment.

FIG. 40 is a circuit diagram of the "5 bit AD mod 17" circuit block.

The "5 bit AD mod 17" circuit block comprises a PF0 generator unit U1, 3 half adders HA1-HA3, and 7 full adders FA1-FA7.

The PF0 generator unit U1 includes serially connected PMOS transistors QP1-QP4 and NMOS transistors QN1 and QN2 between a Vcc terminal supplied with a certain voltage and a Vss terminal. These transistors QP1, QP2, QP3, QP4, QN1 and QN2 are controlled by S0, S1, S2, S3, S0 and S4, respectively.

The PF0 generator unit U1 additionally includes a PMOS transistor QP5, 3 NMOS transistors QN3-QN5, and an inverter IV1.

The transistor QP5 is connected between the source of the transistor QP1 and the drain of the transistor QP4 in parallel. The transistors QN3-QN5 are connected between the source and drain of the transistor QN1 in parallel. These transistors QP5, PN3, QN4 and QN5 are controlled by S4, S1, S2 and S3, respectively. The inverter IV1 has an input connected to the sources of the transistors QN1, QN3-QN5. The output from the inverter IV1 provides a carry PF0.

The half adder HA1 has inputs $A_0$ and $B_0$, an output S0, and a carry output C0'. The full adder FA1 has inputs $A_1$ and $B_1$, a carry input C0', an output S1, and a carry output C1'. The full adder FA2 has inputs $A_2$ and $B_2$, a carry input C1', an output S2, and a carry output C2'. The full adder FA3 has inputs $A_3$ and $B_3$, a carry input C2', an output S3, and a carry output C3'. The full adder FA4 has inputs $A_4$ and $B_4$, a carry input C3', an output S4, and a carry output C4'. The half adder HA2 has inputs S0 and PF0, and an output $Q_0$, and a carry output C0. The full adder FA5 has inputs S1 and PF0, a carry input C0, an output $Q_1$, and a carry output C1. The full adder FA6 has inputs S2 and PF0, a carry input C1, an output $Q_2$, and a carry output C2. The full adder FA7 has inputs S3 and PF0, a carry input C2, an output $Q_3$, and a carry output C3. The half adder HA3 has inputs C3 and S4, and an output Q.

In accordance with the above configuration, the PF0 generator unit U1 determines if the sum of binaries A and B input to the "5 bit mod 17" circuit block is equal to or higher than 17. If the sum of binaries A and B is equal to or higher than 17, then the half adders HA1-HA3 and the full adders FA1-FA7 are used to add 15, a complement of 17 in 5-bit binary, to the sum of A and B in order to subtract 17 from the sum of A and B.

Hereinafter, the circuitry of the blocks in the "p-adic Zp world" is described with specific examples shown.

An example of circuitry of the encoder unit 102 is described below.

FIG. 41(A) is a block diagram of a circuit for converting a code word A in Zp to a Lee metric code C. FIG. 41(B) is a diagram showing double clocks ck and cl for use in control of the circuit shown in FIG. 41(A).

As shown in FIG. 41(B), the clocks cl are pulses that rise after the rise of ck with delays, and the clocks cl, 11 in total, $cl_0$-$cl_{10}$, rise sequentially at every clock ck. After $cl_{10}$ rises, the next clock ck rises with a delay. The same waveforms repeat from $ck_0$ to $ck_{17}$.

Among these clocks ck and cl, ck is applied to control a "Counter (1 to 6)" circuit block and a "Ri (1-16)" register unit, and cl to control a "Ro (0-16)" register unit and a "Rgstr" register.

The "Counter (1 to 6)" circuit block is a circuit having an initial state of 0. It starts counting the number of clocks again at every rise of the clock ck and provides the number. Namely, of $ck_j$ (j=1-16), it provides j to an "X k-times" circuit block at the rise of $ck_j$.

The "Ri (1-16)" register unit includes registers operative to store components $c_j$ of the code word C and capable of storing 16 numerals in total. The "Ri (1-16)" register unit stores numerals in the individual registers sequentially in sync with the timing of the rise of ck. Namely, data, that is, the element $c_j$ is taken into the register at the timing of the rise of $ck_{j+1}$. At the rise of $ck_{17}$, 16 elements $c_j$ are taken in the registers. In a word, the code C can be thus stored.

The "X k-times" circuit block is circuit that multiplies the input by the output at every rise of the clock cl. The "X k-times" circuit block multiplies the output by the input j at every rise of cl, 11-times in total. Namely, the rises of $cl_i$ (i=0-10) bring the output from the "X k-times" circuit block to $(j)^{i+1}$. This output is fed to the "X Zp" circuit block.

The "Ro (0-10)" register unit includes registers, which can store 11 numerals and, in the initial state, store 11 components $a_0$-$a_{10}$ of the code A. The "Ro (0-10)" register unit receives the clocks cl, and provides the components $a_0$-$a_{10}$ of the code A in order at every rise of the clock cl. Namely, on receipt of $cl_i$ (i=0-10), it provides $a_i$.

The "X Zp" circuit block is a circuit operative to execute a multiplication of the input in Zp. The "X Zp" circuit block receives the output $(j)^{i+1}$ from the "X k-times" circuit block and the output $a_i$ from the "Ro (0-10)" register unit at every clock $cl_i$, and provides $(j)^{i+1}a_i$. The output numerals $(j)^{i+1}a_i$ are summed in a combination of the "5 bit AD mod 17" circuit block and the "Rgstr" register.

Figure 41:
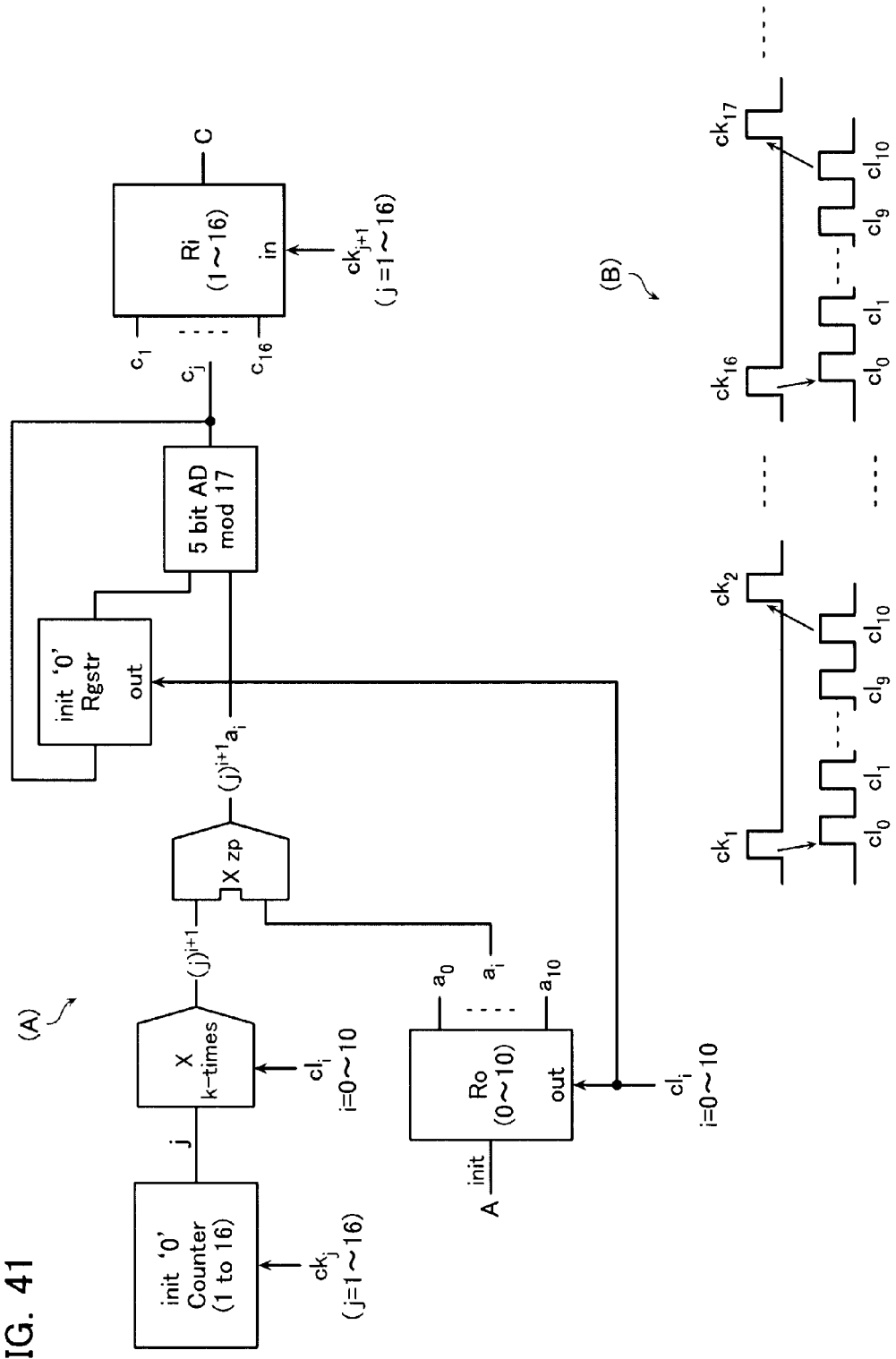
FIG. 41 is a block diagram of a circuit for deriving a code component to be stored in a memory in the memory system according to the present embodiment.

The "5 bit AD mod 17" circuit block is a circuit that seeks the sum of 2 input numerals modulo 17. On the other hand, the "Rgstr" register is a register having an initial state of 0. It blocks any input from the "5 bit AD mod 17" circuit block at every input of the clock cl and feeds the self-holding contents to the "5 bit AD mod 17" circuit block. The connection of the "5 bit AD mod 17" circuit block with the "Rgstr" register as shown in FIG. 41 allows the previous output numeral to be added to a numeral output from a new "X Zp" circuit block at every input of the clock cl. Namely, when the clock $cl_0$-$cl_{10}$ rises, the component $c_j$ of C after the conversion of the code A to the Lee metric code is provided in the cycle of the clock $ck_j$. This is held in the "Ri (1-16)" register unit at the top in the cycle of the next $ck_{j+1}$. Thus, the code C converted from the code A can be obtained.

The "X k-times" circuit block shown in FIG. 41 is described.

Figure 42:
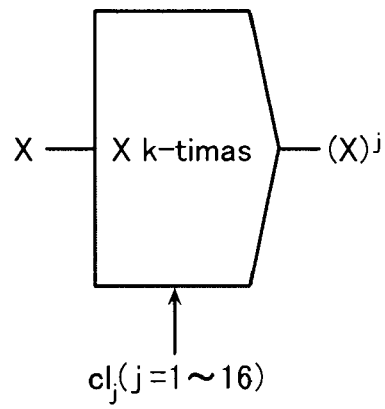
FIG. 42 is a diagram showing a circuit symbol of a circuit for deriving the cumulative sum of elements in Zp ("X k-times" circuit block) in the memory system according to the present embodiment.
Figure 43:
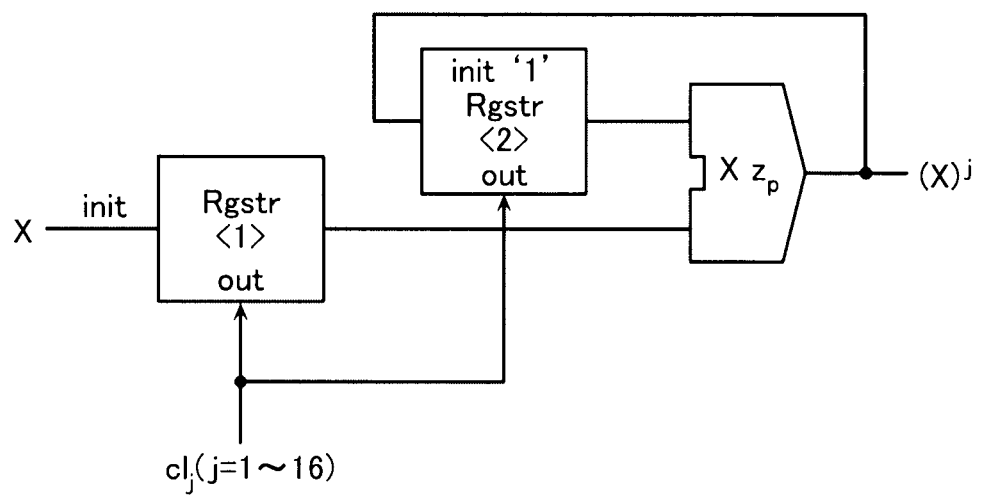
FIG. 43 is a block diagram of the "X k-times" circuit block in the memory system according to the present embodiment.

FIG. 42 is a diagram showing a circuit symbol of the "X k-times" circuit block. FIG. 43 is a block diagram of the "X k-times" circuit block.

The "X k-times" circuit block is a circuit operative to compute a power $(X)^j$ of the input X, which is controlled by the clock $cl_j$ (j=1-16) as shown in FIG. 42.

The "X k-times" circuit block includes an "X Zp" circuit block, and a "Rgstr" register <1> and a "Rgstr" register <2> operable in sync with the clock cl as shown in FIG. 43.

The "Rgstr" register <1> has an input connected to X, and an output connected to one output of the "X Zp" circuit block. The "Rgstr" register <2> has an input connected to the output of the "X k-times" circuit block X, and an output connected to one input of the "X k-times" circuit block. The "Rgstr" register <2> holds '1' in the initial state.

In accordance with this circuitry, the "X k-times" circuit block takes its own output with a 1-cycle delay to obtain the product of the input X and the output $(X)^j$.

The output $(X)^j$ is multiplied cumulatively by the input X at every input of the clock cl. The data X is set in the "Rgstr" register <1> before the clock $cl_j$ (j=1-k) rises, and the "Rgstr" register <2> having an initial state of '1' is brought into sync therewith, thereby obtaining $(X)^j$ at the j-th $cl_j$.

An example of circuitry of the syndrome generator unit 104 is described below.

First, a circuit for seeking component elements of the syndrome $^{<m>}S$ is described.

Scanning of <m>=(m1, m2, m3) is executed over the components from 1 to 15 each. When each <m> is given, the corresponding component of the syndrome is computed. An equation required for operational processing of the component of the syndrome is shown in Expression 37.

$$^{\langle m\rangle}S = Y \begin{bmatrix} (17-1^{-1}) & 0 & \cdots & 0 \\ 0 & (17-2^{-1}) & \cdots & 0 \\ \vdots & \vdots & \ddots & \vdots \\ 0 & 0 & \cdots & (17-16^{-1}) \end{bmatrix}^{m_3} \quad [\text{Expression 37}]$$

$$\begin{bmatrix} 16 & 0 & \cdots & 0 \\ 0 & 15 & \cdots & 0 \\ \vdots & \vdots & \ddots & \vdots \\ 0 & 0 & \cdots & 1 \end{bmatrix}^{m_2} \begin{bmatrix} 1 & 0 & \cdots & 0 \\ 0 & 2 & \cdots & 0 \\ \vdots & \vdots & \ddots & \vdots \\ 0 & 0 & \cdots & 16 \end{bmatrix}^{m_1} H^t$$

$$S_0 = \sum_{j=1}^{16} y_j = \sum_{j=1}^{16} e_j$$

$$S_{\langle m\rangle+1} = \sum_{j=1}^{16} (17-j^{-1})^{m_3}(17-j)^{m_2}(j)^{m_1}(j)^t y_j =$$

$$\sum_{j=1}^{16} (17-j^{-1})^{m_3}(17-j)^{m_2}(j)^{m_1+1} e_j$$

At the start, all the <m>-associated powers of elements in Zp required for computation are sought. In a computing method using that powers in seeking the sum of syndromes, the process seeks the power of each element in Zp and, when the element j in Zp is selected, the process decodes 17-j or $17\text{-}j^{-1}$ to select the power of the corresponding element, thereby computing the product or the sum.

Therefore, a computing circuit operative to seek the powers of elements in Zp is described.

FIG. 44(A) is a block diagram of the computing circuit operative to seek the power $j^m$ of an element j in Zp, and FIG. 44(B) is a timing chart of the clocks ck, cl and the timing signals $B_0$-$B_{15}$ for use in control of this circuit.

This computing circuit comprises a selecting circuit U1, a "$(j)^i$ (j=1 to 16)" circuit block, a "$R_1$ (0-15)" register unit, a "$R_2$ (0-15)" register unit, and a "$R_3$ (0-15)" register unit.

The selecting circuit U1 includes 16 AND gates G1-G16. The AND gate G1 receives $B_0$ and $/B_1$, and provides a signal "m=0". The AND gate G2 receives $B_1$ and $/B_2$, and provides a signal "m=1". From then on, in accordance with similar input/output, the AND gates G3-G16 provide signals "m=2" to "m=15", respectively. These signals "m=0" to "m=15" turn via the control switches SW1-SW16 to the outputs $r_\xi$ ($\xi$=1, 2, 3) from the selecting circuit U1. The signals "m=0" to "m=15" are decoded through the control switches SW1-SW16 at every value of the component of <m>.

As shown in FIG. 44(B), the clocks cl are generated in 16 cycles, 15-times repeatedly, subsequent to the clock ck such that the "$(j)^i$ (j=1 to 16)" circuit block provides $(j)^1$ in the cycles of the clocks $ck_i$ and $cl_j$.

The output $(j)^i$ is latched as data in the "$R_1$ (0-15)" register unit, the "$R_2$ (0-15)" register unit, and the "$R_3$ (0-15)" register unit in appropriate cycles to obtain 3 powers of the elements in Zp.

Determination of the timing of taking data in the "$R_1$ (0-15)" register unit, the "$R_2$ (0-15)" register unit and the "$R_3$ (0-15)" register unit requires the generation and use of signals $B_0$-$B_{16}$ shown in FIG. 44(B) that rise sequentially in sync with the clock ck. The signals $B_0$-$B_{16}$ are used to generate signals m=0, m=1, . . . , m=15, which are activated between the rise of ck and the rise of the next ck.

The selecting circuit U1 decodes and selects these signals m=0, m=1, . . . , m=15 at every value of the component $m_\xi$ of <m>, and provides it as a signal $r_\xi$, which is effective only in the time of $ck_i$ of i=$m_\xi$.

The "$R_1$ (0-15)" register unit, the "$R_2$ (0-15)" register unit and the "$R_3$ (0-15)" register unit each determine the time of taking data in accordance with the signal j, that is, the logical sum of the signal $r_\xi$ and the clock $cl_i$, and latch data in sync with the clock cl. As a result, at the end of the clock cycle, the $m_\xi$-th ($\xi$=1, 2, 3) powers of the elements in Zp are stored in the "$R_1$ (0-15)" register unit, the "$R_2$ (0-15)" register unit and the "$R_3$ (0-15)" register unit.

Thus, the <m>-associated powers of the elements in Zp are generated.

The subsequent description is given to a computing circuit, applied to each element j in Zp, for computing an error component $\epsilon^{<m>+l}_j$ (l=1, 2, 3, 4; j=1-16) converted through the syndrome converting method. The error component is defined as $\epsilon^{<m>+l}_j = (17\text{-}j^{-1})^{m3}(17\text{-}j)^{m2}(j)^{m1+l}y_j$.

Figure 45:
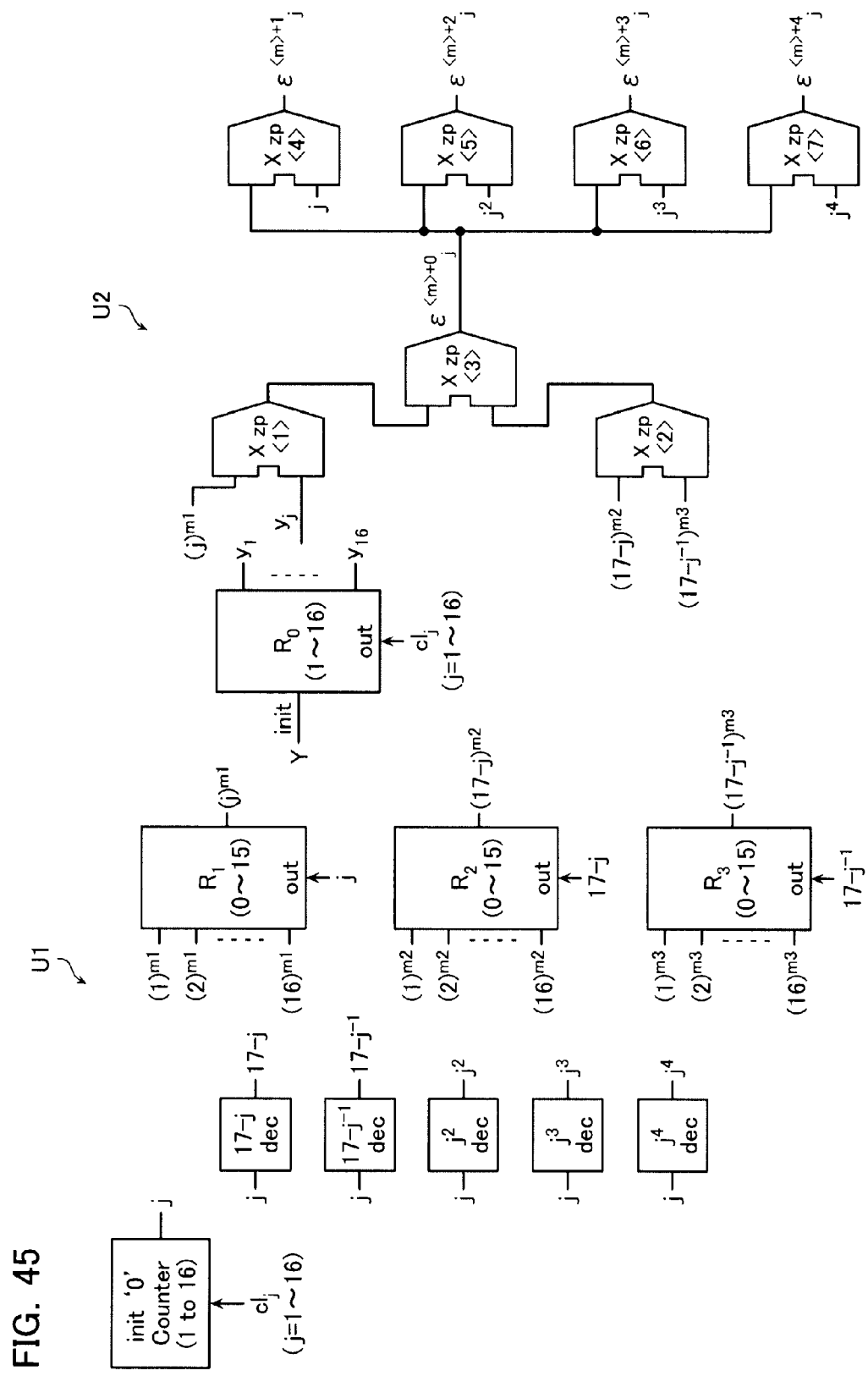
FIG. 45 is a block diagram of a circuit for deriving a syndrome in the memory system according to the present embodiment.

FIG. 45 is a block diagram of the computing circuit for computing $\epsilon^{<m>+l}_j$. Hereinafter, this computing circuit is referred to as the "error component generator circuit".

The error component generator circuit comprises a decoder unit U1, and a product operating unit U2.

Figure 44:
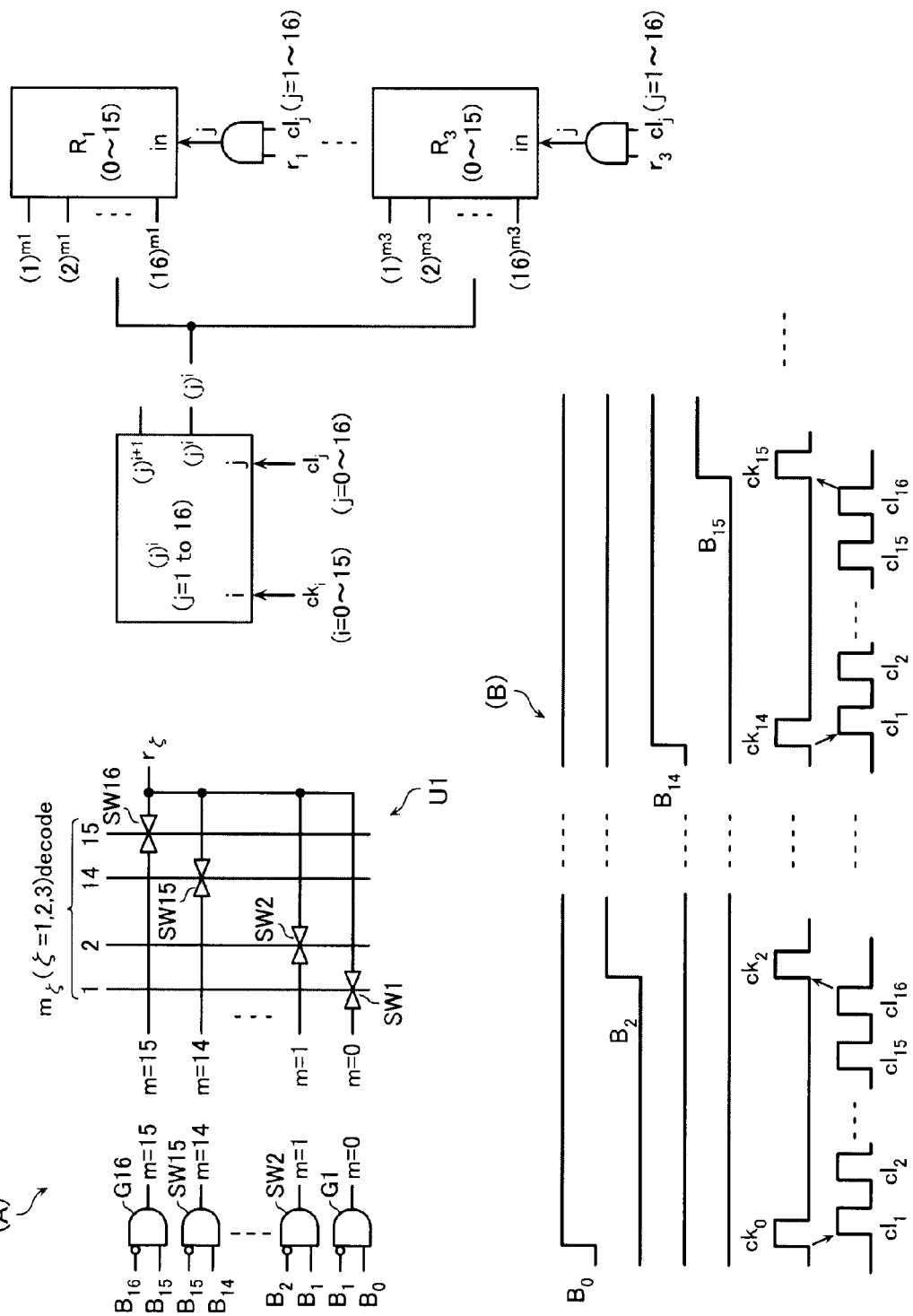
FIG. 44 is a block diagram of a circuit for deriving a syndrome in the memory system according to the present embodiment.

The decoder unit U1 includes a "Counter (1 to 16)" circuit block, a "17-j dec" circuit block, a "$17\text{-}j^{-1}$ dec" circuit block, a "$j^2$ dec" circuit block, a "$j^3$ dec" circuit block and a "$j^4$ dec" circuit block, and also includes the "$R_1$ (0-15)" register unit, the "$R_2$ (0-15)" register unit and the "$R_3$ (0-15)" register unit used to store the $m_\xi$-th powers of the elements in Zp ($\xi$=1, 2, 3) shown in FIG. 44.

The decoder unit U1, "Counter (1 to 16)" circuit block generates j in order at the timing of the clock $cl_j$ (j=1-16). The j output from the "Counter (1 to 16)" circuit block is fed to the "17-j dec" circuit block, to the "$17\text{-}j^{-1}$ dec" circuit block, to the "$j^2$ dec" circuit block, to the "$j^3$ dec" circuit block and to the "$j^4$ dec" circuit block.

The "17-j dec" circuit block decodes the input j to provide 17-j. The "$17\text{-}j^{-1}$ dec" circuit block decodes the input j to provide $17\text{-}j^{-1}$. The $j^2$ dec" circuit block decodes the input j to provide $j^2$. The "$j^3$ dec" circuit block decodes the input j to provide $j^3$. The "$j^4$ dec" circuit block decodes the input j to provide $j^4$.

The "$R_1$ (0-15)" register unit provides $(j)^{m1}$ based on the input j. The "$R_2$ (0-15)" register unit provides $(17\text{-}j)^{m2}$ based on 17-j output from the "17-j dec" circuit block. The "$R_3$ (0-15)" register unit provides $(17\text{-}j^{-1})^{m3}$ based on $17\text{-}j^{-1}$ output from the "$17\text{-}j^{-1}$ dec" circuit block.

Thus, the decoder unit U1 can obtain the outputs $(j)^{m1}$, $(17\text{-}j)^{m2}$, $(17\text{-}j^{-1})^{m3}$.

The product operating unit U2 comprises a "Ro (1-16)" register unit, and 7 "X Zp" circuit blocks <1>-<7>.

The "Ro (1-16)" register unit includes 16 latches. These 16 latches hold 16 components of the code Y read out of the p-adic cells, that is, the elements $y_1$-$y_{16}$ in Zp, respectively. The "Ro(1-16)" register unit provides $y_j$, held in the latches, in sync with the clock $cl_j$ (j=1-16).

The "X Zp" circuit block <1> computes the product in Zp of $y_j$ output from the Ro (1-16)" register unit and $(j)^{m1}$ output from the "$R_1$ (0-15)" register unit, and provides the product.

The "X Zp" circuit block <2> computes the product in Zp of $(17\text{-}j)^{m2}$ output from the "$R_2$ (0-15)" register unit and $(17\text{-}j^{-1})^{m3}$ output from the "$R_3$ (0-15)" register unit, and provides the product.

The "X Zp" circuit block <3> computes the product in Zp of the output from the "X Zp" circuit block <1> and the output from the "X Zp" circuit block <2>, and provides the product $\epsilon^{<m>+0}_j$.

The "X Zp" circuit block <4> computes the product of $\epsilon^{<m>+0}_j$ output from the "X Zp" circuit block <3> and j, and provides the product $\epsilon^{<m>+l}_j$.

The "X Zp" circuit block <5> computes the product of $\epsilon^{<m>+0}_j$ output from the "X Zp" circuit block <3> and $j^2$ output from the "$j^2$ dec" circuit block, and provides the product $\epsilon^{<m>+3}_3$.

The "X Zp" circuit block <6> computes the product of $\epsilon^{<m>+0}_j$ output from the "X Zp" circuit block <3> and $j^3$ output from the "$j^3$ dec" circuit block, and provides the product $\epsilon^{<m>+3}_j$.

The "X Zp" circuit block <7> computes the product of $\epsilon^{<m>+0}_j$ output from the "X Zp" circuit block <3> and $j^4$ output from the "$j^4$ dec" circuit block, and provides the product $\epsilon^{<m>+4}_j$.

With the above-configured product operating unit U2, the selected read data Y can be obtained in sync with the clock $cl_j$ as $\epsilon^{<m>+0}_j, \epsilon^{<m>+l}_j, \epsilon^{<m>+2}_j, \epsilon^{<m>+3}_j, \epsilon^{<m>+4}_j$ corresponding to the elements j in Zp.

The subsequent description is given to a computing circuit operative to seek the sum of $\epsilon^{<m>+l}_j$ (l=1, 2, 3, 4) where j=1-16. Seeking the sum of $\epsilon^{<m>+l}_j$ (l=1, 2, 3, 4) where j=1-16 allows a syndrome $S_{<m>+l}$ to be obtained. Hereinafter, this computing circuit is referred to as the "syndrome generating circuit".

FIG. 46 is a block diagram of the syndrome generating circuit.

The syndrome generating circuit includes a "Rgstr" register and a "5 bit AD mod 17" circuit block.

The syndrome generating circuit yields the sum of $\epsilon^{<m>+l}_j$ in sync with the clock $cl_j$ (j=1-16) through a loop containing the "5 bit AD mod 17" circuit block and the "Rgstr" register to generate the syndrome component $S_{<m>+l}$ (l=0-4).

The following description is given to a circuit block for computing the i-th power of the element j in Zp used in the circuit for seeking $j^m$ shown in FIG. 44. Hereinafter, this circuit block is referred to as the "$(j)^i$ (j=1 to 16)" circuit block.

FIG. 47 is a diagram showing a circuit symbol of the "$(j)^i$ (j=1 to 16)" circuit block.

The "$(j)^i$ (j=1 to 16)" circuit block is controlled by the clocks $ck_i$ (i=0-15) and $cl_j$ (j=1-16), and provides $(j)^i$ and $(j)^{i+1}$ in sync with the rise of the clock $cl_3$.

FIG. 48 is a block diagram of the "$(j)^1$ (j=1 to 16)" circuit block.

The "$(j)^i$ (j=1 to 16)" circuit block is a circuit that computes the 0-th to 15-th powers of all the elements 1-16 in Zp other than zero in order, and holds them in registers.

The "$(j)^i$ (j=1 to 16)" circuit block includes an "X Zp" circuit block, a "Counter (1 to 16)" circuit block, and a "R (1-16)" register unit as shown in FIG. 48.

The index-decidable clock is cki, and an index i can be decided by the order of the clock cki. On the other hand, the elements in Zp are designated in order from 1 by the clock cl, and the order j of the clock cl indicates the number of elements.

The "Counter (1 to 16)" circuit block is connected to one input of the "X Zp" circuit block. It uses $ck_i$ as the start signal and counts up at the timing of the rise of $cl_j$ within a range of 1-16.

The "R (1-16)" register unit includes 16 registers, and it stores inputs $i_1$-$i_{16}$ in No. 1-16 registers in order at the rise of the clock /$cl_j$ at in, and provides the contents $i_1$-$i_{16}$ of No. 1-16 registers in order at the rise of the clock $cl_j$ at out.

As shown in FIG. 48, the clocks ck and cl input to the "Counter (1 to 16)" circuit block and the "R (1-16)" register unit are synchronized with each other, and the output from the "R (1-16)" register unit is multiplied by the output from the "Counter (1 to 16)" circuit block at the "X Zp" circuit block. In this case, after the clock $ck_i$ rises, the "R (1-16)" register unit provides $(j)^i$ at every rise of $cl_j$. In addition, the "X Zp" circuit block provides $(j)^{i+1}$. This $(j)^{i+1}$ can be used in each computing circuit, if required.

As an example of circuitry of the solution searching polynomial generator unit 105, an operating circuit for seeking a solution searching polynomial Ψ(x) is described below. This operating circuit is referred to as the "solution searching polynomial generating circuit".

A processing equation is shown in Expression 38, which is required in operational processing for deriving a coefficient $\phi_j$ at each degree j of x in the solution searching polynomial Ψ(x).

$$\Psi(x) = 1 + \sum_{j=1} \psi_j x^j,$$ [Expression 38]

$$\psi_j = -\frac{u}{j} \sum_{i=1}^{j} \psi_{j-1} S_{<m>+i},$$

$$u = \frac{4}{S_{<m>+0}}$$

Figure 49:
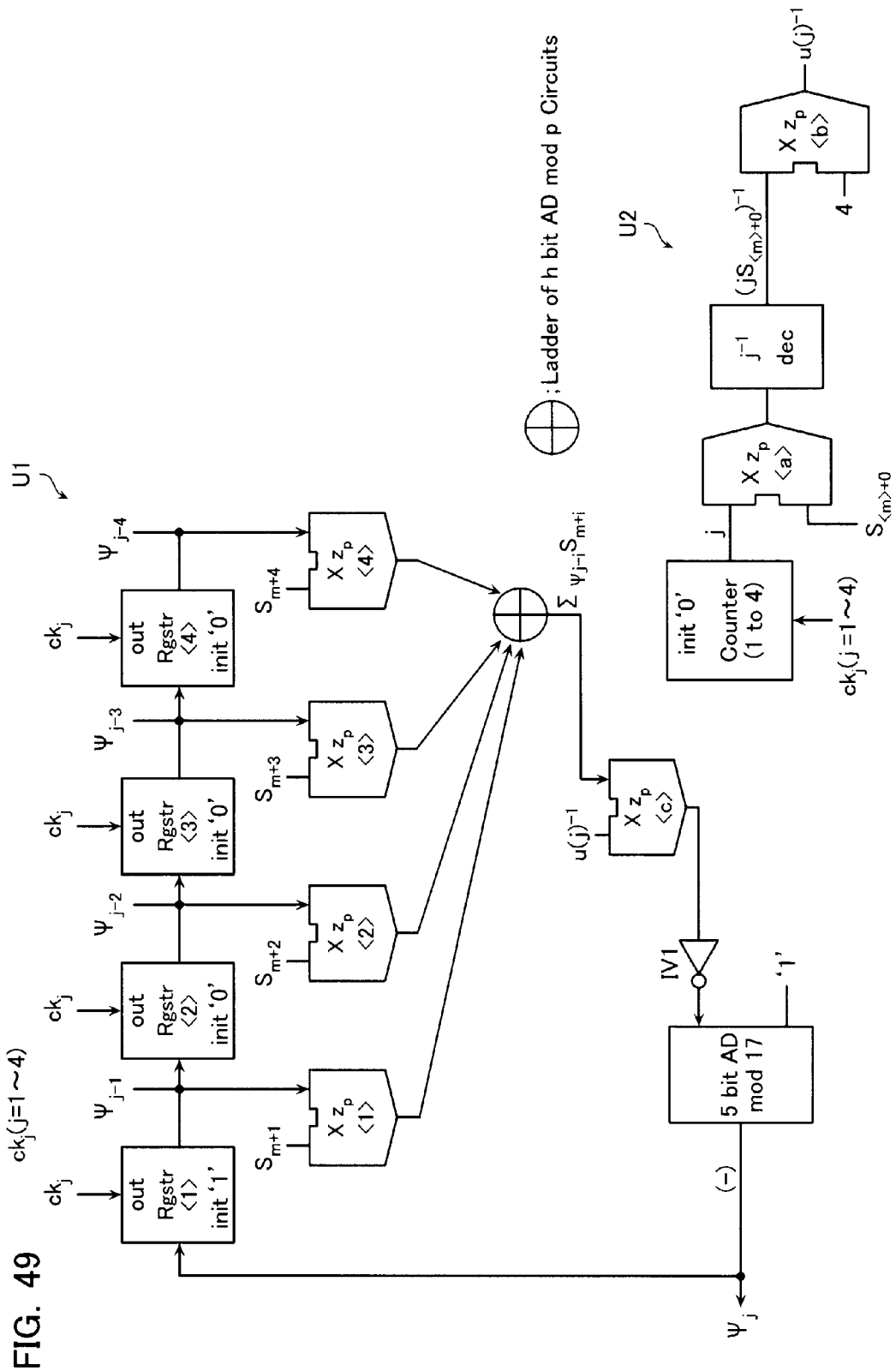
FIG. 49 is a block diagram of a circuit for deriving a solution searching polynomial in the memory system according to the present embodiment.

FIG. 49 is a block diagram of the solution searching polynomial generating circuit.

The solution searching polynomial generating circuit is a circuit for use in the step of error searching with the use of a syndrome $u^{<m>}S=(uS_{<m>+0}, uS_{<m>+1}, uS_{<m>+2}, uS_{<m>+3}, uS_{<m>+4})$.

The solution searching polynomial generating circuit allows a simple circulation circuit to generate the solution searching polynomial Ψ(x) without using a complicated Euclidean iterative method.

The solution searching polynomial generating circuit comprises a first part circuit U1 for deriving $\Sigma\phi_{j-1}S_{<m>+i}$ on the right side of the 2nd equation shown in Expression 38, and a second part circuit U2 for deriving $u(j)^{-1}$ on the right side of the 2nd equation shown in Expression 38 as well.

The first part circuit U1 includes 4 serially connected "Rgstr" registers <1>-<4>, and 4 "X Zp" circuit blocks <1>-<4> connected to the outputs of the Rgstr" registers, respectively.

The "Rgstr" register <1> has an initial value of '1' and other "Rgstr" registers <2>-<4> have an initial value of '0'.

The first part circuit U1 is controlled by the clock ck fed to the "Rgstr" registers, and provides the coefficients $\phi_{j-1}, \phi_{j-2}, \phi_{j-3}, \phi_{j-4}$ at the respective degrees from the nodes between the "Rgstr" registers at the rise of the j-th clock $ck_j$. A node with no coefficient present is at '0' and accordingly cannot contribute to the product operation with the syndrome components $S_{<m>+1}$-$S_{<m>+4}$ executed by the "X Zp" circuit blocks <1>-<4>. The outputs from the X Zp" circuit blocks <1>-<4> are summed 2 by 2 at the "5 bit AD mod 17" circuit blocks, and a ladder of these "5 bit AD mod 17" circuit blocks is applied to finally obtains $\Sigma\phi_{j-1}S_{<m>+i}$.

The second part circuit U2 comprises a "Counter (1 to 4)" circuit block, "X Zp" circuit blocks <a>, <b>, and a "$j^{-1}$ dec" circuit block.

The second part circuit U2 generates $(jS_{<m>+0})^{-1}$ from j generated at the "Counter (1 to 4)" circuit block and the syndrome component $S_{<m>+0}$, in accordance with the clock $ck_j$, at the "X Zp" circuit block <a> and the "$j^{-1}$ dec" circuit block. Then, the "X Zp" circuit block <b> derives $u(j)^{-1}$ from the generated $(jS_{<m>+0})^{-1}$ and the established $\epsilon=4$.

An "X Zp" circuit block <c> is used to multiply $\Sigma\phi_{j-1}S_{<m>+i}$ generated at the first part circuit U1, by $u(j)^{-1}$, generated at the second part circuit U2, to yield the coefficient $\phi_j$.

The coefficient $\phi_j$ is a h-bit binary, which is represented in complement to represent a negative number. Therefore, the output from the "X Zp" circuit block <c> is inverted through the inverter IV1, and '1' is added thereto at the "5 bit AD mod 17" circuit block, thereby obtaining a complement representation of 5-bit binary.

The "$j^{-1}$ dec" circuit block shown in FIG. 49 is a circuit operative to seek the inverse element $j^{-1}$ of an element j in Zp. The details of the "$j^{-1}$ dec" circuit block are described later.

The solution searching polynomial generating circuit described above is possible to provide the coefficients $\phi_4$-$\phi_0$ where j=4 on the respective nodes on receipt of 4-times inputs of the clock ck.

An example of circuitry of the Hasse differential polynomial generator unit 106 is described below.

If the degree of Ψ(x) is coincident with 4, it is required to derive the root of this Ψ(x) and the associated multiplicity. Therefore, the following description is given to an operating circuit operative to compute a coefficient of the Hasse differential polynomial required in deriving the multiplicity of the root. Hereinafter, this operating circuit is referred to as the "Hasse differential polynomial coefficient generating circuit".

A relation between the coefficient of the Hasse differential polynomial, the coefficient, and the coefficient of Ψ(x) is as shown in Expression 39.

$$[\Psi(x)]^{[i]} = \sum_{j=0}^{4-i} \binom{j+i}{i} \psi_{j+i} x^j = \sum_{j=0}^{4-i} \psi^{[i]}{}_j x^j \qquad \text{[Expression 39]}$$

In a word, as can be found from Expression 39, the Hasse differential polynomial coefficient generating circuit multiplies the coefficient of Ψ(x) by the binomial coefficient, generates the coefficient at each degree at every differential stage using the clocks ck and cl, and stores all the coefficients in the registers.

FIG. 50(A) is a block diagram of the Hasse differential polynomial coefficient generating circuit, and FIG. 50(B) is a timing chart of the clocks ck and cl for use in control of the Hasse differential polynomial coefficient generating circuit.

The Hasse differential polynomial coefficient generating circuit includes a "i!" table having a record of the factorial i! of each element i in Zp, a "(i!)$^{-1}$" table having a record of the inverse element, and a "$\phi_i$" table having a record of the coefficient $\phi_i$ of the solution searching polynomial Ψ(x). As for the i! table and "(i!)$^{-1}$" table, they can be suppressed to sufficiently small scales in practice in the case of p=17 as in the present example.

As for the "$\phi_i$" table, it is created in the Hasse differential polynomial coefficient generating circuit shown in FIG. 49. Therefore, this is used.

Figure 50:
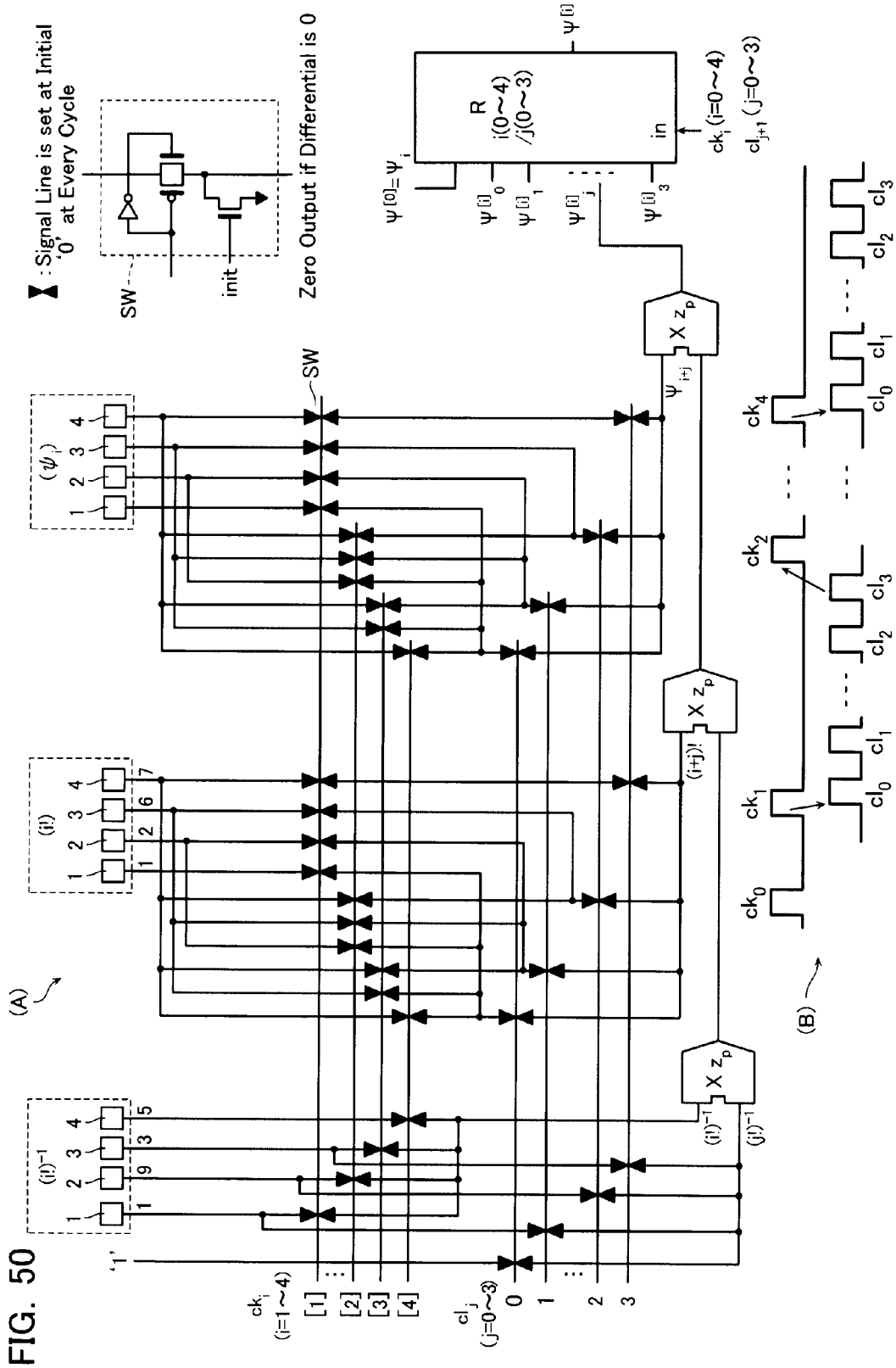
FIG. 50 is a block diagram of a circuit for deriving coefficients of a Hasse differential polynomial in the memory system according to the present embodiment.

The Hasse differential polynomial coefficient generating circuit includes, as shown in FIG. 50, the "i!" table, the "(i!)$^{-1}$" table, the "$\phi_i$" table, an "X Zp" circuit block, and control switches SW for switching the connections among those. Non-selected nodes, the nodes on the output side of the control switches SW, are discharged to '0' in the initial state, such that the result of the product operation executed by the "X Zp" circuit block indicates '0'.

The number of clocks of the clock ck corresponds to the number of differential stages, and i in ck$_i$ takes a value of 1-4. On the other hand, the clock cl corresponds to the degree, and a growth in number of differential stages increases undesired degrees. Therefore, it is not required to generate the clock cl every time by the same number as the clock ck though the circuit of FIG. 50 generates it just 4 times every time. Therefore, although there are $4^2$ storage timings, the "R i(0-4)/j(0-3)" register unit is not required to include registers corresponding to all clocks but just required to include almost half registers.

For the purpose of storing the coefficients of Ψ(x), that is, the coefficients corresponding to Ψ$^{[0]}$, previously in the registers, ck$_0$ is provided as a matter of convenience.

FIG. 51 is a table of fixed operations (such as inverse element, factorial, and power) executed to each element in Zp in the case of p=17 also available in the Hasse differential polynomial coefficient generating circuit.

The 5-bit binary representations of these numerals can be used to form a decoder. Examples of the functions, which can scan all elements in Zp without excess/shortage when j varies through all elements 1-16 in Zp, are as shown in the table, which may exclude even powers and factorials in many cases. For example, a$^j$ can scan all elements in Zp except zero when j varies if a can satisfy the condition. For example, the cases of a=3, 5, 6, 7, 10 are as shown in FIG. 51.

These functions can be utilized to extend the searching range by virtual errors in the syndrome converting method.

As an example of the circuit that configures the decoder, a decoder operative to derive the inverse element j$^{-1}$ of an element j in Zp is described. Hereinafter, this decoder is referred to as the "j$^{-1}$ dec" circuit block.

The inverse element j$^{-1}$ can be derived from the element j by seeking a relation of j×j$^{-1}$≡1 (mod 17), then configuring j and j$^{-1}$, 5-bit binary representations as shown in Expression 40 to form a converting decoder thereof.

Input: $I_i=(j)_i$ $j=(j)_0+(j)_1 2+(j)_2 2^2+(j)_3 2^3+(j)_4 2^4$

Output: $O_i=(j^{-1})_i$ $jj^{-1} \equiv 1 \pmod{p}$ $j^{-1}=(j^{-1})_0+(j^{-1})_1 2+(j^{-1})_2 2^2+(j^{-1})_3 2^3+(j^{-1})_4 2^4$ [Expression 40]

Figure 52:
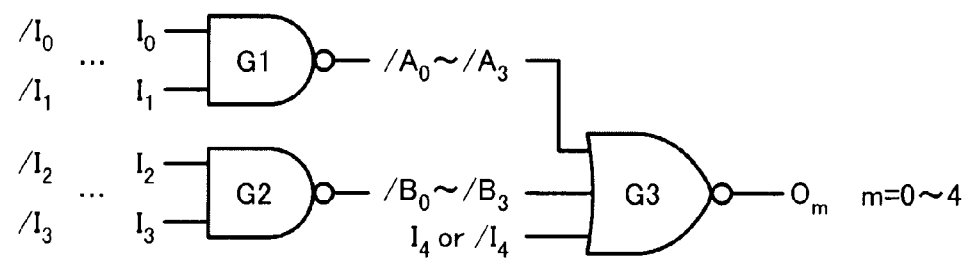
FIG. 52 is a circuit diagram of a decoder for deriving the correspondences among elements in Zp in the memory system according to the present embodiment.

FIG. 52 is a block diagram of the "j$^{-1}$ dec" circuit block.

The "j$^{-1}$ dec" circuit block can be configured by a general circuit operative to decode 5-bit binary data I to other 5-bit binary data O, setting I=j, O=j$^{-1}$ as shown in Expression 40 in this case.

The "j$^{-1}$ dec" circuit block includes NAND gates G1 and G2 to decode bits I$_0$-I$_3$ partially 2-bit by 2-bit to create signals /A$_0$-/A$_3$, /B$_0$-/B$_3$, and also includes a 3-input NOR gate G3 to create O$_m$ (m=0-4) from /A$_m$, /B$_m$, I$_4$ (or /I$_4$). In the case of j=0, a setting of j$^{-1}$=0 is given.

The following description is given to an operating circuit operative to compute the root and the associated multiplicity of the solution searching polynomial Ψ(x). Hereinafter, this operating circuit is referred to as the "solution searching polynomial root/multiplicity operating circuit".

The solution searching polynomial root/multiplicity operating circuit regards the 0-th stage differential in the Hasse differential polynomial as Ψ(x). Unless the Hasse differential polynomial is zero for each element in Zp, the circuit shifts the computation to the next element. The circuit increases the number of differential stages while the Hasse differential polynomial keeps zero. When registers are used to hold the number of the first Hasse differential stages where the Hasse differential polynomial is not zero, for each element in Zp, the element with the number of stages being not zero indicates the root, and the number of the remaining stages indicates the multiplicity of the root. In a word, when those with non-'0' contents are selected from the registers, the held value indicates the multiplicity of the root.

Specifically, when the root of the solution searching polynomial Ψ(x) is denoted with α, and a Hasse differential polynomial of Ψ(x) in the i-th stage with [Ψ(x)]$^{[i]}$, a relational equation is given as Expression 41 where the multiplicity of α is denoted with n.

$$[\Psi(\alpha)]^{[0]} = \Psi(\alpha) = 1 + \sum_{j=1}^{4} \psi_j \alpha^j = 0 \qquad \text{[Expression 41]}$$

$$[\Psi(\alpha)]^{[n-1]} = \sum_{j=0}^{5-n} \psi_j^{[n-1]} \alpha^j = 0,$$

$$[\Psi(\alpha)]^{[n]} = \sum_{j=0}^{4-n} \psi_j^{[n]} \alpha^j \neq 0$$

The solution searching polynomial root/multiplicity operating circuit seeks n as in Expression 41 for each element a in Zp regardless of whether it is the root of $\Psi(x)$ or not. In the case of n=0, it means that $\alpha$ is not a root.

Figure 53:
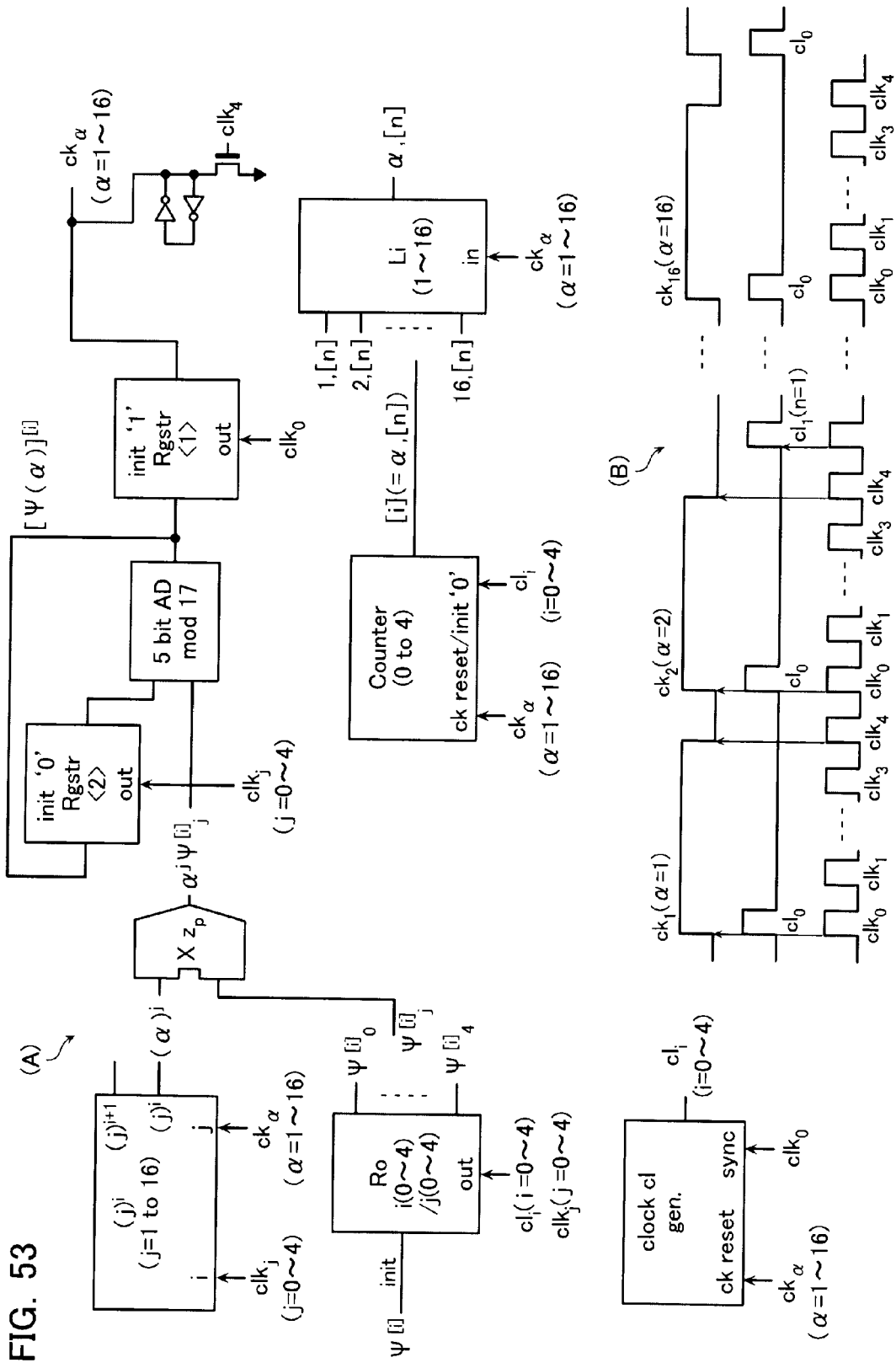
FIG. 53 is a block diagram of a circuit for deriving a polynomial solution and the associated multiplicity in the memory system according to the present embodiment.

FIG. 53(A) is a block diagram of the solution searching polynomial root/multiplicity operating circuit, and FIG. 53(B) is a timing chart of the clocks ck, cl and clk for use in control of the solution searching polynomial root/multiplicity operating circuit.

The solution searching polynomial root/multiplicity operating circuit scans the elements 1-16 in Zp at the clock ck to seek the number of stages of the Hasse differential at the clock cl, and the value of the Hasse differential polynomial in that number of stages at the clock clk. The clock ck is generated when the computed value of the Hasse differential polynomial becomes non-zero such that the process enters the cycle for the next element in Zp.

The solution searching polynomial root/multiplicity operating circuit includes, as shown in FIG. 53(A), a "$(j)^i$ (j=1 to 16)" circuit block, a "Ro i(0-4)/j(0-4)" register unit, an "X Zp" circuit block, a "Rgstr" register <1>, a "5 bit AD mod 17" circuit block, a "Rgstr" register <2>, a "clock cl gen." circuit block, a "Counter (0 to 4)" circuit block, and a "Li (1-16)" register unit.

The "$(j)^i$ (j=1 to 16)" circuit block selects an element $\alpha$ on $\alpha$-times receipt of the clock ck, and provides the j-th power of $\alpha$ on (j−1)-times receipt of the clock clk.

The "Ro i(0-4)/j(0-4)" register unit is a register operative to provide a coefficient $\phi^{[i]}_j$ of the Hasse differential polynomial on receipt of the clocks $cl_i$ and $clk_j$.

The "X Zp" circuit block multiplies the output a from the "$(j)^i$ (j=1 to 16)" circuit block by the output $\phi^{[i]}_j$ from the "Ro i(0-4)/j(0-4)" register unit, and provides $\alpha^j \phi^{[i]}_j$.

Thus, when the clock clk is applied 5-times to the "$(j)^i$ (j=1 to 16)" circuit block, the "Ro i(0-4)/j(0-4)" register unit, and the "X Zp" circuit block, the value of the Hasse differential polynomial can be obtained. For the purpose of simplifying the control of the clocks ck, cl and clk, the sum of the terms of the value 0 not present in this computation is computed as well. Therefore, the total sum of the clocks clk originally required is almost halved.

The value $[\Psi(x)]^{[i]}$ of the differential polynomial is taken in the "Rgstr" register <1> as '0' in the case of zero and '1' in other cases.

The value held in the "Rgstr" register <1> is output at the timing of the clock $clk_0$ as the clock $ck_\alpha$ ($\alpha$=1-16). The clock $ck_\alpha$ is held until it is reset by the clock $clk_4$.

The "Rgstr" register <1> has an initial value of 0 and accordingly the clock $ck_1$ rises at the first $clk_0$. The clock $ck_2$ and so forth rise at $clk_0$ in any cycle of clk in accordance with the computation result.

The "clock cl gen." circuit block generates the clock $cl_i$ in sync with the clock $clk_0$ and resets it to the clock $cl_0$ at every rise of the clock $ck_\alpha$.

The "Counter (0 to 4)" circuit block is reset to 0 by the clock $ck_\alpha$, and counts up at every input of the clock cl and outputs the order of the clock cl minus 1. This output is stored in the "Li (1-16)" register unit.

The "Li (1-16)" register unit has the inputs, which are switched by the clock $ck_\alpha$, and thus can store the associated multiplicity in the $\alpha$-th register.

An example of circuitry of the error quantity computing unit 107 is described below.

The following description is given to a converting circuit operative to derive a true error from the root and multiplicity of the Hasse differential polynomial, an $\alpha$ and [n] pair, to execute error correction. This converting circuit is herein referred to as the "code correcting circuit".

The solution sought through the syndrome converting method, the virtual error n, the error-caused position t, and the true error $e_t$ have a relation therebetween as in Expression 42.

$$uS_{\langle m \rangle +0} = \sum_{j=1}^{16} u(j)^{\langle m \rangle} e_j = 4,$$ [Expression 42]

$$t = \alpha^{-1},$$

$$n = u(t)^{\langle m \rangle} e_t$$

Figure 54:
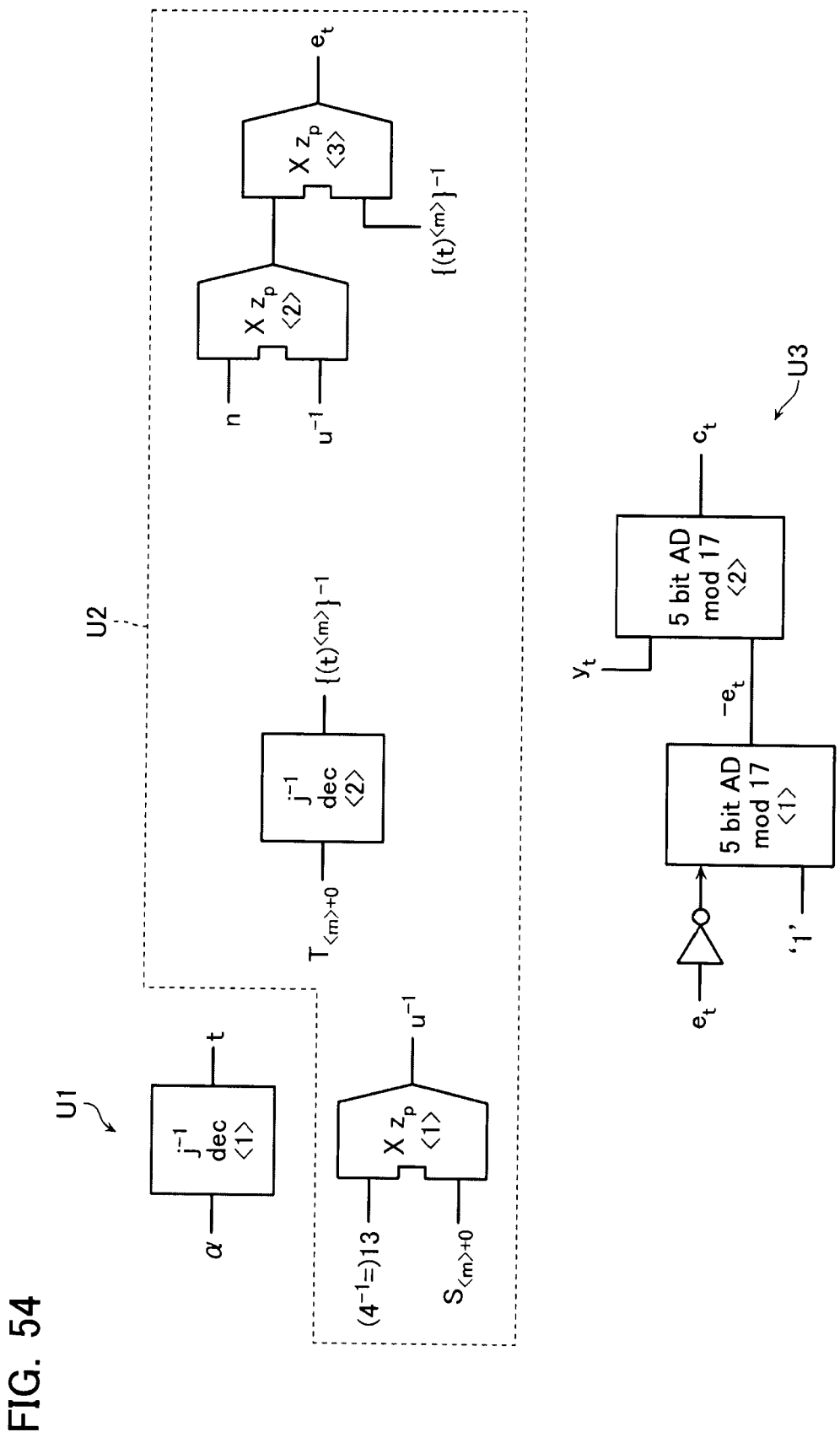
FIG. 54 is a block diagram of a circuit for deriving a true error from a root and multiplicity pair of the Hasse differential polynomial to execute code correction in the memory system according to the present embodiment.

The numeral $(j)^{\langle m \rangle} = (17-j^{-1})^{m_3}(17-j)^{m_2}(j)^{m_1}$ is utilized in the conversion. This numeral is equal to $S_{\langle m \rangle +0}$ when compared with the relational equation $S_{\langle m \rangle +1}$ of the syndrome component shown in Expression 43 if $Y = (0, 0, \ldots, y_j = 1, \ldots, 0, 0)$ is used as the syndrome component at l=0. This is used to give a representation of $T_{\langle m \rangle +0}$ to the syndrome component replaced by 1 for the t component of Y and 0 for others, which is used as a circuit input in a circuit shown in a block diagram of FIG. 54.

$$S_{\langle m \rangle +1} = \sum_{j=1}^{16} (17 - j^{-1})^{m_3}(17 - j)^{m_2}(j)^{m_1}(j)^1 y_j$$ [Expression 43]

$$= \sum_{j=1}^{16} (j)^{\langle m \rangle}(j)^1 y_j$$

The code correcting circuit includes a first part unit U1 operative to seek the error-caused position t, a second part unit U2 operative to seek the true error $e_t$, and a third part unit U3 operative to execute code correction in accordance with the true error $e_t$.

The first part unit U1 includes a "$j^{-1}$ dec" circuit block <1≤.

The "$j^{-1}$ dec" circuit block <1> receives the root $\alpha$, and provides the error-caused position t.

The second part unit U2 includes 3 "X Zp" circuit blocks <1>-<3>, and a "$j^{-1}$ dec" circuit block <2>.

The "X Zp" circuit block <1> receives the syndrome component $S_{\langle m \rangle +0}$ and $4^{-1}$ (=13), and provides $u^{-1}$, that is, the inverse element of the numeral u found in the conversion.

The "$j^{-1}$ dec" circuit block <2> receives $T_{\langle m \rangle +0}$, and provides $\{(t)^{\langle m \rangle}\}^{-1}$, that is, the inverse element of $(t)^{\langle m \rangle}$.

The "X Zp" circuit block <2> receives the multiplicity n and the output $u^{-1}$ from the "X Zp" circuit block <1>, and provides the product thereof $nu^{-1}$.

The "X Zp" circuit block <3> receives the output $nu^{-1}$ from the "X Zp" circuit block <2> and the output $\{(t)^{\langle m \rangle}\}^{-1}$ from the "$j^{-1}$ dec" circuit block <2>, and provides the true error $e^t$.

The third part unit U3 includes 2 "5 bit AD mod 17" circuit blocks <1> and <2>.

The "5 bit AD mod 17" circuit block <1> receives /$e_t$ and '1', and provides −$e_t$, that is, the complement of $e_t$.

The "5 bit AD mod 17" circuit block <1> receives the code $y_t$ read out of the p-adic cells and the output −$e_t$ from the "5 bit AD mod 17" circuit block <1>, and provides the error-corrected correct code $c_t$.

The code correcting circuit thus configured is possible to restore the correct code $c_t$.

The following description is given to an operating circuit for computing a Lee metric $w(E) = \Sigma |e_j|$ (j=1-16) of an error code word E. Hereinafter, this operating circuit is referred to as the "Lee metric operating circuit".

Figure 55:
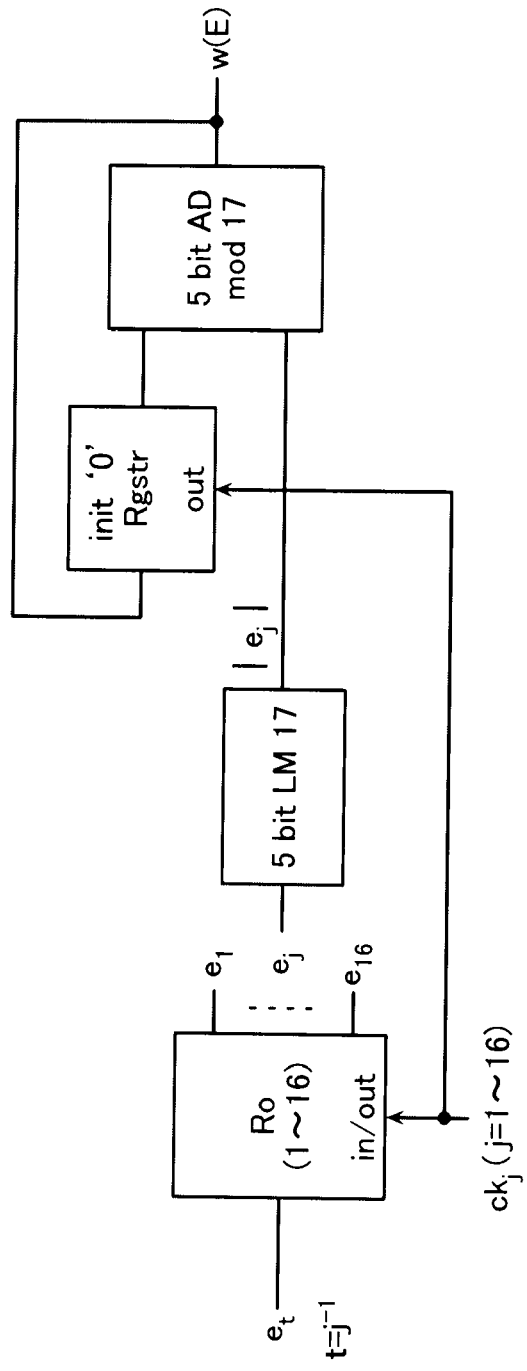
FIG. 55 is a block diagram of an operating circuit for computing a Lee metric of the error code word in the memory system according to the present embodiment.

FIG. 55 is a block diagram of the Lee metric operating circuit.

The Lee metric operating circuit includes a "Ro (0-16)" register unit, a "5 bit LM mod 17" circuit block, a "5 bit AD mod 17" circuit block, and a "Rgstr" register.

The error code word E derived from the polynomial $\Psi(x)$ is stored as the initial value in the "Ro (0-16)" register unit. From the "Ro (0-16)" register unit, the components $e_j$ of E are taken out in order by the clock $ck_j$.

The "5 bit LM mod 17" circuit block computes the associated Lee metrics $|e_j|$ from the taken-out components $e_j$. The "5 bit LM mod 17" circuit block provides the Lee metrics $|e_j|$ of the components, computed at every clock $ck_j$, to the "5 bit AD mod 17" circuit block.

The "Rgstr" register and the "5 bit AD mod 17" circuit block form a loop, which is used to sum these $|e_j|$. The output from the "5 bit AD mod 17" circuit block when the 16th clock ck rises provides $w(E)=\Sigma|e_j|$.

If $w(E) \leq 4$, a series of error searching are finished, and E can be used to execute correction.

The error E sought through operational processing can be corrected after it is ensured that the associated Lee metric is equal to or below and it can be found that failed correction does not occur.

Therefore, the following description is given to an operational circuit element operative to compute a Lee metric of the element in Zp. Hereinafter, this operational circuit element is referred to as the "5 bit LM 17" circuit block.

As for an element a in Zp represented in 5-bit binary, the associated Lee metric $Q=|a|$ can be expressed by $Q=/PF0 \times a + PF0 \times (17-a)$. Here, PF0 becomes '1' if $a \geq 9$ and '0' if $a<9$. Therefore, if $a \geq 9$, a derivation of the Lee metric of a just requires a subtraction of a from 17, that is, an addition of the complement of a to 17.

A relation between A and Q in the case of h=5, p=17 is as in Expression 44.

$$a = A_0 + A_1 2 + A_2 2^2 + A_3 2^3 + A_4 2^4$$

$$Q = |a|(Q = /PF0 \times a + PF0 \times (17-a))$$

$$Q = Q_0 + Q_1 2 + Q_2 2^2 + Q_3 2^3 + Q_4 2^4 \quad \text{[Expression 44]}$$

Figure 56:
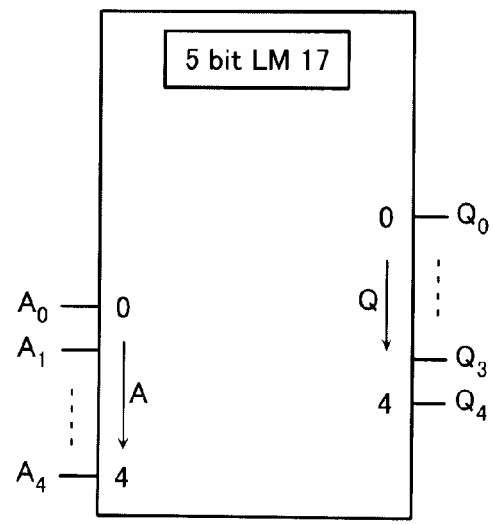
FIG. 56 is a diagram showing a circuit symbol of an operating circuit element for computing the Lee metric ("5 bit LM 17" circuit block) in the memory system according to the present embodiment.
Figure 57:
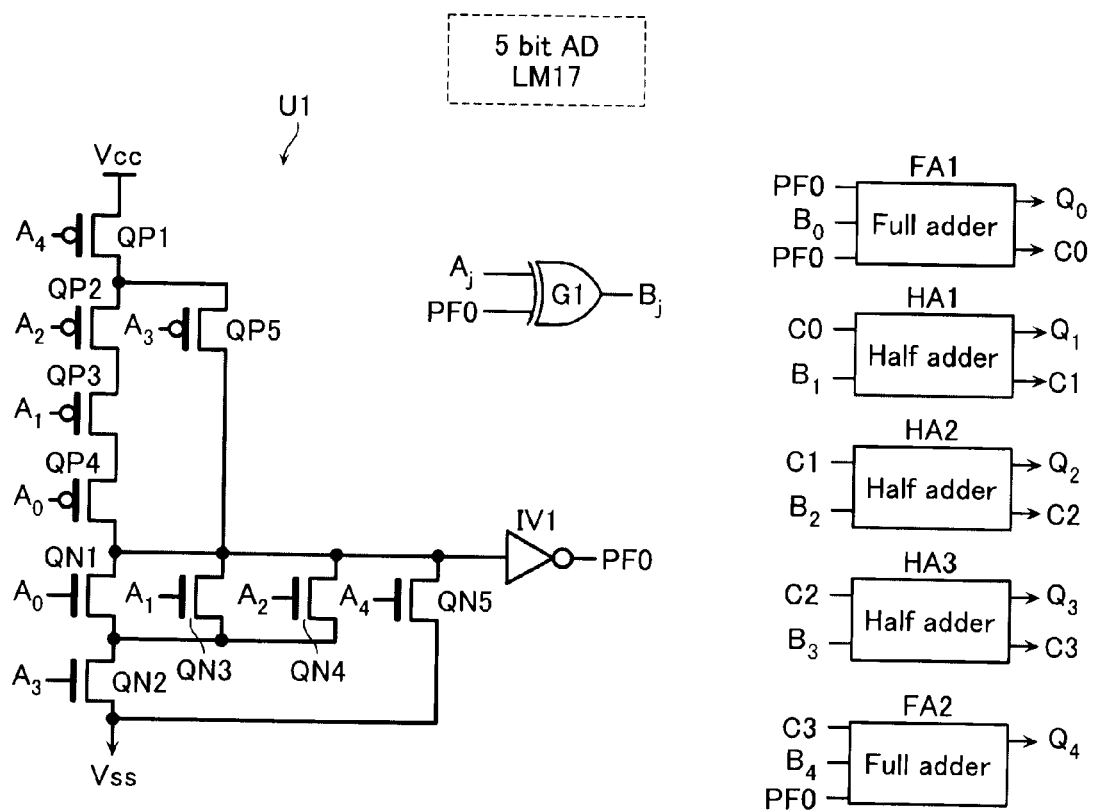
FIG. 57 is a block diagram of the "5 bit LM 17" circuit block in the memory system according to the present embodiment.

FIG. 56 shows a circuit symbol of the "5 bit LM 17" circuit block, and FIG. 57 is a block diagram of the "5 bit LM 17" circuit block.

The "5 bit LM 17" circuit block receives a 5-bit binary $A_0$-$A_4$, and provides a 5-bit binary $Q_0$-$Q_4$.

The "5 bit LM 17" circuit block comprises a PF0 generator unit U1, an XOR gate G1, 3 half adders HA1-HA3, and 2 full adders FA1, FA2.

The PF0 generator unit U1 includes, between the Vcc terminal and the Vss terminal, serially connected PMOS transistors QP1-QP4 and NMOS transistors QN1, QN2. These transistors QP1, QP2, QP3, QP4, QN1 and QN2 are controlled by $A_4$, $A_2$, $A_1$, $A_0$, $A_0$, and $A_3$, respectively.

The PF0 generator unit U1 also includes a PMOS transistor QP5, 3 NMOS transistors QN3-QN5, and an inverter IV1.

The transistor QP5 is connected between the source of the transistor QP2 and the drain of the transistor QP4. The transistors QN3 and QN4 are connected between the source and drain of the transistor QN1. The transistor QN5 is connected between the source of the transistor QN1 and the drain of the transistor QN2 (Vss terminal). These transistors QP5, QN3, QN4 and QN5 are controlled by $A_3$, $A_1$, $A_2$ and $A_4$, respectively. The inverter IV1 has an input connected to the sources of the transistors QN1, QN3, QN4 and QN5. The output from the inverter IV1 provides the carry PF0.

The XOR gate G1 receives $A_j$ (j=0-4) and PF0, and provides $B_j$.

The full adder FA1 has inputs $B_0$ and PF0, a carry input PF0, an output $Q_0$, and a carry output C0. The half adder HA1 has inputs C0 and $B_1$, an output $Q_1$, and a carry output C1. The half adder HA2 has inputs C1 and $B_2$, an output $Q_2$, and a carry output C2. The half adder HA3 has inputs C2 and $B_3$, an output $Q_3$, and a carry output C3. The full adder FA2 has inputs $B_4$ and PF0, a carry input C3, and an output $Q_4$.

In this specific example, if the input reaches 9 or above, the complement of a is added to 17. In the case of PF0=1, the complement of a is created at the XOR gate G1 by inverting $A_j$, that is, each bit representation of a, to yield $B_j$, and adding 1 thereto.

As p=17 is $17=(10001)_2$, this is represented by PF0, and further PF0 is used as 1, then these are added to $B_j$ as the sum of binaries.

The "5 bit LM 17" circuit block operates not in sync with the clocks and, on receipt of inputs, provides the computed Lee metric.

An example of circuitry of the decoder unit 109 is described below.

After error searching is finished and a Lee metric code C corrected with the error code E is obtained, it is required to restore it to the data code A in Zp. This operation corresponds to an inverse operation of C=AG with a generator matrix G though an inversion of a matrix requires a large-scale operation. Therefore, the elements of A are sequentially derived from the elements of C. The computation process is shown in Expression 45.

$$c_j = \sum_{i=0}^{10} (j)^{i+1} a_i \quad \text{[Expression 45]}$$

$$\left\{ \sum_{j=1}^{16} (j)^{-1} c_j = \sum_{j=1}^{16} (j)^{-1} \sum_{i=0}^{10} (j)^{i+1} a_i = \right.$$

$$\left. \sum_{i=0}^{10} \sum_{j=1}^{16} (j)^i a_i = \sum_{j=1}^{16} (j)^0 a_0 = 16 a_0 \right\}$$

$$\therefore a_0 = 16^{-1} \sum_{j=1}^{16} (j)^{-1} c_j$$

$$c_j^{(0)} = c_j - j a_0 = \sum_{i=0}^{10} (j)^{i+1} a_i$$

$$\left\{ \sum_{j=1}^{16} (j^2)^{-1} c_j^{(0)} = \sum_{j=1}^{16} (j^2)^{-1} \sum_{i=0}^{10} (j)^{i+1} a_i = \right.$$

$$\left. \sum_{i=1}^{10} \sum_{j=1}^{16} (j)^i a_i = \sum_{j=1}^{16} (j)^0 a_1 = 16 a_1 \right\}$$

$$\therefore a_1 = 16^{-1} \sum_{j=1}^{16} (j^2)^{-1} c_j^{(0)}$$

$$c_j^{(1)} = c_j^{(0)} - j^2 a_1 = \sum_{i=2}^{10} (j)^{i+1} a_i$$

$$\vdots$$

As shown in Expression 45, the relation $c_j = \Sigma(j)^{i+1} a_i$ is deformed in turn to sequentially derive $a_1$ from $a_0$, subsequently $a_2$ from $a_1$, . . . , then $a_m$. This is the principle of computation.

Both sides are multiplied by the inverse element of the power of j to yield the terms on all elements in Zp, which are then summed. At this time, the deformation is executed based on the fact that the sum of all elements in Zp becomes zero.

Expression 46 shows a relational equation of the components of C and the components of A.

$$c_j^{(-1)} = c_j$$

$$c_j^{(m-1)} = c_j^{(m-2)} - (j)^m a_{m-1} = \sum_{i=m}^{10}(j)^{i+1}a_i$$ [Expression 46]

$$\therefore a_m = 16^{-1}\sum_{j=1}^{16}(j^{m+1})^{-1}c_j^{(m-1)}$$

The following description is given to a specific operating circuit realized using the relational equation shown in Expression 46.

When seeking $a_m$ after $a_{m-1}$ is obtained, parallel utilization of clocks is executed by computing the sum of j at $a_m$ in order while seeking $c_j^{(m-1)}$.

At the start, a circuit for converting the component of the Lee metric code C every time is described based on $c_j^{(m-1)} = c_j^{(m-2)} - (j)^m a_{m-1}$ shown in Expression 46. Hereinafter, this circuit is referred to as the "$c_j^{(m-1)}$" circuit block.

Figure 58:
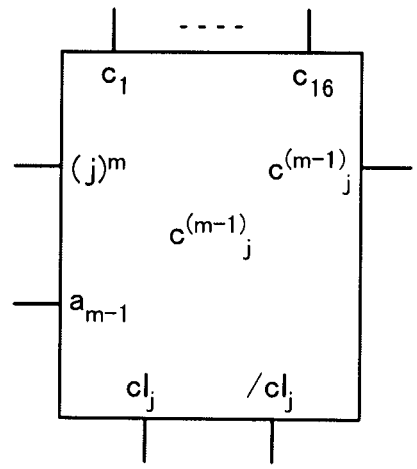
FIG. 58 is a diagram showing a circuit symbol of a unit contained in a computing circuit for deriving $A=CG^{-1}$ from $C=AG$ ("$c^{(m-1)}j$" circuit block) in the memory system according to the present embodiment.
Figure 59:
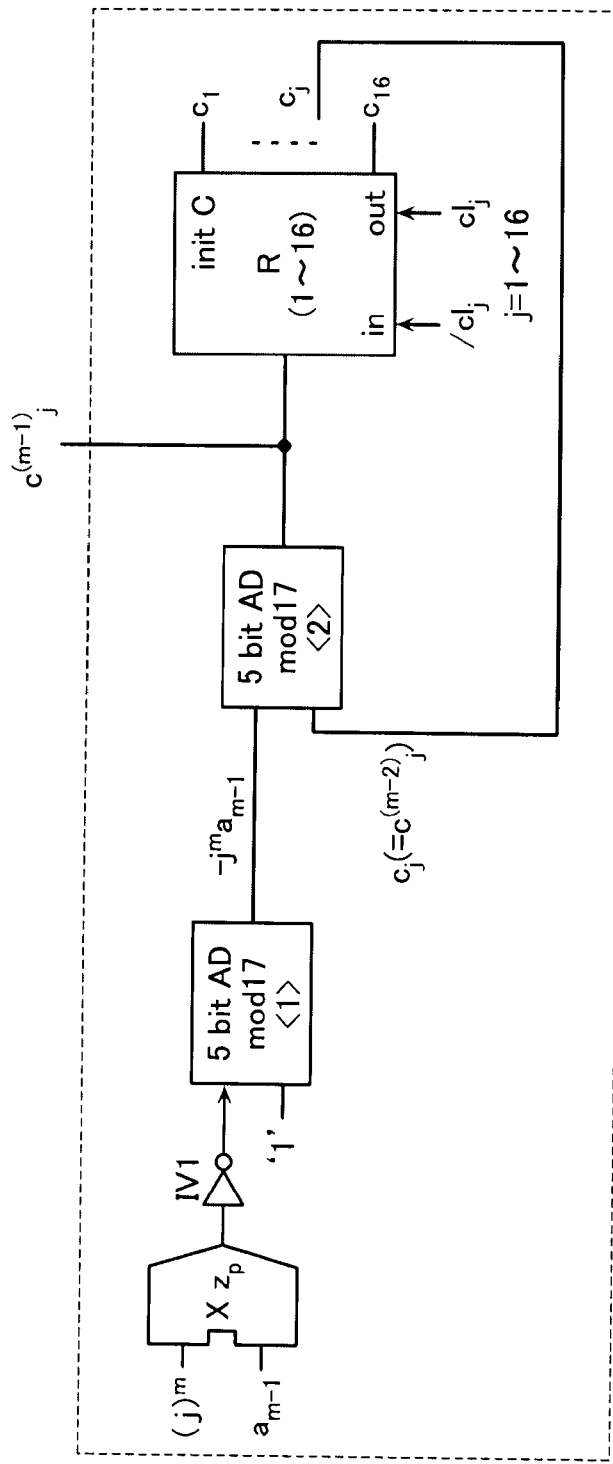
FIG. 59 is a block diagram of the "$c^{(m-1)}j$" circuit block in the memory system according to the present embodiment.

FIG. 58 is a diagram showing a circuit symbol of the "$c_j^{(m-1)}$" circuit block, and FIG. 59 is a block diagram of the "$c_j^{(m-1)}$" circuit block.

The "$c_j^{(m-1)}$" circuit block is a circuit operable in sync with the clocks $cl_j$, $/cl_j$. It receives $(j)^m$, $a_{m-1}$ and the code components $c_1$-$c_{16}$, and provides $c_j^{(m-1)}$.

The "$c_j^{(m-1)}$" circuit block includes an "X Zp" circuit block, 2 "5 bit AD mod 17" circuit blocks <1>, <2>, and a "R (1-16)" register unit.

The "X Zp" circuit block yields the product of $(j)^m$ and $a_{m-1}$, and provides it to the "5 bit AD mod 17" circuit block <1> via the inverter IV1.

The "5 bit AD mod 17" circuit block <1> seeks the complement of $(j)^m a_{m-1}$ output through the inverter IV1 to yield $-j^m a_{m-1}$, and provides it to the "5 bit AD mod 17" circuit block <2>.

The "5 bit AD mod 17" circuit block <2> yields the sum of $-j^m a_{m-1}$ output from the "5 bit AD mod 17" circuit block <1> and $c_j$ ($=c_j^{(m-2)}$) output from the "R (1-16)" register unit in sync with the clock cl. This sum turns to $c_j^{(m-1)}$, that is, the output from the "$c_j^{(m-1)}$" circuit block. The output $c_j^{(m-1)}$ from the "5 bit AD mod 17" circuit block <2> is recorded in the j-th register in the "R (1-16)" register unit in sync with the fall of the clock cl.

The subsequent description is given to a circuit for creating $a_m$ based on $a_m = 16^{-1} \Sigma (j^{m+1})^{-1} c_j^{(m-1)}$ (j=1-16) shown in Expression 46. Hereinafter, this circuit is referred to as the "$a_m$" circuit block.

Figure 60:
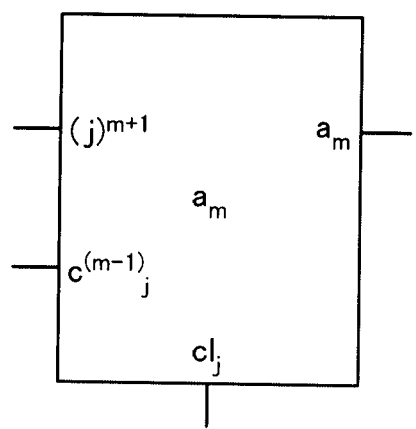
FIG. 60 is a diagram showing a circuit symbol of a unit contained in the computing circuit for deriving $A=CG^{-1}$ from $C=AG$ ("$a_m$" circuit block) in the memory system according to the present embodiment.
Figure 61:
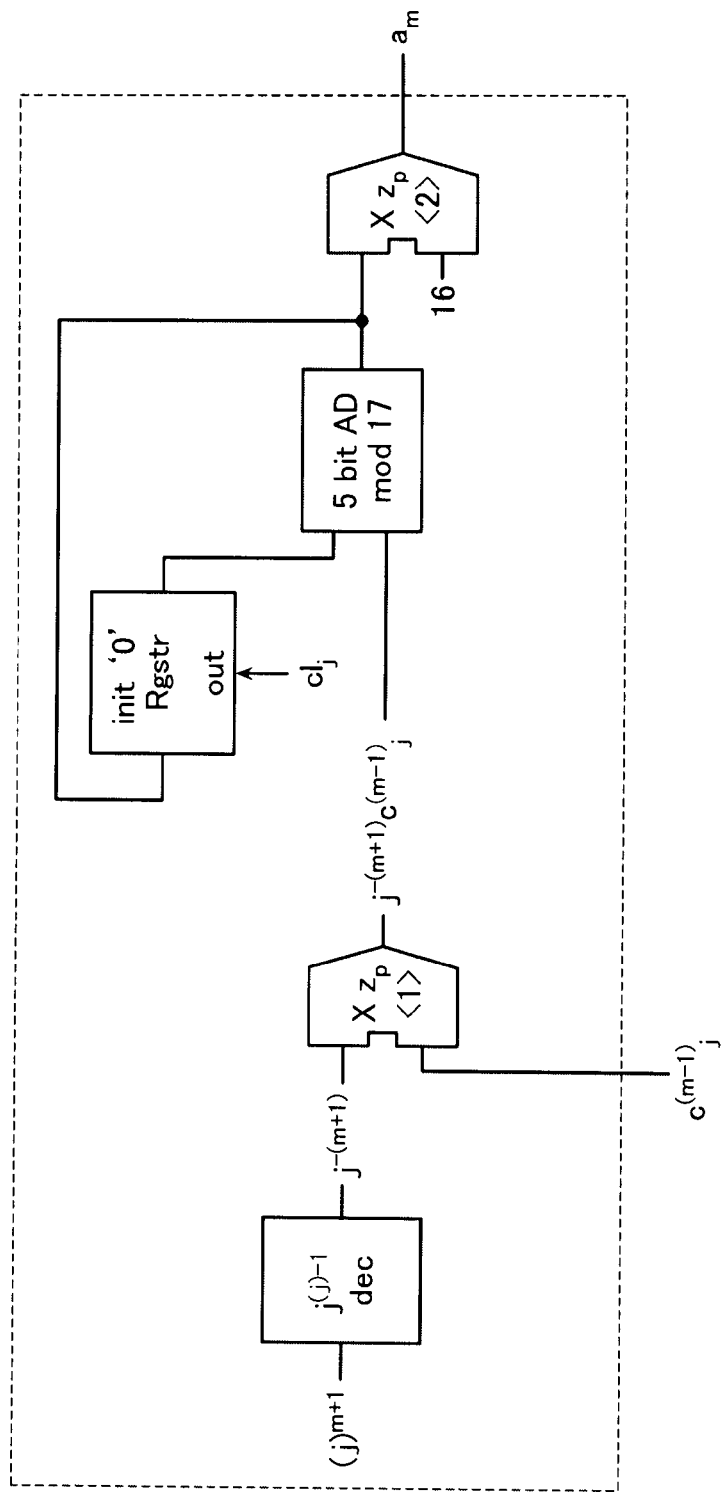
FIG. 61 is a block diagram of the "$a_m$" circuit block in the memory system according to the present embodiment.

FIG. 60 is a diagram showing a circuit symbol of the "$a_m$" circuit block, and FIG. 61 is a block diagram of the "$a_m$" circuit block.

The "$a_m$" circuit block is operable in sync with the clock $cl_j$. It receives $(j)^{m+1}$ and $c_j^{(m-1)}$, and provides $a_m$.

The "$a_m$" circuit block includes a "$j^{-1}$ dec" circuit block, 2 "X Zp" circuit blocks <1>, <2>, a "5 bit AD mod 17" circuit block, and a "Rgstr" register.

The "$j^{-1}$ dec" circuit block converts $(j)^{m+1}$ to the inverse element thereof, $(j)^{-(m+1)}$, and provides it to the "X Zp" circuit block <1>.

The "X Zp" circuit block <1> operates the product of $(j)^{-(m+1)}$ fed from the "$j^{-1}$ dec" circuit block and $c_j$ ($=c_j^{(m-1)}$) output from the "$c_j^{(m-1)}$" circuit block, and provides the product to the "5 bit AD mod 17" circuit block.

The products output from the "5 bit AD mod 17" circuit block are summed through a loop including the "Rgstr" register having an initial value of '0' and the "5 bit AD mod 17" circuit block. The result is fed from the "5 bit AD mod 17" circuit block to the "X Zp" circuit block <2>.

The "X Zp" circuit block <2> operates the product of the sum output from the "5 bit AD mod 17" circuit block and $16^{-1}$=16 to obtain $a_m$, that is, the output from the "$a_m$" circuit block.

Finally, a computing circuit is described, which includes the above-described "$c_j^{(m-1)}$" circuit block and "$a_m$" circuit block to obtain the data code A. Hereinafter, this computing circuit is referred to as the "inverse transforming circuit".

Figure 62:
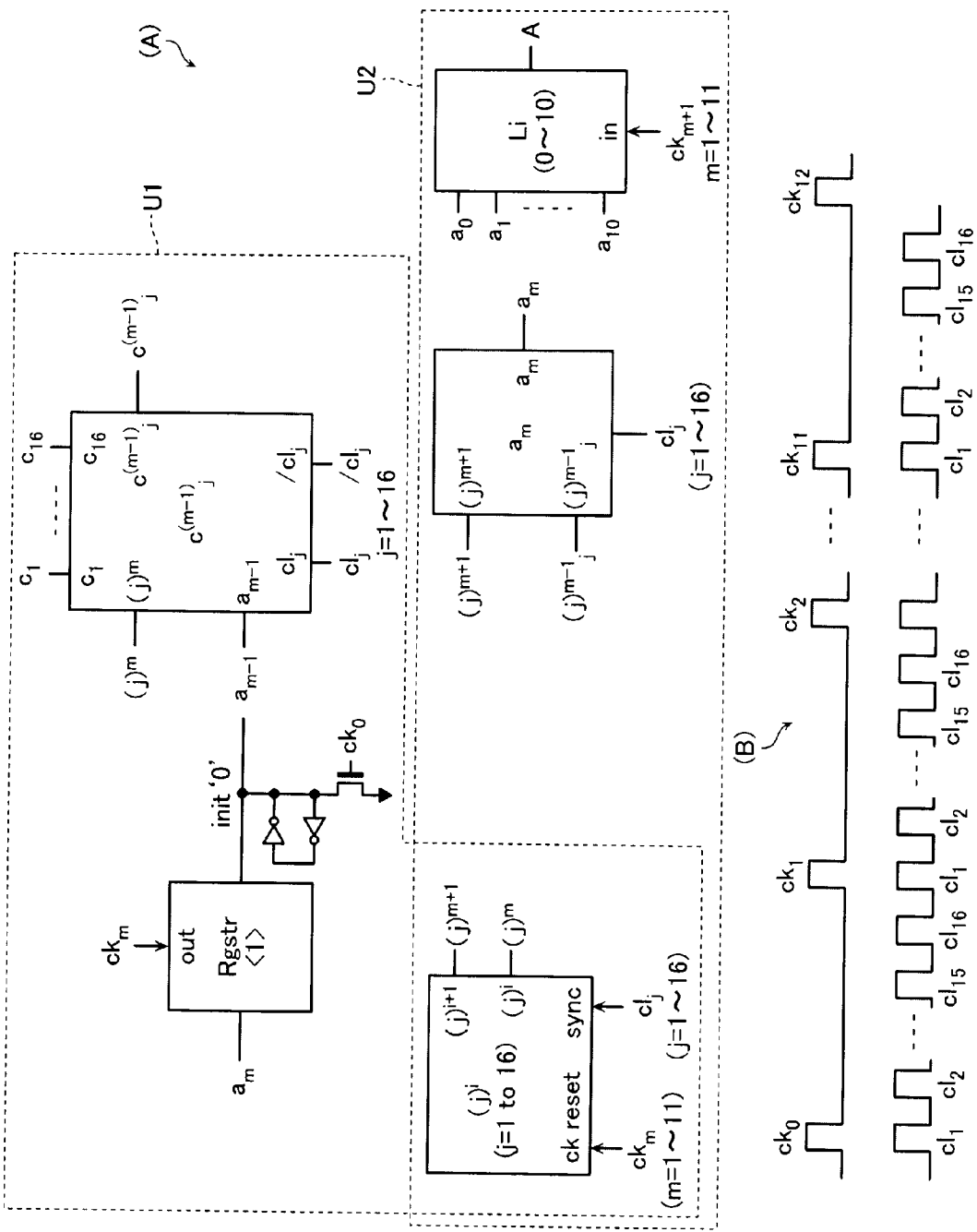
FIG. 62 is a block diagram of the computing circuit for deriving $C=CG^{-1}$ from $C=AG$ in the memory system according to the present embodiment.

FIG. 62(A) is a block diagram of the inverse transforming circuit, and FIG. 62(B) is a timing chart of the clocks ck and cl for use in control of the inverse transforming circuit.

As shown in FIG. 62(B), the clocks ck and cl have such a relation therebetween that the clock cl rises 16 times between the rise of a certain clock ck and the rise of the next clock ck.

The inverse transforming circuit comprises a first part circuit U1 for converting the component of the Lee metric code C required for inverse transformation every time, and a second part circuit U2 for seeking the elements of the data code A one by one.

The first part circuit U1 includes a "$(j^i$ (j=1 to 16)" circuit block, a "Rgstr" register, and a "$c_j^{(m-1)}$" circuit block.

The second part circuit U2 includes a "$(j)^i$ (j=1 to 16)" circuit block, an "$a_m$" circuit block, and a "Li (0-10)" register unit.

Among those, the "$(j)^i$ (j=1 to 16)" circuit block is shared with the first part circuit U1. The "$(j)^i$ (j=1 to 16)" circuit block is a circuit operative to generate the (m+1)-th and m-th powers of the element j in Zp for use in the "$a_m$" circuit block and the "$c_j^{(m-1)}$" circuit block. This circuit block applies m+1, the number of cycles of the clock ck and, m, a 1-cycle lower number than this number of cycles, as indexes, and provides $(j)^{m+1}$ and $(j)^m$.

The "$(j)^i$ (j=1 to 16)" circuit block provides the element in Zp itself to the "$a_m$" circuit block and '1' to the "$c_j^{(m-1)}$" circuit block in the 1st cycle of ck. The '1' fed to the "$c_j^{(m-1)}$" circuit block is originally not utilized in computation. Accordingly, it is required to put a thought in preventing the '1' from exerting an influence on the operation result. Therefore, for the purpose of removing the influence of the '1', the product operation in the first part circuit U1 turns the other input to '0' at the first cycle of the clock ck such that the result of the product operation becomes zero.

The "Rgstr" register in the first part circuit U1 is given a setting of $a_m$. The setting of $a_m$ is provided from the "Rgstr" register at the timing of the clock ck after the clock $ck_1$. Namely, the output $a_{m-1}$ from the "Rgstr" register is provided at the timing of the clock $ck_m$.

In the first clock cycle $ck_0$ of the clock ck, the initial value of the output node in the "Rgstr" register is set at '0' to exert no influence on the computation result as described above.

In sync with the clock $ck_m$, the "$c_j^{(m-1)}$" circuit block receives $a_{m-1}$ and $(j)^m$ output from the "Rgstr" register and the "$(j)^i$ (j=1 to 16)" circuit block, respectively. The "$c_j^{(m-1)}$" circuit block derives $c_j^{(m-1)}$, that is, the output from the first part circuit U1, from these inputs $a_{m-1}$ and $(j)^m$.

The initial value of the "$c_j^{(m-1)}$" circuit block is the restored code data C, and the setting in the "Rgstr" register at the clock $ck_0$ provides $c_j^{(-1)}$=init C.

The "$a_m$" circuit block in the second part circuit U2 obtains $a_m$ at every 16 cycles of the clock cl in accordance with the computing equation shown in Expression 46. The $a_m$ created at the "$a_m$" circuit block is stored in the m-th register in the "Li (0-10)" register unit at the clock $ck_{m+1}$ that indicates the start timing of the cycles of the next 16 clocks cl.

After completion of all the clock cycles, the code data A is set and stored in the "Li (0-10)" register unit.

<Conclusion>

Thus, the first embodiment is described on the p-adic NAND flash memory using the syndrome converting method in error correction with the specific configurations exemplified.

The first embodiment makes it possible to ensure the reliability of data by a strong error correcting ability even if the level setting is insufficient in data write to p-adic cells and data read from p-adic cells.

Second Embodiment

The first embodiment describes the memory system that applies the syndrome converting method in data (code) processing in the "p-adci Zp world". In this case, the circuitry used in the memory system can be simplified. An increase in the correctable error quantity, however, results in an increased number of searching repetitions for searching with no miss in error correction, which leads to an increase in processing time.

If the syndrome converting method is used in error correction as in the first embodiment, the number of repetitions of the computation required for error searching is, for example, in the case of p=17, equal to 16×16=256 times at the maximum if the correctable Lee metrics $\epsilon$=3, and 16 times at the maximum if $\epsilon$=2. On the other hand, if the correctable Lee metrics $\epsilon$=4 as described in the first embodiment, it is required to repeat computation processing 16×16×16=4096 times at the maximum on error searching.

From the above point, the syndrome converting method is effective to an error correcting system mounted on a memory system with a smaller error quantity. In contrast, if the error-correctable quantity is larger (such as p=17, $\epsilon$=4), the use of the conventional Euclidean iterative method rather than the syndrome converting method may reduce the processing time and the circuit scale depending on the case.

Therefore, the second embodiment describes a p-adic NAND flash memory using the Euclidean iterative method in error correction.

Figure 63:
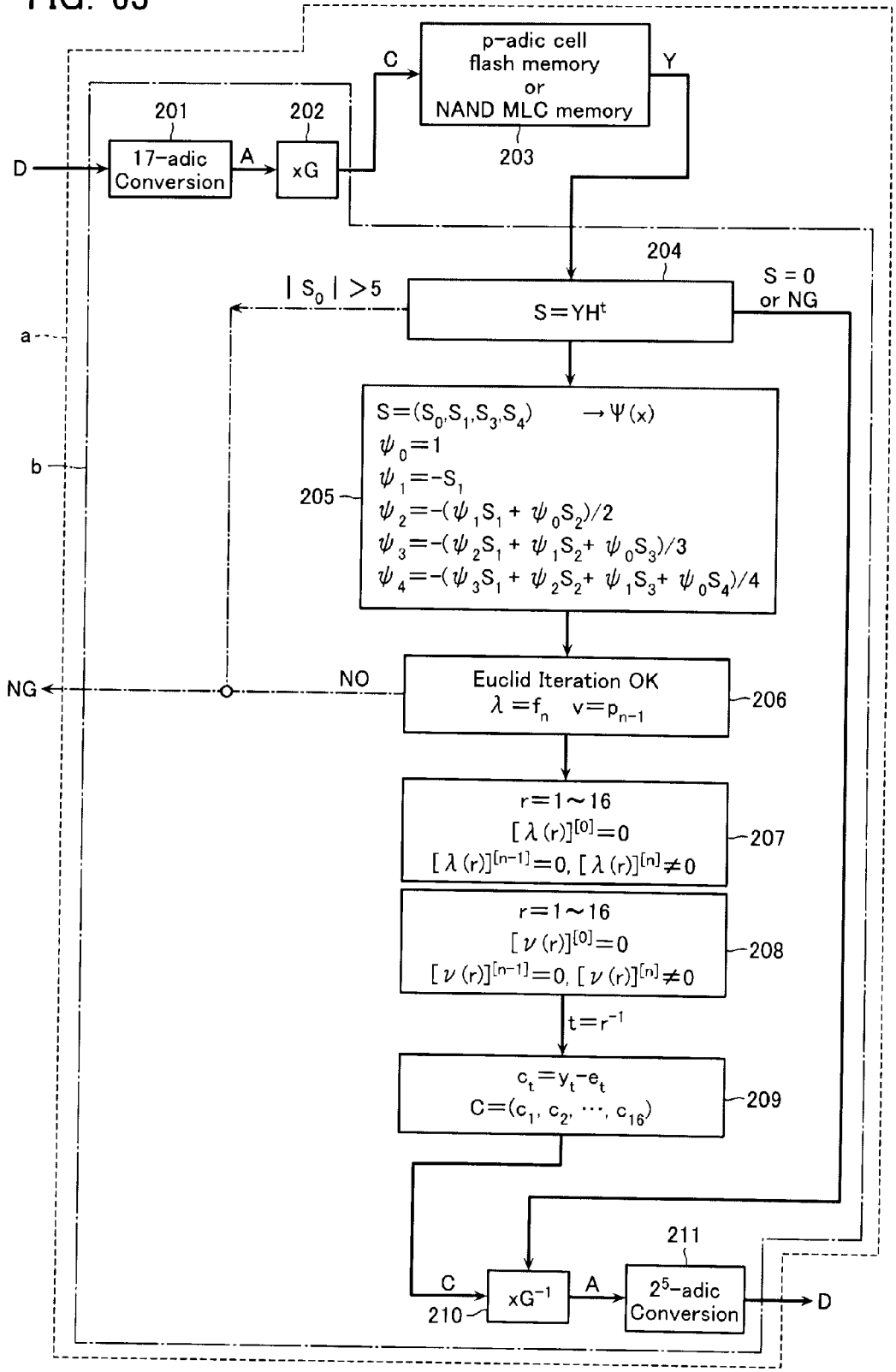
FIG. 63 is a block diagram of a memory system according to a second embodiment.

FIG. 63 is a block diagram of a memory system using the Euclidean iterative method in an error correction. This memory system is configured in the case of p=17 and the maximum error-correctable quantity of $\epsilon$=4.

The p-adic memory system comprises a 17-adic converter unit 201, an encoder unit 202, a p-adic cell memory unit 203, a syndrome generator unit 204, a solution searching polynomial generator unit 205, a Euclidean iteration processing unit 206, a first Hasse differential polynomial generator unit 207, a second Hasse differential polynomial generator unit 208, a code restorer unit 209, a decoder unit 210, and a $2^5$-adic converter unit 211.

Among those, the processes of processing in the 17-adic converter unit 201, the encoder unit 202, and the p-adic cell memory unit 203 are same as those in the 17-adic converter unit 101, the encoder unit 102, and the p-adic cell flash memory 103 in the p-adic memory system shown in FIG. 33. Therefore, the following description is given to the processes of processing after the code Y is read out of the p-adic cell flash memory 103.

The code C, Lee-metric-coded at the encoder unit 202, is read out as the error-containing code Y from the p-adic cell flash memory 203. The code Y is fed to the syndrome generator unit 204.

The syndrome generator unit 204 uses the syndrome matrix H and each code word component of the code Y to compute the syndrome S in accordance with $S=YH^t$. In the case of S=0, the code Y contains no error. Accordingly, the code Y is fed to the decoder unit 210 for final processing. On the other hand, if $S \neq 0$ and the first component $S_0$ of S is $|S_0|>5$, the error in the code Y cannot be corrected surely. Accordingly, NG signal is provided and the error-containing code Y is directly fed to the decoder unit 210 for first processing. In other cases, the syndrome S is fed to the solution searching polynomial generator unit 205.

The solution searching polynomial generator unit 205 derives a polynomial $\Psi(x)$ from the syndrome S in accordance with the computation equation shown in Expression 47. This polynomial $\Psi(x)$ is fed to the Euclidean iteration processing unit 206.

$$S=(S_0,S_1,S_3,S_4) \rightarrow \Psi(x)$$

$$\psi_0=1$$

$$\psi_1=-S_1$$

$$\psi_2=-(\psi_1 S_1+\psi_0 S_2)/2$$

$$\psi_3=-(\psi_2 S_1+\psi_1 S_2+\psi_0 S_3)/3$$

$$\psi_4=-(\psi_3 S_1+\psi_2 S_2+\psi_1 S_3+\psi_0 S_4)/4 \qquad [\text{Expression 47}]$$

The Euclidean iteration processing unit 206 tries creation of $\lambda=f_n$, $\nu=p_{n-1}$ through the Euclidean iterative method. If succeeded to create $\lambda$ and $\nu$, it provides these polynomials $\lambda(x)$ and $\nu(x)$ to the first and second Hasse differential polynomial generator units 207 and 208. On the other hand, if failed to create $\lambda$ and $\nu$, it provides NG signal, and feeds the error-containing code Y directly to the encoder unit 210 for first processing. The circuitry of the Euclidean iteration processing unit 206 is detailed later.

The first and second Hasse differential polynomial generator units 207 and 208 derive respective Hasse differential polynomials from the polynomials $\lambda(x)$ and $\nu(x)$, and seek the roots r thereof and the multiplicities n of the roots. The first and second Hasse differential polynomial generator units 207 and 208 provide $t=r^{-1}$ to the code restorer unit 210 in accordance with the established roots r and multiplicities n.

The code restorer unit 210 derives an error quantity $e_t$ from the positional coordinates of the error-caused code word and the multiplicities n. It restores the code $C=(c_1, c_2, \ldots, c_{16})$ of the Lee metric code from $c_t=y_t-e_t$.

Processing on and after the decoder unit 210 and the $2^5$-adic converter unit 211 is same as that in the decoder unit 109 and the $2^5$-adic converter unit 110 shown in FIG. 33 and accordingly omitted from the following description.

Thus, in the case of the memory system according to the present embodiment, the iteration and complication of processing can be all pushed in the Euclidean iterative method and the entire processing flow can be simplified.

The entire system configuration is roughly divided in 2: a system configuration surrounded by the dashed line shown with a in FIG. 63; and a system configuration surrounded by the chain line shown with b in FIG. 63 as can be considered.

The system surrounded by the dashed line includes a p-adic cell flash memory mounted thereon, which can serve as one memory system by itself. Therefore, in the case of this memory system, it is required to develop the p-adic cell flash memory also described in the first embodiment. In accordance therewith, it is also required to modify the level setting method applied to p-adic cells from that in the case of the memory system using the conventional NAND MLC.

The system surrounded by the chain line serves as a memory controller that uses the conventional NAND MLC directly as the memory device. Therefore, this system can be realized only by providing I/O operative to decode the elements in Zp so as to correspond to the levels of MLC at the time of data write. Thus, the conventional NAND MLC can be utilized to construct the memory system that uses the Lee metric code. The memory system that uses the memory controller, however, requires a longer time for mapping of MLC and Zp, and thus cannot provide a faster data processing system. It is still possible, though, to execute data management with increased reliability of data.

Mapping of MLC and Zp has different pages at every group of levels of MLC. Accordingly, unless pieces of data between different pages are managed collectively, the levels of 1 memory cell cannot be continuously associated as the elements in Zp. Therefore, it is required to provide registers corresponding to all pieces of page data for mapping of the elements in Zp and binary representations, and execute a series of data transfers between all pages in the register group and individual pages in the NAND MLC memory device. Therefore, the mapping requires a plurality of logic circuits. This mapping can be regarded as a large register-and-decoder set and accordingly the details are not described. The number of levels in NAND MLC is equal to a power of 2 and the number of elements in Zp is a prime. Therefore, available primes are below p=7 in the case of an 8-level cell, and below p=13 in the case of a 16-level cell. Thus, from the viewpoint of the efficiency of memory cells, it cannot be regarded as an optimal memory system.

Market demands determine which one of the systems should be constructed. In accordance with the description in the first embodiment and a second embodiment shown below, it is possible to realize either of the systems.

<Euclidean Method>

First, as the premise of the memory system using the Euclidean iterative method, general relational equations in the case of the use of the Euclidean method are described collectively where $\gamma=\epsilon+1$.

The binary data of the code C recorded in p-adic cells includes h-bit code word symbols, a collection of (p−1) pieces, which may cause variations bit by bit when suffer various disturbances. Thus, the operation required to restore the code C from the code Y is decoding. Prior to decoding, the syndrome is sought at the start.

The syndrome S can be sought as elements $S_0, S_1, \ldots, S_{\gamma-1}$ shown in Expression 48 through an operation $S=YH^t$ using a syndrome matrix H.

$$\sum_{j=1}^{p-1} (j)^l c_j = \sum_{i=0}^{k} x^i \sum_{j=0}^{p-1} (j)^{l+i} = 0 \quad \text{[Expression 48]}$$

$$\therefore S_l = \sum_{j=1}^{p-1} (j)^l e_j, \; S_0 = \sum e_j$$

Here, $H^t$ is a transpose of H. The generator matrix G and the syndrome matrix H are configured to satisfy $GH^t=0$ (mod p). Accordingly, a representation of Y=C+E yields $S=EH^t$. With $E=(e_1, e_2, \ldots, e_{p-1})$, a syndrome $S_0$ corresponds to the total sum of errors in the code word symbols as can be found.

These syndromes S provide the only information on errors and, on the basis of these syndromes S, the correct code C is restored as follows.

Subsequently, the principle of decoding is described. Here, n(=p−1) error symbols are classified into 2 sets $J_+$ and $J_-$ as in Expression 49.

$$J_+ = \{j \in (1,2, \ldots n); e_j < p/2\}$$

$$J_- = \{j \in (1,2, \ldots n); e_j > p/2\} \quad \text{[Expression 49]}$$

Namely, it is classified into $J_+$ that is an arrangement of the positions j of the code symbols $c_j$ if the error quantity in the symbol is $e_j < p/2$, and $J_-$ that is an arrangement of the positions j of the code symbols $c_j$ if the error quantity in the symbol is $e_j > p/2$. Polynomials $\Lambda(x)$, $V(x)$ in the Galois field GF(p) are configured on the basis of these sets as in Expression 50.

$$\Lambda(x) = \prod_{j \in J_+} (1 - jx)^{e_j}, \; V(x) = \prod_{j \in J_-} (1 - jx)^{p-e_j} \quad \text{[Expression 50]}$$

Thus, the polynomial $\Lambda(x)$ is a polynomial that has a reciprocal number of the position j of an error code word symbol in $J_+$ as a root and that has a Lee metric $e_j$ of that code word symbol as the multiplicity of the root. On the other hand, the polynomial $V(x)$ is a polynomial that has a reciprocal number of the position j of an error code word symbol in $J_-$ as a root and that has a Lee metric $p-e_j$ of that code word symbol as the multiplicity of the root. Decoding is a process of finally configuring these polynomials only from the information on the syndrome $S_1$ to solve them, thereby obtaining information on errors. In a word, it is required to seek a relation between these polynomials $\Lambda(x)$, $V(x)$ and the syndrome $S_1$.

Subsequently, as shown in Expression 51, when it is configured with a series polynomial having each syndrome $S_1$ on a coefficient of the corresponding degree, it is represented with a rational polynomial having the error quantity $e_j$ of the symbol, the position j and the value thereof.

$$S(x) = \sum_{l=1}^{\infty} S_l x^l = \sum_{j=1}^{p-1} e_j \sum_{l=1}^{\infty} (jx)^l = \sum_{j=1}^{p-1} e_j \frac{jx}{1-jx} \quad \text{[Expression 51]}$$

From Expression 51, a relational expression shown in Expression 52 can be established among the polynomials $\Lambda(x)$, $V(x)$ and the syndrome $S(x)$.

$$\left(\frac{\Lambda(x)}{V(x)}\right) S(x) = -x \left(\frac{\Lambda(x)}{V(x)}\right)' \quad \text{[Expression 52]}$$

Subsequently, the relational expression shown in Expression 52 is used to seek the polynomials $\Lambda(x)$, $V(x)$ from the syndrome $S(x)$.

From the syndrome $S(x)$, a polynomial $\Psi(x)$ with a degree of $\gamma-1$ or lower shown in Expression 53 is sought.

$$\Psi(x) S(x) \equiv -x \Psi'(x) (\mathrm{mod}\, x^\gamma) \quad \text{[Expression 53]}$$

$$\Psi(x) = 1 + \sum_{l=1}^{} \psi_l x^l,$$

$$\psi_j = -\frac{1}{j} \sum_{i=1}^{j} \psi_{j-i} S_i$$

In an expansive expression of the polynomial $\Psi(x)$, a coefficient $\psi_3$ can be sought from a comparison between the coefficients at the homogeneous degree on both sides of the expression shown in Expression 53 through an iterative method using the syndrome $S_i$ and an already-determined coefficient $\psi_{j-1}$. The coefficients $\psi_0$ to $\psi_{\gamma-1}$ of the polynomial $\Psi(x)$ are sought from the syndromes $S_1$ to $S_{\gamma-1}$. The results are shown in Expression 54.

$$\psi_0 = 1$$
$$\psi_1 = -\psi_0 S_1 = -S_1$$
$$\psi_2 = -(\psi_1 S_1 + \psi_0 S_2)/2$$
$$\vdots$$
$$\psi_{\gamma-1} = -(\psi_{\gamma-2} S_1 + \ldots + \psi_0 S_{\gamma-1})/(\gamma-1)$$

[Expression 54]

The polynomial $\Psi(x)$ is a polynomial equivalent to $\Lambda(x)/V(x)$ while the polynomials $\Lambda(x)$, $V(x)$ are given key conditions shown in Expression 55. Therefore, it can be sought through a Euclid iterative method applied to $x^\gamma$ and the polynomial $\Psi(x)$ to eliminate constant multiples.

$$V(x)\Psi(x) \equiv \Lambda(x) \pmod{x^\gamma}$$
$$deg\Lambda(x) + deg\, V(x) < \gamma$$
$$\Lambda(x) \text{ and } V(x) \text{ are coprimes}$$
$$deg\Lambda(x) - deg\, V(x) \equiv S_0 \pmod{p}$$

[Expression 55]

Therefore, if the polynomial $\Psi(x)$ can be configured from the syndromes $S_1$ to $S_{\gamma-1}$, the syndrome $S_0$ can be used as the stop condition on the iterative method to seek the polynomials $\Lambda(x)$, $V(x)$. Namely, the polynomials $\Lambda(x)$, $V(x)$ sought from the set of $(S_0, \Psi(x))$ through the iterative method can represent the position $j$ and the error quantity $e_j$ of an error code word symbol.

<Error Correction through Euclidean Iterative Method>

Next, the Euclidean iterative method is described. The following description is given to an iterative method of seeking a congruence equation, $v(x)\Psi(x) \equiv \lambda(x) \pmod{x^\gamma}$, with the stop condition, $deg\, \lambda(x) - deg\, v(x) \equiv S_0 \pmod{p}$.

The Euclid iterative method is a method of sequentially seeking functions $f_0, f_1, \ldots, f_n$ using divisions of polynomials. These quantities have relations shown in Expression 56.

$$f_0 = k_0 f_1 + f_2, f_1 = k_1 f_2 + f_3, \ldots, f_n = k_n f_{n+1} + f_{n+2}$$

[Expression 56]

$$p_{-1} = 0, p_0 = 1, p_n = k_{n-1} p_{n-1} + p_{n-2}$$
$$q_0 = 0, q_1 = 1, q_n = k_{n-1} q_{n-1} + q_{n-2}$$

$$p_n f_n + p_{n-1} f_{n+1} = (k_{n-1} p_{n-1} + p_{n-2}) f_n + p_{n-1} f_{n+1}$$
$$= p_{n-1}(k_{n-1} f_n + f_{n+1}) + p_{n-2} f_n$$
$$= p_{n-1} f_{n-1} + p_{n-2} f_n$$
$$\vdots$$
$$= p_0 f_0 + p_{-1} f_1 = f_0$$

$$q_n f_n + q_{n-1} f_{n+1} = (k_{n-1} q_{n-1} + q_{n-2}) f_n + q_{n-1} f_{n+1}$$
$$= q_{n-1}(k_{n-1} f_n + f_{n+1}) + q_{n-2} f_n$$
$$= q_{n-1} f_{n-1} + q_{n-2} f_n$$
$$\vdots$$
$$= q_1 f_1 + q_0 f_2 = f_1$$

-continued $$f_0 = p_n f_n + p_{n-1} f_{n+1}, f_1 = q_n f_n + q_{n-1} f_{n+1}$$

$$\begin{vmatrix} p_n & p_{n-1} \\ q_n & q_{n-1} \end{vmatrix} = \begin{vmatrix} k_{n-1} p_{n-1} & p_{n-1} \\ k_{n-1} q_{n-1} & q_{n-1} \end{vmatrix}$$
$$= -\begin{vmatrix} p_{n-1} & p_{n-2} \\ q_{n-1} & q_{n-2} \end{vmatrix} \to p_n q_{n-1} - p_{n-1} q_n$$
$$= (-1)^{n-1}(p_1 q_0 - p_0 q_1)$$
$$= (-1)^n,$$

$$f_n = (-1)^n (q_{n-1} f_0 - p_{n-1} f_1)$$
$$\therefore f_n \equiv (-1)^{n+1} p_{n-1} \Psi(\bmod x^\gamma), f_0 = x^\gamma, f_1 = \Psi$$

Here, as shown in Expression 57, when $p_n$ or $q_n$ can be sequentially introduced from a quotient polynomial $k_n$ particularly obtained through the process of division, these polynomials can satisfy a simple relation. Accordingly, $f_n$ can be represented by $f_0$, $f_1$, $p_{n-1}$ and $q_{n-1}$. Then, when $f_0 = x^\gamma$, $f_1 = \Psi(x)$ are established to create a congruence equation at $x^\gamma$, the stop condition on iteration turns to $deg\, f_n - deg\, p_{n-1} \equiv S_0 \pmod{p}$. With regard to n that satisfies the stop condition, if $deg\, f_n + deg\, p_{n-1} < \gamma$, then $\lambda(x) = f_n$, $V(x) = p_{n-1}$ can be established.

As $\gamma = \epsilon + 1$, a computation for error 4 requires around 4 times of iterations, for example. With this regard, the use of the Euclidean iterative method increases the scale of the operating circuit though it can reduce the number of computations particularly lower than the syndrome converting method.

The following description is given to specific circuitry on points greatly different from the syndrome converting method.

<Circuitry of Syndrome Generator Unit>

Next, as an example of circuitry of the syndrome generator unit 204, an operating circuit operative to seek component elements of the syndrome S in batch is described. Hereinafter, this operating circuit is referred to as the "syndrome component element generating circuit".

The syndrome component element generating circuit is configured based on the equations shown in Expression 57.

$$S_0 = \sum_{j=1}^{p-1} y_j = \sum_{j=1}^{p-1} e_j$$

[Expression 57]

$$S_1 = \sum_{j=1}^{p-1} (j)^1 y_j = \sum_{j=1}^{p-1} (j)^1 e_j$$

Figure 64:
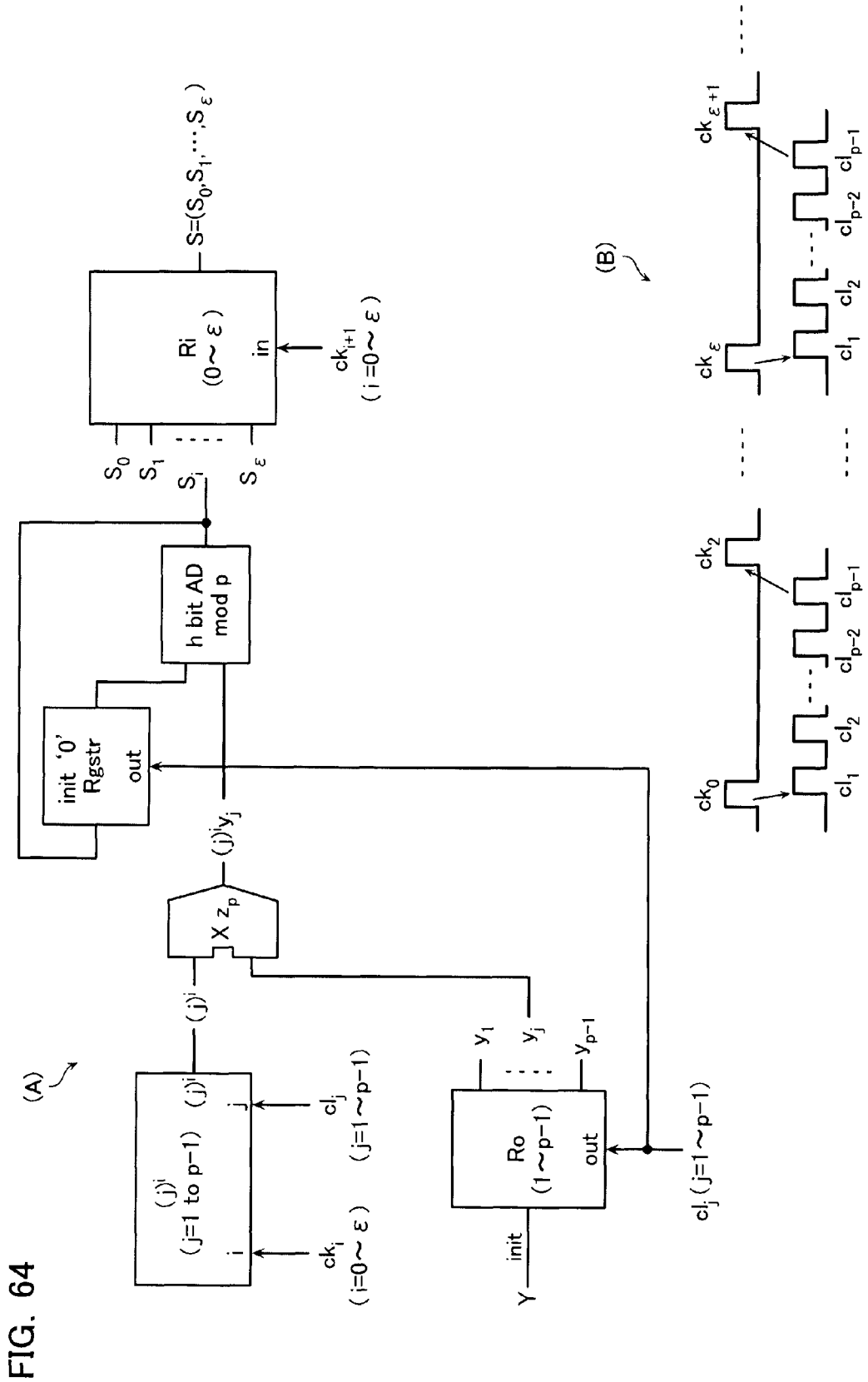
FIG. 64 is a block diagram of a circuit for deriving component elements of a syndrome in the memory system according to the present embodiment.

FIG. 64(A) is a block diagram of the syndrome component element generating circuit, and FIG. 64(B) is a timing chart of the clocks $ck_i$ ($i=0$ to $\epsilon+1$), $cl_j$ ($j=1$ to $p-1$) for use in control of the syndrome component element generating circuit.

The syndrome component element generating circuit includes, as shown in FIG. 64(A), a "Ro (1 to p−1)" register unit, a "$(j)^i$ ($j=1$ to p−1)" circuit block, an "X Zp" circuit block, a "h bit AD mod p" circuit block, a "Rgstr" register, and a "Ri (0-$\epsilon$)" register unit.

Data Y read out of the p-adic cell array is stored in the "Ro (1 to p−1)" register as an initial value. The "$(j)^i$ ($j=1$ to p−1)" circuit block generates $(j)^i$. These "Ro (1 to p−1)" register and "$(j)^i$ ($j=1$ to p−1)" circuit block are synchronized with each other by the clock $cl_i$ and controlled such that $(j)^i$ is provided at the same time as the output of the component $y_j$ of Y. The "X Zp" circuit block yields the product thereof, $(j)^i y_j$, which is summed, in sync with the clock $cl_j$ ($j=1$ to p−1), through the loop including the "h bit AD mod p" circuit block and the "Rgstr" register, to create a syndrome component $S_i$. The resultant $S_i$ is stored in the i-th register in the Ri (0-ϵ)" register at the clock $ck_{i+1}$. This process is treated at the clock $ck_i$ for i=0-ϵ to obtain all syndrome components, which are then stored in the "Ri (0-ϵ)" register unit.

An example of circuitry of the Euclidean iteration processing unit 206 is described below.

The first description is given to a circuit operative to derive $k_n$ in computation of $f_n = k_n f_{n+1} + f_{n+2}$. Hereinafter, this circuit is referred to as the "kn" circuit block.

The "kn" circuit block is configured based on the relational equations shown in Expression 58.

$$f_n = k_n f_{n+1} + f_{n+2}$$

$$f_n = a^{(n)}_0 + a^{(n)}_1 x + \ldots + a^{(n)}_{j-1} x^{j-1} + a^{(n)}_j x^j$$

$$k_n = b^{(n)}_0 + b^{(n)}_1 x$$

$$b^{(n)}_1 = a^{(n)}_j / b^{(n+1)}_{j-1}, b^{(n)}_0 = (a^{(n)}_{j-1} - b^{(n)}_1 a^{(n+1)}_{j-2}) / a^{(n+1)}_{j-1}$$ [Expression 58]

The "kn" circuit block applies the relations between coefficients shown in Expression 58 to derive an unknown coefficient from the known coefficients. On the assumption that the polynomial of $k_n$ is at the 1st degree, and that the coefficient is turned to 0 in the process of computation if the coefficient at the highest degree becomes 0 as well, the process advances the procedure of computation sequentially. At this time, the inverse element of 0 is determined 0 to allow the relations between coefficients to establish always.

Figure 65:
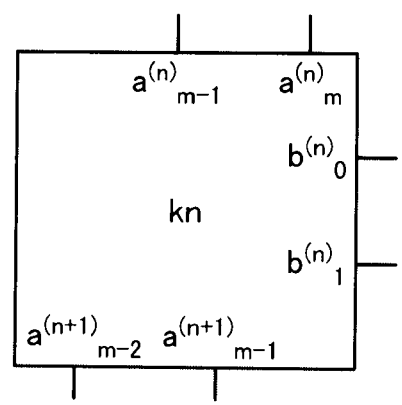
FIG. 65 is a diagram showing a circuit symbol of a circuit for use in a Euclidean iterative method ("kn" circuit block) in the memory system according to the present embodiment.
Figure 66:
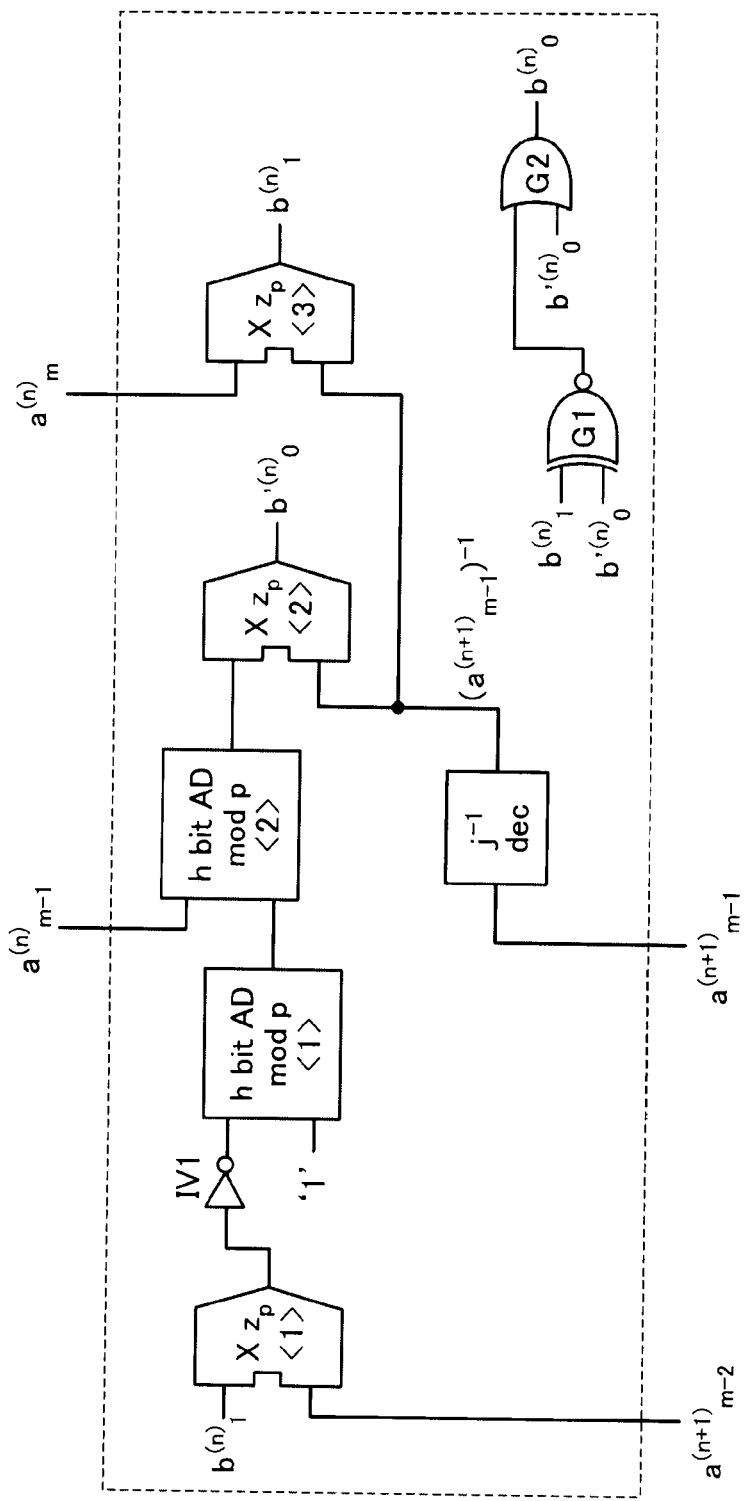
FIG. 66 is a block diagram of the "kn" circuit block in the memory system according to the present embodiment.

FIG. 65 is a diagram showing a circuit symbol of the "kn" circuit block. FIG. 66 is a block diagram of the "kn" circuit block.

The "kn" circuit block receives $a^{(n)}_{m-1}$ and $a^{(n)}_m$, and provides $a^{(n+1)}_{m-1}$, $a^{(n+1)}_{m-2}$, $b^{(n)}_1$, and $b^{(n)}_0$ as shown in FIG. 65.

The "kn" circuit block includes 3 "X Zp" circuit blocks <1>, <2>, <3>, 2 "h bit AD mod p" circuit blocks <1>, <2>, a "$j^{-1}$ dec" circuit block, an XNOR gate G1, and an OR gate G2.

The "X Zp" circuit block <1> computes the product of $a^{(n+1)}_{m-2}$ and $b^{(n)}_1$. The result $b^{(n)}_1 a^{(n+1)}_{m-2}$ is fed to the "h bit AD mod p" circuit block <1> via the inverter IV1.

The "h bit AD mod p" circuit block <1> receives the output from the inverter IV1 and '1', and obtains the complement of $b^{(n)}_1 a^{(n+1)}_{m-2}$.

The "h bit AD mod p" circuit block <2> receives the output from the "h bit AD mod p" circuit block <1> and $a^{(n)}_{m-1}$, and provides the result, $a^{(n)}_{m-1} - b^{(n)}_1 a^{(n+1)}_{m-2}$, to the "X Zp" circuit block <2>.

The "$j^{-1}$ dec" circuit block receives $a^{(n+1)}_{m-1}$, and provides the inverse element thereof, $(a^{(n+1)}_{m-1})^{-1}$, to the "X Zp" circuit blocks <2> and <3>.

The "X Zp" circuit block <2> computes the product of the output, $a^{(n)}_{m-1} - b^{(n)}_1 a^{(n+1)}_{m-2}$, from the "h bit AD mod p" circuit block <2> and the output, $(a^{(n+1)}_{m-1})^{-1}$, from the "$j^{-1}$ dec" circuit block, to obtain the result $b'^{(n)}_0$.

The "X Zp" circuit block <3> computes the product of $a^{(n)}_m$ and the output, $(a^{(n+1)}_{m-1})^{-1}$, from the "$j^{-1}$ dec" circuit block, to obtain the result $b^{(n)}_1$, that is, the output from the "kn" circuit block.

The XNOR gate G1 receives the output, $b'^{(n)}_0$, from the "X Zp" circuit block <2> and the output, $b^{(n)1}_0$, from the "X Zp" circuit block <3>. The OR gate G2 receives the output from the "X Zp" circuit block <3> and $b'^{(n)}_0$. In this case, the output from the OR gate G2 turns to the output, $b^{(n)}_0$, from the "kn" circuit block.

The following description is given to a circuit operative to derive $f_{n+2}$ in computation of $f_n = k_n f_{n+1} + f_{n+2}$. Hereinafter, this circuit is referred to as the "fn" circuit block.

The "fn" circuit block is configured based on the relational equations shown in Expression 59.

$$f_n = k_n f_{n+1} + f_{n+2}$$

$$f_{n+2} = f_n - k_n f_{n+1}, k_n = b^{(n)}_0 + b^{(n)}_1 x$$

$$f_{n+2} = f_n - (b^{(n)}_0 f_{n+1} + b^{(n)}_1 x f_{n+1})$$

$$a^{(n+2)}_m = a^{(n)}_m - (b^{(n)}_0 a^{(n+1)}_m + b^{(n)}_1 a^{(n+1)}_{m-1})$$ [Expression 59]

The "fn" circuit block applies the relations between coefficients shown in Expression 59 to derive an unknown coefficient from the known coefficients. It utilizes the already-obtained coefficients of the polynomial of $k_n$.

Figure 67:
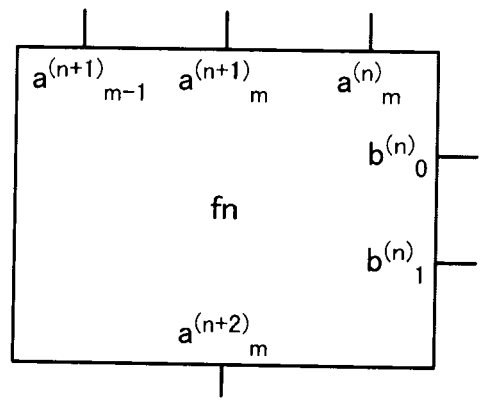
FIG. 67 is a diagram showing a circuit symbol of a circuit for use in a Euclidean iterative method ("fn" circuit block) in the memory system according to the present embodiment.
Figure 68:
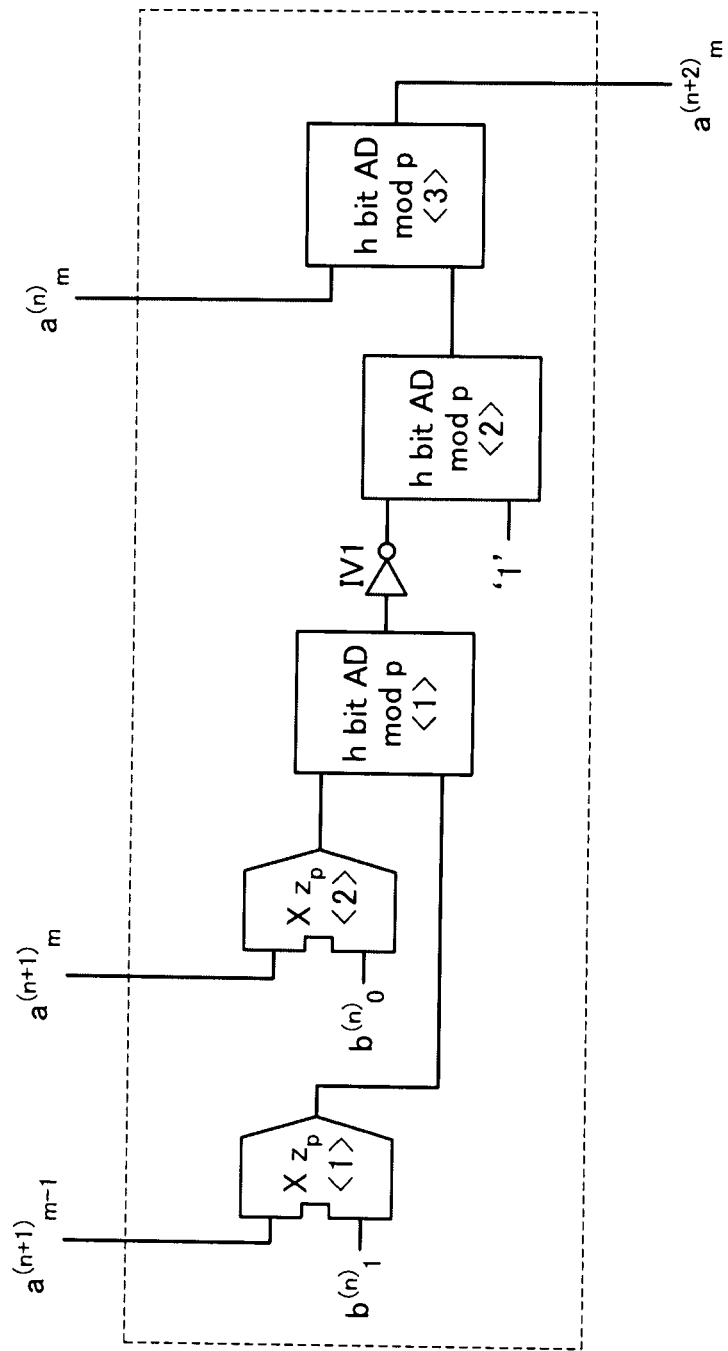
FIG. 68 is a block diagram of the "fn" circuit block in the memory system according to the present embodiment.

FIG. 67 is a diagram showing a circuit symbol of the "fn" circuit block. FIG. 68 is a block diagram of the "fn" circuit block.

The "fn" circuit block receives $a^{(n+1)}_{m-1}$, $a^{(n+1)}_m$, $a^{(n)}_m$, $b^{(n)}_1$ and $b^{(n)}_0$, and provides $a^{(n+2)}_m$ as shown in FIG. 67.

The "fn" circuit block includes 2 "X Zp" circuit blocks <1>, <2>, and 3 "h bit AD mod p" circuit blocks <1>, <2> and <3>.

The "X Zp" circuit block <1> computes the product of $a^{(n+1)}_{m-1}$ and $b^{(n)}_1$, and provides the result, $b^{(n)}_1 a^{(n+1)}_{m-1}$, to the "h bit AD mod p" circuit block <1>.

The "X Zp" circuit block <2> computes the product of $a^{(n+1)}_m$ and $b^{(n)}_0$, and provides the result, $b^{(n)}_0 a^{(n+1)}_m$, to the "h bit AD mod p" circuit block <1>.

The "h bit AD mod p" circuit block <1> receives the output, $b^{(n)}_1 a^{(n+1)}_{m-1}$, from the X Zp" circuit block <1> and the output, $b^{(n)}_0 a^{(n+1)}_m$, from the X Zp" circuit block <2>. The output from the "h bit AD mod p" circuit block <1> is fed to the "h bit AD mod p" circuit block <2> via the inverter IV1.

The "h bit AD mod p" circuit block <2> receives the output from the inverter IV1 and '1', and obtains the complement of $(b^{(n)}_0 a^{(n+1)}_m + b^{(n)}_1 a^{(n+1)}_{m-1})$.

The "h bit AD mod p" circuit block <3> receives $a^{(n)}_m$ and the output from the "h bit AD mod p" circuit block <2>, and obtains $a^{(n+2)}_m$, that is, the output from this "fn" circuit block.

The following description is given to a circuit operative to derive $p_{n-2}$ in computation of $p_n = k_{n-1} p_{n-1} + p_{n-2}$. Hereinafter, this circuit is referred to as the "pn" circuit block.

The "pn" circuit block is configured based on the relational equations shown in Expression 60.

$$p_n = k_{n-1} p_{n-1} + p_{n-2}$$

$$p_n = a^{(n)}_0 + a^{(n)}_1 x + \ldots + a^{(0)}_{j-1} x^{j-1} + a^{(n)}_j x^j$$

$$k_n = b^{(n)}_0 + b^{(n)}_1 x$$

$$p_{n+1} = (b^{(n)}_0 p_n + b^{(n)}_1 x p_n) + p_{n-1}$$

$$a^{(n+1)}_m = (b^{(n)}_0 a^{(n)}_m + b^{(n)}_1 a^{(n)}_{m-1}) + a^{(n-1)}_m$$ [Expression 60]

The "pn" circuit block applies the relations between coefficients shown in Expression 60 to derive an unknown coefficient from the known coefficients. It utilizes the already-obtained coefficients of the polynomial of $k_n$.

Figure 69:
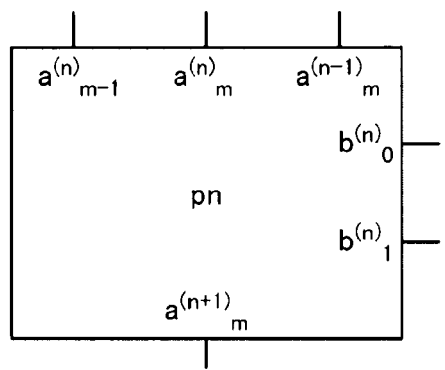
FIG. 69 is a diagram illustrative of a circuit symbol of a circuit for use in a Euclidean iterative method ("pn" circuit block) in the memory system according to the present embodiment.
Figure 70:
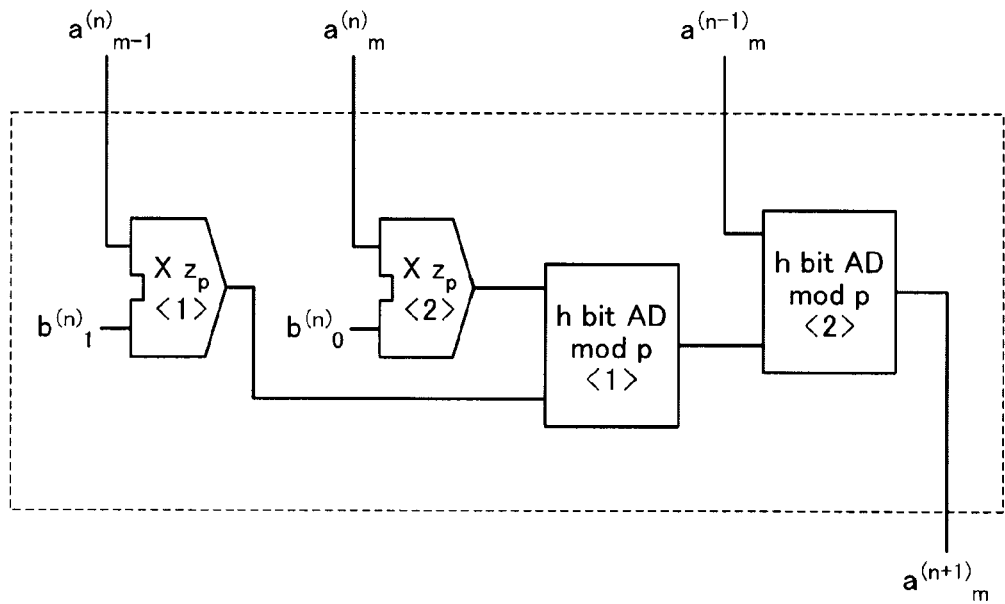
FIG. 70 is a block diagram of the "pn" circuit block in the memory system according to the present embodiment.

FIG. 69 is a diagram showing a circuit symbol of the "pn" circuit block. FIG. 70 is a block diagram of the "pn" circuit block.

The "pn" circuit block receives $a^{(n)}_{m-1}$, $a^{(n)}_m$ and $a^{(n-1)}_m$, and provides $a^{(n+1)}_m$ as shown in FIG. 69.

The "pn" circuit block includes 2 "X Zp" circuit blocks <1>, <2>, and 2 "h bit AD mod p" circuit blocks <1> and <2> as shown in FIG. 70.

The "X Zp" circuit block <1> computes the product of $a^{(n)}_{m-1}$ and $b^{(n)}_{1}$, and provides the result, $b^{(n)}_{1}a^{(n)}_{m-1}$, to the "h bit AD mod p" circuit block <1>.

The "X Zp" circuit block <2> computes the product of $a^{(n)}_{m}$ and $b^{(n)}_{0}$, and provides the result, $b^{(n)}_{0}a^{(n)}_{m}$, to the "h bit AD mod p" circuit block <1>.

The "h bit AD mod p" circuit block <1> receives the output, $b^{(n)}_{1}a^{(n)}_{m-1}$, from the X Zp circuit block <1> and the output, $b^{(n)}_{0}a^{(n)}_{m}$, from the X Zp circuit block <2>, and provides $b^{(n)}_{0}a^{(n)}_{m}+b^{(n)}_{1}a^{(n)}_{m-1}$ to the "h bit AD mod p" circuit block <1>.

The "h bit AD mod p" circuit block <2> receives $a^{(n-1)}_{m}$ and the output, $b^{(n)}_{0}a^{(n)}_{m}+b^{(n)}_{1}a^{(n)}_{m-1}$, from the "h bit AD mod p" circuit block <1>, and obtains $a^{(n+1)}_{m}$, that is, the output from the "pn" circuit block.

Subsequently, a circuit for computing $f_n=k_n f_{n+1}+f_{n+2}$ is described. Hereinafter, this circuit is referred to as the "$f_n=k_n f_{n+1}+f_{n+2}$" circuit block.

Figure 71:
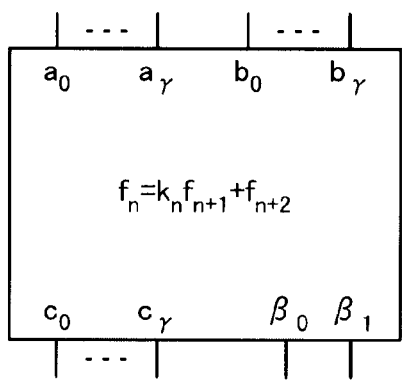
FIG. 71 is a diagram showing a circuit symbol of a circuit for use in a Euclidean iterative method ("$f_n=k_n f_{n+1}+f_{n+2}$" circuit block) in the memory system according to the present embodiment.
Figure 72:
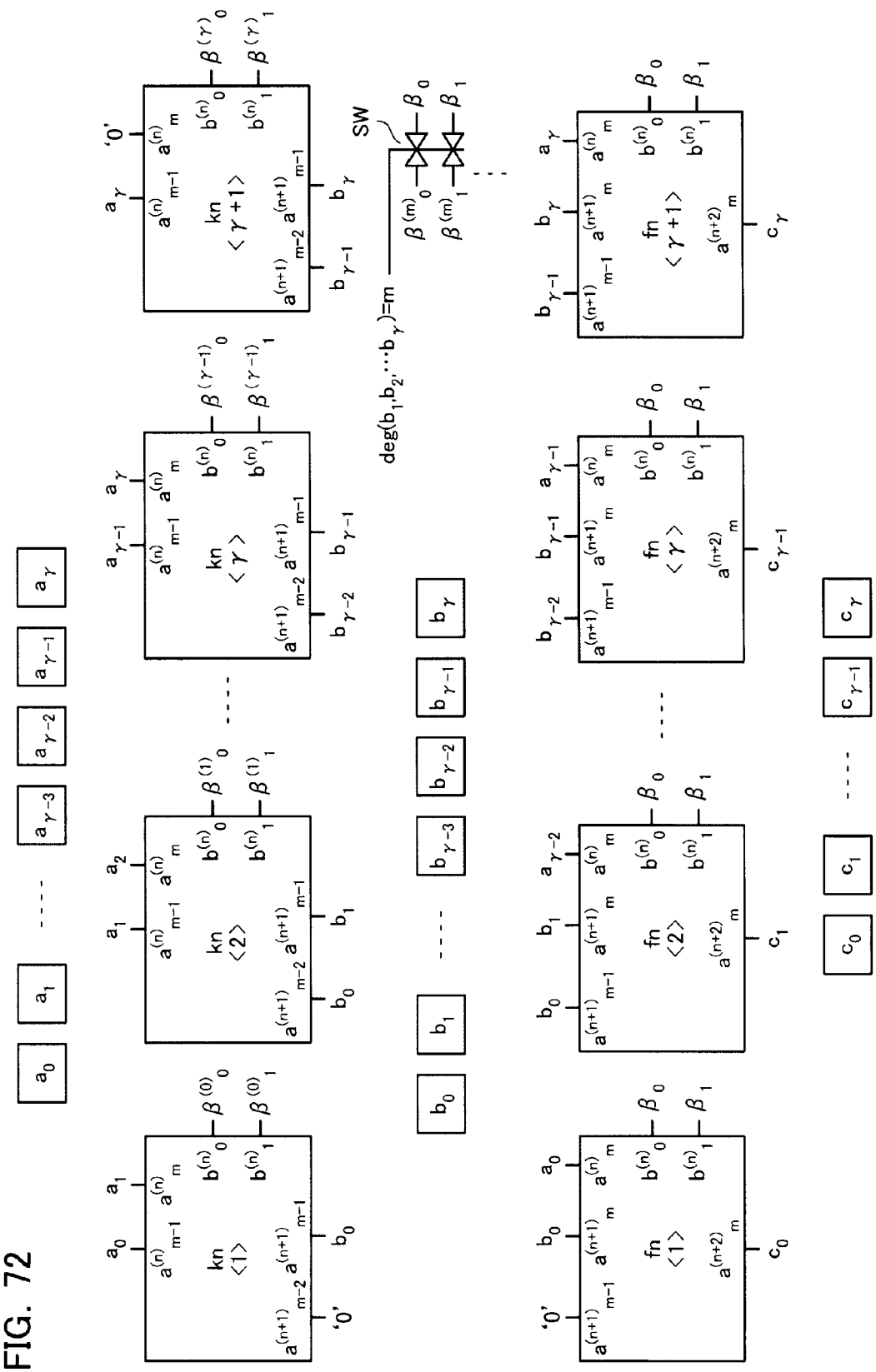
FIG. 72 is a block diagram of the "$f_n=k_n f_{n+1}+f_{n+2}$" circuit block in the memory system according to the present embodiment.

FIG. 71 is a diagram showing a circuit symbol of the "$f_n=k_n f_{n+1}+f_{n+2}$" circuit block. FIG. 72 is a block diagram of the "$f_n=k_n f_{n+1}+f_{n+2}$" circuit block.

The "$f_n=k_n f_{n+1}+f_{n+2}$" circuit block receives $a_0$-$a_\gamma$, the coefficients of $f_n$; and $b_0$-$b_\gamma$, the coefficients of $f_{n+1}$, and provides $c_0$-$c_\gamma$, the coefficients of $f_{n+2}$; and $\beta_0$-$\beta_\gamma$, the coefficients of $k_n$ as shown in FIG. 71.

As computations are started with substitutions of $f_0=x^\gamma$, $f_1=\Psi(x)$, the maximum degree of $f_n$ is $\gamma$, and the maximum degree of $f_{n+2}$ is also $\gamma$ because $k_n$ may be 1. Therefore, the "$f_n=k_n f_{n+1}+f_{n+2}$" circuit block includes $(\gamma+1)$ "kn" circuit blocks <1>-<$\gamma+1$>, and $(\gamma+1)$ "fn" circuit blocks <1>-<$\gamma+1$> as shown in FIG. 72.

The "kn" circuit block <1> associates '0', $a_0$, $b_0$ and $a_1$ with $a^{(n+1)}_{m-2}$, $a^{(n)}_{m-1}$, $a^{(n+1)}_{m-1}$ and $a^{(n)}_{m}$, and associates $\beta^{(1)}_{0}$ and $\beta^{(1)}_{1}$ with $b^{(n)}_{0}$ and $b^{(n)}_{1}$, respectively.

The "kn" circuit block <2> associates $b_0$, $a_1$, $b_1$ and $a_2$ with $a^{(n+1)}_{m-2}$, $a^{(n)}_{m-1}$, $a^{(n+1)}_{m-1}$ and $a^{(n)}_{m}$, and associates $\beta^{(1)}_{0}$ and $\beta^{(1)}_{1}$ with $b^{(n)}_{0}$ and $b^{(n)}_{1}$, respectively.

The subsequent "kn" circuit blocks <3>-<$\gamma+1$> have the similar inputs/outputs to the "kn" circuit blocks <1> and <2>.

The outputs, $\beta^{(m)}_{0}$ and $\beta^{(m)}_{1}$ (m=0–$\gamma$), from the "kn" circuit blocks <1>-<$\gamma+1$> are provided as $\beta_0$ and $\beta_1$ from the "$f_n=k_n f_{n+1}+f_{n+2}$" circuit block via the control switches SW controlled by $\deg(b_1, b_2, \ldots, b_\gamma)=m$. The $\beta_0$ and $\beta_1$ can be utilized also as the inputs to the "fn" circuit blocks <1>-<$\gamma+1$>. Here, deg( ) represents the output from the degree decision circuit associated with $f_{n+1}$.

The "fn" circuit block <1> receives '0', $b_0$, $a_0$, $\beta_0$ and $\beta_1$ as $a^{(n+1)}_{m-1}$, $a^{(n+1)}_{m}$, $a^{(n)}_{m}$, $b^{(n)}_{0}$ and $b^{(n)}_{1}$, and provides $c_0$ as $a^{(n+2)}_{m}$.

The "fn" circuit block <2> receives $b_0$, $b_1$, $a_1$, $\beta_0$ and $\beta_1$ as $a^{(n+1)}_{m-1}$, $a^{(n+1)}_{m}$, $a^{(n)}_{m}$, $b^{(n)}_{0}$ and $b^{(n)}_{1}$, and provides $c_1$ as $a^{(n+2)}_{m}$.

The subsequent "fn" circuit blocks <3>-<$\gamma+1$> have the similar inputs/outputs to the "fn" circuit blocks <1> and <2>.

The outputs from the "fn" circuit blocks <1>-<$\gamma+1$> turn to $c_0$-$c_\gamma$, that is, the output from the "$f_n=k_n f_{n+1}+f_{n+2}$" circuit block.

Subsequently, a circuit for computing $p_{n+1}=k_n p_n+p_{n-1}$ is described. Hereinafter, this circuit is referred to as the "$p_{n+1}=k_n p_n+p_{n-1}$" circuit block.

Figure 73:
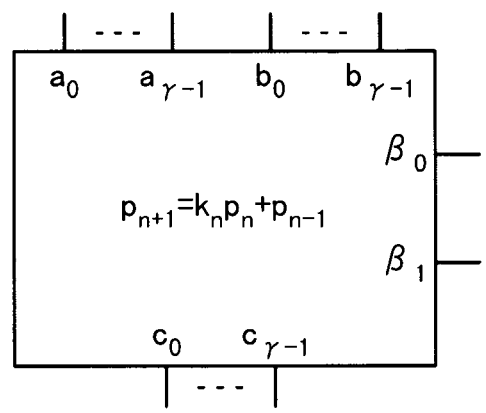
FIG. 73 is a diagram showing a circuit symbol of a circuit for use in a Euclidean iterative method ("$p_{n+1}=k_n p_n+p_{n-1}$" circuit block) in the memory system according to the present embodiment.
Figure 74:
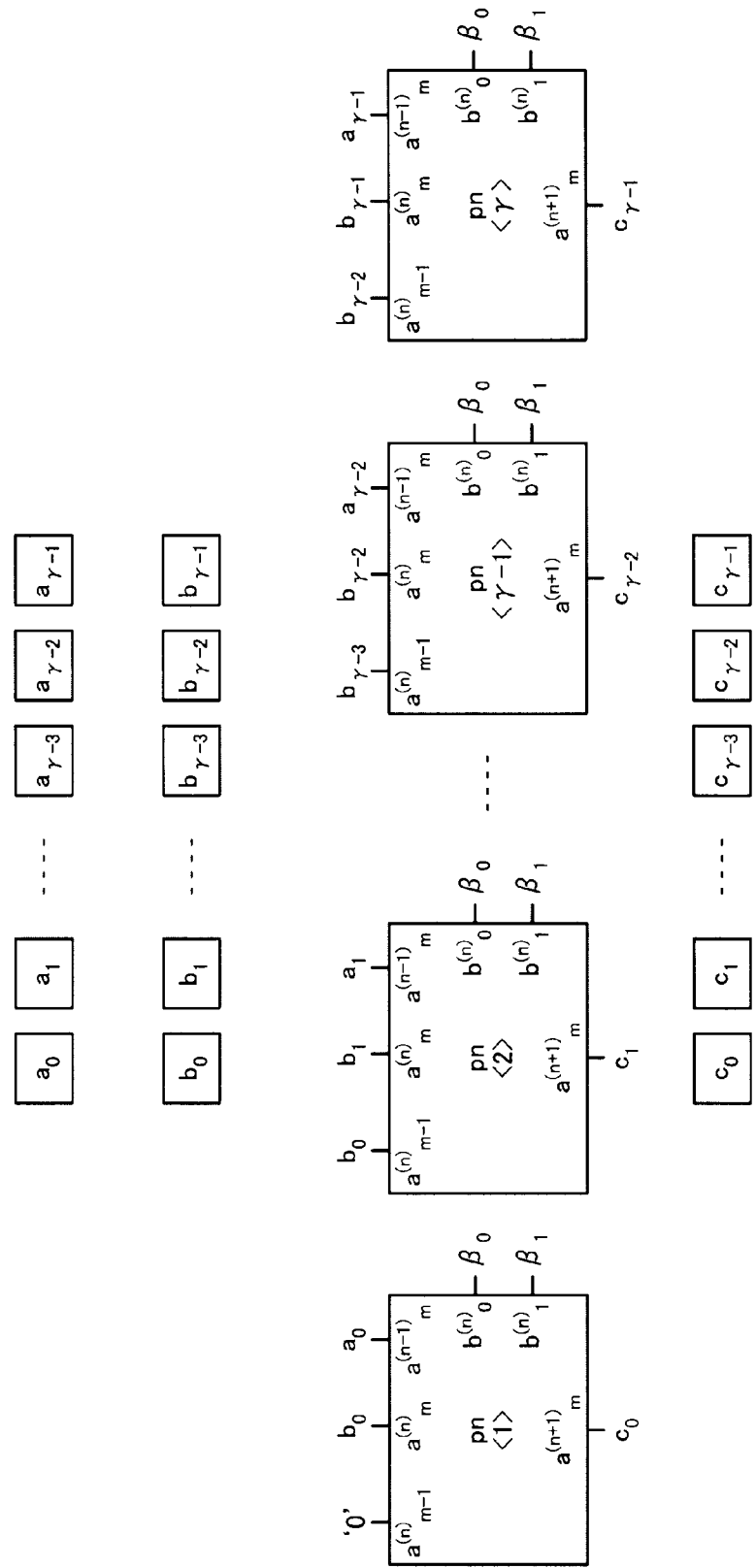
FIG. 74 is a block diagram of the "$p_{n+1}=k_n p_n+p_{n-1}$" circuit block in the memory system according to the present embodiment.

FIG. 73 is a diagram showing a circuit symbol of the "$p_{n+1}=k_n p_n+p_{n-1}$" circuit block. FIG. 74 is a block diagram of the "$p_{n+1}=k_n p_n+p_{n-1}$" circuit block.

The "$p_{n+1}=k_n p_n+p_{n-1}$" circuit block receives $\beta_0$, $\beta_1$, the coefficients of $k_n$; $a_0$-$a_{\gamma-1}$, the coefficients of $p_{n-1}$; and $b_0$-$b_{\gamma-1}$, the coefficients of $p_n$, and provides $c_0$-$c_{\gamma-1}$, the coefficients of $p_{n+1}$ as shown in FIG. 73.

As computations are started with substitutions of $p_{-1}=0$, $p_0=1$, the maximum degree of $p_{n+1}$ is $\gamma-1$, for the purpose of utilizing $p_{n+1}$ mod $x^\gamma$. Therefore, the "$p_{n+1}=k_n p_n+p_{n-1}$" circuit block includes $\gamma$ "kn" circuit blocks <1>-<$\gamma$>.

The "pn" circuit block <1> receives '0', $b_0$, $a_0$, $\beta_0$ and $\beta_1$ as $a^{(n)}_{m-1}$, $a^{(n)}_{m}$, $a^{(n-1)}_{m}$, $b^{(n)}0$ and $b^{(n)}1$, and provides $c_0$ as $a^{(n+1)}_{m}$, respectively.

The "pn" circuit block <2> receives $b_0$, $b_1$, $a_1$, $\beta_0$ and $\beta_1$ as $a^{(n)}_{m-1}$, $a^{(n)}_{m}$, $a^{(n-1)}_{m}$, $b^{(n)}0$ and $b^{(n)}1$, and provides $c_1$ as $a^{(n+1)}_{m}$, respectively.

The subsequent "pn" circuit blocks <3>-<$\gamma$> have the similar inputs/outputs to the "pn" circuit blocks <1> and <2>.

The outputs from the "pn" circuit blocks <1>-<$\gamma$> are provided as $c_0$-$c_{\gamma-1}$, that is, the output from the "$p_{n+1}=k_n p_n+p_{n-1}$" circuit block.

Subsequently, a description is given to computing circuits operative to derive $f_n$ and $p_{n-1}$ through iterative computations from 0 to n.

Figure 75:
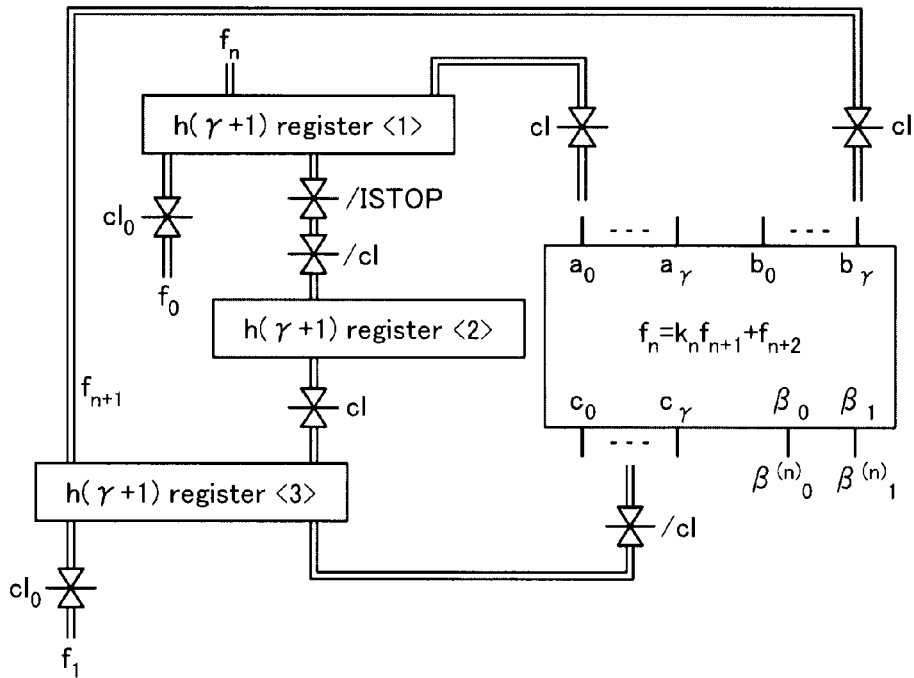
FIG. 75 is a block diagram of a circuit for use in the Euclidean iterative method in the memory system according to the present embodiment.
Figure 76:
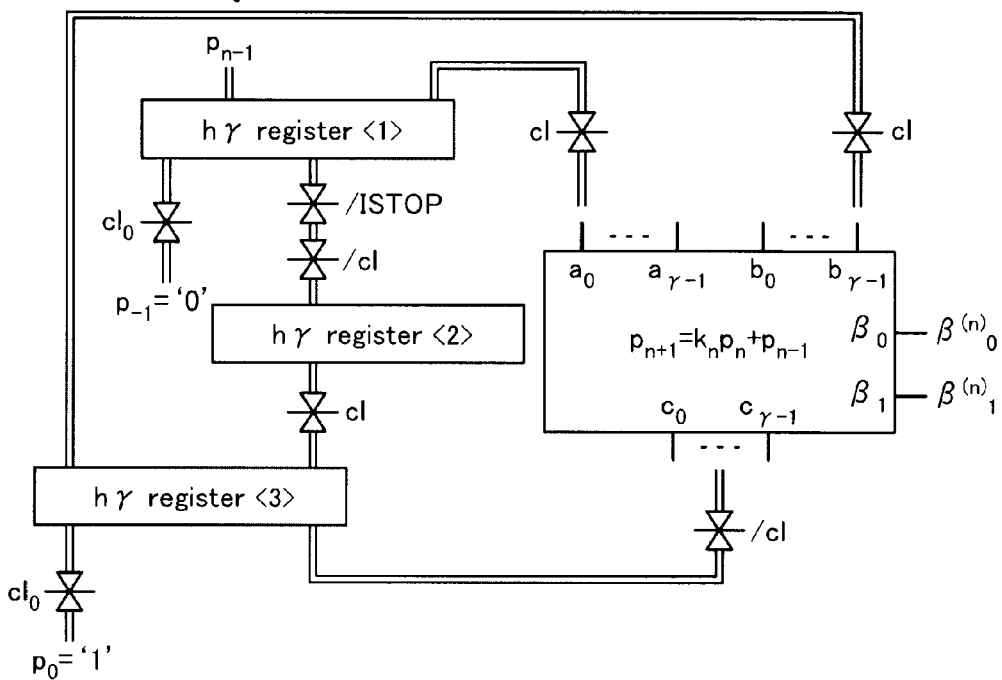
FIG. 76 is a block diagram of a circuit for use in the Euclidean iterative method in the memory system according to the present embodiment.

FIG. 75 shows the computing circuit operative to derive $f_n$, and FIG. 76 shows the computing circuit operative to derive $p_{n-1}$.

The computing circuit operative to derive $f_n$ includes 3 "h($\gamma+1$)" register units <1>-<3>, as shown in FIG. 75, in addition to the "$f_n=k_n f_{n+1}+f_{n+2}$" circuit block. The "h($\gamma+1$)" register units <1>-<3> include ($\gamma+1$) pieces of h-bit latches each. The "h($\gamma+1$)" register units <1>-<3> are given a setting of '0' if there is no corresponding input. The computation of $f_n$ is advanced at the "$f_n=k_n f_{n+1}+f_{n+2}$" circuit block and 3 "h($\gamma+1$)" register units <1>-<3> provided in the periphery thereof, which circularly transfer data.

The computing circuit operative to derive $p_{n+1}$ includes "h$\gamma$" register units <1>-<3>, as shown in FIG. 76, in addition to the "$p_{n+1}=k_n p_n+p_{n-1}$" circuit block. The "h$\gamma$" register units <1>-<3> include $\gamma$ pieces of h-bit latches each. The "h$\gamma$" register units <1>-<3> are given a setting of '0' if there is no corresponding input. The computation of $p_{n+1}$ is advanced at the "$p_{n+1}=k_n p_n+p_{n-1}$" circuit block and 3 "h$\gamma$" register units <1>-<3> provided in the periphery thereof, which circularly transfer data.

The computations of $f_n$ and $p_{n-1}$ advance at every cycle of the clock cl and the number of cycles of the clock cl counted from 0 corresponds to n of the Euclidean iteration. Finally, the "h($\gamma+1$)" register unit <1> holds $f_n$, and the "h$\gamma$" register unit <1> holds $p_{n-1}$.

In the first clock cycle $cl_0$, the "h($\gamma+1$)" register units <1>-<3> and the "h$\gamma$" register units <1>-<3> are given settings of initial values as shown in FIGS. 75 and 76, respectively.

In the computing circuit operative to derive $f_n$, the coefficient of $f_0=x^\gamma$ is set in the "h($\gamma+1$)" register unit <1> and the coefficient of $f_1=\Psi(x)$ in the "h($\gamma+1$)" register unit <3>. In the computing circuit operative to derive $p_{n-1}$, $p_{-1}=$'0' is set in the "h$\gamma$" register unit <1> and $p_{-1}=$'1' in the "h$\gamma$" register unit <3>. Thereafter, as the clock cycle advances, $f_n$ and $p_{n-1}$ are set in the corresponding register units at the start of the $cl_n$ cycle.

The "h($\gamma+1$)" register unit <1> and the "h$\gamma$" register unit <1> are prevented from receiving the inputs by a signal /ISTOP. Accordingly, data in the "h($\gamma+1$)" register unit <1> and the "h$\gamma$" register unit <1> can be determined at that moment. The signal /ISTOP is a signal that is activated if the later-described stop condition on the Euclidean iterative method is satisfied.

Thus, the "h(γ+1)" register unit <1> and the "hγ" register unit <1> can obtain the desired resultant coefficients of the polynomials therein.

These coefficients can be fed to the first Hasse differential polynomial generator unit 207 and the second Hasse differential polynomial generator unit 208 to seek the root and the multiplicity of the Hasse differential polynomial.

For the purpose of seeking the signal /ISTOP shown in FIGS. 75 and 76, that is, the stop condition on the Euclidean iterative method, it is required to determine the degree of the computed polynomial. Therefore, the following description is given to a circuit operative to represent the degree in binary based on the obtained coefficients, $a_j$ (j=0–γ), of $f_n$ or $p_{n-1}$. Hereinafter, this circuit is referred to as the "DEG" circuit block.

Figure 77:
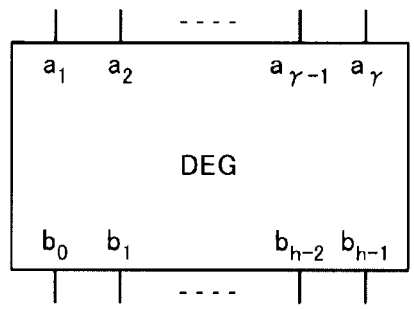
FIG. 77 is a diagram showing a circuit symbol of a circuit for use in a Euclidean iterative method ("DEG" circuit block) in the memory system according to the present embodiment.
Figure 78:
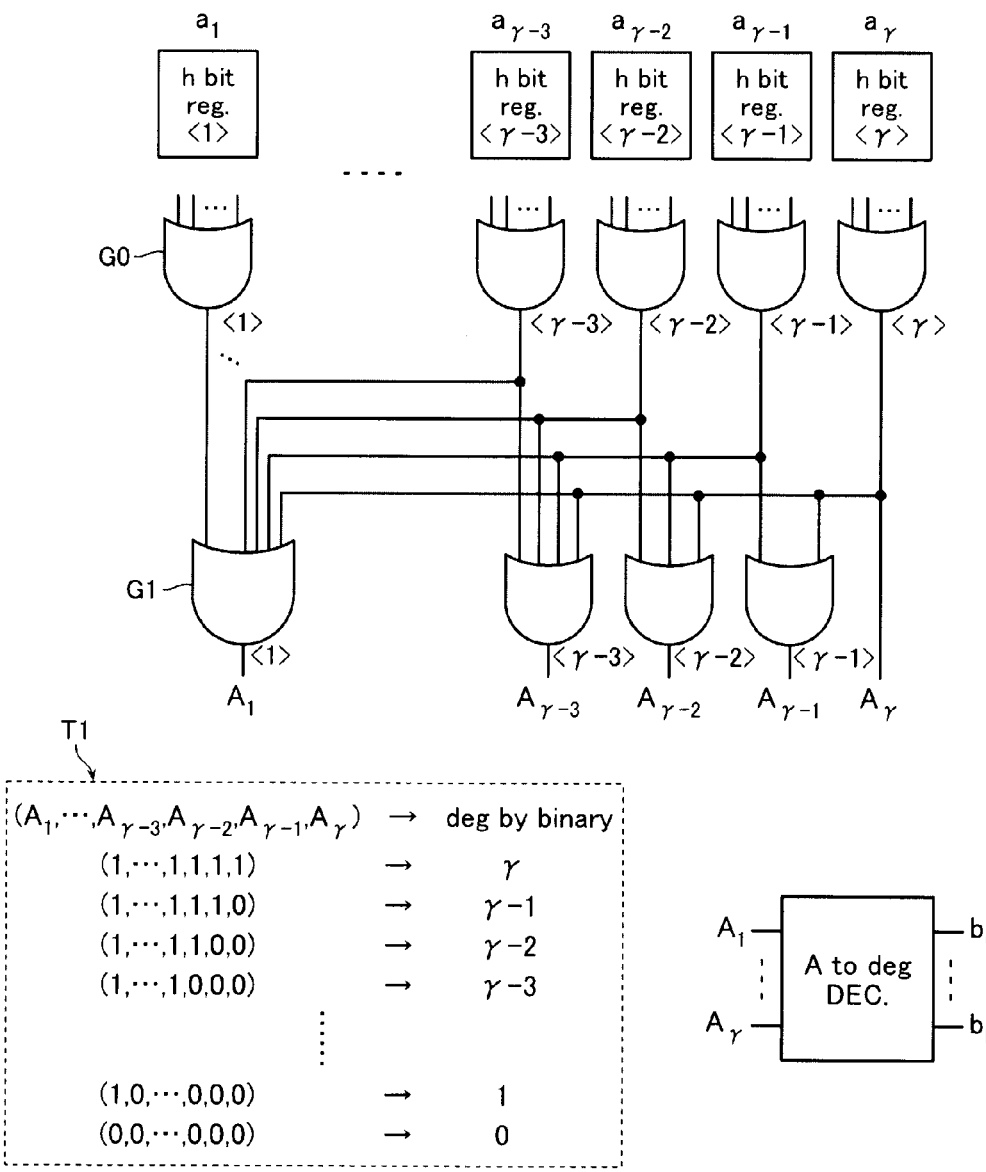
FIG. 78 is a block diagram of the "DEG" circuit block in the memory system according to the present embodiment.

FIG. 77 is a diagram showing a circuit symbol of the "DEG" circuit block. FIG. 78 is a block diagram of the "DEG" circuit block.

The "DEG" circuit block receives $a_1$-$a_\gamma$, and provides that is, a binary representation of the degree as shown in FIG. 77.

The "DEG" circuit block includes "h bit reg" registers <1>-<γ>, OR gates G0<1>-<γ>, G1<1>-<γ>, and an "A to deg DEC." circuit block as shown in FIG. 78.

The "h bit" registers each hold h-bit binary data indicative of the coefficients, $a_1$-$a_\gamma$, of the γ-th degree polynomial. The h-bit binary data indicative of the coefficients a1-aγ are fed to the OR gates G0<1>-<γ>.

The OR gate G0<n> (n=1-γ) receives h-bit binary data indicative of $a_n$. The OR gate G0<1> provides '0' if $a_n$=0 and '1' if $a_n \neq 0$. In a word, the OR gate G0<n> determines whether $a_n$ is equal to 0 or other than 0.

The OR gate G1<m> (m=1 to γ−1) receives the outputs from the OR gates G0<m>-<γ>. The outputs from the OR gates G1<1>-<γ−1> turn to $A_1$-$A_{\gamma-1}$, respectively. In addition, the output from the OR gate G0<γ> directly turns to $A_\gamma$. These $A_1$-$A_\gamma$ are fed to the "A to deg DEC." circuit block.

The "A to deg DEC." circuit block is a decoder circuit capable of realizing the associated relations between $A_1$-$A_\gamma$ and binary representations of the degrees as shown with T1 in FIG. 78. The total sum of '1's in $A_j$ (j=1−γ) corresponds to a binary representation of the degree.

The "A to deg DEC." circuit block derives $b_0$-$b_{h-1}$, that is, the output from the "DEC" circuit block, from $A_1$-$A_\gamma$ based on the association table shown with T1 in FIG. 78. The degree γ is equal to or lower than p and accordingly can be represented by h bits.

The final description is given to a circuit operative to decide if the key condition on the Lee metric code is satisfied to stop the iterations, and if the error correctable condition is satisfied, based on fn and pn−1 obtained through the Euclidean iterative method.

Figure 79:
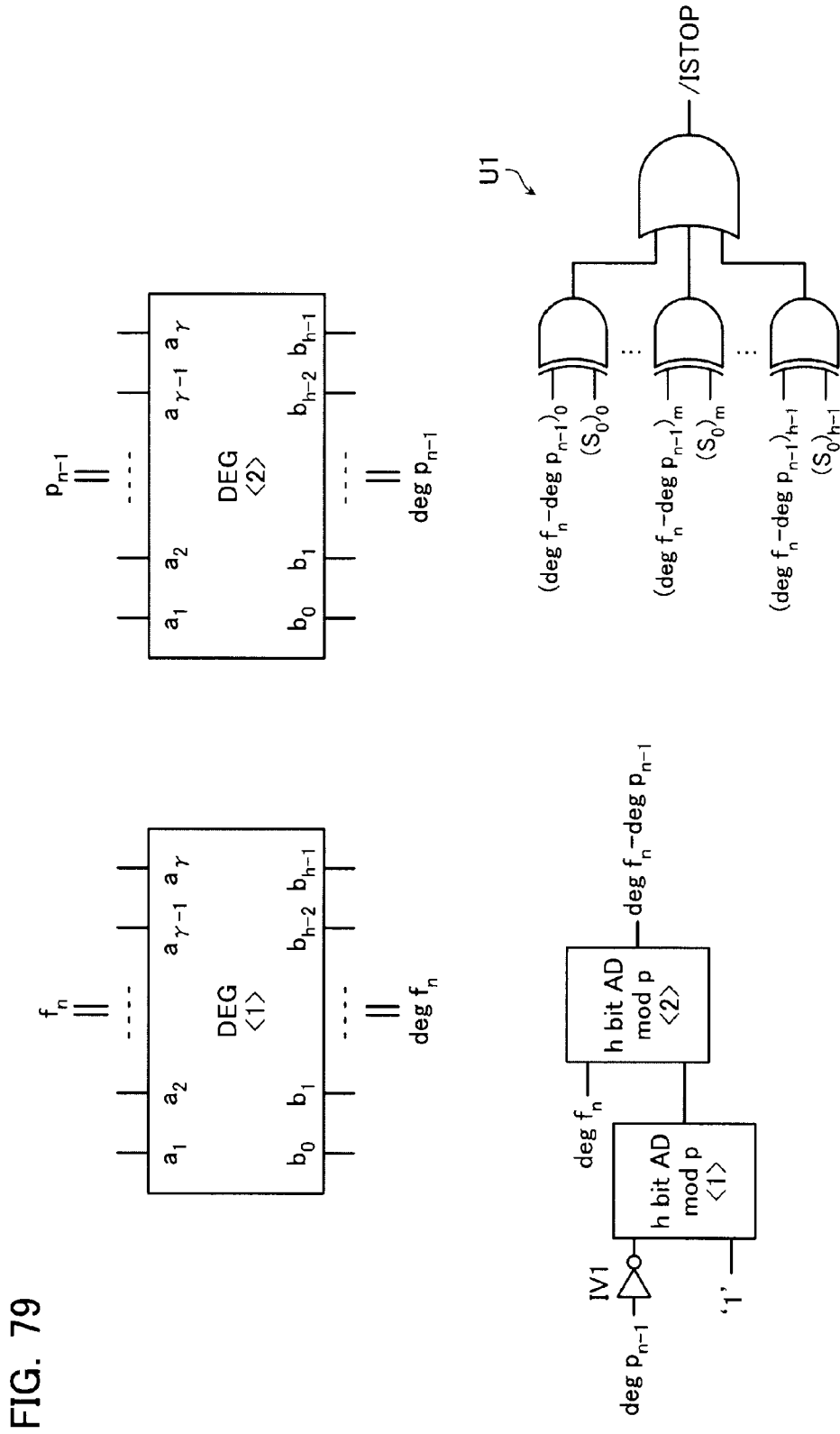
FIG. 79 is a block diagram of a circuit for deciding the stop condition on the Euclidean iterative method in the memory system according to the present embodiment.

FIG. 79 is a block diagram of a circuit operative to decide the stop condition on the Euclidean iterative method, that is, to create the signal /ISTOP.

This circuit includes 2 "DEG" circuit blocks <1>, <2>, 2 "h bit AD mod p" circuit blocks <1>, <2>, and a part circuit U1 composed of plural logic gates.

The "DEG" circuit block <1> receives $f_n$ as $a_1$-$a_\gamma$, and provides deg $f_n$, that is, a binary representation of $f_n$ as $b_0$-$b_{n-1}$. This deg $f_n$ is fed to the "h bit AD mod p" circuit block <2>.

The "DEG" circuit block <2> receives $p_{n-1}$ as $a_1$-$a_\gamma$, and provides deg $p_{n-1}$, that is, a binary representation of $p_{n-1}$ as $b_0$-$b_{h-1}$. This deg $p_{n-1}$ is fed to the "h bit AD mod p" circuit block <1> via the inverter IV1.

The "h bit AD mod p" circuit block <1> derives the complement of deg $p_{n-1}$ from the input, deg $p_{n-1}$, fed via the inverter IV1 and '1'. The complement of deg $p_{n-1}$ is fed to the "h bit AD mod p" circuit block <2>.

The stop condition on the Euclidean iterative method is deg $f_n$−deg $p_{n-1} \equiv S_0$ (mod p). Therefore, the "h bit AD mod p" circuit block <2> receives deg $f_n$ and the complement of deg $p_{n-1}$ to obtain deg $f_n$−deg $p_{n-1}$ as a numeral in Zp. This result is fed to the part circuit U1 for comparison with $S_0$ at every bit of the binary representation.

For the purpose of comparing deg $f_n$−deg $p_{n-1}$ with $S_0$ at every bit, the part circuit U1 seeks an exclusive logical sum at every bit. If all bits (deg $f_n$−deg $p_{n-1}$)$_j$ (j=0 to h−1) match $(S_0)_j$, the part circuit U1 provides '0' as the signal /ISTOP. In a word, the signal /ISTOP is (deg $f_n$−deg $p_{n-1}$)$_0$ (+) $(S_0)_0$ □ . . . □(deg $f_n$−deg $p_{n-1}$)$_m$ (+) $(S_0)_m$ □ . . . □(deg $f_n$−deg $p_{n-1}$)$_{h-1}$ (+) $(S_0)_{h-1}$. Thus, the part circuit U1 can realize if deg $f_n$−deg $p_{n-1}$ matches $S_0$ or not.

Figure 80:
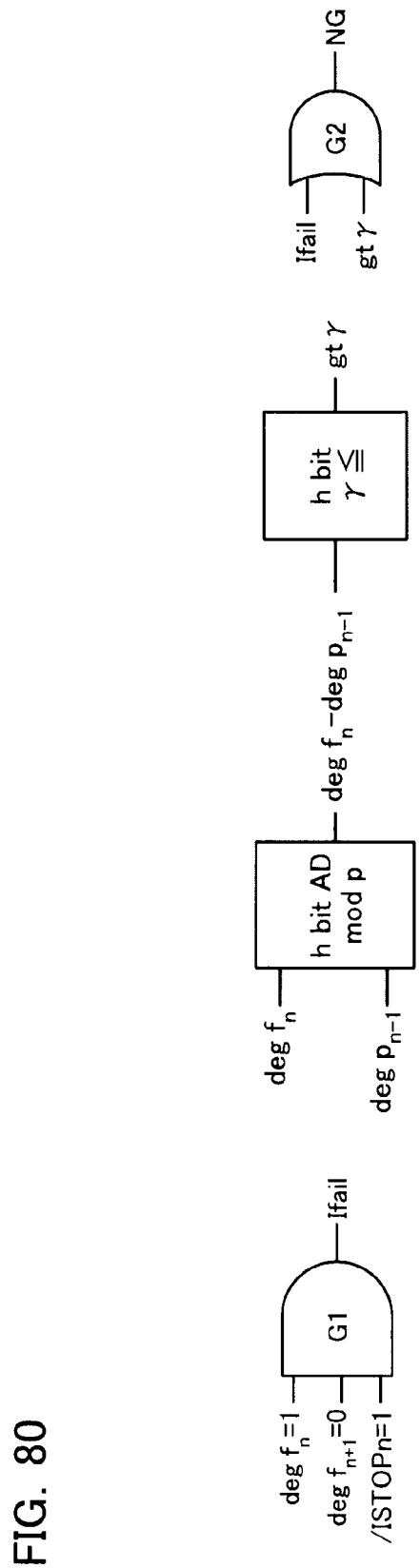
FIG. 80 is a block diagram of a circuit for deciding the success condition on the Euclidean iterative method in the memory system according to the present embodiment.

FIG. 80 is a block diagram of a circuit for deciding the success condition on the Euclidean iterative method.

This circuit includes a NAND gate G1, a "h bit AD mod p" circuit block, a "h bit γ≤" circuit block later-described, and an NOR gate G2.

The NAND gate G1 is arranged to provide for the case where the Euclidean iterative method fails to satisfy the stop condition to stop. If the degree of $f_n$ is equal to 1, the degree of $f_{n+1}$ is equal to 0, and the signal /ISTOPn in reverse logic of the signal /ISTOP is at 1, that is, under the condition of (deg $f_n$=1)□(deg $f_{n+1}$=0)□(/ISTOPn=1), the NAND gate G1 provides '1' as a signal Ifail.

It is determined based on deg $f_n$+deg $p_{n-1}$<γ if the error is correctable when the Euclidean iterative method stops.

Therefore, the "h bit AD mod p" circuit block is given deg $f_n$ and deg $p_{n-1}$ to derive the sum thereof, deg $f_n$+deg $p_{n-1}$. This sum, deg $f_n$+deg $p_{n-1}$, is fed to the "h bit γ≤" circuit block.

The "h bit γ≤" circuit block is a circuit operative to determine if the input is equal to or higher than γ or not. The "h bit γ≤" circuit block provides '1' as a signal gtγ if the input, deg $f_n$+deg $p_{n-1}$, supplied from the "h bit AD mod p" circuit block is equal to or higher than γ.

The details of the "h bit γ≤" circuit block are omitted from the following description though they can be configured similar to the PF0 generator unit U1 in the "h bit AD mod p" circuit block shown in FIG. 40.

The OR gate G2 receives the output, Ifail, from the NAND gate G1 and the output, gtγ, from the "h bit γ≤" circuit block and, if Ifail□gtγ, it provides NG signal indicative of the impossibility of error correction through the Euclidean iterative method.

<Conclusion>

Thus, the second embodiment is described on the p-adic NAND flash memory using the Euclidean iterative method in error correction with the specific configurations exemplified.

The second embodiment makes it possible to ensure the reliability of data by a strong error correcting ability even if the level setting is insufficient in data write to p-adic cells and data read from p-adic cells. It is possible to realize faster error correction processing than the first embodiment.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system, comprising:
a cell array including word lines and plural memory cells operative to store multi-level data in accordance with plural different physical levels when selected by said word lines;
a register operative to hold first data input from external; and
a data converter unit operative to, before recording said multi-level data to said memory cells, convert the first data held in said register into second data and overwrite the second data in the area of said register for holding the first data, and furthermore convert the second data held in said register into third data or said multi-level data and overwrite the third data in the area of said register for holding the second data.

2. The memory system according to claim 1, further comprising a data write unit operative to supply said memory cells with plural write voltages via said word lines for making transitions to said plural physical levels correspondingly,
wherein said data write unit supplies said word lines with all said write voltages continuously while making stepwise changes from the lowest write voltage to the highest write voltage on writing data in plural memory cells selected by said word lines.

3. The memory system according to claim 1, further comprising a data read unit operative to supply said memory cells with plural read voltages via said word lines for detecting said plural physical levels in said memory cells individually,
wherein said data read unit supplies said word lines with all said read voltages continuously while making stepwise changes from the lowest read voltage to the highest read voltage or from the highest read voltage to the lowest read voltage on reading data from plural memory cells selected by said word lines.

4. The memory system according to claim 1, wherein said first data is binary data,
wherein said second data is p-adic data (p is a prime),
wherein said third data is a Lee metric code.

5. The memory system according to claim 1, further comprising an error correcting unit operative, for fourth data read out of said memory cells, to correct an error contained in said fourth data to restore said third data.

6. The memory system according to claim 5, wherein said error correcting unit includes
a syndrome generator unit operative to generate a syndrome from said fourth data,
a solution searching polynomial generator unit operative to generate a solution searching polynomial from said syndrome,
an error quantity computing unit operative to compute an error quantity based on a root and a multiplicity, and
a code restorer unit operative to restore said third data from said fourth data based on said error quantity.

7. The memory system according to claim 5, wherein said error correcting unit includes
a syndrome generator unit operative to generate a syndrome from said fourth data,
a solution searching polynomial generator unit operative to generate a solution searching polynomial from said syndrome,
a code restorer unit operative to compute an error quantity from said solution searching polynomial based on a root and a multiplicity through a Euclidean iterative method and restore said third data from said fourth data based on said error quantity.

8. A memory system, comprising:
a cell array including word lines and plural memory cells operative to store multi-level data in accordance with plural different physical levels when selected by said word lines;
a register operative to hold first data input from external; and
a data converter unit operative to, before recording said multi-level data to said memory cells, convert the first data held in said register into second data and overwrite the second data in the area of said register for holding the first data, and furthermore convert the second data held in said register into third data or said multi-level data and overwrite the third data in the area of said register for holding the second data,
wherein said register holds said third data restored based on fourth data read out of said memory cells,
wherein said data converter unit converts the third data held in said register into said second data and overwrites the second data in the area of said register for holding the third data, and furthermore converts the second data held in said register into said first data to be output to external and overwrites the first data in the area of said register for holding the second data.

9. The memory system according to claim 8, wherein said first data is held in said register at every transfer unit composed of certain bits,
wherein said data converter unit executes conversion processing of said first through third data at every processing unit composed of certain bits,
wherein a part of the certain transfer unit is subject to conversion processing at a certain processing unit and another part of said certain transfer unit is subject to conversion processing at another processing unit different from said certain transfer unit.

10. The memory system according to claim 8, further comprising a data write unit operative to supply said memory cells with plural write voltages via said word lines for making transitions to said plural physical levels correspondingly,
wherein said data write unit supplies said word lines with all said write voltages continuously while making stepwise changes from the lowest write voltage to the highest write voltage on writing data in plural memory cells selected by said word lines.

11. The memory system according to claim 8, further comprising a data read unit operative to supply said memory cells with plural read voltages via said word lines for detecting said plural physical levels in said memory cells individually,
wherein said data read unit supplies said word lines with all said read voltages continuously while making stepwise changes from the lowest read voltage to the highest read voltage or from the highest read voltage to the lowest read voltage on reading data from plural memory cells selected by said word lines.

12. The memory system according to claim 8, wherein said first data is binary data,
wherein said second data is p-adic data (p is a prime),
wherein said third data is a Lee metric code.

13. The memory system according to claim 8, further comprising an error correcting unit operative to correct an error contained in said fourth data to restore said third data.

14. The memory system according to claim 13, wherein said error correcting unit includes
- a syndrome generator unit operative to generate a syndrome from said fourth data,
- a solution searching polynomial generator unit operative to generate a solution searching polynomial from said syndrome,
- an error quantity computing unit operative to compute an error quantity based on a root and a multiplicity, and
- a code restorer unit operative to restore said third data from said fourth data based on said error quantity.

15. The memory system according to claim 14, wherein said error correcting unit includes
- a syndrome generator unit operative to generate a syndrome from said fourth data,
- a solution searching polynomial generator unit operative to generate a solution searching polynomial from said syndrome,
- a code restorer unit operative to compute an error quantity from said solution searching polynomial based on a root and a multiplicity through a Euclidean iterative method and restore said third data from said fourth data based on said error quantity.

16. A memory system, comprising:
- a cell array including word lines and plural memory cells operative to store multi-level data in accordance with plural different physical levels when selected by said word lines;
- a register operative to hold first data input from external; and
- a data converter unit operative to, before recording said multi-level data to said memory cells, convert the first data held in said register into second data and overwrite the second data in the area of said register for holding the first data, and furthermore convert the second data held in said register into third data or said multi-level data and overwrite the third data in the area of said register for holding the second data,
- wherein said first data is held in said register at every transfer unit composed of certain bits,
- wherein said data converter unit executes conversion processing of said first through third data at every processing unit composed of certain bits, and
- wherein a part of the certain transfer unit is subject to conversion processing at a certain processing unit and another part of said certain transfer unit is subject to conversion processing at another processing unit different from said certain transfer unit.

17. The memory system according to claim 16, further comprising a data write unit operative to supply said memory cells with plural write voltages via said word lines for making transitions to said plural physical levels correspondingly,
- wherein said data write unit supplies said word lines with all said write voltages continuously while making stepwise changes from the lowest write voltage to the highest write voltage on writing data in plural memory cells selected by said word lines.

18. The memory system according to claim 16, further comprising a data read unit operative to supply said memory cells with plural read voltages via said word lines for detecting said plural physical levels in said memory cells individually,
- wherein said data read unit supplies said word lines with all said read voltages continuously while making stepwise changes from the lowest read voltage to the highest read voltage or from the highest read voltage to the lowest read voltage on reading data from plural memory cells selected by said word lines.

19. The memory system according to claim 16, wherein said first data is binary data,
- wherein said second data is p-adic data (p is a prime),
- wherein said third data is a Lee metric code.

20. The memory system according to claim 16, further comprising an error correcting unit operative, for fourth data read out of said memory cells, to correct an error contained in said fourth data to restore said third data.

* * * * *